US010605415B2

(12) United States Patent
Xiong et al.

(10) Patent No.: US 10,605,415 B2
(45) **Date of Patent: *Mar. 31, 2020**

(54) LED TUBE LAMP

(71) Applicant: JIAXING SUPER LIGHTING ELECTRIC APPLIANCE CO., LTD, Jiaxing (CN)

(72) Inventors: Aiming Xiong, Jiaxing (CN); Xintong Liu, Shanghai (CN)

(73) Assignee: Jiaxing Super Lighting Electric Appliance Co., Ltd., Xiuzhou Area, Jiaxing, Zhejiang (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/436,454

(22) Filed: Jun. 10, 2019

(65) Prior Publication Data

US 2019/0331305 A1 Oct. 31, 2019

Related U.S. Application Data

(63) Continuation of application No. 16/143,755, filed on Sep. 27, 2018, now Pat. No. 10,317,017, which is a (Continued)

(30) Foreign Application Priority Data

Mar. 10, 2015 (CN) .......................... 2015 1 0104823
Mar. 25, 2015 (CN) .......................... 2015 1 0133689
(Continued)

(51) Int. Cl.
*H05B 37/00* (2006.01)
*H05B 41/00* (2006.01)
(Continued)

(52) U.S. Cl.
CPC .............. *F21K 9/278* (2016.08); *F21K 9/272* (2016.08); *F21K 9/275* (2016.08); *F21V 3/061* (2018.02);
(Continued)

(58) Field of Classification Search
None
See application file for complete search history.

(56) References Cited

U.S. PATENT DOCUMENTS 5,936,599 A 8/1999 Reymond
8,749,167 B2 6/2014 Hsia et al.
(Continued)

FOREIGN PATENT DOCUMENTS

CN 101945512 A 1/2011
CN 102014560 A 4/2011
(Continued)

*Primary Examiner* — Anh Q Tran
(74) *Attorney, Agent, or Firm* — Muir Patent Law, PLLC

(57) ABSTRACT

A ballast-bypass light-emitting diode (LED) tube lamp includes at least a first and second external connection terminal, the first and second external connection terminals respectively connected to opposite sides of the ballast by-pass LED tube lamp. The tube lamp includes an LED module, configured to emit light in response to a driving current, and a power supply module, electrically connected to the first and second external connection terminals for receiving an AC driving signal and configured to provide the driving current to the LED module. The power supply module comprises a rectifying circuit, a filtering circuit, a driving circuit, and a circuit electrically connected to the driving circuit and configured to operate in response to whether a foreign external impedance is connected to the LED tube lamp. When part of the LED tube lamp is electrically connected to an external power source and the foreign external impedance is electrically connected to the LED tube lamp, the first circuit disables the driving circuit
(Continued)

511 510 Dd1 Dd2 Rd1 501 6112 Sc (DP) 502 Cd1 Rd2 6110 Rd1 Rd2 Cd1 6112 512 so as to limit the generation of the driving current to prevent the LED module from emitting light based on the driving current. When both ends of the LED tube lamp are electrically connected to an external power source and the foreign external impedance is not electrically connected to the LED tube lamp, the first circuit enables the driving circuit so as to not limit the generation of the driving current in order to allow the LED module to emitting light based on the driving current.

20 Claims, 67 Drawing Sheets

Related U.S. Application Data continuation-in-part of application No. 16/106,060, filed on Aug. 21, 2018, now Pat. No. 10,281,092, which is a continuation of application No. 15/662,094, filed on Jul. 27, 2017, now Pat. No. 10,054,271, which is a continuation-in-part of application No. 15/626,238, filed on Jun. 19, 2017, now Pat. No. 10,208,897, which is a continuation of application No. 15/373,388, filed on Dec. 8, 2016, now Pat. No. 9,689,536, which is a continuation-in-part of application No. 15/339,221, filed on Oct. 31, 2016, now Pat. No. 9,939,140, which is a continuation-in-part of application No. 15/210,989, filed on Jul. 15, 2016, now Pat. No. 9,587,817, which is a continuation-in-part of application No. 15/066,645, filed on Mar. 10, 2016, now Pat. No. 9,497,821, which is a continuation-in-part of application No. 14/865,387, filed on Sep. 25, 2015, now Pat. No. 9,609,711, said application No. 15/210,989 is a continuation-in-part of application No. 15/205,011, filed on Jul. 8, 2016, now Pat. No. 9,629,211, which is a continuation-in-part of application No. 15/150,458, filed on May 10, 2016, now Pat. No. 9,794,990, which is a continuation-in-part of application No. 14/865,387, filed on Sep. 25, 2015, now Pat. No. 9,609,711, said application No. 15/373,388 is a continuation-in-part of application No. 15/211,813, filed on Jul. 15, 2016, now Pat. No. 9,756,698, which is a continuation-in-part of application No. 15/150,458, filed on May 10, 2016, now Pat. No. 9,794,990, which is a continuation-in-part of application No. 14/865,387, filed on Sep. 25, 2015, now Pat. No. 9,609,711, said application No. 15/373,388 is a continuation-in-part of application No. 15/084,483, filed on Mar. 30, 2016, now Pat. No. 9,521,718, which is a continuation-in-part of application No. 14/865,387, filed on Sep. 25, 2015, now Pat. No. 9,609,711, said application No. 15/373,388 is a continuation-in-part of application No. 15/065,892, filed on Mar. 10, 2016, now Pat. No. 9,526,145, which is a continuation-in-part of application No. 14/865,387, filed on Sep. 25, 2015, now Pat. No. 9,609,711.

(30) Foreign Application Priority Data

Mar. 26, 2015 (CN) .......................... 2015 1 0134586
Apr. 3, 2015 (CN) .......................... 2015 1 0155807
Apr. 22, 2015 (CN) .......................... 2015 1 0193980
May 29, 2015 (CN) .......................... 2015 1 0284720
Jun. 17, 2015 (CN) .......................... 2015 1 0338027
Jun. 26, 2015 (CN) .......................... 2015 1 0364735
Jun. 26, 2015 (CN) .......................... 2015 1 0373492
Jun. 29, 2015 (CN) .......................... 2015 1 0378322
Jul. 10, 2015 (CN) .......................... 2015 1 0406595
Jul. 20, 2015 (CN) .......................... 2015 1 0428680
Jul. 27, 2015 (CN) .......................... 2015 1 0448220
Aug. 8, 2015 (CN) .......................... 2015 1 0486115
Aug. 14, 2015 (CN) .......................... 2015 1 0499512
Aug. 26, 2015 (CN) .......................... 2015 1 0530110
Sep. 6, 2015 (CN) .......................... 2015 1 0557717
Sep. 18, 2015 (CN) .......................... 2015 1 0595173
Sep. 25, 2015 (CN) .......................... 2015 1 0617370
Oct. 8, 2015 (CN) .......................... 2015 1 0645134
Oct. 27, 2015 (CN) .......................... 2015 1 0705222
Oct. 30, 2015 (CN) .......................... 2015 1 0726365
Nov. 27, 2015 (CN) .......................... 2015 1 0848766
Dec. 9, 2015 (CN) .......................... 2015 1 0903680
Jan. 22, 2016 (CN) .......................... 2016 1 0044148
Jan. 26, 2016 (CN) .......................... 2016 1 0050944
Jan. 26, 2016 (CN) .......................... 2016 1 0051691
Feb. 15, 2016 (CN) .......................... 2016 1 0085895
Feb. 16, 2016 (CN) .......................... 2016 1 0087627
Feb. 23, 2016 (CN) .......................... 2016 1 0098424
Mar. 3, 2016 (CN) .......................... 2016 1 0120993
Mar. 9, 2016 (CN) .......................... 2016 1 0132513
Mar. 14, 2016 (CN) .......................... 2016 1 0142140
Mar. 25, 2016 (CN) .......................... 2016 1 0177706
Apr. 29, 2016 (CN) .......................... 2016 1 0281812
May 18, 2016 (CN) .......................... 2016 1 0327806
Jun. 14, 2016 (CN) .......................... 2016 1 0420790
Jun. 20, 2016 (CN) .......................... 2016 1 0452437
Oct. 8, 2016 (CN) .......................... 2016 1 0876593
Oct. 8, 2016 (CN) .......................... 2016 1 0878349
Oct. 12, 2016 (CN) .......................... 2016 1 0890527
Oct. 27, 2016 (CN) .......................... 2016 1 0955338
Oct. 27, 2016 (CN) .......................... 2016 1 0955342
Nov. 3, 2016 (CN) .......................... 2016 1 0975119
Nov. 25, 2016 (CN) .......................... 2016 1 1057357
Jan. 19, 2017 (CN) .......................... 2017 1 0036966
Mar. 16, 2017 (CN) .......................... 2017 1 0158971
Mar. 21, 2017 (CN) .......................... 2017 1 0170620
Apr. 19, 2017 (CN) .......................... 2017 1 0258874
Apr. 28, 2017 (CN) .......................... 2017 1 0295599
Jul. 19, 2017 (CN) .......................... 2017 1 0591551
Sep. 27, 2017 (CN) .......................... 2017 1 0888946
Dec. 8, 2017 (CN) .......................... 2017 1 1298908
Jan. 12, 2018 (CN) .......................... 2018 1 0032366
Feb. 8, 2018 (CN) .......................... 2018 1 0130074
Mar. 13, 2018 (CN) .......................... 2018 1 0205729
Mar. 29, 2018 (CN) .......................... 2018 1 0272726
Mar. 30, 2018 (CN) .......................... 2018 1 0292824
Apr. 12, 2018 (CN) .......................... 2018 1 0326908
Jul. 10, 2018 (CN) .......................... 2018 1 0752429
Aug. 30, 2018 (CN) .......................... 2018 1 1005720
Sep. 10, 2018 (CN) .......................... 2018 1 1053085

(51) Int. Cl.

*F21K 9/278* (2016.01)
*F21V 25/04* (2006.01)
*F21V 3/06* (2018.01)
*F21V 23/00* (2015.01)
*H05B 33/08* (2020.01)
*H05K 1/00* (2006.01)
*F21K 9/272* (2016.01)
*F21K 9/275* (2016.01)
*F21V 23/02* (2006.01)

| | |
|---|---|
| ***F21V 29/70*** | (2015.01) |
| ***F21V 25/02*** | (2006.01) |
| ***F21V 15/015*** | (2006.01) |
| *H05K 1/14* | (2006.01) |
| *F21Y 115/10* | (2016.01) |
| *F21V 29/83* | (2015.01) |
| *F21Y 103/10* | (2016.01) |

(52) U.S. Cl.
CPC .......... *F21V 15/015* (2013.01); *F21V 23/003* (2013.01); *F21V 23/005* (2013.01); *F21V 23/023* (2013.01); *F21V 25/02* (2013.01); *F21V 25/04* (2013.01); *F21V 29/70* (2015.01); *H05B 33/0803* (2013.01); *H05B 33/0815* (2013.01); *H05B 33/0845* (2013.01); *H05B 33/0857* (2013.01); *H05B 33/0884* (2013.01); *H05B 33/0887* (2013.01); *H05K 1/00* (2013.01); *F21V 23/02* (2013.01); *F21V 29/83* (2015.01); *F21Y 2103/10* (2016.08); *F21Y 2115/10* (2016.08); *H05K 1/147* (2013.01); *H05K 2201/10106* (2013.01); *Y02B 20/346* (2013.01)

(56) References Cited

U.S. PATENT DOCUMENTS

| | | | | |
|---|---|---|---|---|
| 9,163,818 | B2 | 10/2015 | Hsia et al. | |
| 9,277,603 | B2 | 3/2016 | Hsia | |
| 9,288,867 | B2 | 3/2016 | Hsia et al. | |
| 9,288,879 | B2 | 3/2016 | Tao et al. | |
| 9,420,663 | B1 | 8/2016 | Hsia et al. | |
| 9,480,109 | B2 | 10/2016 | Ye et al. | |
| 9,480,123 | B2 | 10/2016 | Van Dijk et al. | |
| 9,497,821 | B2 | 11/2016 | Liu | |
| 9,521,718 | B2 | 12/2016 | Xiong et al. | |
| 9,526,145 | B2 | 12/2016 | Xiong et al. | |
| 9,585,221 | B1 | 2/2017 | Chen et al. | |
| 9,587,817 | B2 | 3/2017 | Liu et al. | |
| 9,622,317 | B2 | 4/2017 | Ackermann et al. | |
| 9,689,536 | B2 | 6/2017 | Xiong et al. | |
| 9,723,662 | B2 | 8/2017 | Ye et al. | |
| 9,750,096 | B2 | 8/2017 | Xiong et al. | |
| 9,775,215 | B2 | 9/2017 | Xiong et al. | |
| 9,781,805 | B2 | 10/2017 | Xiong et al. | |
| 9,794,990 | B2 | 10/2017 | Ye et al. | |
| 9,795,001 | B2 | 10/2017 | Ye et al. | |
| 9,801,240 | B2 | 10/2017 | Xiong et al. | |
| 9,807,826 | B2 | 10/2017 | Xiong et al. | |
| 9,820,341 | B2 | 11/2017 | Xiong et al. | |
| 9,826,585 | B2 | 11/2017 | Xiong | |
| 9,826,595 | B2 | 11/2017 | Hsia | |
| 9,841,174 | B2 | 12/2017 | Liu et al. | |
| 9,970,602 | B2 | 5/2018 | Xiong et al. | |
| 10,117,296 | B1 | 10/2018 | Zhao | |
| 10,317,017 | B2 * | 6/2019 | Xiong | F21K 9/272 |
| 10,337,676 | B2 * | 7/2019 | Xiong | F21K 9/272 |
| 2002/0176262 | A1 | 11/2002 | Tripathi et al. | |
| 2003/0102819 | A1 | 6/2003 | Min et al. | |
| 2007/0127242 | A1 | 6/2007 | Allen et al. | |
| 2010/0096976 | A1 | 4/2010 | Park et al. | |
| 2011/0043127 | A1 | 2/2011 | Yamasaki | |
| 2011/0084554 | A1 | 4/2011 | Tian et al. | |
| 2011/0148313 | A1 | 6/2011 | Ramaker | |
| 2011/0228526 | A1 | 9/2011 | Hartikka et al. | |
| 2011/0260614 | A1 | 10/2011 | Hartikka et al. | |
| 2012/0181952 | A1 | 7/2012 | Roeer | |
| 2013/0147350 | A1 | 6/2013 | Yang | |
| 2013/0335959 | A1 | 12/2013 | Hsia et al. | |
| 2014/0035463 | A1 | 2/2014 | Miyamichi | |
| 2014/0055029 | A1 | 2/2014 | Jans | |
| 2014/0239827 | A1 | 8/2014 | Park | |
| 2014/0265900 | A1 | 9/2014 | Sadwick et al. | |
| 2015/0061520 | A1 | 3/2015 | Tao et al. | |
| 2015/0173138 | A1 | 6/2015 | Roberts | |
| 2015/0181661 | A1 | 6/2015 | Hsia et al. | |
| 2015/0223303 | A1 | 8/2015 | Hsia et al. | |
| 2016/0081147 | A1 | 3/2016 | Guang | |
| 2016/0219658 | A1 | 7/2016 | Xiong et al. | |
| 2016/0270163 | A1 | 9/2016 | Hu et al. | |
| 2016/0270165 | A1 | 9/2016 | Xiong et al. | |
| 2017/0067627 | A1 | 3/2017 | Liu et al. | |
| 2017/0079115 | A1 | 3/2017 | Hsia | |
| 2017/0290119 | A1 | 10/2017 | Xiong et al. | |
| 2017/0311397 | A1 | 10/2017 | Hsia | |
| 2018/0259135 | A1 | 9/2018 | Xiong et al. | |

FOREIGN PATENT DOCUMENTS

| | | | |
|---|---|---|---|
| CN | 201827683 | U | 5/2011 |
| CN | 202059618 | U | 11/2011 |
| CN | 104246348 | A | 12/2014 |
| CN | 106015996 | A | 10/2016 |
| CN | 105325058 | B | 3/2017 |
| CN | 106996514 | A | 8/2017 |
| CN | 107079545 | A | 8/2017 |
| CN | 206555763 | U | 10/2017 |
| CN | 207039939 | U | 2/2018 |
| CN | 207124784 | U | 3/2018 |
| CN | 207369353 | U | 5/2018 |
| GB | 2465966 | A | 6/2010 |
| GB | 2543380 | A | 4/2017 |
| GB | 2544211 | A | 5/2017 |
| JP | 2009545115 | A | 12/2009 |
| JP | 2014057501 | A | 3/2014 |
| WO | 2014195350 | A1 | 12/2014 |
| WO | 2015001067 | A1 | 1/2015 |
| WO | 2015014584 | A1 | 2/2015 |
| WO | 2015028639 | A1 | 3/2015 |
| WO | 2015066566 | A1 | 5/2015 |
| WO | 2015104246 | A1 | 7/2015 |
| WO | 2017012514 | A1 | 1/2017 |

* cited by examiner

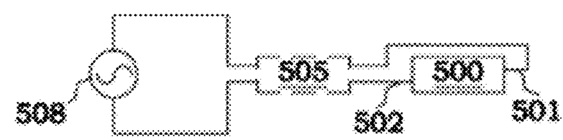
FIG. 4A
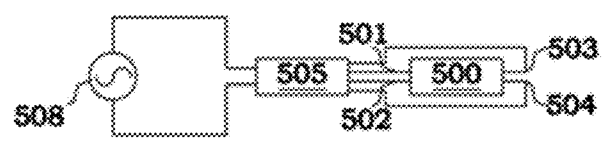
FIG. 4B
508
501
505
500
503
502
504
FIG. 4C
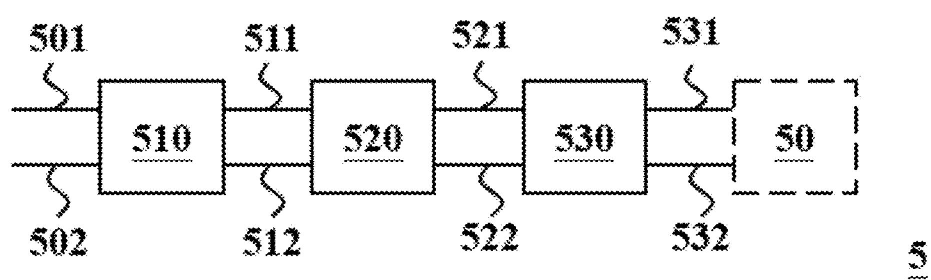
FIG. 5A

LED TUBE LAMP

RELATED APPLICATIONS

This application is a Continuation application of U.S. patent application Ser. No. 16/143,755, filed on Sep. 27, 2018, which is a Continuation-In-Part application of U.S. patent application Ser. No. 16/106,060, filed on Aug. 21, 2018, which is a Continuation application of U.S. patent application Ser. No. 15/662,094, filed on Jul. 27, 2017, which is a Continuation-In-Part application of U.S. patent application Ser. No. 15/626,238, filed on Jun. 19, 2017, which is a Continuation application of U.S. patent application Ser. No. 15/373,388, filed on Dec. 8, 2016, which is a Continuation-In-Part application of U.S. patent application Ser. No. 15/339,221, filed on Oct. 31, 2016, U.S. patent application Ser. No. 15/211,813, filed on Jul. 15, 2016, U.S. patent application Ser. No. 15/084,483, filed on Mar. 30, 2016, and U.S. patent application Ser. No. 15/065,892, filed on Mar. 10, 2016, the disclosure of each of which is incorporated in its entirety by reference herein. U.S. patent application Ser. No. 15/339,221 is also a Continuation-In-Part application of U.S. patent application Ser. No. 15/210,989, filed on Jul. 15, 2016, which is a Continuation-In-Part application of U.S. patent application Ser. No. 15/066,645, filed on Mar. 10, 2016, which is a Continuation-In-Part application of U.S. patent application Ser. No. 14/865,387, filed on Sep. 25, 2015, the disclosure of each of which is incorporated in its entirety by reference herein. U.S. patent application Ser. No. 15/210,989, filed on Jul. 15, 2016 is also a Continuation-In-Part application of U.S. patent application Ser. No. 15/205,011, filed on Jul. 8, 2016, which is a Continuation-In-Part application of U.S. patent application Ser. No. 15/150,458, filed on May 10, 2016, which is a Continuation-In-Part Ser. No. 14/865,387, filed on Sep. 25, 2015, the disclosure of each of which is incorporated in its entirely by reference herein. U.S. patent application Ser. No. 15/211,813 is also a Continuation-In-Part application of U.S. patent application Ser. No. 15/150,458, filed on May 10, 2016, which is a Continuation-In-Part application of U.S. patent application Ser. No. 14/865,387, filed on Sep. 25, 2015. U.S. patent application Ser. No. 15/084,483, filed on Mar. 30, 2016, is also a Continuation-In-Part application of U.S. patent application Ser. No. 14/865,387, filed on Sep. 25, 2015. U.S. patent application Ser. No. 15/065,892, filed on Mar. 10, 2016, is also a Continuation-In-Part application of U.S. patent application Ser. No. 14/865,387, filed on Sep. 25, 2015. U.S. patent application Ser. No. 14/865,387, filed on Sep. 25, 2015 claims priority under 35 U.S.C. 119(e) to Chinese Patent Applications No.: CN 201410507660.9 filed on 2014 Sep. 28; CN 201410508899.8 filed on 2014 Sep. 28; CN 201510104823.3 filed on 2015 Mar. 10; CN 201510134586.5 filed on 2015 Mar. 26; CN 201510133689.x filed on 2015 Mar. 25; CN 201510155807.7 filed on 2015 Apr. 3; CN 201510193980.6 filed on 2015 Apr. 22; CN 201510284720.x filed on 2015 May 29; CN 201510338027.6 filed on 2015 Jun. 17; CN 201510373492.3 filed on 2015 Jun. 26; CN 201510364735.7 filed on 2015 Jun. 26; CN 201510378322.4 filed on 2015 Jun. 29; CN 201510406595.5 filed on 2015 Jul. 10; CN 201510486115.0 filed on 2015 Aug. 8; CN 201510428680.1 filed on 2015 Jul. 20; CN 201510557717.0 filed on 2015 Sep. 6; CN 201510595173.7 filed on 2015 Sep. 18, the disclosures of each of which are incorporated herein in their entirety by reference.

In addition, U.S. patent application Ser. No. 15/066,645, from which U.S. patent application Ser. No. 15/210,989 claims priority as a Continuation-In-Part also claims priority under 35 U.S.C. 119(e) to Chinese Patent Applications Nos.: CN 201510530110.3 filed on 2015 Aug. 26; CN 201510499512.1 filed on 2015 Aug. 14; CN 201510448220.5 filed on 2015 Jul. 27; and CN 201510645134.3 filed on 2015 Oct. 8, the disclosures of each of which are incorporated herein in their entirety by reference.

In addition, U.S. patent application Ser. No. 15/205,011, from which U.S. patent application Ser. No. 15/210,989 claims priority as a Continuation-in-Part also claims priority under 35 U.S.C. 119(e) to Chinese Patent Application Nos.: CN 201610327806.0, filed on May 18, 2016; and CN 201610420790.8, filed on Jun. 14, 2016, the disclosures of each of which are incorporated herein in their entirety by reference.

In addition, U.S. patent application Ser. No. 15/210,989 also claims priority under 35 U.S.C. 119(e) to Chinese Patent Application Nos.: CN 201510848766.X, filed on Nov. 27, 2015; CN 201510903680.2, filed on Dec. 9, 2015; CN 201610132513.7, filed on Mar. 9, 2016; CN 201610142140.1, filed on Mar. 14, 2016; and CN 201610452437.8, filed on Jun. 20, 2016, the disclosures of each of which are incorporated herein in their entirety by reference. In addition, U.S. patent application Ser. No. 15/210,989 also claims priority under 35 U.S.C. 119(e) to Chinese Patent Application Nos.: CN 201510530110.3, filed on Aug. 26, 2015; CN 201510499512.1, filed on Aug. 14, 2015; CN 201510617370.4, filed on Sep. 25, 2015; CN 201510645134.3, filed on Oct. 8, 2015; CN 201510726365.7, filed on Oct. 30, 2015; CN 201610044148.4, filed on Jan. 22, 2016; CN 201610051691.7, filed on Jan. 26, 2016; CN 201610085895.2, filed on Feb. 15, 2016; CN 201610087627.4, filed on Feb. 16, 2016; CN 201610281812.7, filed on Apr. 29, 2016; CN 201510705222.8, filed on Oct. 27, 2015; CN 201610050944.9, filed on Jan. 26, 2016; CN 201610098424.5, filed on Feb. 23, 2016; and CN 201610120993.5, filed on Mar. 3, 2016, the disclosures of each of which are incorporated herein by reference in their entirety.

In addition, U.S. patent application Ser. No. 15/339,221 also claims priority under 35 U.S.C. 119(e) to Chinese Patent Application No.: CN 201610876593.7, filed on Oct. 8, 2016, the entire contents of which are incorporated herein by reference.

In addition, U.S. patent application Ser. No. 15/373,388 claims priority under 35 U.S.C. 119(e) to Chinese Patent Application No.: CN 201610878349.4, filed on Oct. 8, 2016; CN 201610955338.1, filed on Oct. 27, 2016; CN 201610955342.8, filed on Oct. 27, 2016; CN 201610975119.X, filed on Nov. 3, 2016; CN 201611057357.9, filed on Nov. 25, 2016; CN 201610177706.4, filed on Mar. 25, 2016; and CN 201610890527.5, filed on Oct. 12, 2016, the disclosures of each of which are incorporated herein by reference in their entirety.

In addition, U.S. patent application Ser. No. 15/662,094 claims priority under 35 U.S.C. 119(e) to Chinese Patent Application No.: CN 201710036966.4, filed on Jan. 19, 2017; CN 201710170620.3, filed on Mar. 21, 2017; CN 201710158971.2, filed on Mar. 16, 2017; CN 201710258874.0, filed on Apr. 19, 2017; CN 201710295599.X, filed on Apr. 28, 2017; and CN 201710591551.3, filed on Jul. 19, 2017, the disclosures of each of which are incorporated herein by reference in their entirety.

In addition, U.S. patent application Ser. No. 16/143,755 also claims priority under 35 U.S.C. 119(e) to Chinese Patent Application No.: CN 201710888946.X, filed on Sep. 27, 2017; CN 201711298908.5, filed on Dec. 8, 2017; CN 201810032366.5, filed on Jan. 12, 2018; CN 201810130074.5, filed Feb. 8, 2018; CN 201810205729.0, filed Mar. 13, 2018; CN 201810272726.9, filed Mar. 29, 2018; CN 201810292824.9, filed Mar. 30, 2018; CN 201810326908.X, filed Apr. 12, 2018; CN 201810752429.4, filed Jul. 10, 2018; CN 201811005720.1, filed Aug. 30, 2018; and CN 201811053085.4, filed Sep. 10, 2018, the disclosures of each of which are incorporated herein by reference in their entirety.

TECHNICAL FIELD

The disclosed embodiments relate to the features of light emitting diode (LED) lighting. More particularly, the disclosed embodiments describe various improvements for LED tube lamps.

BACKGROUND

LED lighting technology is rapidly developing to replace traditional incandescent and fluorescent lighting. LED tube lamps are mercury-free in comparison with fluorescent tube lamps that need to be filled with inert gas and mercury. Thus, it is not surprising that LED tube lamps are becoming a highly desired illumination option among different available lighting systems used in homes and workplaces, which used to be dominated by traditional lighting options such as compact fluorescent light bulbs (CFLs) and fluorescent tube lamps. Benefits of LED tube lamps include improved durability and longevity and far less energy consumption. Therefore, when taking into account all factors, they would typically be considered as a cost-effective lighting option.

Typical LED tube lamps have a lamp tube, a circuit board disposed inside the lamp tube with light sources being mounted on the circuit board, and end caps accompanying a power supply provided at two ends of the lamp tube with the electricity from the power supply transmitting to the light sources through the circuit board. However, existing LED tube lamps have certain drawbacks. For example, the typical circuit board is rigid and allows the entire lamp tube to maintain a straight tube configuration when the lamp tube is partially ruptured or broken, and this gives the user a false impression that the LED tube lamp remains usable and is likely to cause the user to be electrically shocked upon handling or installation of the LED tube lamp.

Conventional circuit design of LED tube lamps typically doesn't provide suitable solutions for complying with relevant certification standards. For example, since there are usually no electronic components in a fluorescent lamp, it's fairly easy for a fluorescent lamp to be certified under EMI (electromagnetic interference) standards and safety standards for lighting equipment as provided by Underwriters Laboratories (UL). However, there are a considerable number of electronic components in an LED tube lamp, and therefore consideration of the impacts caused by the layout (structure) of the electronic components is important, resulting in difficulties in complying with such standards.

Further, the driving of an LED uses a DC driving signal, but the driving signal for a fluorescent lamp is a low-frequency, low-voltage AC signal as provided by an AC powerline, a high-frequency, high-voltage AC signal provided by a ballast, or even a DC signal provided by a battery for emergency lighting applications. Since the voltages and frequency spectrums of these types of signals differ significantly, simply performing a rectification to produce the required DC driving signal in an LED tube lamp may not achieve the LED tube lamp's compatibility with traditional driving systems of a fluorescent lamp.

Currently, LED tube lamps used to replace traditional fluorescent lighting devices can be primarily categorized into two types. One is for ballast-compatible LED tube lamps, e.g., T-LED lamp, which directly replaces fluorescent tube lamps without changing any circuit on the lighting device; and the other one is for ballast by-pass LED tube lamps, which omit traditional ballast on their circuit and directly connect the commercial electricity to the LED tube lamp. The latter LED tube lamp is suitable for the new surroundings in fixtures with new driving circuits and LED tube lamps. The ballast-compatible LED tube lamp is also known as "Type-A" LED tube lamp, and the ballast by-pass LED tube lamp provided with a lamp driving circuit is also known as a "Type-B" LED tube lamp. In the prior art, when a Type-B LED tube lamp has an architecture with dual-end power supply and one end cap thereof is inserted into a lamp socket but the other is not, since the lamp socket corresponding to the Type-B LED tube lamp is configured to directly receive the commercial electricity without passing through a ballast, an electric shock situation could take place for the user touching the metal or conductive part of the end cap which has not been inserted into the lamp socket. In addition, due to the frequency of the voltage provided from the ballast being much higher than the voltage directly provided from the commercial electricity/AC mains, the skin effect occurs when the leakage current is generated in the Type-B LED tube lamp, and thus the human body would not be harmed by the leakage current.

Therefore, since the Type-B LED tube lamp has higher risk of electric shock/hazard, compared to the Type-A, the Type B-LED tube lamp is requested to have extremely low leakage current for meeting the strict requirements in the safety certification standard (e.g., UL, CE, GS).

Due to the above technical issues, even many well-known international luminaries and LED lamps manufacturers also strand at the bottleneck on development of the ballast by-pass/Type-B LED tuba lamps having dual-end power supply structure. Taking GE lighting corporation for the example, according to the marketing material titled "Considering LED tubes" published on Jul. 8, 2014, and the marketing material titled "Dollars&Sense: Type-B LED Tubes" published on Oct. 21, 2016, GE lighting corporation asserts, over and over again, that the drawback of the risk of electric shock that occurs in the Type-B LED tube lamp cannot be overcome, and thus GE lighting corporation would not perform further product commercialization and sales consideration.

In the prior art, a solution of disposing a mechanical structure on the end cap for preventing electric shock is proposed. In this electric shock protection design, the connection between the external power and the internal circuit of the tube lamp can be cut off or established by the mechanical component's interaction/shifting when a user installs the tube lamp, so as to achieve the electric shock protection.

SUMMARY

It's specially noted that the present disclosure may actually include one or more inventions claimed currently or not yet claimed, and for avoiding confusion due to unnecessarily distinguishing between those possible inventions at the stage of preparing the specification, the possible plurality of inventions herein may be collectively referred to as "the (present) invention" herein.

Various embodiments are summarized in this section, and may be described with respect to the "present invention," which terminology is used to describe certain presently disclosed embodiments, whether claimed or not, and is not necessarily an exhaustive description of all possible embodiments, but rather is merely a summary of certain embodiments. Certain of the embodiments described below as various aspects of the "present invention" can be combined in different manners to form an LED tube lamp or a portion thereof.

The present disclosure provides a novel LED tube lamp, and aspects thereof.

According to some embodiments, a ballast-bypass light-emitting diode (LED) tube lamp includes at least a first and second external connection terminal, the first and second external connection terminals respectively connected to opposite sides of the ballast by-pass LED tube lamp. The tube lamp includes an LED module, configured to emit light in response to a driving current, and a power supply module, electrically connected to the first and second external connection terminals for receiving an AC driving signal and configured to provide the driving current to the LED module. The power supply module comprises a rectifying circuit, a filtering circuit, a driving circuit, and a circuit electrically connected to the driving circuit and configured to operate in response to whether a foreign external impedance is connected to the LED tube lamp. When part of the LED tube lamp is electrically connected to an external power source and the foreign external impedance is electrically connected to the LED tube lamp, the first circuit disables the driving circuit so as to limit the generation of the driving current to prevent the LED module from emitting light based on the driving current. When both ends of the LED tube lamp are electrically connected to an external power source and the foreign external impedance is not electrically connected to the LED tube lamp, the first circuit enables the driving circuit so as to not limit the generation of the driving current in order to allow the LED module to emitting light based on the driving current

BRIEF DESCRIPTION OF THE FIGURES

FIG. 4A is a block diagram of an exemplary power supply system for an LED tube lamp according to some exemplary embodiments;

FIG. 4B is a block diagram of an exemplary power supply system for an LED tube lamp according to some exemplary embodiments;

FIG. 4C is a block diagram of an exemplary power supply system for an LED tube lamp according to some exemplary embodiments;

FIG. 5A-5C are block diagrams of exemplary power supply modules in an LED tube lamp according to some exemplary embodiments;

DETAILED DESCRIPTION

Figure 1A:
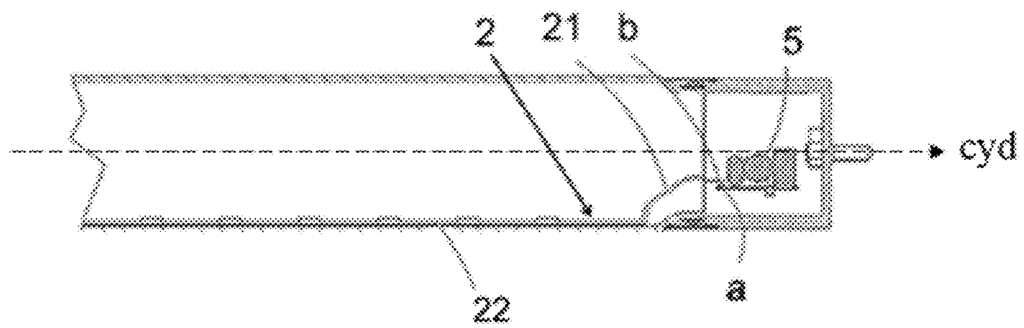
FIGS. 1A-1C are plane cross-sectional views schematically illustrating an LED tube lamp including an LED light strip that is a bendable circuit sheet with ends thereof passing across the transition region of the lamp tube of the LED tube lamp to be connected to a power supply according to some exemplary embodiments.

The present disclosure provides a novel LED tube lamp. The present disclosure will now be described in the following embodiments with reference to the drawings. The following descriptions of various embodiments of this invention are presented herein for purpose of illustration and giving examples only. It is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of components may be exaggerated for clarity. Like numbers refer to like elements throughout.

The terminology used herein is for the purpose of describing particular embodiments only and is not intended to be limiting of the invention. As used herein, the singular forms “a”, “an” and “the” are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers, or steps, these elements, components, regions, layers, and/or steps should not be limited by these terms. Unless the context indicates otherwise, these terms are only used to distinguish one element, component, region, layer, or step from another element, component, region, or step, for example as a naming convention. Thus, a first element, component, region, layer, or step discussed below in one section of the specification could be termed a second element, component, region, layer, or step in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct connection (i.e., touching) unless the context indicates otherwise.

Embodiments described herein will be described referring to plane views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Terms such as "transistor", used herein may include, for example, a field-effect transistor (FET) of any appropriate type such as N-type metal-oxide-semiconductor field-effect transistor (MOSFET), P-type MOSFET, GaN FET, SiC FET, bipolar junction transistor (BJT), Darlington BJT, heterojunction bipolar transistor (HBT), etc.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component. Moreover, items that are "directly electrically connected," to each other are electrically connected through one or more passive elements, such as, for example, wires, pads, internal electrical lines, etc. As such, directly electrically connected components do not include components electrically connected through active elements, such as transistors or diodes, or through capacitors. Directly electrically connected elements may be directly physically connected and directly electrically connected.

Components described as thermally connected or in thermal communication are arranged such that heat will follow a path between the components to allow the heat to transfer from the first component to the second component. Simply because two components are part of the same device or board does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which materials significantly prevent heat transfer between the two components, or only allow for incidental heat transfer, are not described as thermally connected or in thermal communication with each other. The terms "heat-conductive" or "thermally-conductive" do not apply to any material that provides incidental heat conduction, but are intended to refer to materials that are typically known as good heat conductors or known to have utility for transferring heat, or components having similar heat conducting properties as those materials.

Embodiments may be described, and illustrated in the drawings, in terms of functional blocks, units and/or modules. Those skilled in the art will appreciate that these blocks, units and/or modules are physically implemented by electronic (or optical) circuits such as logic circuits, discrete components, analog circuits, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules. Further, the blocks, units and/or modules of the various embodiments may be physically combined into more complex blocks, units and/or modules.

If any terms in this application conflict with terms used in any application(s) from which this application claims priority, or terms incorporated by reference into this application or the application(s) from which this application claims priority, a construction based on the terms as used or defined in this application should be applied.

It should be noted that, the following description of various embodiments of the present disclosure is described herein in order to clearly illustrate the inventive features of the present disclosure. However, it is not intended that various embodiments can only be implemented alone. Rather, it is contemplated that various of the different embodiments can be and are intended to be used together in a final product, and can be combined in various ways to achieve various final products. Thus, people having ordinary skill in the art may combine the possible embodiments together or replace the components/modules between the different embodiments according to design requirements. The embodiments taught herein are not limited to the form described in the following examples, any possible replacement and arrangement between the various embodiments are included.

Applicant's prior U.S. patent application Ser. No. 14/724,840 (US PGPUb No. 2016/0091156, the disclosure of which is incorporated herein in its entirety by reference), as an illustrated example, has addressed certain issues associated with the occurrence of electric shock in using a conventional LED lamp by providing a bendable circuit sheet. Some of the embodiments disclosed in U.S. patent application Ser. No. 14/724,840 can be combined with one or more of the exemplary embodiments disclosed herein to further reduce the occurrence of electric shock in using an LED lamp.

FIG. 1A is a plane cross-sectional view schematically illustrating an LED tube lamp including an LED light strip and a power supply module according to some exemplary embodiments. Referring to FIG. 1A, an LED tube lamp may include an LED light strip 2 and a power supply 5, in which the power supply 5 can be a modularized element, which means the power supply 5 can be integrated into a single power supply circuit or can be integrated into several separated power supply circuits. For example, in an embodiment, the power supply 5 can be a single unit (i.e., all components of the power supply 5 are disposed on a single body/carrier) disposed in one of the end caps at one end of the lamp tube. In another embodiment, the power supply 5 can be two separate units (i.e., the components of the power supply 5 are divided into two parts) disposed in different end caps at respective ends of the lamp tube.

In the embodiment of FIG. 1A, the power supply 5 is illustrated as being integrated into one module for example (hereinafter referred to as a power supply module 5) and is disposed in the end cap parallel to the axial direction cyd of the lamp tube. More specifically, the axial direction cyd of the lamp tube, which refers to the direction pointed to by the axis of the lamp tube, is perpendicular to the end wall of the end caps. Disposing the power supply module 5 parallel to the axial direction cyd means the circuit board, with the electronic components of the power supply module, is parallel to the axial direction cyd. Therefore, the normal direction of the circuit board is perpendicular to the axial direction cyd. In certain embodiments, the power supply module 5 can be arranged in a position where the axial direction cyd passes, in a position above the axial plane/axial direction cyd, or in a position below the axial plane/axial direction cyd (relative to the figure). The invention is not limited thereto.

Figure 1B:
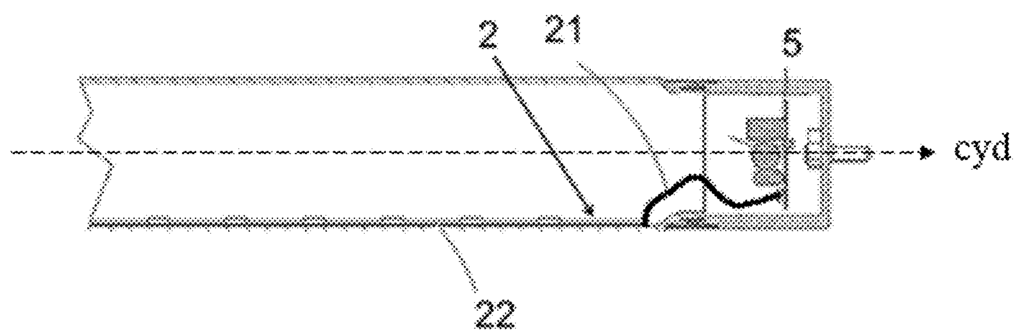

FIG. 1B is another plane cross-sectional view schematically illustrating an LED tube lamp including an LED light strip and a power supply module according to some exemplary embodiments. Referring to FIG. 1B, the difference between the embodiments of FIGS. 1A and 1B is that the power supply module 5 illustrated in FIG. 1B is disposed in the end cap perpendicular to the axial direction cyd of the lamp tube. For example, the power supply module 5 is disposed parallel to the end wall of the end caps. Although the FIG. 1B shows that the electronic components are disposed on the side facing the interior of the lamp tube, the invention is not limited thereto. In certain embodiments, the electronic component can be disposed on the side facing the end wall of the corresponding end cap. Under these configurations, since at least one opening can be formed in the end wall of the end caps, the heat dissipation effect of the electronic components can be improved through the opening.

Figure 1C:
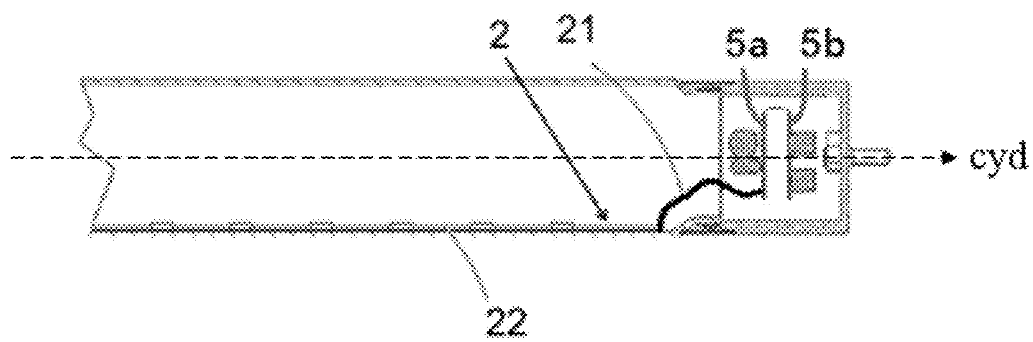

In addition, due to the power supply module 5 being vertically disposed in the end caps, the space within the end caps can be increased so that the power supply module 5 can be further divided into a plurality of separated circuit boards as shown in FIG. 1C. FIG. 1C is still another plane cross-sectional view schematically illustrating an LED tube lamp including an LED light strip and a power supply module according to some exemplary embodiments. The difference between the embodiments of FIGS. 1B and 1C is that the power supply 5 is formed by two power supply modules 5*a* and 5*b*. The power supply modules 5*a* and 5*b* are disposed in the end cap perpendicular to the axial direction cyd and are arranged, toward to the end wall of the end cap, along the axial direction cyd. Specifically, power supply modules 5*a* and 5*b* are respectively provided with each having an independent circuit board. The circuit boards are connected to each other through one or more electrical connection means, so that the overall power supply circuit topology is similar to the embodiment illustrated in FIG. 1A or FIG. 1B. According to the configuration of FIG. 1C, the space within the end caps can be more effectively utilized, such that the circuit layout space can be increased. In some certain embodiments, the electronic components generating more heat (e.g., the capacitor and the inductor) can be disposed on the power supply module 5*b*, which is close to the end wall, so as to enhance the heat dissipation effect of the electronic components through the opening on the end cap.

In certain embodiments, the circuit boards of the power supply modules 5*a* and 5*b* can be designed as a disk shape structure (not shown). The disk-shaped circuit boards are disposed in the same end cap along the same axis. For example, the maximum outer diameter of the circuit boards may be slightly smaller than the inner diameter of the end cap and the normal direction of the disk plane is substantially parallel to the radial direction of the end cap, so that the disk-shaped circuit boards can be disposed into the space of the end cap. In certain embodiments, at least a DC-to-DC converter circuit and a conversion control IC (i.e., lighting control circuit) are disposed on the disk-shaped circuit board of the power supply module 5*a*, and at least a fuse, a EMI module, a rectifying circuit and an installation detection module are disposed on the disk-shaped circuit board of the power supply module 5*b*. The disk-shaped circuit board of the power supply module 5*b* is disposed close to the side wall of the end cap (in relation to the power supply module 5*a* and other components of the LED tube lamp) and electrically connected to the conduction pins on the end cap. The disk-shaped circuit boards of the power supply modules 5*a* and 5*b* are electrically connected to each other. The disk-shaped circuit board of the power supply module 5*a* is electrically connected to the LED light strip 2.

In certain embodiments, in order to vertically dispose the power supply modules 5*a* and 5*b* in the cylindrical end caps and maximize the layout area, the circuit boards of the power supply modules 5*a* and 5*b* can adopt an octagon structure. But other shapes can be used.

For the connection means between the power supply modules 5*a* and 5*b*, the separate power supply modules 5*a* and 5*b* can be connected to each other, for example, through a male plug and a female plug or through bonding a lead. If the lead is utilized to connect the power supply modules 5*a* and 5*b*, the outer layer of the lead can be wrapped with an insulating sleeve to serve as electrical insulation protection. In addition, the power supply modules 5*a* and 5*b* can also be connected through rivets or solder paste, or bound together by wires.

Referring to FIGS. 1A to 1C, an LED tube lamp may include an LED light strip 2. In certain embodiments, the LED light strip 2 may be formed from a bendable circuit sheet, for example that may be flexible. As described further below, the bendable circuit sheet is also described as a bendable circuit board. The LED light strip 2, and for example the bendable circuit sheet, may also be a flexible strip, such as a flexible or non-rigid tape or a ribbon. The bendable circuit sheet may have ends thereof passing across a transition region of the lamp tube of the LED tube lamp to be connected to a power supply 5. In some embodiments, the ends of the bendable circuit sheet may be connected to a power supply in an end cap of the LED tube lamp. For example, the ends may be connected in a manner such that a portion of the bendable circuit sheet is bent away from the lamp tube and passes through the transition region where a lamp tube narrows, and such that the bendable circuit sheet vertically overlaps part of a power supply within an end cap of the LED tube lamp.

A power supply as described herein may include a circuit that converts or generates power based on a received voltage, in order to supply power to operate an LED module of the LED tube lamp. A power supply, as described in connection with power supply 5, may be otherwise referred to as a power conversion module or circuit or a power supply module. A power conversion module or circuit, or power supply module, may supply or provide power from external signal(s), such as from an AC power line or from a ballast, to an LED module. For example, a power supply 5 may refer to a circuit that converts ac line voltage to dc voltage and supplies power to the LED or LED module. The power supply 5 may include one or more power components mounted thereon for converting and/or generating power.

Figure 2:
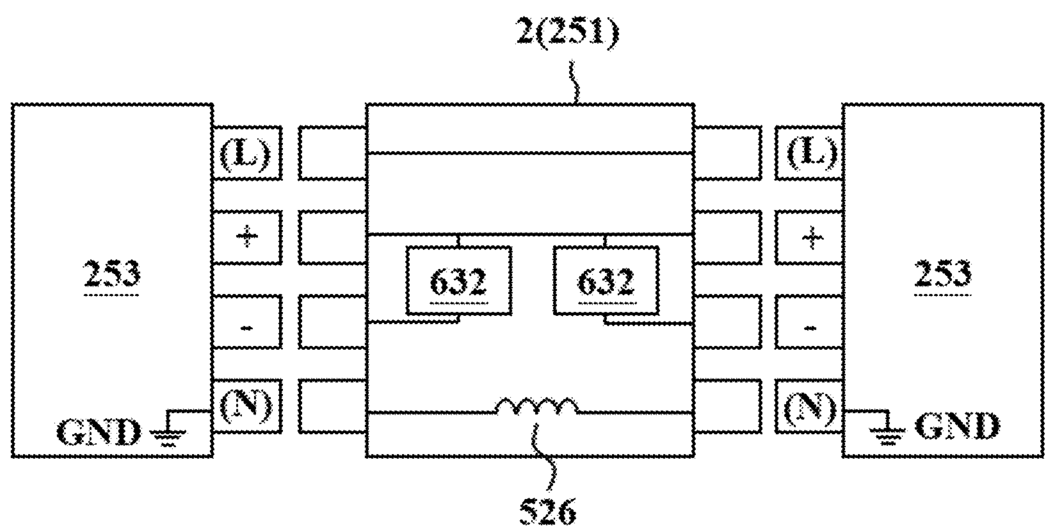
FIG. 2 is a block diagram illustrating leads that are disposed between two end caps of an LED tube lamp according to some exemplary embodiments.

FIG. 2 is a block diagram illustrating leads that are disposed between two end caps of an LED tube lamp according to some exemplary embodiments.

Referring to FIG. 2, in some embodiments, the LED tube lamp includes a lamp tube (not shown in FIG. 2), end caps (not shown in FIG. 2), a light strip 2, short circuit boards 253 (also referred to as right end short circuit board 253 and left end short circuit board 253) respectively provided at two ends of the lamp tube, and an inductive element 526. Each of the lamp tube's two ends may have at least one conductive pin or external connection terminal for receiving the external driving signal. The end caps are disposed respectively at the two ends of the lamp tube, and (at least partial electronic components of) the short circuit boards 253 shown as located respectively at the left and right ends of the lamp tube in FIG. 2 may be disposed respectively in the end caps. The short circuit boards may be, for example, a rigid circuit board such as depicted in and described in connection with FIG. 1 and the various other rigid circuit boards described herein. For example, these circuit boards may include mounted thereon one or more power supply components for generating and/or converting power to be used to light the LED light sources on the light strip 2. The light strip 2 is disposed in the lamp tube and includes an LED module, which includes an LED unit 632.

For an LED tube lamp, such as an 8 ft. 42 W LED tube lamp, to receive a dual-end power supply between two ends of the LED tube lamp, two (partial) power supply circuits (each having a power rating of e.g. 21 W, 17.5 W, or 12.5 W) are typically disposed respectively in the two end caps of the lamp tube, and a lead (typically referred to as lead Line, Neutral and Ground) disposed between two end caps of the lamp tube (e.g., between two conductive pins or external connection terminals at respective end caps of the lamp tube), connected to the power supply circuits disposed on the opposite sides of the light strip and as an input signal line may be needed. The lead Line (also known as the "live wire") and/or the lead Neutral (also known as the "neutral wire") may be disposed along the light strip that may include, e.g., a bendable circuit sheet or flexible circuit board, for receiving and transmitting an external driving signal from the power supply. This lead Line is distinct from two leads typically referred to as LED+ and LED− that are respectively connected to a positive electrode and a negative electrode of an LED unit in the lamp tube. This lead Line is also distinct from a lead Ground (also known as the "earth wire") which is disposed between respective ground terminals of the LED tube lamp. Because the lead Line is typically disposed along the light strip, and because parasitic capacitance(s) (e.g., about 200 pF) may be caused between the lead Line and the lead LED+ due to their close proximity to each other, some high frequency signals (not the intended frequency range of signal for supplying power to the LED module) passing through the lead LED+ will be reflected to the lead Line through the parasitic capacitance(s) and then can be detected there as undesirable EMI effects. The unfavorable EMI effects may lower or degrade the quality of power transmission in the LED tube lamp.

Again referring to FIG. 2, in some embodiments, the right and left short circuit boards 253 are electrically connected to the light strip 2. In some embodiments, the electrical connection (such as through soldering or bond pad(s)) between the short circuit boards 253 and the light strip 2 may comprise a first terminal (denoted by "L"), a second terminal (denoted by "+" or "LED+"), a third terminal (denoted by "−" or "LED−"), and a fourth terminal (denoted by "GND" or "ground"). The light strip 2 includes the first through fourth terminals at a first end of the light strip 2 adjacent to the right end short circuit board 253 near one end cap of the lamp tube and includes the first through fourth terminals at a second end, opposite to the first end, of the light strip 2 adjacent to the left end short circuit board 253 near the other end cap of the lamp tube. The right end short circuit board 253 also includes the first through fourth terminals to respectively connect to the first through fourth terminals of the light strip 2 at the first end of the light strip 2. The left end short circuit board 253 also includes the first through fourth terminals to respectively connect to the first through fourth terminals of the light strip 2 at the second end of the light strip 2. For example, the first terminal L is utilized to connect a lead (typically referred to as Line or Neutral) for connecting both of the at least one pin of each of the two ends of the lamp tube; the second terminal LED+ is utilized to connect each of the short circuit boards 253 to the positive electrode of the LED unit 632 of the LED module included in the light strip 2. The third terminal LED− is utilized to connect each of the short circuit boards 253 to the negative electrode of the LED unit 632 of the LED module included in the light strip 2. The fourth terminal GND is utilized to connect to a reference potential. Preferably and typically, the reference potential is defined as the electrical potential of ground. Therefore, the fourth terminal is utilized for a grounding purpose of the power supply module of the LED tube lamp.

To address the undesirable EMI effects mentioned above caused by parasitic capacitance(s) between the lead Line and the lead LED+, inductive element 526 disposed in the lead Ground serves to reduce or prevent the EMI effects by blocking the forming of a complete circuit between the lead LED+ and the Ground lead for the high frequency signals mentioned above to pass through, since at these high frequencies inductive element 526 behaves like an open circuit. When the complete circuit is prevented or blocked by inductive element 526, the high frequency signals will be prevented on the lead LED+ and therefore will not be reflected to the lead Line, thus preventing the undesirable EMI effects. In some embodiments, the inductive element 526 is connected between two of the fourth terminals respectively of the right end and left end short circuit boards 253 at the two ends of the lamp tube. In some embodiments, the inductive element 526 may comprise an inductor such as a choke inductor or a dual-inline-package inductor capable of achieving a function of eliminating or reducing the above-mentioned EMI effects of the lead ("Line") disposed along the light strip 2 between two of the first terminals ("L") respectively at two ends of the lamp tube. Therefore, this function can improve signal transmission (which may include transmissions through leads "L", "LED+", and "LED-") of the power supply in the LED tube lamp, and thus the qualities of the LED tube lamp. Therefore, the LED tube lamp comprising the inductive element 526 may effectively reduce EMI effects of the lead "L" or "Line". Moreover, such an LED tube lamp or an LED lighting fixture may further comprise an installation detection circuit or module, which is described below with reference to FIGS. 13A and 13B, for detecting whether or not the LED tube lamp is properly installed in a lamp socket or whether an external impedance is electrically connected to the LED tube lamp.

Figure 3A:
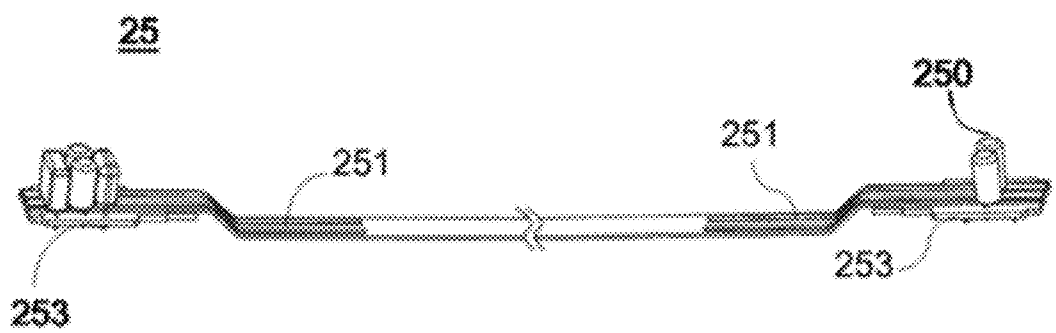
FIG. 3A is a perspective view schematically illustrating a circuit board assembly composed of a bendable circuit sheet of an LED light strip and a printed circuit board of a power supply according to some exemplary embodiments.
Figure 3B:
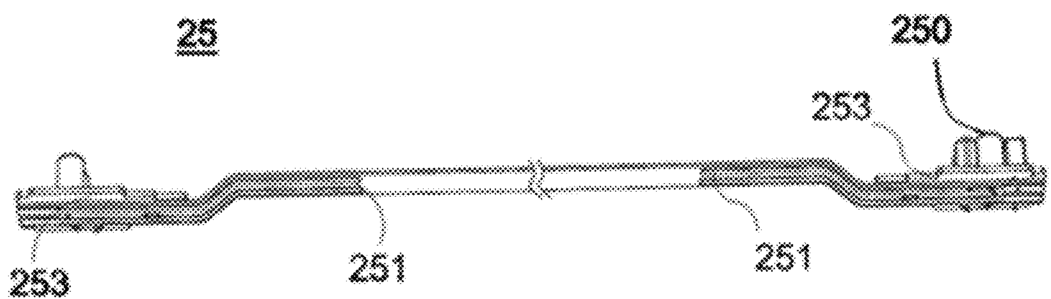
FIG. 3B is a perspective view schematically illustrating another arrangement of a circuit board assembly, according to some exemplary embodiments.

Referring to FIGS. 3A and 3B, in another embodiment, the LED light strip and the power supply may be connected by utilizing a circuit board assembly 25 configured with a power supply module 250 instead of solder bonding as described previously. The circuit board assembly 25 has a long circuit sheet 251 and a short circuit board 253 that are adhered to each other with the short circuit board 253 being adjacent to the side edge of the long circuit sheet 251. The short circuit board 253 may be provided with the power supply module 250 to form the power supply. The short circuit board 253 is stiffer or more rigid than the long circuit sheet 251 to be able to support the power supply module 250.

The long circuit sheet 251 may be the bendable circuit sheet of the LED light strip 2 including a wiring layer. The wiring layer 2*a* of the LED light strip 2 and the power supply module 250 may be electrically connected in various manners depending on the demand in practice. As shown in FIG. 3A, the power supply module 250 and the long circuit sheet 251 having the wiring layer 2*a* on surface are on the same side of the short circuit board 253 such that the power supply module 250 is directly connected to the long circuit sheet 251. As shown in FIG. 3B, alternatively, the power supply module 250 and the long circuit sheet 251 including the wiring layer 2*a* on surface are on opposite sides of the short circuit board 253 such that the power supply module 250 is directly connected to the short circuit board 253 and indirectly connected to the wiring layer 2*a* of the LED light strip 2 by way of the short circuit board 253.

The power supply module 250 and power supply 5 described above may include various elements for providing power to the LED light strip 2. For example, they may include power converters or other circuit elements and/or components for providing power to the LED light strip 2. Also, it should be noted that the power supply 5 depicted and discussed in FIG. 1 may also include a power supply module 250, though one is not labeled in FIG. 1. For example, the power supply module may be mounted on the circuit board, as shown in FIG. 1, and may include power converters or other circuit elements and/or components for providing power to the LED light strip 2.

FIG. 4A is a block diagram of a system including an LED tube lamp including a power supply module according to certain embodiments. Referring to FIG. 4A, an alternating current (AC) power supply 508 is used to supply an AC supply signal, and may be an AC powerline with a voltage rating, for example, in 100-277V and a frequency rating, for example, of 50 Hz or 60 Hz. A lamp driving circuit 505 receives the AC supply signal from the AC power supply 508 and then converts it into an AC driving signal. The power supply module and power supply 508 described above may include various elements for providing power to the LED light strip 2. For example, they may include power converters or other circuit elements for providing power to the LED light strip 2. In some embodiments, the power supply 508 and the lamp driving circuit 505 are outside of the LED tube lamp. For example, the lamp driving circuit 505 may be part of a lamp socket or lamp holder into which the LED tube lamp is inserted. The lamp driving circuit 505 could be an electronic ballast and may be used to convert the signal of commercial electricity into high-frequency and high-voltage AC driving signal. The common types of electronic ballast, such as instant-start electronic ballast, program-start electronic ballast, and rapid-start electronic ballast, can be applied to the LED tube lamp. In some embodiments, the voltage of the AC driving signal is bigger than 300V and in some embodiments 400-700V with frequency being higher than 10 kHz and in some embodiments 20-50 kHz. An LED tube lamp 500 receives the AC driving signal from the lamp driving circuit 505 and is thus driven to emit light. In the present embodiment, the LED tube lamp 500 is in a driving environment in which it is power-supplied at its one end cap having two conductive pins 501 and 502 (which can be referred to the external connection terminals), which are used to receive the AC driving signal. The two pins 501 and 502 may be electrically coupled to, either directly or indirectly, the lamp driving circuit 505.

In some embodiments, the lamp driving circuit 505 may be omitted and is therefore depicted by a dotted line. In certain embodiments, if the lamp driving circuit 505 is omitted, the AC power supply 508 is directly coupled to the pins 501 and 502, which then receive the AC supply signal as the AC driving signal.

In an alternative to the application of the single-end power supply mentioned above, the LED tube lamp may be power-supplied at its both end caps respectively having two conductive pins, which are coupled to the lamp driving circuit to concurrently receive the AC driving signal. Under the structure where the LED tube lamp having two end caps and each end cap has two conductive pins, the LED tube lamp can be designed for receiving the AC driving signal by one pin in each end cap, or by two pins in each end cap.

An example of a circuit configuration of the power supply module receiving the AC driving signal by one pin in each end cap can be seen in FIG. 4B (referred to as a "dual-end-single-pin configuration" hereinafter), which illustrates a block diagram of an exemplary power supply module for an LED tube lamp according to some exemplary embodiments. Referring to FIG. 4B, each end cap of the LED tube lamp 500 could have only one conductive pin for receiving the AC driving signal. For example, it is not required to have two conductive pins used in each end cap for the purpose of passing electricity through the both ends of the LED tube lamp. Compared to FIG. 4A, the conductive pins 501 and 502 in FIG. 4B are correspondingly configured at both end caps of the LED tube lamp 500, and the AC power supply 508 and the lamp driving circuit 505 are the same as those mentioned above.

The circuit configuration of the power supply module receiving the AC driving signal by two pins in each end cap can be referred to FIG. 4C (referred to "dual-end-dual-pin configuration" hereinafter), which illustrates a block diagram of an exemplary power supply module for an LED tube lamp according to some exemplary embodiments. Compared to FIG. 4A and FIG. 4B, the present embodiment further includes pins 503 and 504. One end cap of the lamp tube has the pins 501 and 502, and the other end cap of the lamp tube has the pins 503 and 504. The pins 501 to 504 are connected to the lamp driving circuit 505 to collectively receive the AC driving signal, and thus the LED light sources (not shown) in the LED tube lamp 500 are driven to emit light.

Under the dual-end-dual-pin configuration, no matter whether the AC driving signal is provided to two pins on one of the end caps, one pin on each end cap, or two pins on each end cap, the AC driving signal can be used for the operating power of the LED tube lamp by rearranging the circuit configuration of the power supply module. When the AC driving signal is provided to one pin on each end cap (i.e., different polarities of the AC driving signal are respectively provided to the two end caps), in an exemplary embodiment, another one pin on each end cap is set to a floating state. For example, the pins 502 and 503 can be set to the floating state, so that the tube lamp receives the AC driving signal via the pins 501 and 504. The power supply module performs rectification and filtering to the AC driving signal received from the pins 501 and 504. In another exemplary embodiment, both pins on the same end cap are connected to each other, for example, the pin 501 is connected to the pin 502 on the left end cap, and the pin 503 is connected to the pin 504 on the right end cap. Therefore, the pins 501 and 502 can be used for receiving the positive or negative AC driving signal, and the pins 503 and 504 can be used for receiving the AC driving signal having opposite polarity with the signal received by the pins 501 and 502. Thus, the power supply module within the tube lamp may perform the rectification and filtering to the received signal. When the AC driving signal is provided to two pins on each end cap, the pins on the same side may receive the AC driving signal having different polarity. For example, the pins 501 and 502 may receive the AC driving signal having opposite polarity, the pins 503 and 504 may receive the AC driving signal having opposite polarity, and the power supply module within the tube lamp may perform the rectification and filtering to the received signal.

FIG. 5A is a block diagram of an exemplary power supply module in an LED lamp according to some embodiments. Referring to FIG. 5A, the power supply module 5 is coupled to an LED module 50 in the LED tube lamp 500 and includes a rectifying circuit 510 (also referred to as first rectifying circuit 510), a filtering circuit 520, and a driving circuit 530. The rectifying circuit 510 is coupled to a first pin 501 and a second pin 502 at one end, for receiving and then rectifying an external driving signal in order to output or produce a rectified signal at a first rectifying output terminal 511 and a second rectifying output terminal 512. The external driving signal in this embodiment may be an AC power signal provided by an AC power supply 508 under any of the power-supply configurations of FIGS. 4A-4C, or even be a DC signal compatible with or suitable for normal operations of the LED tube lamp 500. The filtering circuit 520 is coupled to the rectifying circuit 510 for performing filtering of the rectified signal. Specifically, the filtering circuit 520 is coupled to the first rectifying output terminal 511 and second rectifying output terminal 512 in order to receive and then filter the rectified signal, and then outputs or produces a filtered signal at a first filtering output terminal 521 and a second filtering output terminal 522. The driving circuit 530 is coupled to the LED module 50 and the filtering circuit 520, in order to receive the filtered signal and then produce a driving signal for driving the LED module 50 to emit light. The driving circuit 530 includes e.g. a DC-to-DC converter circuit for converting the received filtered signal into the driving signal, which is output at a first driving output terminal 531 and a second driving output terminal 532. In FIG. 5A, the driving circuit 530 is coupled to the first filtering output terminal 521 and second filtering output terminal 522 in order to receive the filtered signal and then drive LEDs (not illustrated) in the LED tube lamp 500 to emit light. The operation(s) of embodiments of the driving circuit 530 is further described in more detail below. The LED module 50 is coupled to the first driving output terminal 531 and second driving output terminal 532 in order to receive the driving signal to emit light, for which the electrical current flowing on or through the LED module 50 is preferably stable at a set or defined current value. In some embodiments, an LED module being driven to emit light can refer to lumens of the LED module reaching at least fifty percent of the lumen output indicated by the manufacturer, also described as nominal lumens (e.g., at least fifty percent of the lumens expected to be output under full power operating conditions). Details of these operations are described below according to some certain embodiments.

Figure 5B:
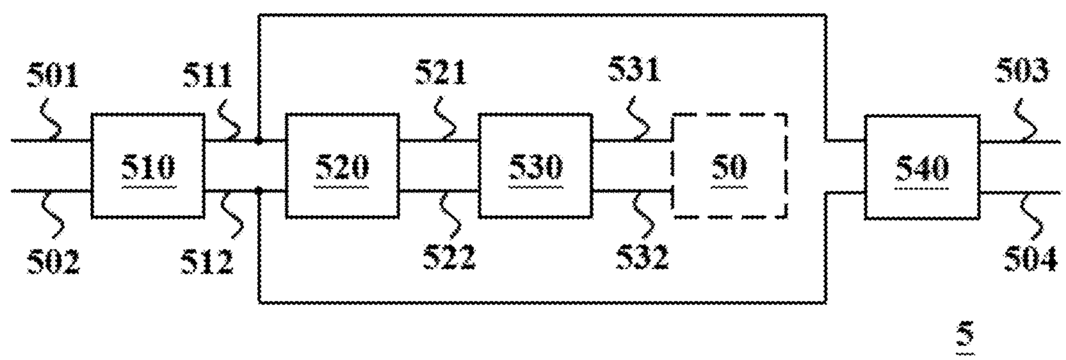

FIG. 5B is a block diagram of an exemplary power supply module in an LED lamp according to some exemplary embodiments. Referring to FIG. 5B, the power supply module 5 is coupled to an LED module 50 in the LED tube lamp and includes a first rectifying circuit 510, a filtering circuit 520, a driving circuit 530, and another rectifying circuit 540 (also referred to as second rectifying circuit 540). The power supply module 5 of FIG. 5B can be utilized in the single-end power supply configuration illustrated in FIG. 4A or the dual-end power supply configuration illustrated in FIGS. 4B and 4C. The first rectifying circuit 510 is coupled to the pins 501 and 502 to receive and then rectify an external driving signal transmitted by the pins 501 and 502; the second rectifying circuit 540 is coupled to the pins 503 and 504 to receive and then rectify an external driving signal transmitted by pins 503 and 504. The first rectifying circuit 510 and the second rectifying circuit 540 of the power supply module collectively output a rectified signal at two rectifying circuit output terminals 511 and 512. The filtering circuit 520 is coupled to the rectifying circuit output terminals 511 and 512 to receive and then filter the rectified signal, so as to output a filtered signal at two filtering output terminals 521 and 522. The driving circuit 530 is coupled to the first filtering output terminal 521 and second filtering output terminal 522 in order to receive the filtered signal and then drive LEDs (not illustrated) in the LED tube lamp 500 to emit light.

Figure 5C:
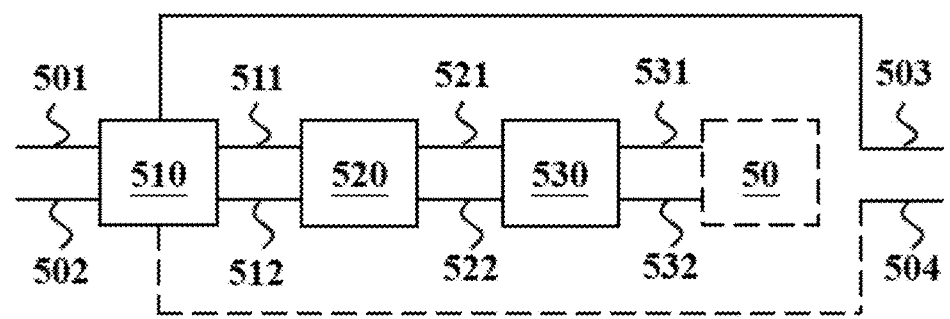

FIG. 5C is a block diagram of an exemplary LED lamp according to some exemplary embodiments. Referring to FIG. 4F, the power supply module of LED tube lamp includes a rectifying circuit 510, a filtering circuit 520 and a driving circuit 530, which can also be utilized in the single-end power supply configuration illustrated in FIG. 4A or the dual-end power supply configuration illustrated in FIGS. 4B and 4C. The difference between the embodiments illustrated in FIG. 5C and FIG. 5B is that the rectifying circuit 510 has three input terminals to be coupled to the pins 501 to 503, respectively. The rectifying circuit 510 rectifies the signals received from the pins 501 to 503, in which the pin 504 can be set to the floating state or connected to the pin 503. Therefore, the second rectifying circuit 540 can be omitted in the present embodiment. The rest of circuitry operates substantially the same as the embodiment illustrated in FIG. 5B, so that the detailed description is not repeated herein.

Although there are two rectifying output terminals 511 and 512 and two filtering output terminals 521 and 522 in the embodiments of these FIGS., in practice the number of ports or terminals for coupling between the rectifying circuit 510, the filtering circuit 520, the driving circuit 530 and the LED module 50 may be one or more depending on the needs of signal transmission between the circuits or devices.

In addition, the power supply module of the LED lamp described in FIG. 5A, and embodiments of a power supply module of an LED lamp described below, may each be used in the LED tube lamp 500 in FIGS. 4A and 4B, and may instead be used in any other type of LED lighting structure having two conductive pins used to conduct power, such as LED light bulbs, personal area lights (PAL), plug-in LED lamps with different types of bases (such as types of PL-S, PL-D, PL-T, PL-L, etc.), etc. Further, the implementation for LED light bulbs may provide better effects on protecting from electric shock as combining this invention and the structures disclosed in PCT patent application WO2016045631.

When the LED tube lamp 500 is applied to the dual-end power structure with at least one pin, retrofit can be performed to a lamp socket including a lamp driving circuit 505, so as to bypass the lamp driving circuit 505 and provide the AC power supply (e.g., commercial electricity) or the DC power supply as the power source of the LED tube lamp.

Figure 6A:
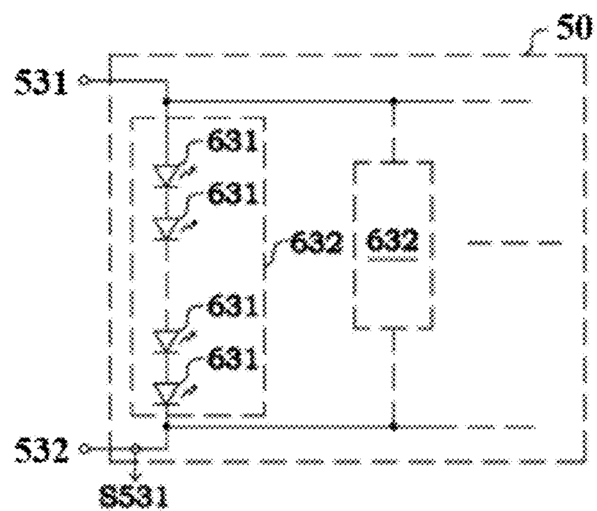
FIGS. 6A-6B are schematic diagrams of exemplary LED modules according to some exemplary embodiments.

FIG. 6A is a schematic diagram of an LED module according to an embodiment. Referring to FIG. 6A, an LED module 50 has an anode connected to a driving output terminal 531, a cathode connected to a driving output terminal 522, and includes at least one LED unit 632, such as the light source mentioned above. When two or more LED units are included, they are connected in parallel. The anode of each LED unit 632 is connected to the anode of LED module 50 to couple with the driving output terminal 531, and the cathode of each LED unit 632 is connected to the cathode of LED module 50 to couple to the driving output terminal 532. Each LED unit 632 includes at least one LED 631. When multiple LEDs 631 are included in an LED unit 632, they are connected in series with the anode of the first LED 631 connected to the anode of this LED unit 632 (the anode of the first LED 631 and the anode of the LED unit 632 may be the same terminal) and the cathode of the first LED 631 connected to the next or second LED 631. And the anode of the last LED 631 in this LED unit 632 is connected to the cathode of a previous LED 631 and the cathode of the last LED 631 connected to the cathode of this LED unit 632 (the cathode of the last LED 631 and the cathode of the LED unit 632 may be the same terminal).

In some embodiments, the LED module 50 may produce a current detection signal S531 reflecting the magnitude of current through the LED module 50 and being used for controlling or detecting the LED module 50.

Figure 6B:
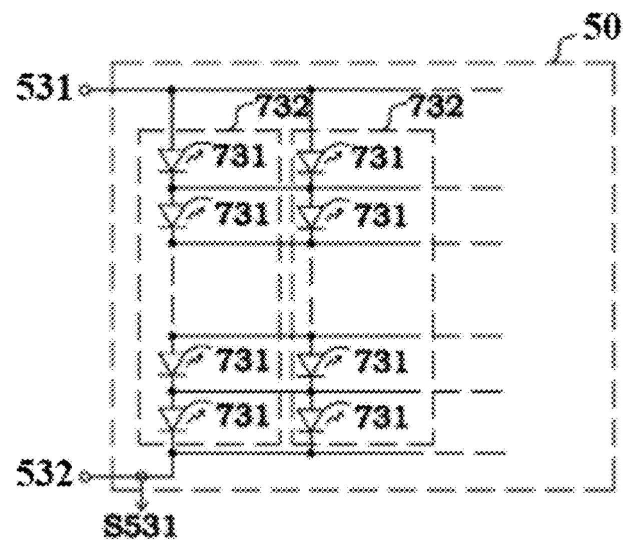

FIG. 6B is a schematic diagram of an LED module according to an exemplary embodiment. Referring to FIG. 6B, an LED module 50 has an anode connected to a filtering output terminal 521, a cathode connected to a filtering output terminal 522, and includes at least two LED units 732 with the anode of each LED unit 732 connected to the anode of LED module 50 and the cathode of each LED unit 732 connected to the cathode of LED module 50 (the anode of each LED unit 732 and the anode of the LED module 50 may be the same terminal, and the cathode of each LED unit 732 and the cathode of the LED module 50 may be the same terminal). Each LED unit 732 includes at least two LEDs 731 connected in the same way as those described in FIG. 6A. For example, the anode of the first LED 731 in an LED unit 732 is connected to the anode of this LED unit 732, the cathode of the first LED 731 is connected to the anode of the next or second LED 731, and the cathode of the last LED 731 is connected to the cathode of this LED unit 732. Further, LED units 732 in an LED module 50 are connected to each other in this embodiment. All of the n-th LEDs 731 in the related LED units 732 thereof are connected by their anodes and cathodes, such as those shown in FIG. 6B but not limit to, where n is a positive integer. In this way, the LEDs in the LED module 50 of this embodiment are connected in the form of a mesh.

In some embodiments, the number of LEDs 731 included by an LED unit 732 is in the range of 15-25, and may be in some embodiments in the range of 18-22.

Figure 7A:
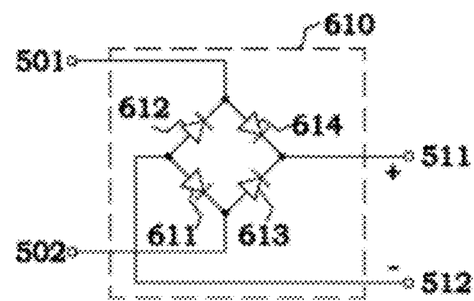
FIGS. 7A-7F are schematic circuit diagrams of exemplary rectifying circuits according to some exemplary embodiments.

FIG. 7A is a schematic circuit diagram of a rectifying circuit according to an embodiment. Referring to FIG. 7A, a rectifying circuit 610, i.e. a bridge rectifier, includes four rectifying diodes 611, 612, 613, and 614, configured to full-wave rectify a received signal. The diode 611 has an anode connected to the output terminal 512, and a cathode connected to the pin 502. The diode 612 has an anode connected to the output terminal 512, and a cathode connected to the pin 501. The diode 613 has an anode connected to the pin 502, and a cathode connected to the output terminal 511. The diode 614 has an anode connected to the pin 501, and a cathode connected to the output terminal 511.

When the pins 501 and 502 receive an AC signal, the rectifying circuit 610 operates as follows. During the connected AC signal's positive half cycle, the AC signal is input through the pin 501, the diode 614, and the output terminal 511 in sequence, and later output through the output terminal 512, the diode 611, and the pin 502 in sequence. During the connected AC signal's negative half cycle, the AC signal is input through the pin 502, the diode 613, and the output terminal 511 in sequence, and later output through the output terminal 512, the diode 612, and the pin 501 in sequence. Therefore, during the connected AC signal's full cycle, the positive pole of the rectified signal produced by the rectifying circuit 610 keeps at the output terminal 511, and the negative pole of the rectified signal remains at the output terminal 512. Accordingly, the rectified signal produced or output by the rectifying circuit 610 is a full-wave rectified signal.

When the pins 501 and 502 are coupled to a DC power supply to receive a DC signal, the rectifying circuit 610 operates as follows. When the pin 501 is coupled to the positive end of the DC power supply and the pin 502 to the negative end of the DC power supply, the DC signal is input through the pin 501, the diode 614, and the output terminal 511 in sequence, and later output through the output terminal 512, the diode 611, and the pin 502 in sequence. When the pin 501 is coupled to the negative end of the DC power supply and the pin 502 to the positive end of the DC power supply, the DC signal is input through the pin 502, the diode 613, and the output terminal 511 in sequence, and later output through the output terminal 512, the diode 612, and the pin 501 in sequence. Therefore, no matter what the electrical polarity of the DC signal is between the pins 501 and 502, the positive pole of the rectified signal produced by the rectifying circuit 610 keeps at the output terminal 511, and the negative pole of the rectified signal remains at the output terminal 512.

Therefore, the rectifying circuit 610 in this embodiment can output or produce a proper rectified signal regardless of whether the received input signal is an AC or DC signal.

Figure 7B:
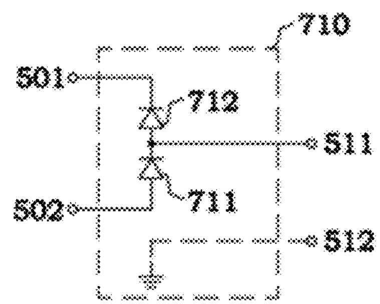

FIG. 7B is a schematic diagram of a rectifying circuit according to an embodiment. Referring to FIG. 7B, a rectifying circuit 710 includes two rectifying diodes 711 and 712, configured to half-wave rectify a received signal. The rectifying diode 711 has an anode connected to the pin 502, and a cathode connected to the rectifying output terminal 511. The rectifying diode 712 has an anode connected to the rectifying output terminal 511, and a cathode connected to the pin 501. The rectifying output terminal 512 can be omitted or connect to ground according to the practical application. Detailed operations of the rectifying circuit 710 are described below.

During the connected AC signal's positive half cycle, the signal level of the AC signal input through the pin 501 is greater than the signal level of the AC signal input through the pin 502. At that time, both the rectifying diodes 711 and 712 are cut off since being reverse biased, and thus the rectifying circuit 710 stops outputting the rectified signal. During the connected AC signal's negative half cycle, the signal level of the AC signal input through the pin 501 is less than the signal level of the AC signal input through the pin 502. At that time, both the rectifying diodes 711 and 712 are conducting since they are forward biased, and thus the AC signal is input through the pin 502, the rectifying diode 711, and the rectifying output terminal 511 in sequence, and later output through the rectifying output terminal 512 or another circuit or ground of the LED tube lamp. Accordingly, the rectified signal produced or output by the rectifying circuit 710 is a half-wave rectified signal.

Figure 7C:
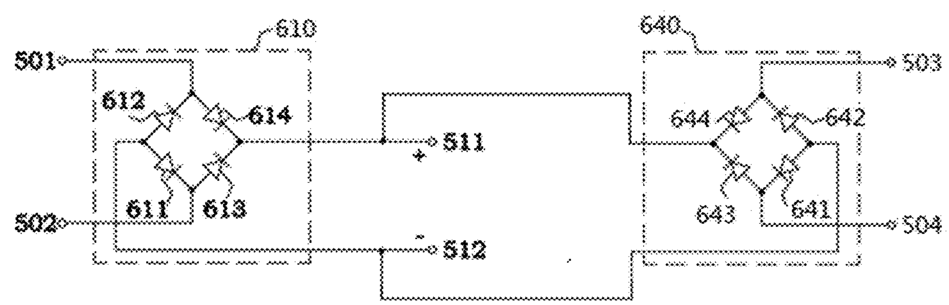

It should be noted that, when the pins 501 and 502 shown in FIG. 7A and FIG. 7B are respectively changed to the pins 503 and 504, the rectifying circuit 610 and 710 can be considered as the rectifying circuit 540 illustrated in FIG. 5B. More specifically, in an exemplary embodiment, when the full-wave rectifying circuit 610 shown in FIG. 7A is applied to the dual-end tube lamp shown in FIG. 5B, the configuration of the rectifying circuits 510 and 540 is shown in FIG. 7C. FIG. 7C is a schematic diagram of a rectifying circuit according to an embodiment.

Referring to FIG. 7C, the rectifying circuit 640 has the same configuration as the rectifying circuit 610, which is the bridge rectifying circuit. The rectifying circuit 610 includes four rectifying diodes 611 to 614, which has the same configuration as the embodiment illustrated in FIG. 7A. The rectifying circuit 640 includes four rectifying diodes 641 to 644 and is configured to perform full-wave rectification on the received signal. The rectifying diode 641 has an anode coupled to the rectifying output terminal 512, and a cathode coupled to the pin 504. The rectifying diode 642 has an anode coupled to the rectifying output terminal 512, and a cathode coupled to the pin 503. The rectifying diode 643 has an anode coupled to the pin 502, and a cathode coupled to the rectifying output terminal 511. The rectifying diode 644 has an anode coupled to the pin 503, and a cathode coupled to the rectifying output terminal 511.

In the present embodiment, the rectifying circuits 610 and 640 are configured to correspond to each other, in which the difference between the rectifying circuits 610 and 640 is that the input terminal of the rectifying circuit 610 (which can be used as the rectifying circuit 510 shown in FIG. 5B) is coupled to the pins 501 and 502, but the input terminal of the rectifying circuit 640 (which can be used as the rectifying circuit 540 shown in FIG. 5B) is coupled to the pins 503 and 504. Therefore, the present embodiment applies a structure including two full-wave rectifying circuits for implementing the dual-end-dual-pin circuit configuration.

In some embodiments, in the rectifying circuit illustrated in the example of FIG. 7C, although the circuit configuration is disposed as the dual-end-dual-pin configuration, the external driving signal is not limited to be provided through both pins on each end cap. Under the configuration shown in FIG. 7C, no matter whether the AC signal is provided through both pins on single end cap or through signal pin on each end cap, the rectifying circuit shown in FIG. 7C may correctly rectify the received signal and generate the rectified signal for lighting the LED tube lamp. Detailed operations are described below.

When the AC signal is provided through both pins on single end cap, the AC signal can be applied to the pins 501 and 502, or to the pins 503 and 504. When the AC signal is applied to the pins 501 and 502, the rectifying circuit 610 performs full-wave rectification on the AC signal based on the operation illustrated in the embodiment of FIG. 7A, and the rectifying circuit 640 does not operate. On the contrary, when the external driving signal is applied to the pins 503 and 504, the rectifying circuit 640 performs full-wave rectification on the AC signal based on the operation illustrated in the embodiment of FIG. 7A, and the rectifying circuit 610 does not operate.

When the AC signal is provided through a single pin on each end cap, the AC signal can be applied to the pins 501 and 504, or to the pins 502 and 503. For example, the dual pins on each end cap can be arranged based on standard socket configuration so that the AC signal will be applied to either pins 501 and 504 or pins 502 and 503, but not pins 501 and 503 or pins 502 and 504 (e.g., based on the physical positioning of the pins on each end cap).

When the AC signal is applied to the pins 501 and 504, during the AC signal's positive half cycle (e.g., the voltage at pin 501 is higher than the voltage at pin 504), the AC signal is input through the pin 501, the diode 614, and the output terminal 511 in sequence, and later output through the output terminal 512, the diode 641, and the pin 504 in sequence. In this manner, output terminal 511 remains at a higher voltage than output terminal 512. During the AC signal's negative half cycle (e.g., the voltage at pin 504 is higher than the voltage at pin 501), the AC signal is input through the pin 504, the diode 643, and the output terminal 511 in sequence, and later output through the output terminal 512, the diode 612, and the pin 501 in sequence. In this manner, output terminal 511 still remains at a higher voltage than output terminal 512. Therefore, during the AC signal's full cycle, the positive pole of the rectified signal remains at the output terminal 511, and the negative pole of the rectified signal remains at the output terminal 512. Accordingly, the diodes 612 and 614 of the rectifying circuit 610 and the diodes 641 and 643 of the rectifying circuit 640 are configured to perform the full-wave rectification on the AC signal and thus the rectified signal produced or output by the diodes 612, 614, 641, and 643 is a full-wave rectified signal.

On the other hand, when the AC signal is applied to the pins 502 and 503, during the AC signal's positive half cycle (e.g., the voltage at pin 502 is higher than the voltage at pin 503), the AC signal is input through the pin 502, the diode 613, and the output terminal 511 in sequence, and later output through the output terminal 512, the diode 642, and the pin 503. During the AC signal's negative half cycle (e.g., the voltage at pin 503 is higher than the voltage at pin 502), the AC signal is input through the pin 503, the diode 644, and the output terminal 511 in sequence, and later output through the output terminal 512, the diode 611, and the pin 502 in sequence. Therefore, during the AC signal's full cycle, the positive pole of the rectified signal remains at the output terminal 511, and the negative pole of the rectified signal remains at the output terminal 512. Accordingly, the diodes 611 and 613 of the rectifying circuit 610 and the diodes 642 and 644 of the rectifying circuit 640 are configured to perform the full-wave rectification on the AC signal and thus the rectified signal produced or output by the diodes 611, 613, 642, and 644 is a full-wave rectified signal.

When the AC signal is provided through two pins on each end cap, the operation in each of the rectifying circuits 610 and 640 can be referred to the embodiment illustrated in FIG. 7A, and it will not be repeated herein. The rectified signal produced by the rectifying circuits 610 and 640 is output to the rear-end circuit after superposing on the output terminals 511 and 512.

Figure 7D:
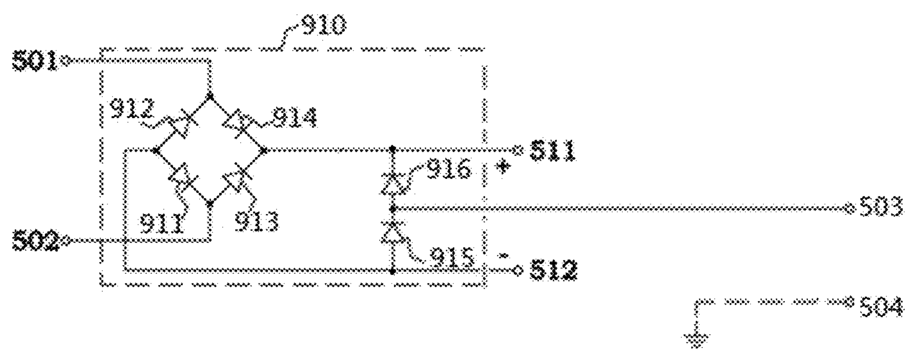

In an exemplary embodiment, the rectifying circuit 510 illustrated in FIG. 5C can be implemented by the configuration illustrated in FIG. 7D. FIG. 7D is a schematic diagram of a rectifying circuit according to an embodiment. Referring to FIG. 7D, the rectifying circuit 910 includes diodes 911 to 914, which are configured as the embodiment illustrated in FIG. 7A. In the present embodiment, the rectifying circuit 910 further includes rectifying diodes 915 and 916. The diode 915 has an anode coupled to the rectifying output terminal 512, and a cathode coupled to the pin 503. The diode 916 has an anode coupled to the pin 503, and a cathode coupled to the rectifying output terminal 511. The pin 504 is set to the float state in the present embodiment.

Specifically, the rectifying circuit 910 can be regarded as a rectifying circuit including three sets of bridge arms, in which each of the bridge arms provides an input signal receiving terminal. For example, the diodes 911 and 913 constitute a first bridge arm for receiving the signal on the pin 502; the diodes 912 and 914 constitute a second bridge arm for receiving the signal on the pin 501; and the diodes 915 and 916 constitute a third bridge arm for receiving the signal on the pin 503. According to the rectifying circuit 910 illustrated in FIG. 7D, the full-wave rectification can be performed as long as different polarity AC signal is respectively received by two of the bridge arms. Accordingly, under the configuration illustrated in FIG. 7D, no matter what kind of power supply configuration, such as the AC signal being provided to both pins on single end cap, a single pin on each end cap, or both pins on each end cap, the rectifying circuit 910 is compatible for producing the rectified signal, correctly. Detailed operations of the present embodiment are described below.

When the AC signal is provided through both pins on single end cap, the AC signal can be applied to the pins 501 and 502. The diodes 911 to 914 perform full-wave rectification on the AC signal based on the operation illustrated in the embodiment of FIG. 7A, and the diodes 915 and 916 do not operate.

When the AC signal is provided through single pin on each end cap, the AC signal can be applied to the pins 501 and 503, or to the pins 502 and 503. When the AC signal is applied to the pins 501 and 503, during the AC signal's positive half cycle (e.g., when the signal on pin 501 has a larger voltage than the signal on pin 503), the AC signal is input through the pin 501, the diode 914, and the output terminal 511 in sequence, and later output through the output terminal 512, the diode 915, and the pin 503 in sequence. During the AC signal's negative half cycle (e.g., when the signal on pin 503 has a larger voltage than the signal on pin 501), the AC signal is input through the pin 503, the diode 916, and the output terminal 511 in sequence, and later output through the output terminal 512, the diode 912, and the pin 501 in sequence. Therefore, during the AC signal's full cycle, the positive pole of the rectified signal remains at the output terminal 511, and the negative pole of the rectified signal remains at the output terminal 512. Accordingly, the diodes 912, 914, 915, and 916 of the rectifying circuit 910 are configured to perform the full-wave rectification on the AC signal and thus the rectified signal produced or output by the diodes 912, 914, 915, and 916 is a full-wave rectified signal.

On the other hand, when the AC signal is applied to the pins 502 and 503, during the AC signal's positive half cycle (e.g., when the signal on pin 502 has a larger voltage than the signal on pin 503), the AC signal is input through the pin 502, the diode 913, and the output terminal 511 in sequence, and later output through the output terminal 512, the diode 915, and the pin 503. During the AC signal's negative half cycle (e.g., when the signal on pin 503 has a larger voltage than the signal on pin 502), the AC signal is input through the pin 503, the diode 916, and the output terminal 511 in sequence, and later output through the output terminal 512, the diode 911, and the pin 502 in sequence. Therefore, during the AC signal's full cycle, the positive pole of the rectified signal remains at the output terminal 511, and the negative pole of the rectified signal remains at the output terminal 512. Accordingly, the diodes 911, 913, 915, and 916 of the rectifying circuit 910 are configured to perform the full-wave rectification on the AC signal and thus the rectified signal produced or output by the diodes 911, 913, 915, and 916 is a full-wave rectified signal.

When the AC signal is provided through two pins on each end cap, the operation of the diodes 911 to 914 can be referred to the embodiment illustrated in FIG. 7A, and it will not be repeated herein. Also, if the signal polarity of the pin 503 is the same as the pin 501, the operation of the diodes 915 and 916 is similar to that of the diodes 912 and 914 (i.e., the first bridge arm). On the other hand, if the signal polarity of the pin 503 is the same as that of the pin 502, the operation of the diodes 915 and 916 is similar with the diodes 912 and 914 (i.e., the second bridge arm).

Figure 7E:
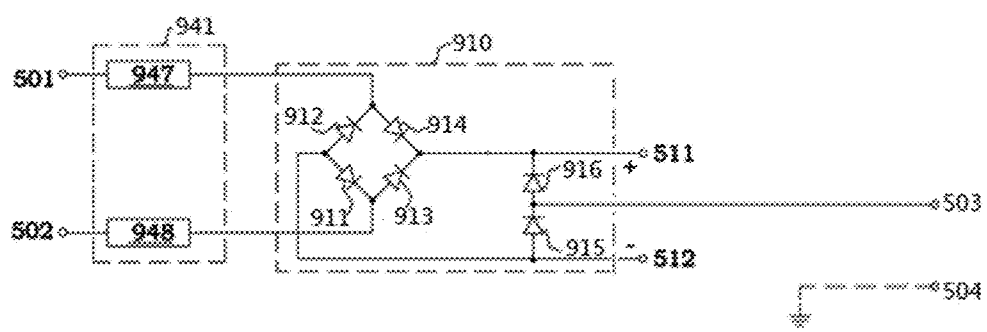

FIG. 7E is a schematic diagram of a rectifying circuit according to an embodiment. Referring to FIG. 7E, the difference between the embodiments of FIG. 7E and FIG. 7D is that the rectifying circuit shown in FIG. 7E further includes a terminal adapter circuit 941. The terminal adapter circuit 941 includes fuses 947 and 948. One end of the fuse 947 is coupled to the pin 501, and the other end of the fuse 947 is coupled to the connection node of the diodes 912 and 914 (i.e., the input terminal of the first bridge arm). One end of the fuse 948 is coupled to the pin 502, and the other end of the fuse 948 is coupled to the connection node of the diodes 911 and 913 (i.e., the input terminal of the second bridge arm). Accordingly, when the current flowing through any one of the pins 501 and 502 is higher than the rated current of the fuses 947 and 948, the fuse 947/948 will be fused (e.g., broken) in response to the current so as to form an open circuit between the pin 501/502 and the rectifying circuit 910, thereby achieving the function of over current protection. In the case of only one of the fuses 947 and 948 being fused (e.g., the over current situation just happens in a brief period and then is eliminated), if the AC driving signal is provided through both pins on each end cap, the rectifying circuit still works, after the over current situation is eliminated, since the AC driving signal can be provided through single pin on each end cap.

Figure 7F:
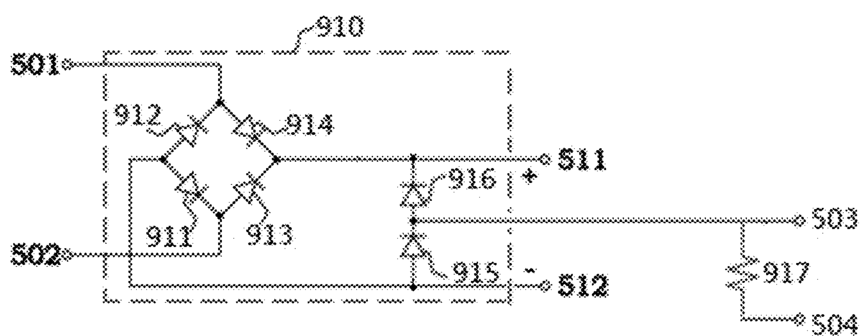

FIG. 7F is a schematic diagram of a rectifying circuit according to an embodiment. Referring to FIG. 7F, the difference between the embodiments of FIG. 7F and FIG. 7D is that the pins are connected to each other through a thin wire 917. Compared to the embodiments illustrated in FIG. 7D or FIG. 7E, when the AC signal is applied to the dual-end-single-pin configuration, no matter the AC signal is applied to the pin 503 or the pin 504, the rectifying circuit of the present embodiment can be normally operated. Furthermore, when the pins 503 and 504 are installed on the wrong lamp socket which provides the AC signal to the single end cap, the thin wire 917 can be reliably fused. Therefore, when the lamp is installed on the correct lamp socket, the tube lamp utilizing the rectifying illustrated in FIG. 7F may keep working, normally.

According to the embodiments mentioned above, the rectifying circuits illustrated in FIG. 7C to 7F are compatible for receiving the AC signal through both pins on single end cap, through single pin on each end cap, and through both pins on each end cap, such that the compatibility of the LED tube lamp's application is improved. In this manner, an LED tube lamp can include a rectifying circuit that is arranged to rectify an AC signal in all of the following situations: when the LED tube lamp is connected (e.g., coupled to a socket) to receive the AC signal through both of two pins on a single end cap; when the LED tube lamp is connected (e.g., coupled to a socket) to receive the AC signal through both of two pins on each end cap; and when the LED tube lamp is connected (e.g., coupled to a socket) to receive the AC signal through a single pin on each end cap. In addition, based on the aspect of the actual circuit layout scenario, the embodiments illustrated in FIG. 7D to 7F require only three power pads for connecting the corresponding pins, so that the process yield can be significant enhanced since the manufacture process of the three pads configuration is easier than the four power pads configuration.

In some embodiments, one or plural varistors (also known as voltage dependent resistor (VDR)) is disposed on the input side or the output side of the rectifying circuit. The varistor is configured to protect against excessive transient voltages by shunting the current created by the excessive voltage. According to some embodiments of disposing the varistor on the input side of the rectifying circuit, the varistor is electrically connected between the pins 501 and 502. According to some embodiments of disposing the varistor on the output side of the rectifying circuit, the varistor is electrically connected between the rectifying output terminals 511 and 512. In some embodiments, the varistor can be designed for smaller size by disposing the varistor on the output side of the rectifying circuit. In some embodiments, the size of the varistor disposed on the output side of the rectifying circuit can be half of the varistor disposed on the input side of the rectifying circuit.

Figure 8A:
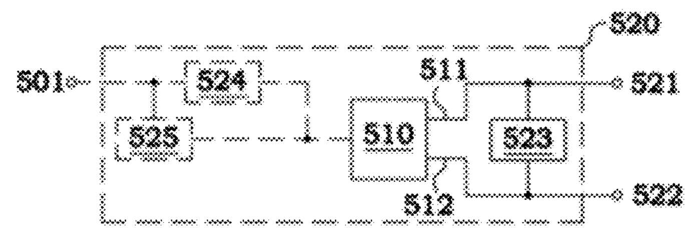
FIGS. 8A-8E are block diagrams of exemplary filtering circuits according to some exemplary embodiments.

FIG. 8A is a block diagram of the filtering circuit according to an embodiment. A rectifying circuit 510 is shown in FIG. 8A for illustrating its connection with other components, without intending a filtering circuit 520 to include the rectifying circuit 510. Referring to FIG. 8A, the filtering circuit 520 includes a filtering unit 523 coupled to two rectifying output terminals 511 and 512 to receive and to filter out ripples of a rectified signal from the rectifying circuit 510. Accordingly, the waveform of a filtered signal is smoother than that of the rectified signal. The filtering circuit 520 may further include another filtering unit 524 coupled between a rectifying circuit and a pin correspondingly, for example, between the rectifying circuit 510 and the pin 501, the rectifying circuit 510 and the pin 502, the rectifying circuit 540 and the pin 503, and/or the rectifying circuit 540 and the pin 504. The filtering unit 524 is used to filter a specific frequency, for example, to filter out a specific frequency of an external driving signal. In this embodiment, the filtering unit 524 is coupled between the rectifying circuit 510 and the pin 501. The filtering circuit 520 may further include another filtering unit 525 coupled between one of the pins 501 and 502 and one of the diodes of the rectifying circuit 510, or between one of the pins 503 and 504 and one of the diodes of the rectifying circuit 540 to reduce or filter out electromagnetic interference (EMI). In this embodiment, the filtering unit 525 is coupled between the pin 501 and one of diodes (not shown in FIG. 8A) of the rectifying circuit 510. Since the filtering units 524 and 525 may be present or omitted depending on actual circumstances of their uses, they are depicted by a dotted line in FIG. 8A.

Figure 8B:
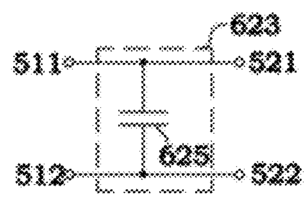

FIG. 8B is a schematic diagram of the filtering unit according to an embodiment. Referring to FIG. 8B, a filtering unit 623 includes a capacitor 625 having an end coupled to the output terminal 511 and a filtering output terminal 521 and the other end thereof coupled to the output terminal 512 and a filtering output terminal 522, and is configured to low-pass filter a rectified signal from the output terminals 511 and 512, so as to filter out high-frequency components of the rectified signal and thereby output a filtered signal at the filtering output terminals 521 and 522.

Figure 8C:
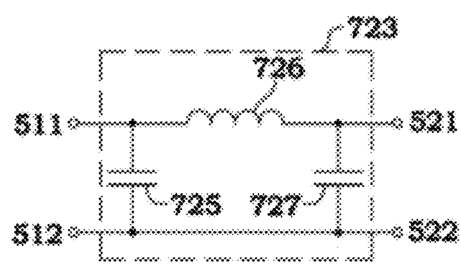

FIG. 8C is a schematic diagram of the filtering unit according to an embodiment. Referring to FIG. 8C, a filtering unit 723 includes a pi filter circuit including a capacitor 725, an inductor 726, and a capacitor 727. As is well known, a pi-type filter looks like the symbol in its shape or structure. The capacitor 725 has an end connected to the output terminal 511 and coupled to the filtering output terminal 521 through the inductor 726, and has another end connected to the output terminal 512 and the filtering output terminal 522. The inductor 726 is coupled between output terminal 511 and the filtering output terminal 521. The capacitor 727 has an end connected to the filtering output terminal 521 and coupled to the output terminal 511 through the inductor 726, and has another end connected to the output terminal 512 and the filtering output terminal 522.

As seen between the output terminals 511 and 512 and the filtering output terminals 521 and 522, the filtering unit 723 compared to the filtering unit 623 in FIG. 8B additionally has an inductor 726 and a capacitor 727, which perform the function of low-pass filtering like the capacitor 725 does. Therefore, the filtering unit 723 in this embodiment compared to the filtering unit 623 in FIG. 8B has a better ability to filter out high-frequency components to output a filtered signal with a smoother waveform.

The inductance values of the inductor 726 in the embodiments mentioned above are chosen in the range of, for example in some embodiments, about 10 nH to 10 mH. And the capacitance values of the capacitors 625, 725, and 727 in the embodiments stated above are chosen in the range of, for example in some embodiments, about 100 pF to 1 uF.

Figure 8D:
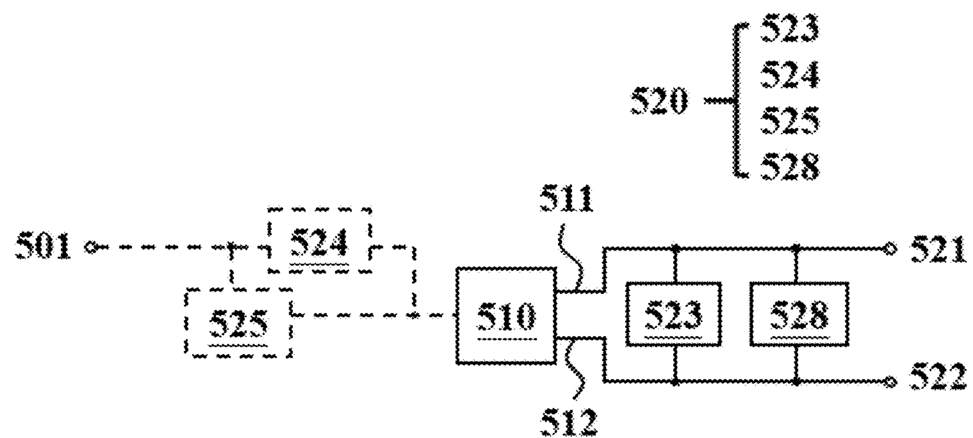

FIG. 8D is a circuit diagram of the filtering circuit according to an embodiment of the present disclosure. Referring to FIG. 8D, the embodiment of FIG. 8D is similar to that of FIG. 8A, with a main difference that the filtering circuit in FIG. 8D includes a negative voltage clipping unit 528. The negative voltage clipping unit 528 is coupled to a filtering unit 523, and is configured to clip, limit, or prevent a negative voltage (or other effects) that might result from possible resonances of the filtering unit 523, in order to prevent damage due to the negative voltage to a controller or integrated circuit in a later-stage driving circuit. Specifically, the filtering unit 523 typically comprises a circuit formed by a resistor, a capacitor, an inductor, or any combination thereof, wherein due to characteristics of capacitance and inductance the filtering unit 523 exhibits pure resistive qualities at or close to a specific frequency at the resonance point. At the resonance point a signal received by the filtering unit 523 will be amplified and output, so a phenomenon of signal fluctuations will be observed at the output terminal of the filtering unit 523. When the magnitude of the signal fluctuation is excessive to cause the level of the negative amplitude of the output of the filtering unit 523 to be lower than a ground level, a negative voltage might occur at the filtering output terminals 521 and 522, which negative voltage will be applied to a later-stage circuit, imposing risks of damages to the later-stage circuit.

Figure 8E:
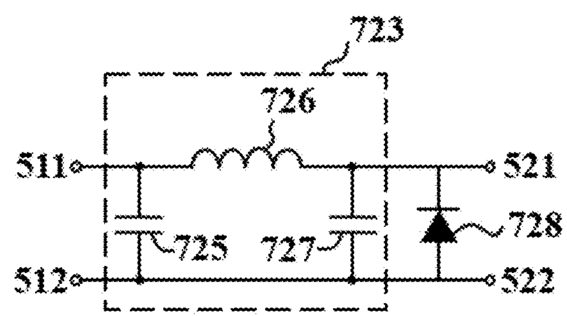

In this embodiment of FIG. 8D, the negative voltage clipping unit 528 may be configured to conduct an energy-releasing loop when the negative voltage occurs, to cause a reverse current resulting from the negative voltage to be released through the energy-releasing loop and back to the power line, thereby preventing the reverse current from flowing to a later-stage circuit. FIG. 8E is a circuit diagram of a filtering unit 723 and a negative voltage clipping unit according to an embodiment of the present disclosure. Referring to FIG. 8E, in this embodiment the negative voltage clipping unit is implemented by a diode 728, although the present invention is not limited thereto. When resonance of the filtering unit 723 does not occur, the first filtering output terminal 521 has a voltage level higher than that at the second filtering output terminal 522, so that the diode 728 is cutoff to prevent a current to flow through. On the other hand, when resonance of the filtering unit 723 occurs to cause the negative voltage, the second filtering output terminal 522 has a voltage level higher than that at the first filtering output terminal 521, causing the diode 728 to conduct due to the forward bias voltage across it, which conduction then releases a reverse current due to the negative voltage back to the first filtering output terminal 521.

In some embodiments, the LED module 50 in this embodiment may produce a current detection signal S531 reflecting the magnitude of current through the LED module 50 and being used for controlling or detecting the LED module 50.

Figure 9A:
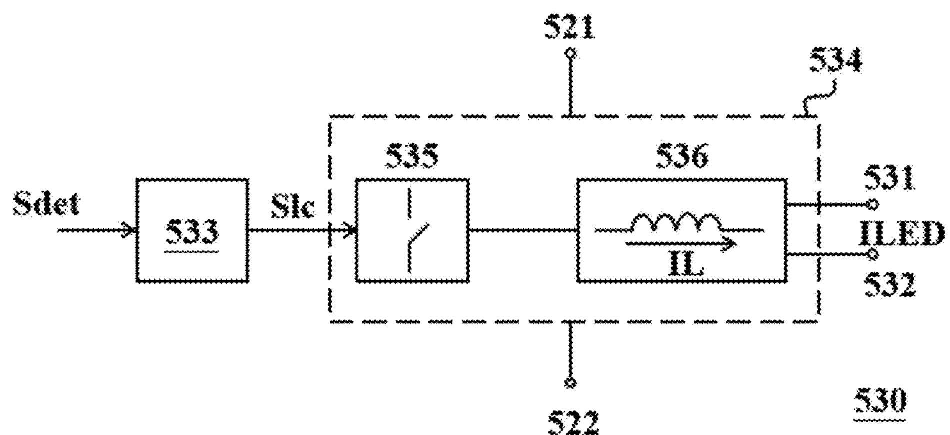
FIG. 9A is a block diagram of a driving circuit according to some exemplary embodiments.

FIG. 9A is a block diagram of a driving circuit 530 according to a first embodiment. Referring to FIG. 9A, the driving circuit 530 includes a controller 533, and a conversion circuit 534 for power conversion based on a current source, for driving an LED module to emit light. The conversion circuit 534 includes a switching circuit 535 (also known as a power switch) and an energy storage circuit 536. And the conversion circuit 534 is coupled to first and second filtering output terminals 521 and 522 in order to receive and then convert a filtered signal, under the control by the controller 533, into a driving signal at first and second driving output terminals 531 and 532 for driving the LED module. Under the control by the controller 533, the driving signal output by the conversion circuit 534 comprises a steady current, making the LED module emit steady light.

It should be noted that, the connection embodiments of the LED module 50 described above is not limited to being utilized in a tube lamp. The connection embodiments can be applied to any kind of LED lamp directly powered by the mains electricity/commercial electricity (i.e., the AC power without passing a ballast), such as an LED bulb, an LED filament lamp, an integrated LED lamp, etc. The invention is not limited to these specific examples.

FIG. 8B is a block diagram of the driving circuit according to an embodiment. Referring to FIG. 8B, a driving circuit includes a controller 1531, and a conversion circuit 1532 for power conversion based on a current source, for driving the LED module to emit light. The conversion circuit 1532 includes a switching circuit 1535 (also known as a power switch) and an energy storage circuit 1538. And the conversion circuit 1532 is coupled to the filtering output terminals 521 and 522 to receive and then convert a filtered signal, under the control by the controller 1531, into a lamp driving signal at the driving output terminals 531 and 532 for driving the LED module. Under the control by the controller 1531, the lamp driving signal output by the conversion circuit 1532 comprises a steady current, making the LED module emitting steady light.

Figure 10A:
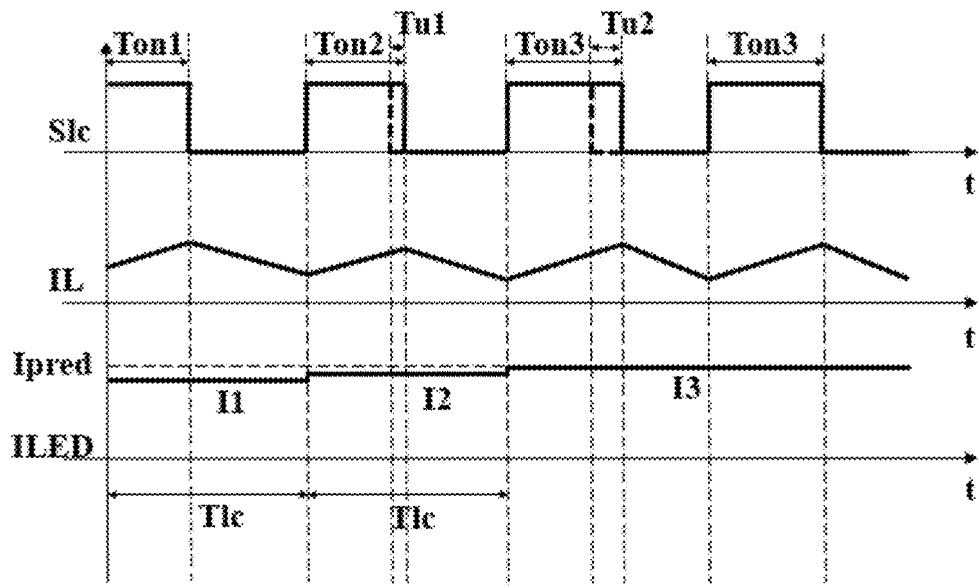
FIGS. 10A-10D are signal waveform diagrams of exemplary driving circuits according to some exemplary embodiments.
Figure 10B:
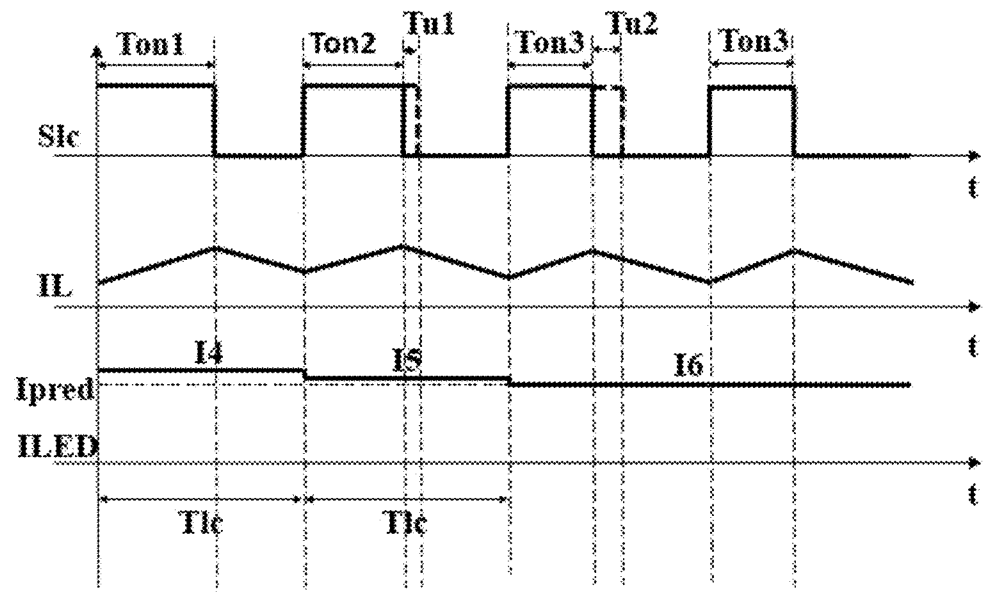
Figure 10C:
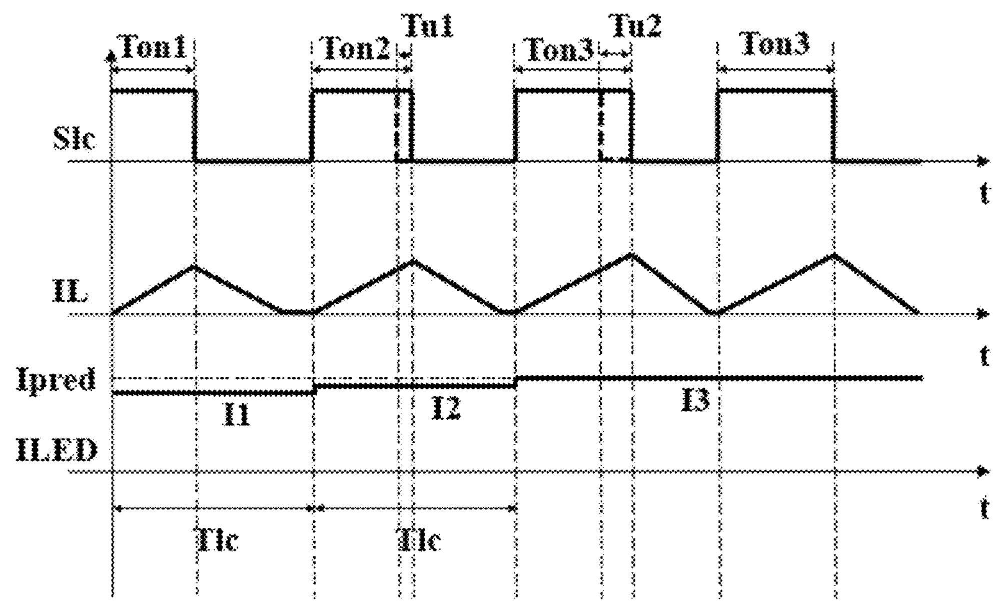
Figure 10D:
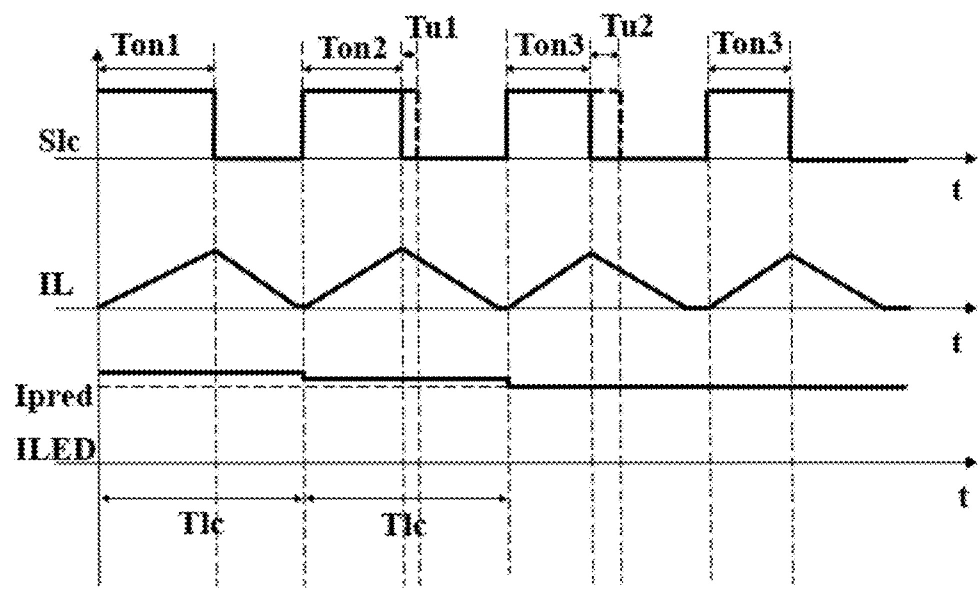

The operation of the driving circuit 530 is further described based on the signal waveform illustrated in FIGS. 10A to 10D. FIGS. 10A-10D are signal waveform diagrams of exemplary driving circuits according to some exemplary embodiments, in which FIGS. 10A and 10B illustrate the signal waveform and the control condition when the driving circuit 530 is operated in a Continuous-Conduction Mode (CCM) and FIGS. 10C and 10D illustrate the signal waveform and the control condition when the driving circuit 530 is operated in a Discontinuous-Conduction Mode (DCM). In signal waveform diagrams, the horizontal axis represents time (represented by a symbol "t"), and the vertical axis represents a voltage or current value (depending on the type of the signal).

The controller 533 can be, for example, a constant current controller which can generate a lighting control signal Slc and adjust the duty cycle of the lighting control signal Slc based on a current detection signal Sdet, so that the switch circuit 535 is turned on or off in response to the lighting control signal Slc. The energy storage circuit 536 is repeatedly charged and discharged according to the on/off state of the switch circuit 535, so that the driving current ILED received by the LED module 50 can be stably maintained at a predetermined current value Ipred. In some embodiments, the lighting control signal Slc may have fixed signal period Tlc and signal amplitude, and the pulse-on period (also known as the pulse width) of each signal period Tlc, such as Ton1, Ton2 and Ton3, can be adjusted according to the control requirement. In the present embodiment, the duty cycle of the lighting control signal Slc represents a ratio of the pulse-on period and the signal period Tlc. For example, when the pulse-on period Ton1 is 40% of the signal period Tlc, the duty cycle of the lighting control signal Slc under the first signal period Tlc is 0.4.

In addition, the signal level of the current detection signal may represent the magnitude of the current flowing through the LED module 50, or represent the magnitude of the current flowing through the switching circuit 535; the present invention is not limited thereto.

Referring to FIGS. 9A and 10A, FIG. 10A illustrates the signal waveform variation of the driving circuit 530 during a plurality of signal periods Tlc when the driving current ILED is smaller than the predetermined current value Ipred. Specifically, under the first signal period Tlc, the switching circuit 535 is turned on during the pulse-on period Ton1 in response to the high level voltage of the lighting control signal Slc. In the meantime, the conversion circuit 534 provides the driving current ILED to the LED module 50 according to an input power received from the first and the second filtering output terminals 521 and 522, and further charges the energy storage circuit 536 via the turned-on switch circuit 535, so that the current IL flowing through the energy storage circuit 536 gradually increases. In this manner, during the pulse-on period Ton1, the energy storage circuit 536 is charged in response to the input power received from the first and the second filtering output terminals 521 and 522.

After the pulse-on period Ton1, the switch circuit 535 is turned off in response to the low level voltage of the lighting control signal Slc. During a cut-off period of the switch circuit 535, the input power output from the first and the second filtering output terminals 521 and 522 would not be provided to the LED module 50, and the driving current ILED is dominated by the energy storage circuit 536 (i.e., the driving current ILED is generated by the energy storage circuit 536 by discharging). Due to the energy storage circuit 536 discharging during the cut-off period, the current IL is gradually decreased. Therefore, even when the lighting control signal Slc is at the low level (i.e., the disable period of the lighting control signal Slc), the driving circuit 530 continuously supply power to the LED module 50 by discharging the energy storage circuit 536. In this embodiment, no matter whether the switch circuit 535 is turned on or off, the driving circuit 530 continuously provides a stable driving current ILED to the LED module 50, and the current value of the driving current ILED is I1 during the first signal period Tlc.

Under the first signal period Tlc, the controller 533 determines the current value I1 of the driving current ILED is smaller than the predetermined current value Ipred, so that the pulse-on period of the lighting control signal Slc is adjusted to Ton2 when entering the second signal period Tlc. The length of the pulse-on period Ton2 equals to the length of the pulse-on period Ton1 plus a unit period t1.

Under the second signal period Tlc, the operation of the switch circuit 535 and the energy storage circuit 536 are similar to the operation under the first signal period Tlc. The difference of the operation between the first and the second signal periods Tlc is the energy storage circuit 536 has relatively longer charging time and shorter discharging time since the pulse-on period Ton2 is longer than pulse-on period Ton1. Therefore, the average current value of the driving current ILED under the second signal period Tlc is increased to a current value I2 closer to the predetermined current value Ipred.

Similarly, since the current value I2 of the driving current ILED is still smaller than the predetermined current value Ipred, the controller 533 further adjusts, under the third signal period Tlc, the pulse-on period of the lighting control signal Slc to Ton3, in which the length of the pulse-on period Ton3 equals to the length of the pulse-on period Ton2 plus the unit period t1. Under the third signal period Ton3, the operation of the switch circuit 535 and the energy storage circuit 536 are similar to the operation under the first and the second signal periods Tlc. Due to the pulse-on period Ton3 being further increased in comparison with the pulse-on period Ton1 and Ton2, the current value of the driving current ILED is increased to I3, and substantially reaches the predetermined current value Ipred. Since the current value I3 of the driving current ILED has reached the predetermined current value Ipred, the controller 533 maintains the same duty cycle after the third signal period Tlc, so that the driving current ILED can be substantially maintained at the predetermined current value Ipred.

Referring to FIGS. 9A and 10B, FIG. 10B illustrates the signal waveform variation of the driving circuit 530 during a plurality of signal periods Tlc when the driving current ILED is larger than the predetermined current value Ipred. Specifically, under the first signal period Tlc, the switching circuit 535 is turned on during the pulse-on period Ton1 in response to the high level voltage of the lighting control signal Slc. In the meantime, the conversion circuit 534 provides the driving current ILED to the LED module 50 according to an input power received from the first and the second filtering output terminals 521 and 522, and further charges the energy storage circuit 536 via the turned-on switch circuit 535, so that the current IL flowing through the energy storage circuit 536 gradually increases. As a result, during the pulse-on period Ton1, the energy storage circuit 536 is charged in response to the input power received from the first and the second filtering output terminals 521 and 522.

After the pulse-on period Ton1, the switch circuit 535 is turned off in response to the low level voltage of the lighting control signal Slc. During a cut-off period of the switch circuit 535, the input power output from the first and the second filtering output terminals 521 and 522 would not be provided to the LED module 50, and the driving current ILED is dominated by the energy storage circuit 536 (i.e., the driving current ILED is generated by the energy storage circuit 536 by discharging). Due to the energy storage circuit 536 discharging during the cut-off period, the current IL is gradually decreased. Therefore, even when the lighting control signal Slc is at the low level (i.e., the disable period of the lighting control signal Slc), the driving circuit 530 continuously supplies power to the LED module 50 by discharging the energy storage circuit 536. Accordingly, no matter whether the switch circuit 535 is turned on or turned off, the driving circuit 530 continuously provides a stable driving current ILED to the LED module 50, and the current value of the driving current ILED is I4 during the first signal period Tlc.

Under the first signal period Tlc, the controller 533 determines the current value I4 of the driving current ILED is larger than the predetermined current value Ipred, so that the pulse-on period of the lighting control signal Slc is adjusted to Ton2 when entering the second signal period Tlc. The length of the pulse-on period Ton2 equals to the length of the pulse-on period Ton1 minus the unit period t1.

Under the second signal period Tlc, the operation of the switch circuit 535 and the energy storage circuit 536 are similar to the operation under the first signal period Tlc. The difference of the operation between the first and the second signal periods Tlc is the energy storage circuit 536 has relatively shorter charging time and longer discharging time since the pulse-on period Ton2 is shorter than pulse-on period Ton1. Therefore, the average current value of the driving current ILED under the second signal period Tlc is decreased to a current value I5 closer to the predetermined current value Ipred.

Similarly, since the current value I5 of the driving current ILED is still larger than the predetermined current value Ipred, the controller 533 further adjusts, under the third signal period Tlc, the pulse-on period of the lighting control signal Slc to Ton3, in which the length of the pulse-on period Ton3 equals to the length of the pulse-on period Ton2 minus the unit period t1. Under the third signal period Tlc, the operation of the switch circuit 535 and the energy storage circuit 536 are similar to the operation under the first and the second signal periods Tlc. Since the pulse-on period Ton3 is further decreased in comparison with the pulse-on period Ton1 and Ton2, the current value of the driving current ILED is decreased to I6, so that the driving current ILED substantially reaches the predetermined current value Ipred. Since the current value I6 of the driving current ILED has reached the predetermined current value Ipred, the controller 533 maintains the same duty cycle after the third signal period Tlc, so that the driving current ILED can be substantially maintained on the predetermined current value Ipred.

According to the above operations, the driving circuit 530 may adjust, by a stepped approach, the pulse-on period/pulse width of the lighting control signal Slc, so that the driving current ILED is gradually adjusted to be close to the predetermined current value Ipred. Therefore, the constant current output can be realized.

In the present embodiment, the driving circuit 530 is operated in CCM for example, which means the energy storage circuit 536 will not be discharged to zero current (i.e., the current IL will not be decreased to zero) during the cut-off period of the switch circuit 535. By utilizing the driving circuit 530 operating in CCM to provide power to the LED module 50, the power provided to the LED module 50 can be more stable and has a low ripple.

The control operation of the driving circuit 530 operating in DCM will be described below. Referring to FIGS. 9A and 10C, the operation and the signal waveform of the driving circuit 530 illustrated in FIG. 10C are similar to that of FIG. 10A. The difference between the FIGS. 10A and 10C is that the driving circuit 530 operates in DCM, so that the energy storage circuit 536 discharges, during the pulse-off time of the lighting control signal Slc, to zero current (i.e., the current IL equals to zero) and then re-charges in the next signal period Tlc. The other operation of the driving circuit 530 can be referred to the embodiments of FIG. 10A, and will not be described in detail herein.

Referring to FIGS. 9A and 10D, the operation and the signal waveform of the driving circuit 530 illustrated in FIG. 10D are similar to that of FIG. 10B. The difference between the FIGS. 10B and 10D is that the driving circuit 530 operates in DCM, so that the energy storage circuit 536 discharges, during the pulse-off time of the lighting control signal Slc, to zero current (i.e., the current IL decreases to zero) and then re-charges in the next signal period Tlc. The other operation of the driving circuit 530 can be referred to the embodiments of FIG. 10B, and will not be described in detail herein.

By utilizing the driving circuit 530 operating in DCM to provide power to the LED module 50, the driving circuit 530 may have lower power consumption, so as to obtain higher power conversion efficiency.

It's noted that although single-stage DC-to-DC converter circuits are taken as examples of the driving circuit 530 herein, the invention disclosed herein is not limited to using the disclosed single-stage DC-to-DC converter circuits. For example, the driving circuit 530 may instead comprise a two-stage driving circuit composed of a power factor correction circuit along with a DC-to-DC converter. Therefore, any suitable power conversion circuit structure that can be used for driving LED light sources may be applied with the invention.

The embodiments of the power conversion operation described above illustrate the inventive features of the present disclosure and these operations are not limited for use in a tube lamp. The embodiments of the power conversion operation can be applied to any kind of LED lamp directly powered by the mains electricity/commercial electricity (i.e., the AC power without passing a ballast), such as, for example an LED bulb, an LED filament lamp, and an integrated LED lamp. The embodiments taught herein are not limited to these specific examples and are not limited to the form described in the above examples, any possible replacement and arrangement between the various embodiments are included.

Figure 9B:
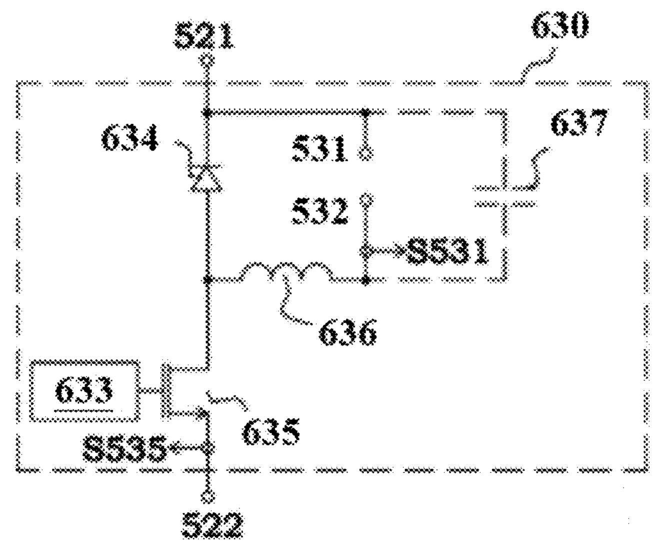
FIGS. 9B-9E are schematic diagrams of exemplary driving circuits according to some exemplary embodiments.

FIG. 9B is a schematic diagram of the driving circuit according to an embodiment of the present disclosure. Referring to FIG. 9B, a driving circuit 630 in this embodiment comprises a buck DC-to-DC converter circuit having a controller 633 and a conversion circuit. The conversion circuit includes an inductor 636, a diode 634 for "freewheeling" of current, a capacitor 637, and a switch 635. The driving circuit 630 is coupled to the filtering output terminals 521 and 522 to receive and then convert a filtered signal into a lamp driving signal for driving an LED module connected between the driving output terminals 531 and 532.

In this embodiment, the switch 635 includes a metal-oxide-semiconductor field-effect transistor (MOSFET) and has a first terminal coupled to the anode of freewheeling diode 634, a second terminal coupled to the filtering output terminal 522, and a control terminal coupled to the controller 633 used for controlling current conduction or cutoff between the first and second terminals of switch 635. The driving output terminal 531 is connected to the filtering output terminal 521, and the driving output terminal 532 is connected to an end of the inductor 636, which has another end connected to the first terminal of switch 635. The capacitor 637 is coupled between the driving output terminals 531 and 532 to stabilize the voltage between the driving output terminals 531 and 532. The freewheeling diode 634 has a cathode connected to the driving output terminal 531.

Next, a description follows as to an exemplary operation of the driving circuit 630.

The controller 633 is configured for determining when to turn the switch 635 on (in a conducting state) or off (in a cutoff state) according to a current detection signal S535 and/or a current detection signal S531. For example, in some embodiments, the controller 633 is configured to control the duty cycle of switch 635 being on and switch 635 being off in order to adjust the size or magnitude of the lamp driving signal. The current detection signal S535 represents the magnitude of current through the switch 635. The current detection signal S531 represents the magnitude of current through the LED module coupled between the driving output terminals 531 and 532. The controller 633 may control the duty cycle of the switch 635 being on and off, based on, for example, a magnitude of a current detected based on current detection signal S531 or S535. As such, when the magnitude is above a threshold, the switch may be off (cutoff state) for more time, and when magnitude goes below the threshold, the switch may be on (conducting state) for more time. According to any of current detection signal S535 or current detection signal S531, the controller 633 can obtain information on the magnitude of power converted by the conversion circuit. When the switch 635 is switched on, a current of a filtered signal is input through the filtering output terminal 521, and then flows through the capacitor 637, the driving output terminal 531, the LED module, the inductor 636, and the switch 635, and then flows out from the filtering output terminal 522. During this flowing of current, the capacitor 637 and the inductor 636 are performing storing of energy. On the other hand, when the switch 635 is switched off, the capacitor 637 and the inductor 636 perform releasing of stored energy by a current flowing from the freewheeling diode 634 to the driving output terminal 531 to make the LED module continuing to emit light.

In some embodiments, the capacitor 637 is an optional element, so it can be omitted and is thus depicted in a dotted line in FIG. 9B. In some application environments, the natural characteristic of an inductor to oppose instantaneous change in electric current passing through the inductor may be used to achieve the effect of stabilizing the current through the LED module, thus omitting the capacitor 637. It should be noted that, according to some embodiments that utilize the non-isolating driving circuit for performing power conversion, which means there is no transformer in the driving circuit, the switch 635 is capable of being controlled by detecting the magnitude of the current flowing through the switch 635 (e.g., the current detection signal S535). In some embodiments where the isolating driving circuit is utilized for performing power conversion, due to the LED module and the controller being isolated by a transformer, the switch 635 can merely be controlled by detecting the magnitude of the current flowing through the LED module (e.g., the current detection signal S531). In some embodiments where the isolating driving circuit is adopted, a detection resistor (not shown) is required for detecting current flowing through the LED module, and a photo-coupler (not shown) is required for transmitting the detection result to the controller 633 at the primary side as the basis for controlling the switch 635.

As described above, because the driving circuit 630 is configured for determining when to turn a switch 635 on (in a conducting state) or off (in a cutoff state) according to a current detection signal S535 and/or a current detection signal S531, the driving circuit 630 can maintain a stable current flow through the LED module. Therefore, the color temperature will not change with the current for some LED modules, such as white, red, blue, or green LED modules. For example, an LED can retain the same color temperature under different illumination conditions. In some embodiments, because the inductor 636 playing the role of the energy-storing circuit releases the stored power when the switch 635 cuts off, the voltage/current flowing through the LED module remains above a predetermined voltage/current level so that the LED module may continue to emit light maintaining the same color temperature. In this way, when the switch 635 conducts again, the voltage/current flowing through the LED module does not need to be adjusted to go from a minimum value to a maximum value. Accordingly, problems of flickering in the LED module can be avoided, the entire illumination can be improved, the lowest conducting period can be smaller, and the driving frequency can be higher.

Figure 9C:
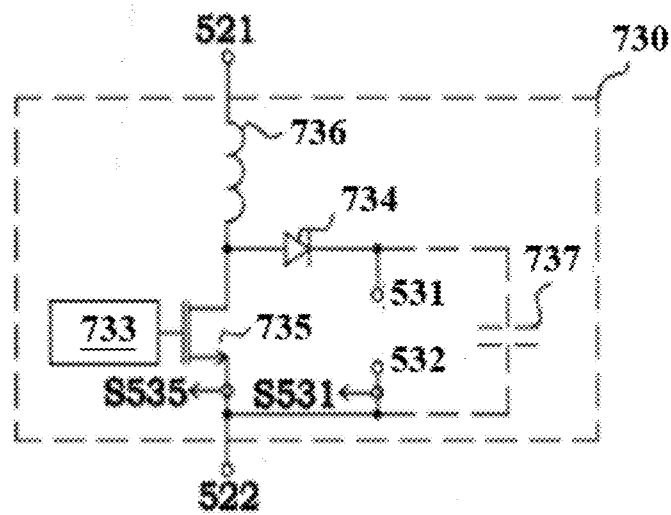

FIG. 9C is a schematic diagram of the driving circuit according to an embodiment of the present disclosure. Referring to FIG. 9C, a driving circuit 730 in this embodiment comprises a boost DC-to-DC converter circuit having a controller 733 and a converter circuit. The converter circuit includes an inductor 736, a diode 734 for "freewheeling" of current, a capacitor 737, and a switch 735. The driving circuit 730 is configured to receive and then convert a filtered signal from the filtering output terminals 521 and 522 into a lamp driving signal for driving an LED module coupled between the driving output terminals 531 and 532.

The inductor 736 has an end connected to the filtering output terminal 521, and another end connected to the anode of freewheeling diode 734 and a first terminal of the switch 735, which has a second terminal connected to the filtering output terminal 522 and the driving output terminal 532. The freewheeling diode 734 has a cathode connected to the driving output terminal 531. And the capacitor 737 is coupled between the driving output terminals 531 and 532.

The controller 733 is coupled to a control terminal of switch 735, and is configured for determining when to turn the switch 735 on (in a conducting state) or off (in a cutoff state), according to a current detection signal S535 and/or a current detection signal S531. When the switch 735 is switched on, a current of a filtered signal is input through the filtering output terminal 521, and then flows through the inductor 736 and the switch 735, and then flows out from the filtering output terminal 522. During this flowing of current, the current through the inductor 736 increases with time, with the inductor 736 being in a state of storing energy, while the capacitor 737 enters a state of releasing energy, making the LED module continuing to emit light. On the other hand, when the switch 735 is switched off, the inductor 736 enters a state of releasing energy as the current through the inductor 736 decreases with time. In this state, the current through the inductor 736 then flows through the freewheeling diode 734, the capacitor 737, and the LED module, while the capacitor 737 enters a state of storing energy.

In some embodiments, the capacitor 737 is an optional element, so it can be omitted and is thus depicted as a dotted line in FIG. 9C. When the capacitor 737 is omitted and the switch 735 is switched on, the current of inductor 736 does not flow through the LED module, making the LED module not emit light; but when the switch 735 is switched off, the current of inductor 736 flows through the freewheeling diode 734 to reach the LED module, making the LED module emit light. Therefore, by controlling the time that the LED module emits light, and the magnitude of current through the LED module, the average luminance of the LED module can be stabilized to be above a defined value, thus also achieving the effect of emitting a steady light. It should be noted that, according to some embodiments that utilize the non-isolating driving circuit for performing power conversion, which means there is no transformer in the driving circuit, the switch 735 is capable of being controlled by detecting the magnitude of the current flowing through the switch 735 (e.g., the current detection signal S535). In some embodiments where the isolating driving circuit is utilized for performing power conversion, due to the LED module and the controller being isolated by a transformer, the magnitude of the current flowing through the switch 735 cannot be used as a reference for controlling the switch 735.

For detecting magnitude of current flowing through the switch 735, a detection resistor (not shown) may be disposed between the switch 735 and the second filtering output terminal 522, according to some embodiments of the present disclosure. When the switch 735 is conducting, current flowing through the detection resistor will cause a voltage difference across two terminals of the detection resistor, so using or sending current detection signal S535 to control the controller 733 can be based on the voltage across the detection resistor, namely the voltage difference between the two terminals of the detection resistor. However, at the instant that the LED tube lamp is powered up or is struck by lightning, for example, a relatively large current (as high as 10 A or above) is likely to occur on a circuit loop on the switch 735 that may damage the detection resistor and the controller 733. Therefore, in some embodiments, the driving circuit 730 may further include a clamping component, which is connected to the detection resistor. The clamping component performs a clamping operation on the circuit loop of the detection resistor when a current flowing through the detection resistor or the voltage difference across the detection resistor exceeds a threshold value, so as to limit a current to flow through the detection resistor. In some embodiments, the clamping component may comprise for example a plurality of diodes connected in series and the diode series are connected in parallel with the detection resistor. In such a configuration, when a large current occurs on a circuit loop on the switch 735, the diode series in parallel with the detection resistor will quickly conduct current, so as to limit a voltage across the detection resistor to a specific voltage level. For example, if the diode series comprises 5 diodes, since the forward bias voltage of a diode is about 0.7 V, the diode series can clamp the voltage across the detection resistor to be about 3.5 V.

As described above, because the controller 733 included in the driving circuit 730 is coupled to the control terminal of switch 735, and is configured for determining when to turn a switch 735 on (in a conducting state) or off (in a cutoff state), according to a current detection signal S535 and/or a current detection signal S531, the driving circuit 730 can maintain a stable current flow through the LED module. Therefore, the color temperature may not change with the current for some LED modules, such as white, red, blue, or green LED modules. For example, an LED can retain the same color temperature under different illumination conditions. In some embodiments, because the inductor 736 acting as the energy-storing circuit releases the stored power when the switch 735 cuts off, the voltage/current flowing through the LED module remains above a predetermined voltage/current level so that the LED module may continue to emit light maintaining the same color temperature. In this way, when the switch 735 conducts again, the voltage/current flowing through the LED module does not need to be adjusted to go from a minimum value to a maximum value. Accordingly, the problem of flickering in the LED module can be avoided, the entire illumination can be improved, the lowest conducting period can be smaller, and the driving frequency can be higher.

Figure 9D:
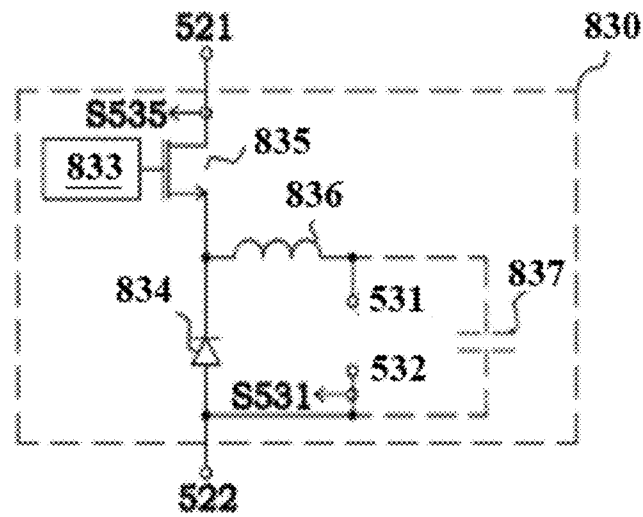

FIG. 9D is a schematic diagram of the driving circuit according to an exemplary embodiment of the present disclosure. Referring to FIG. 9D, a driving circuit 830 in this embodiment comprises a buck DC-to-DC converter circuit having a controller 833 and a conversion circuit. The conversion circuit includes an inductor 836, a diode 834 for "freewheeling" of current, a capacitor 837, and a switch 835. The driving circuit 830 is coupled to the filtering output terminals 521 and 522 to receive and then convert a filtered signal into a lamp driving signal for driving an LED module connected between the driving output terminals 531 and 532.

The switch 835 has a first terminal coupled to the filtering output terminal 521, a second terminal coupled to the cathode of freewheeling diode 834, and a control terminal coupled to the controller 833 to receive a control signal from the controller 833 for controlling current conduction or cutoff between the first and second terminals of the switch 835. The anode of freewheeling diode 834 is connected to the filtering output terminal 522 and the driving output terminal 532. The inductor 836 has an end connected to the second terminal of switch 835, and another end connected to the driving output terminal 531. The capacitor 837 is coupled between the driving output terminals 531 and 532 to stabilize the voltage between the driving output terminals 531 and 532.

The controller 833 is configured for controlling when to turn the switch 835 on (in a conducting state) or off (in a cutoff state) according to a current detection signal S535 and/or a current detection signal S531. When the switch 835 is switched on, a current of a filtered signal is input through the filtering output terminal 521, and then flows through the switch 835, the inductor 836, and the driving output terminals 531 and 532, and then flows out from the filtering output terminal 522. During this flowing of current, the current through the inductor 836 and the voltage of the capacitor 837 both increase with time, so the inductor 836 and the capacitor 837 are in a state of storing energy. On the other hand, when the switch 835 is switched off, the inductor 836 is in a state of releasing energy and thus the current through it decreases with time. In this case, the current through the inductor 836 circulates through the driving output terminals 531 and 532, the freewheeling diode 834, and back to the inductor 836.

In some embodiments the capacitor 837 is an optional element, so it can be omitted and is thus depicted as a dotted line in FIG. 9D. When the capacitor 837 is omitted, no matter whether the switch 835 is turned on or off, the current through the inductor 836 will flow through the driving output terminals 531 and 532 to drive the LED module to continue emitting light. It should be noted that, according to some embodiments that utilize the non-isolating driving circuit for performing power conversion, which means there is no transformer in the driving circuit, the switch 835 is capable of being controlled by detecting the magnitude of the current flowing through the switch 835 (e.g., the current detection signal S535). In some embodiments where the isolating driving circuit is utilized for performing power conversion, due to the LED module and the controller being isolated by a transformer, the magnitude of the current flowing through the switch 835 cannot be used as a reference for controlling the switch 835.

As described above, because the controller 833 included in the driving circuit 830 is configured for controlling when to turn a switch 835 on (in a conducting state) or off (in a cutoff state) according to a current detection signal S535 and/or a current detection signal S531, the driving circuit 830 can maintain a stable current flow through the LED module. Therefore, the color temperature may not change with the current for some LED modules, such as white, red, blue, or green LED modules. For example, an LED can retain the same color temperature under different illumination conditions. In some embodiments, because the inductor 836 acting as the energy-storing circuit releases the stored power when the switch 835 cuts off, the voltage/current flowing through the LED module remains above a predetermined voltage/current level so that the LED module may continue to emit light maintaining the same color temperature. In this way, when the switch 835 conducts again, the voltage/current flowing through the LED module does not need to be adjusted to go from a minimum value to a maximum value. Accordingly, the problem of flickering in the LED module can be avoided, the entire illumination can be improved, the lowest conducting period can be smaller, and the driving frequency can be higher.

Figure 9E:
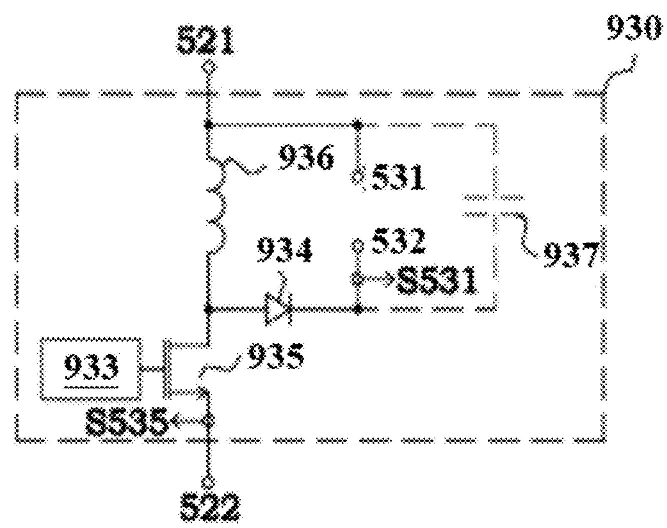

FIG. 9E is a schematic diagram of the driving circuit according to an exemplary embodiment of the present disclosure. Referring to FIG. 9E, a driving circuit 930 in this embodiment comprises a buck DC-to-DC converter circuit having a controller 933 and a conversion circuit. The conversion circuit includes an inductor 936, a diode 934 for "freewheeling" of current, a capacitor 937, and a switch 935. The driving circuit 930 is coupled to the filtering output terminals 521 and 522 to receive and then convert a filtered signal into a lamp driving signal for driving an LED module connected between the driving output terminals 531 and 532.

The inductor 936 has an end connected to the filtering output terminal 521 and the driving output terminal 532, and another end connected to a first end of the switch 935. The switch 935 has a second end connected to the filtering output terminal 522, and a control terminal connected to controller 933 to receive a control signal from controller 933 for controlling current conduction or cutoff of the switch 935. The freewheeling diode 934 has an anode coupled to a node connecting the inductor 936 and the switch 935, and a cathode coupled to the driving output terminal 531. The capacitor 937 is coupled to the driving output terminals 531 and 532 to stabilize the driving of the LED module coupled between the driving output terminals 531 and 532.

The controller 933 is configured for controlling when to turn the switch 935 on (in a conducting state) or off (in a cutoff state) according to a current detection signal S531 and/or a current detection signal S535. When the switch 935 is turned on, a current is input through the filtering output terminal 521, and then flows through the inductor 936 and the switch 935, and then flows out from the filtering output terminal 522. During this flowing of current, the current through the inductor 936 increases with time, so the inductor 936 is in a state of storing energy; but the voltage of the capacitor 937 decreases with time, so the capacitor 937 is in a state of releasing energy to keep the LED module continuing to emit light. On the other hand, when the switch 935 is turned off, the inductor 936 is in a state of releasing energy and its current decreases with time. In this case, the current through the inductor 936 circulates through the freewheeling diode 934, the driving output terminals 531 and 532, and back to the inductor 936. During this circulation, the capacitor 937 is in a state of storing energy and its voltage increases with time.

In some embodiments the capacitor 937 is an optional element, so it can be omitted and is thus depicted as a dotted line in FIG. 10D. When the capacitor 937 is omitted and the switch 935 is turned on, the current through the inductor 936 doesn't flow through the driving output terminals 531 and 532, thereby making the LED module not emit light. On the other hand, when the switch 935 is turned off, the current through the inductor 936 flows through the freewheeling diode 934 and then the LED module to make the LED module emit light. Therefore, by controlling the time that the LED module emits light, and the magnitude of current through the LED module, the average luminance of the LED module can be stabilized to be above a defined value, thus also achieving the effect of emitting a steady light. It should be noted that, according to some embodiments that utilize the non-isolating driving circuit for performing power conversion, which means there is no transformer in the driving circuit, the switch 935 is capable of being controlled by detecting the magnitude of the current flowing through the switch 935 (e.g., the current detection signal S535). In some embodiments where the isolating driving circuit is utilized for performing power conversion, due to the LED module and the controller being isolated by a transformer, the magnitude of the current flowing through the switch 935 cannot be used as a reference for controlling the switch 935.

As described above, because the controller 933 included in the driving circuit 930 is configured for controlling when to turn a switch 935 on (in a conducting state) or off (in a cutoff state) according to a current detection signal S535 and/or a current detection signal S531, the driving circuit 930 can maintain a stable current flow through the LED module. Therefore, the color temperature may not change with the current for some LED modules, such as white, red, blue, or green LED modules. For example, an LED can retain the same color temperature under different illumination conditions. In some embodiments, because the inductor 936 acting as the energy-storing circuit releases the stored power when the switch 935 cuts off, the voltage/current flowing through the LED module remains above a predetermined voltage/current level so that the LED module may continue to emit light maintaining the same color temperature. In this way, when the switch 935 conducts again, the voltage/current flowing through the LED module does not need to be adjusted to go from a minimum value to a maximum value. Accordingly, the problem of flickering in the LED module can be avoided, the entire illumination can be improved, the lowest conducting period can be smaller, and the driving frequency can be higher.

With reference back to FIGS. 3A and 3B, a short circuit board 253 includes a first short circuit substrate and a second short circuit substrate respectively connected to two terminal portions of a long circuit sheet 251, and electronic components of the power supply module are respectively disposed on the first short circuit substrate and the second short circuit substrate, according to some embodiments of the present disclosure. In some embodiments, the first short circuit substrate and the second short circuit substrate may have roughly the same length, or different lengths. In general, the first short circuit substrate (i.e. the right circuit substrate of short circuit board 253 in FIG. 3A and the left circuit substrate of short circuit board 253 in FIG. 3B) has a length that is about 30%-80% of the length of the second short circuit substrate (i.e. the left circuit substrate of short circuit board 253 in FIG. 3A and the right circuit substrate of short circuit board 253 in FIG. 3B). In some embodiments the length of the first short circuit substrate is about ⅓-⅔ of the length of the second short circuit substrate. In an exemplary embodiment, the length of the first short circuit substrate may be about half the length of the second short circuit substrate. The length of the second short circuit substrate may be, in some embodiments in the range of about 15 mm to about 65 mm, depending on actual application occasions. In certain embodiments, the first short circuit substrate is disposed in an end cap at an end of the LED tube lamp, and the second short circuit substrate is disposed in another end cap at the opposite end of the LED tube lamp.

In some embodiments, capacitors of the driving circuit, such as the capacitors 637, 737, 837, and 937 in FIGS. 9B-9E, in practical use may include two or more capacitors connected in parallel. Some or all capacitors of the driving circuit in the power supply module may be arranged on the first short circuit substrate of short circuit board 253, while other components such as the rectifying circuit, filtering circuit, inductor(s) of the driving circuit, controller(s), switch(es), diodes, etc. are arranged on the second short circuit substrate of short circuit board 253. Since the inductors, controllers, switches, etc. are electronic components with higher temperature, arranging some or all capacitors on a circuit substrate separate or away from the circuit substrate (s) of high-temperature components helps prevent the working life of capacitors (especially electrolytic capacitors) from being negatively affected by the high-temperature components, thus improving the reliability of the capacitors. Further, the physical separation between the capacitors and both the rectifying circuit and filtering circuit also contributes to reducing the problem of EMI.

In some embodiments, components of the driving circuit (such as 1530) that are liable to have relatively higher temperature or overheat are disposed at one end of the LED tube lamp, or a first end of the LED tube lamp, and are disposed for example in an end cap at the first end; and the rest of components of the driving circuit are disposed at the other end of the LED tube lamp, or a second end of the LED tube lamp. In this case, for an LED lamp system of a plurality of LED lamp tubes, the plurality of LED lamp tubes may be connected in series wherein the first end of each of the LED lamp tubes is connected to the second end of one of the other LED lamp tubes, so that components of the LED lamp system that are liable to have relatively higher temperature and disposed at the first end of each of the plurality of LED lamp tubes are evenly distributed along the connected LED lamp tubes, as the components are spaced apart by at least the length of each LED lamp tube. Therefore, the drawback of concentrating the components that are liable to have relatively higher temperature at a specific position along the connected LED lamp tubes, or concentrating heat generated by the components, is avoided by this way of even distribution, and thus the overall lighting efficiency of the LED lamp system is not negatively affected by this drawback.

In certain exemplary embodiments, the conversion efficiency of the driving circuits is above 80%. In some embodiments, the conversion efficiency of the driving circuits is above 90%. In still other embodiments, the conversion efficiency of the driving circuits is above 92%. In some embodiments, the illumination efficiency of the LED lamps is above 120 lm/W. In some embodiments, the illumination efficiency of the LED lamps is above 160 lm/W. In some embodiments, the illumination efficiency including the combination of the driving circuits and the LED modules is above 120 lm/W*90%=108 lm/W. In some embodiments, the illumination efficiency including the combination of the driving circuits and the LED modules is above 160 lm/W*92%=147.21 lm/W.

In some embodiments, the transmittance of the diffusion film in the LED tube lamp is above 85%. As a result, in certain embodiments, the illumination efficiency of the LED lamps is above 108 lm/W*85%=91.8 lm/W. In some embodiments, the illumination efficiency of the LED lamps is above 147.21 lm/W*85%=125.12 lm/W.

Figure 11A:
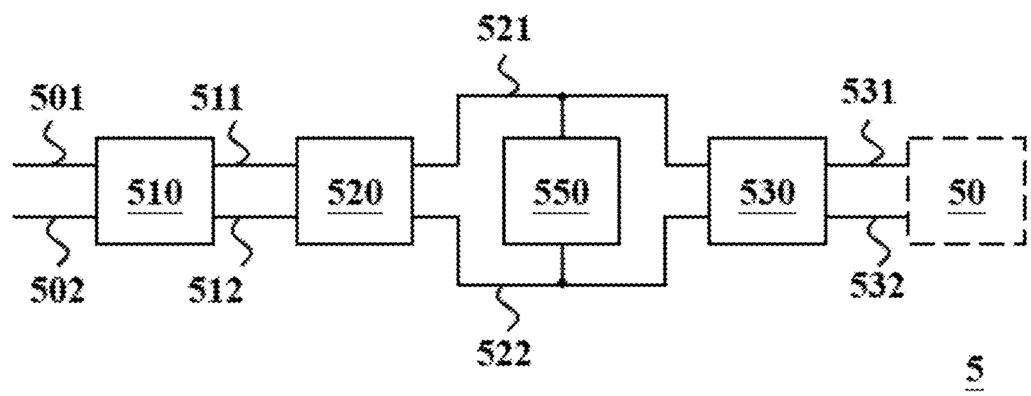
FIGS. 11A and 11B are block diagrams of exemplary power supply modules in an LED tube lamp according to some exemplary embodiments.

FIG. 11A is a block diagram of a power supply module in an LED tube lamp according to an exemplary embodiment of the present disclosure. Compared to that shown in FIG. 5A, the power supply module 5 of the present embodiment comprises a rectifying circuit 510, a filtering circuit 520, and a driving circuit 1530, and further comprises an over voltage protection (OVP) circuit 1570. In this embodiment, a driving circuit 530 and an LED module 50 compose the LED lighting module 530. The OVP circuit 1570 is coupled to the filtering output terminals 521 and 522 for detecting the filtered signal. The OVP circuit 1570 clamps the logic level of the filtered signal when determining the logic level thereof higher than a defined OVP value. Hence, the OVP circuit 1570 protects the LED lighting module 530 from damage due to an OVP condition.

Figure 11B:
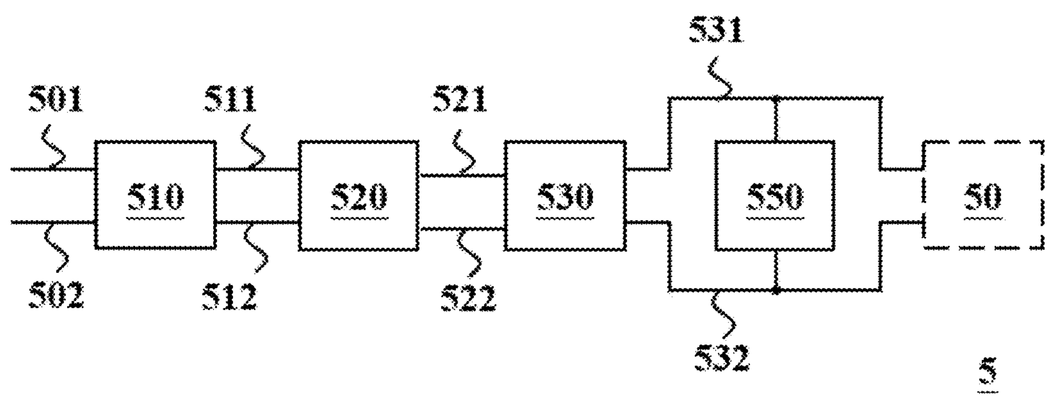

FIG. 11B is a block diagram of a power supply module in an LED tube lamp 500 according to an exemplary embodiment of the present disclosure. The power supply module 5 in this embodiment of FIG. 11B is similar to that in the embodiment of FIG. 11A, with a difference that the OVP circuit 550 of FIG. 15B is disposed between the driving circuit 530 and the LED module 50, wherein the OVP circuit 550 of FIG. 15B is coupled to first and second driving output terminals 531 and 532 of the driving circuit 530 for detecting a driving signal. The OVP circuit 550 of FIG. 15B is configured to clamp the level of the driving signal when determining that the level is higher than a defined OVP value. Hence, the OVP circuit 550 protects the LED module 50 of FIG. 15B from damages due to an OVP condition.

Figure 11C:
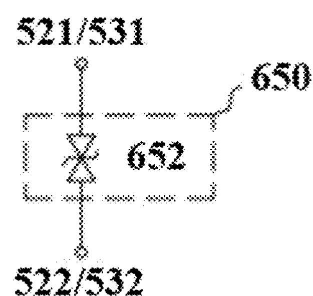
FIG. 11C is a schematic diagram of an over-voltage protection (OVP) circuit according to some exemplary embodiments.

FIG. 11C is a schematic diagram of an overvoltage protection (OVP) circuit according to an exemplary embodiment. An OVP circuit 650 comprises a voltage clamping diode 652, such as zener diode, coupled to the filtering output terminals 521 and 522 (as shown in FIG. 11A), or coupled to the driving output terminals 531 and 532 (as shown in FIG. 11B). Taking its connection as shown in FIG. 11A as an example, the voltage clamping diode 652 is conducted to clamp a voltage difference at a breakdown voltage when the voltage difference of the filtering output terminals 521 and 522 (i.e., the logic level of the filtered signal) reaches the breakdown voltage. In some embodiments, the breakdown voltage may be in a range of about 40 V to about 100 V. In certain embodiments, the breakdown voltage may be in a range of about 55 V to about 75V.

Figure 12A:
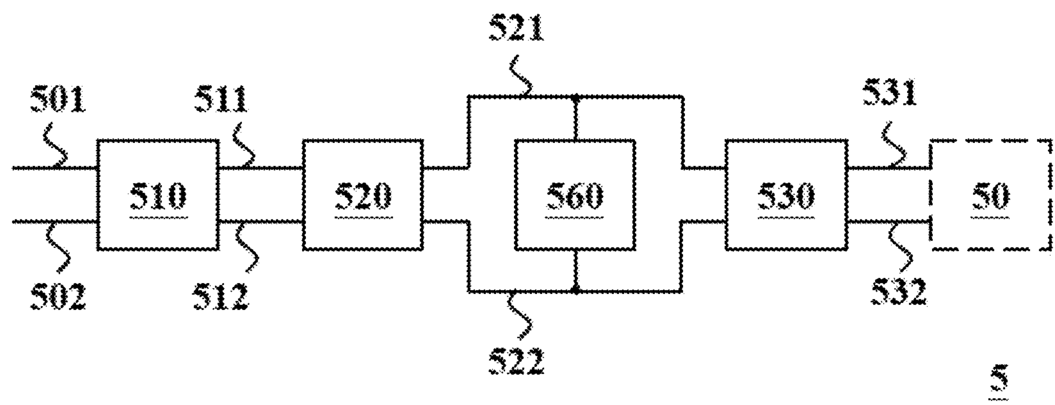
FIGS. 12A and 12B are block diagrams of power supply modules in an LED tube lamp according to some exemplary embodiments.

FIG. 12A is a block diagram of a power supply module in an LED tube lamp according to an exemplary embodiment. Compared to that shown in FIG. 5A, the power supply module 5 of FIG. 12A comprises a rectifying circuit 510, a filtering circuit 520, and a driving circuit 530, and further comprises an auxiliary power module 560. The auxiliary power module 560 is coupled between the filtering output terminals 521 and 522. The auxiliary power module 560 detects the filtered signal in the filtering output terminals 521 and 522, and determines whether to provide an auxiliary power to the filtering output terminals 521 and 522 based on the detected result. When the supply of the filtered signal is stopped or a logic level (i.e., a voltage) thereof is insufficient, i.e., when a drive voltage for the LED module is below a defined voltage, the auxiliary power module provides auxiliary power to keep the LED module 50 continuing to emit light. The defined voltage is determined according to an auxiliary power voltage of the auxiliary power module 560.

Figure 12B:
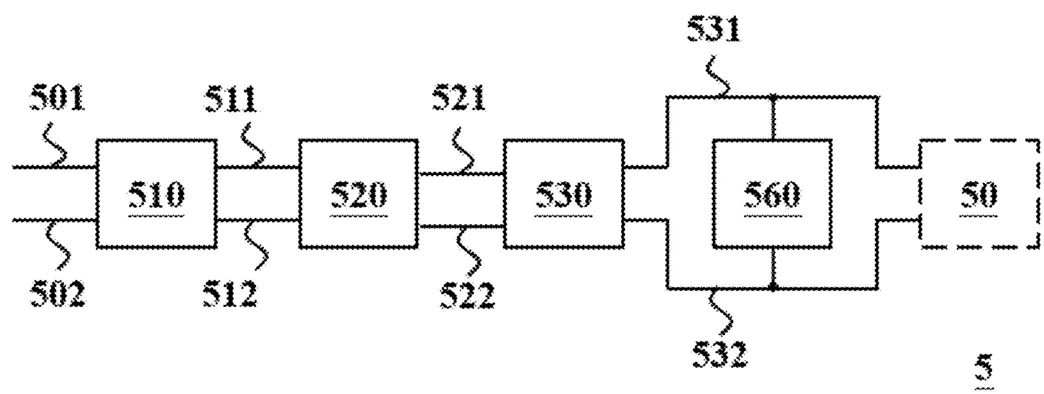

FIG. 12B is a block diagram of a power supply module in an LED tube lamp according to an exemplary embodiment. Compared to that shown in FIG. 12A, the auxiliary power module 560 is coupled between the driving output terminals 531 and 532. The auxiliary power module 560 detects the lamp driving signal in the driving output terminals 531 and 532, and determines whether to provide an auxiliary power to the driving output terminals 531 and 532 based on the detected result. When the lamp driving signal is no longer being supplied or a logic level thereof is insufficient, the auxiliary power module 560 provides the auxiliary power to keep the LED module 50 continuously lighting.

In an exemplary embodiment of FIG. 12A, an energy storage unit of the auxiliary power module 560 can be implemented by a supercapacitor (e.g., electric double-layer capacitor, EDLC). In such an embodiment, since the supercapacitor provides the filtering function which is the same as the filtering circuit 520, the filtering circuit 520 can be omitted in this embodiment.

In another exemplary embodiment, the LED module 50 can be driven merely by the auxiliary power provided by the auxiliary power module 560, and the external driving signal is merely used for charging the auxiliary power module 560. Since such an embodiment applies the auxiliary power provided by the auxiliary power module 560 as the only power source for the LED module 50, regardless of whether the external driving signal is provided by commercial electricity, the external driving signal charges the energy storage unit first, and then the energy storage unit is used for supplying power to the LED module. Accordingly, the LED tube lamp applying said power architecture may be compatible with the external driving signal provided by commercial electricity.

From the perspective of the structure, since the auxiliary power module 560 is connected between the outputs of the filtering circuit 520 (i.e., the first filtering output 521 and the second filtering output 522) or the outputs of the driving circuit 530 (i.e., the first driving output terminal 531 and the second driving output terminal 532), the circuit components of the auxiliary power module 560 can be placed, in an exemplary embodiment, in the lamp tube (e.g., the position adjacent to the driving circuit 530 or LED module 50 and between the two end caps), such that the power transmission loss caused by the long wiring can be avoided. In another exemplary embodiment, the circuit components of the auxiliary power can be placed in at least one of the end caps, such that the heat generated by the auxiliary power module 560 when charging and discharging does not affect operation and illumination of the LED module.

Figure 12C:
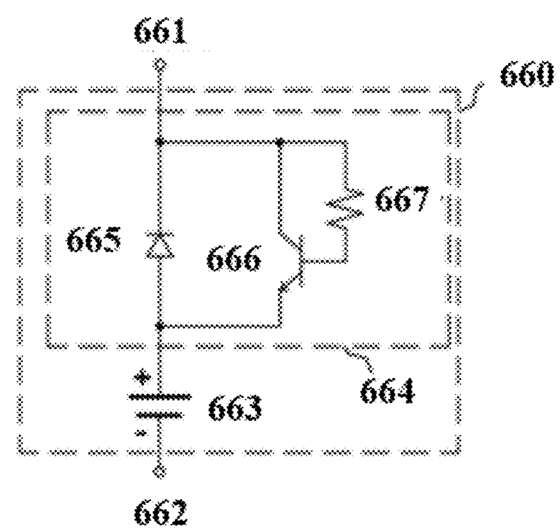
FIG. 12C is a schematic diagram of an auxiliary power module according to some exemplary embodiments.

FIG. 12C is a schematic diagram of an auxiliary power module according to an embodiment. The auxiliary power module 660 can be applied, for example, to the configuration of the auxiliary power module 560 illustrated in FIG. 12B. The auxiliary power module 660 comprises an energy storage unit 663 and a voltage detection circuit 664. The auxiliary power module 660 further comprises an auxiliary power positive terminal 661 and an auxiliary power negative terminal 662 for being respectively coupled to the filtering output terminals 521 and 522 or the driving output terminals 531 and 532. The voltage detection circuit 664 detects a logic level of a signal at the auxiliary power positive terminal 661 and the auxiliary power negative terminal 662 to determine whether to release or not to release outward the power of the energy storage unit 663 through the auxiliary power positive terminal 661 and the auxiliary power negative terminal 662.

In some embodiments, the energy storage unit 663 is a battery or a supercapacitor. When a voltage difference of the auxiliary power positive terminal 661 and the auxiliary power negative terminal 662 (the drive voltage for the LED module) is higher than the auxiliary power voltage of the energy storage unit 663, the voltage detection circuit 664 charges the energy storage unit 663 by the signal in the auxiliary power positive terminal 661 and the auxiliary power negative terminal 662. When the drive voltage is lower than the auxiliary power voltage, the energy storage unit 663 releases the stored energy outward through the auxiliary power positive terminal 661 and the auxiliary power negative terminal 662.

The voltage detection circuit 664 comprises a diode 665, a bipolar junction transistor (BJT) 666 and a resistor 667, according to some embodiments. A positive end of the diode 665 is coupled to a positive end of the energy storage unit 663 and a negative end of the diode 665 is coupled to the auxiliary power positive terminal 661. The negative end of the energy storage unit 663 is coupled to the auxiliary power negative terminal 662. A collector of the BJT 666 is coupled to the auxiliary power positive terminal 661, and an emitter thereof is coupled to the positive end of the energy storage unit 663. One end of the resistor 667 is coupled to the auxiliary power positive terminal 661 and the other end is coupled to a base of the BJT 666. When the collector of the BJT 666 is a cut-in voltage higher than the emitter thereof, the resistor 667 conducts the BJT 666. When the power source provides power to the LED tube lamp normally, the energy storage unit 663 is charged by the filtered signal through the filtering output terminals 521 and 522 and the conducted BJT 666 or by the lamp driving signal through the driving output terminals 531 and 532 and the conducted BJT 666 until that the collector-emitter voltage of the BJT 666 is lower than or equal to the cut-in voltage. When the filtered signal or the lamp driving signal is no longer being supplied or the logic level thereof is insufficient, the energy storage unit 663 provides power through the diode 665 to keep the LED module 50 continuously lighting.

In some embodiments, the maximum voltage of the charged energy storage unit 663 is at least one cut-in voltage of the BJT 666 lower than the voltage difference applied between the auxiliary power positive terminal 661 and the auxiliary power negative terminal 662. The voltage difference provided between the auxiliary power positive terminal

661 and the auxiliary power negative terminal 662 is a turn-on voltage of the diode 665 lower than the voltage of the energy storage unit 663. Hence, when the auxiliary power module 660 provides power, the voltage applied at the LED module 50 is lower (about the sum of the cut-in voltage of the BJT 666 and the turn-on voltage of the diode 665). In the embodiment shown in the FIG. 12B, the brightness of the LED module 50 is reduced when the auxiliary power module supplies power thereto. Thereby, when the auxiliary power module is applied to an emergency lighting system or a constant lighting system, the user realizes the main power supply, such as commercial power, is abnormal and then performs necessary precautions therefor.

In addition to utilizing the embodiments illustrated in FIG. 12A to FIG. 12C in a single tube lamp architecture for emergency power supply, the embodiments also can be utilized in a lamp module including a multi tube lamp. Taking the lamp module having four parallel arranged LED tube lamps as an example, in an exemplary embodiment, one of the LED tube lamps includes the auxiliary power module. When the external driving signal is abnormal, the LED tube lamp including the auxiliary power module is continuously lighted up and the others LED tube lamps go off. According to the consideration of the uniformity of illumination, the LED tube lamp having the auxiliary power module can be arranged in the middle position of the lamp module.

In another exemplary embodiment, a plurality of the LED tube lamps respectively include the auxiliary power module. When the external driving signal is abnormal, the LED tube lamps including the auxiliary power module are continuously lighted up and the other LED tube lamps (if any) go off. In this way, even if the lamp module is operated in an emergency situation, a certain brightness can still be provided for the lamp module. In addition, if there are two LED lamps that have the auxiliary power module, the LED tube lamps having the auxiliary power module can be arranged, according to the consideration of the uniformity of illumination, in a staggered way with the LED tube lamps that don't have the auxiliary power module.

In still another exemplary embodiment, a plurality of the LED tube lamps respectively include the auxiliary power module. When the external driving signal is abnormal, part of the LED tube lamps including the auxiliary power module is first lighted up by the auxiliary power, and the other part of the LED tube lamps including the auxiliary power module is then lighted up by the auxiliary power after a predetermined period. In this way, the lighting time of the lamp module can be extended during the emergency situation by coordinating the auxiliary power supply sequence of the LED tube lamps.

The embodiment of coordinating the auxiliary power supply sequence of the LED tube lamps can be implemented by setting different start-up time for the auxiliary power module disposed in different tube lamp, or by disposing a controller in each tube lamp for communicating the operation state of each auxiliary power module. The present invention is not limited thereto.

Figure 12D:
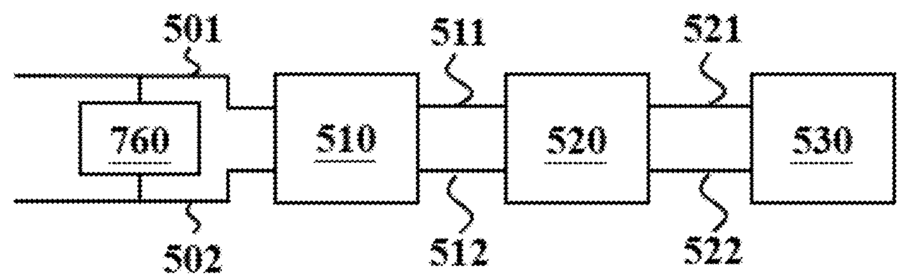
FIG. 12D is a block diagram of an exemplary power supply module in an LED tube lamp according to some exemplary embodiments.

FIG. 12D is a block diagram of a power supply module in an LED tube lamp according to an exemplary embodiment. Referring to FIG. 12D, the power supply module 5 of FIG. 12D includes a rectifying circuit 510, a filtering circuit 520, a driving circuit 530, and an auxiliary power module 760, according to one embodiment. Compared to the embodiment of FIG. 12B, the auxiliary power module 760 of FIG. 12D is connected between the pins 501 and 502 to receive the external driving signal and perform a charge-discharge operation based on the external driving signal, according to some embodiments.

In some embodiments, the operation of the auxiliary power module 760 can be compared to an Off-line uninterruptible power supply (Off-line UPS). Normally, when an AC power source (e.g., the mains electricity, the commercial electricity or the power grid) supplies the external driving signal to the LED tube lamp, the external driving signal is supplied to the rectifying circuit 510 while charging the auxiliary power module 760. Once the AC power source is unstable or abnormal, the auxiliary power module 760 takes the place of the AC power source to supply power to the rectifying circuit 510 until the AC power source recovers normal power supply. As such, the auxiliary power module 760 can operate in a backup manner by the auxiliary power module 760 interceding on behalf of the power supply process when the AC power source is unstable or abnormal. Herein, the power supplied by the auxiliary power module 760 can be an AC power or a DC power.

In some embodiments, the current path between the AC power source and the rectifying circuit 510 is cut off when the AC power source is unstable or abnormal. For example, the unstable AC power source may originate from at least one of the voltage variation, the current variation, and the frequency variation of the external driving signal exceeding a threshold. The abnormal AC power source may be caused by at least one of the voltage, the current, and the frequency of the external driving signal being lower or higher than a normal operation range.

The auxiliary power module 760 includes an energy storage unit and a voltage detection circuit, according to some embodiments. The voltage detection circuit detects the external driving signal, and determines whether the energy storage unit provides the auxiliary power to the input terminal of the rectifying circuit 510 according to the detection result. When the external driving signal stops providing or the AC signal level of the external driving signal is insufficient, the energy storage unit of the auxiliary power module 760 provides the auxiliary power, such that the LED module 50 continues to emit light based on the auxiliary power provided by the auxiliary power module 760. In some embodiments, the energy storage unit for providing auxiliary power can be implemented by an energy storage assembly such as a battery or a supercapacitor. However, the energy storage assembly of the auxiliary power module 760 are not limited to the above exemplary embodiments and other energy storage assemblies are contemplated.

Figure 12E:
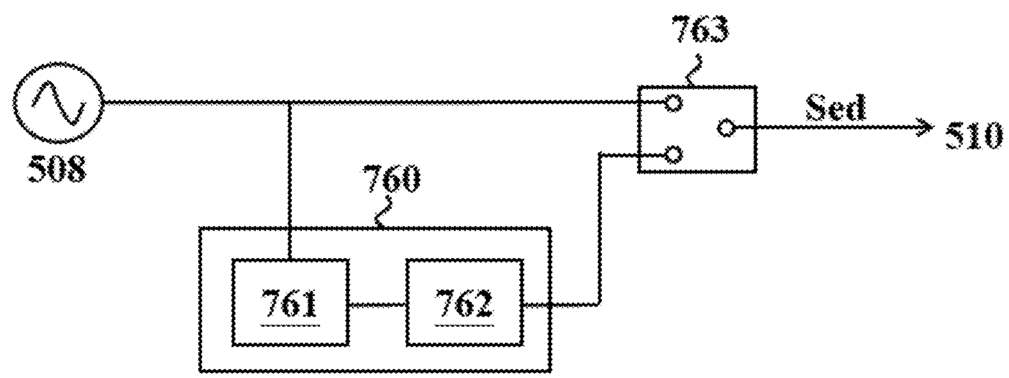
FIG. 12E is a block diagram of an exemplary auxiliary power module according to some exemplary embodiments.

FIG. 12E illustrates an exemplary configuration of the auxiliary power module 760 operating in an Off-line UPS mode according to some embodiments of the present disclosure. Referring to FIG. 12E, the auxiliary power module 760 includes a charging unit 761 and an auxiliary power supply unit 762. The charging unit 761 has an input terminal coupled to an external AC power supply 508 and an output terminal coupled to an input terminal of the auxiliary power supply unit 762. The auxiliary power module 760 further includes a switching unit 763, having terminals connected to the external AC power source 508, an output terminal of the auxiliary power supply unit 762, and an input terminal of the rectifying circuit 510, respectively, according to some embodiments. In operation, depending on the state of power supply by the external AC power source 508, the switching unit 763 is configured to selectively conduct a circuit loop passing through the external AC power supply 508 and the rectifying circuit 510, or conduct a circuit loop passing through the auxiliary power module 760 and the rectifying circuit 510. The auxiliary power supply unit 762 has the input terminal coupled to the output terminal of the charging unit 761 and an output terminal coupled to a power loop between the external AC power supply 508 and the rectifying circuit 510, via the switching unit 763, according to one embodiment. Specifically, when the external AC power supply 508 operates normally, the power, supplied by the external AC power supply 508, will be provided to the input terminal of the rectifying circuit 510 as an external driving signal Sed via the switching unit 763, namely, the switching unit 763 is switched to a state that connects the external AC power supply 508 to the rectifying circuit 510. Meanwhile, the charging unit 761 charges the auxiliary power supply unit 762 based on the power supplied by the external AC power supply 508, but the auxiliary power supply unit 762 does not output power to the rectifying circuit 510 because the external driving signal Sed is correctly transmitted on the power loop. When the external AC power supply 508 is unstable or abnormal, the auxiliary power supply unit 762 starts to supply an auxiliary power, serving as the external driving signal Sed, to the rectifying circuit 510 via the switching unit 763, namely, the switching unit 763 is switched to a state that connects the output terminal of the auxiliary power supply unit 762 to the rectifying circuit 510.

Figure 12F:
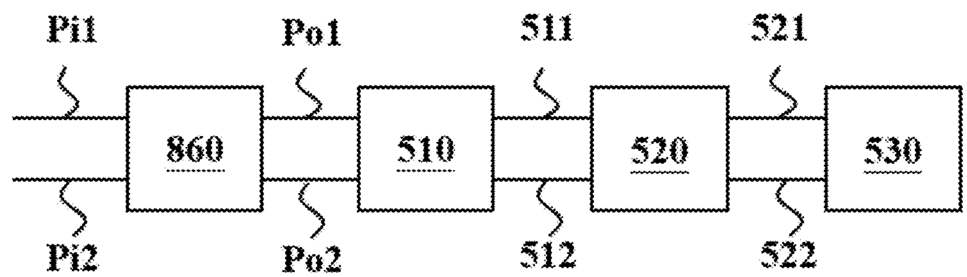
FIG. 12F is a block diagram of an exemplary power supply module in an LED tube lamp according to some exemplary embodiments.

FIG. 12F is a block diagram of a power supply module in an LED tube lamp according to an exemplary embodiment. Referring to FIG. 12F, the power supply module 5 of the present embodiment includes a rectifying circuit 510, a filtering circuit 520, a driving circuit 530 and an auxiliary power module 860 of FIG. 12F. Compared to the embodiment illustrated in FIG. 12D, the input terminals Pi1 and Pi2 of the auxiliary power module 860 are configured to receive an external driving signal and perform a charge-discharge operation based on the external driving signal, and then supply an auxiliary power, generated from the output terminals Po1 and Po2, to the rectifying circuit 510. From the perspective of the structure of the LED tube lamp, the input terminals Pi1 and Pi2 or the output terminals Po1 and Po2 of the auxiliary power module 860 are connected to the pins of the LED tube lamp (e.g., 501 and 502 in FIG. 12A or 12B). If the pins 501 and 502 of the LED tube lamp are connected to the input terminals Pi1 and Pi2 of the auxiliary power module 860, it means the auxiliary power module 860 is disposed inside the LED tube lamp and receives the external driving signal through the pins 501 and 502. On the other hand, if the pins 501 and 502 of the LED tube lamp are connected to the output terminals Po1 and Po2 of the auxiliary power module 860, it means the auxiliary power module 860 is disposed outside the LED tube lamp and outputs the auxiliary power to the rectifying circuit through the pins 501 and 502. The detail structure of the auxiliary power module will be further described in the following embodiments.

In some embodiments, the operation of the auxiliary power module 860 can be similar to an On-line uninterruptible power supply (On-line UPS). Under the On-line UPS operation, the external AC power source would not directly supply power to the rectifying circuit 510, but supplies power through the auxiliary power module 860. Therefore, the external AC power source can be isolated from the LED tube lamp, and the auxiliary power module 860 intervenes the whole power supply process, so that the power supplied to the rectifying circuit 510 is not affected by the unstable or abnormal AC power source.

Figure 12G:
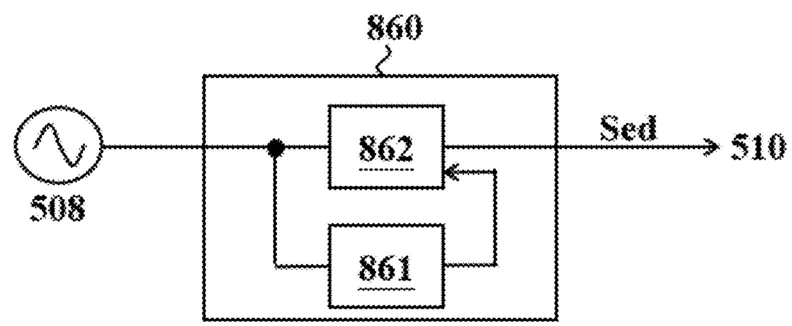
FIGS. 12G-12H are block diagrams of exemplary auxiliary power modules according to some exemplary embodiments.

FIG. 12G illustrates an exemplary configuration of the auxiliary power module 860 operating in an On-line UPS mode according to some embodiments of the present invention. Referring to FIG. 12G, the auxiliary power module 860 includes a charging unit 861 and an auxiliary power supply unit 862. The charging unit 861 has an input terminal coupled to an external AC power supply 508 and an output terminal coupled to a first input terminal of the auxiliary power supply unit 862. The auxiliary power supply unit 862 further has a second input terminal coupled to the external AC power supply 508 and an output terminal coupled to the rectifying circuit 510. Specifically, when the external AC power supply 508 operates normally, the auxiliary power supply unit 862 performs the power conversion based on the power supplied by the external AC power source 508, and accordingly provides an external driving signal Sed to the rectifying circuit 510. In the meantime, the charging unit 861 charges an energy storage unit of the auxiliary power supply unit 862. When the external AC power source is unstable or abnormal, the auxiliary power supply unit 862 performs the power conversion based on the power stored in the energy storage unit, and accordingly provides the external driving signal Sed to the rectifying circuit 510. It should be noted that the power conversion described herein could be rectification, filtering, boost-conversion, buck-conversion or a reasonable combination of above operations. The present invention is not limited thereto.

In some embodiments, the operation of the auxiliary power module 860 can be similar to a Line-Interactive UPS. The basic operation of the auxiliary power module 860 under a Line-Interactive UPS mode is similar to the auxiliary power module 760 under the Off-line UPS mode, the difference between the Line-Interactive UPS mode and the Off-line UPS mode is the auxiliary 860 has a boost and buck compensation circuit and can monitor the power supply condition of the external AC power source at any time. Therefore, the auxiliary power module 860 can correct the power output to the power supply module of the LED tube lamp when the external AC power source is not ideal (e.g., the external driving signal is unstable but the variation does not exceed the threshold value), so as to reduce the frequency of using the battery for power supply.

Figure 12H:
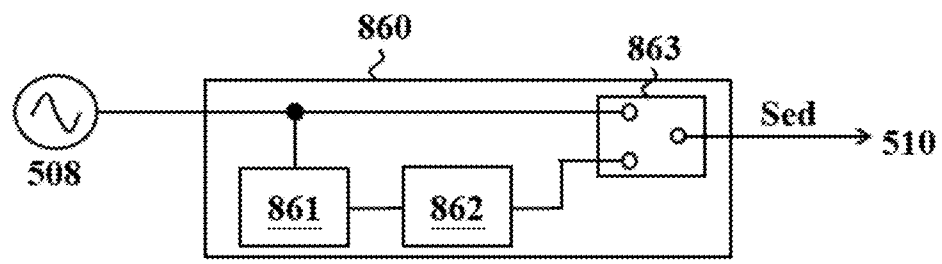

FIG. 12H illustrates an exemplary configuration of the auxiliary power module 860 operating in the Line-Interactive mode according to some embodiments of the present invention. Referring to FIG. 12H, the auxiliary power module 860 includes a charging unit 861, an auxiliary power supply unit 862 and a switching unit 863. The charging unit 861 has an input terminal coupled to an external AC power supply 508. The switching unit 863 is coupled between an output terminal of the auxiliary power supply unit 862 and an input terminal of the rectifying circuit 510, in which the switching unit 863 may selectively conduct a current on a path between the external AC power supply 508 and the rectifying circuit 510 or on a path between the auxiliary power supply unit 862 and the rectifying circuit 510 according to the power supply condition of the external AC power supply 508. In detail, when the external AC power source is normal, the switching unit 863 is switched to conduct a current on the path between the external AC power supply 508 and the rectifying circuit 510 and cut off the path between the auxiliary power supply unit 862 and the rectifying circuit 510. Thus, when the external AC power source is normal, the external AC power supply 508 provides power, regarded as the external driving signal Sed, to the input terminal of the rectifying circuit 510 via the switching unit 863. In the meantime, the charging unit 861 charges the auxiliary power unit 862 based on the external AC power supply 508. When the external AC power source is unstable or abnormal, the switching unit 863 is switched to conduct a current on the path between the auxiliary power supply unit 862 and the rectifying circuit 510 and cut off the path between the AC power supply 508 and the rectifying circuit 510. The auxiliary power supply unit 862 starts to supply power, regarded as the external driving signal Sed, to the rectifying circuit 510.

In the embodiments of the auxiliary power module, the auxiliary power provided by the auxiliary power supply unit 762/862 can be in either AC or DC. When the auxiliary power is provided in AC, the auxiliary power supply unit 762/862 includes, for example, an energy storage unit and a DC-to-AC converter. When the auxiliary power is provided in DC, the auxiliary power supply unit 762/862 includes, for example, an energy storage unit and a DC-to-DC converter, or simply includes an energy storage unit; the present invention is not limited thereto and other energy storage units are contemplated. In some embodiments, the energy storage unit can be a set of batteries. In some embodiments, the DC-to-DC converter can be a boost converter, a buck converter or a buck-boost converter. The energy storage unit may be e.g. a battery module composed of a number of batteries. The DC-to-DC converter may be e.g. of the type of buck, boost, or buck-boost converter. And the auxiliary power module 760/860 further includes a voltage detection circuit, not shown in FIGS. 12D to 12H. The voltage detection circuit is configured to detect an operating state of the external AC power supply 508 and generate a signal, according to the detection result, to control the switching unit 763/863 or the auxiliary power supply unit 862, in order to determine whether the LED tube lamp operates in a normal lighting mode (i.e., supplied by the external AC power supply 508) or in an emergency lighting mode (i.e., supplied by the auxiliary power module 760/860). In such embodiments, the switching unit 763/863 may be implemented by a three-terminal switch or two complementary switches having a complementary relation. When using the complementary switches, one of the complementary switches may be serially connected on the power loop of the external AC power supply 508 and the other one of the complementary switches may be serially connected on the power loop of the auxiliary power module 760/860, wherein the two complementary switches are controlled in a way that when one switch is conducting the other switch is cut off.

In an exemplary embodiment, the switching unit 763/863 is implemented by a relay. The relay operates similar to a two-mode switch. In function, when the LED tube lamp is operating in a normal lighting mode (i.e., electricity provided from the external AC power supply 508 is normally input to the LED tube lamp as an external driving signal), the relay is pulled in so that the power supply module of the LED tube lamp is not electrically connected to the auxiliary power module 760/860. On the other hand, when the AC powerline is abnormal and fails to provide power as the external AC power supply 508, magnetic force in the relay disappears so that the relay is released to a default position, causing the power supply module of the LED tube lamp to be electrically connected to the auxiliary power module 760/860 through the relay, thus using the auxiliary power module 760/860 as a power source.

According to some embodiments, from the perspective of the entire lighting system, when used in the normal lighting occasion, the auxiliary power module 760/860 is not active to provide power, and the LED module 50 is supplied by the AC powerline, which also may charge the battery module of the auxiliary power module 760/860. On the other hand, when used in the emergency lighting occasion, voltage of the battery module is increased by the boost-type DC-to-DC converter to a level required by the LED module 50 to operate in order to emit light. In some embodiments, the voltage level after the boosting is usually or commonly about 4 to 10 times that of the battery module before the boosting, and is in some embodiments 4 to 6 times that of the battery module before the boosting. In this embodiment, the voltage level required by the LED module 50 to operate is be in the range 40 to 80 V, and is preferably in the range 55 to 75 V. In one disclosed embodiment herein, 60 V is chosen as the voltage level, but the voltage level may be other values in other embodiments.

In one embodiment, the battery module includes or is implemented by a single cylindrical battery or cell packaged in a metallic shell to reduce the risk of leakage of electrolyte from the battery. In one embodiment, the battery can be modularized as a packaged battery module including for example two battery cells connected in series, in which a plurality of the battery module can be electrically connected in sequence (e.g., in series or in parallel) and disposed inside the lamp fixture so as to reduce the complexity of maintenance. For instance, when one or part of the battery modules are damaged or bad, each damaged battery module can be easily replaced without the need to replace all of the plurality of battery modules. In some embodiments of the present disclosure, the battery module may be designed to have a cylindrical shape whose internal diameter is slightly longer than the outer diameter of each of its battery cells, for the battery module to accommodate its battery cells in sequence and to form a positive electrode and a negative electrode at two terminals of the battery module. In some embodiments, the voltage of the battery modules electrically connected in series may be designed to be lower than e.g. 36V. In some embodiments, the battery module is designed to have a cuboid shape whose width is slightly longer than the outer diameter of each of its battery cells, for its battery cells to be securely engaged in the battery module, wherein the battery module may be designed to have a snap-fit structure or other structure for easily plugging-in and pulling-out of its battery cells. However, it is understood by those skilled in the art that in some other embodiments the battery module may have other shapes besides cuboid, such as rectangular.

In one embodiment, the charging unit 761/861 is e.g. a battery management system (BMS), which is used to manage the battery module, mainly for intelligent management and maintenance of the battery module in order to prevent over-charging and over-discharging of the battery cells of the battery module. The BMS prolongs the usage lifetime of the battery cells, and to monitor states of the battery cells.

The BMS may be designed to have a port capable of connecting an external module or circuit, for reading or accessing information/data related to the battery cells through the port during periodical examinations of the battery module. If an abnormal condition of the battery module is detected, the abnormal battery module can be replaced.

In other embodiments, the number of battery cells that a battery module can hold may be more than 2, such as 3, 4, 10, 20, 30, or another number, and the battery cells in a battery module may be designed to be connected in series, or some of which are connected in series and some of which are connected in parallel, depending on actual application occasions. In some embodiments where lithium battery cells are used, the rated voltage of a single lithium battery cell is about 3.7V. In some embodiments the number of battery cells of a battery module can be reduced to keep the voltage of the battery unit to be below about 36V.

The relay used in these embodiments is e.g. a magnetic relay mainly including an iron core, coil(s), an armature, and contacts or a reed. The operations principle of the relay may be: when power is applied to two ends of the coil, a current is passed through the coil to produce electromagnetic force, activating the armature to overcome a force provided by a spring and be attracted to the iron core. The movement of the armature brings one of the contacts to connect to a fixed normally-open contact of the contacts. During a power outage or when the current is switched off, the electromagnetic force disappears and so the armature is returned by a reaction force provided by the spring to its relaxed position, bringing the moving contact to connect to a fixed normally-closed contact of the contacts. By these different movements of switching, current conduction and cutoff through the relay can be achieved. A normally-open contact and a normally-closed contact of a relay may be defined such that a fixed contact which is in an open state when the coil of the relay is de-energized is called a normally-open contact, and a fixed contact which is in a closed state when the coil of the relay is de-energized is called a normally-closed contact.

In an exemplary embodiment, the brightness of the LED module supplied by the external driving signal is different from the brightness of the LED module supplied by the auxiliary power module. Therefore, a user may find the external power is abnormal when observing that the brightness of LED module changed, and thus the user can eliminate the problem as soon as possible. In this manner, the operation of the auxiliary power module 760 can be considered as an indication of whether the external driving signal is normally provided, wherein when the external driving signal becomes abnormal, the auxiliary power module 760 provides the auxiliary power having the output power different from that of the normal external driving signal. For example, in some embodiments, the luminance of the LED module is 1600 to 2000 lm when being lighted up by the external driving signal; and the luminance of the LED module is 200 to 250 lm when being lighted up by the auxiliary power. From the perspective of the auxiliary power module 760, in order to let the luminance of the LED module reach 200-250 lm, the output power of the auxiliary power module 760 is, for example, 1 watt to 5 watts, but the present invention is not limited thereto. In addition, the electrical capacity of the energy storage unit in the auxiliary power module 760 may be, for example, 1.5 to 7.5 Wh (watt-hour) or above, so that the LED module can be lighted up for 90 minutes under 200-250 lm based on the auxiliary power. However, the present invention is not limited thereto.

Figure 12I:
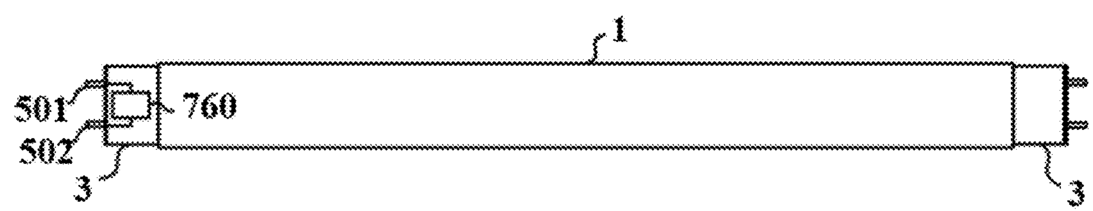
FIGS. 12I-12J are schematic structures of an auxiliary power module disposed in an LED tube lamp according to some exemplary embodiments.

FIG. 12I illustrates a schematic structure of an auxiliary power module disposed in an LED tube lamp according to an exemplary embodiment. In one embodiment, in addition, or as an alternative, the auxiliary power module 760/860 is disposed in the lamp tube 1. In another embodiment, the auxiliary power module 760/860 is disposed in the end cap 3. In order to make the description more clear, the auxiliary power module 760 is chosen as a representative of the auxiliary power modules 760 and 860 in the following paragraph, and only 760 is indicated in the figures. When the auxiliary power module 760 is disposed in an end cap 3, in some embodiments the auxiliary power module 760 connects to the corresponding pins 501 and 502 via internal wiring of the end cap 3, so as to receive the external driving signal provided to the pins 501 and 502. Compared to the structure of disposing the auxiliary power module into the lamp tube 1, the auxiliary power module 760 can be disposed far apart from the LED module since the auxiliary power module 760 is disposed in the end cap 3 which is connected to the respective end of the lamp tube 1. Therefore, the operation and illumination of the LED module won't be affected by heat generated by the charging or discharging of the auxiliary power module 760. In some embodiments, the auxiliary power module 760 and the power supply module of the LED tube lamp are disposed in the same end cap, and in other embodiments the auxiliary power module 760 and the power supply module are disposed in different end caps on the respective ends of the lamp tube. In those embodiments where the auxiliary power module 760 and the power supply module of the LED tube lamp are respectively disposed in the different end caps, each module may have more area for circuit layout.

Figure 12J:
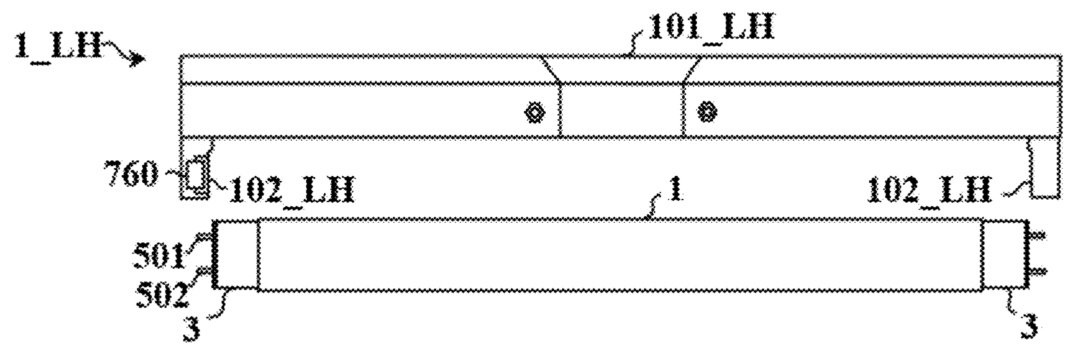

Referring to FIG. 12J, the auxiliary power module 760 is disposed in a lamp socket 1_LH of the LED tube lamp, according to one embodiment. In one embodiment, the lamp socket 1_LH includes a base 101_LH and a connecting socket 102_LH. The base 101_LH has power line disposed inside and is adapted to lock/attach to a fixed object such as a wall or a ceiling. The connecting socket 102_LH has slot corresponding to the pin (e.g., the pins 501 and 502) on the LED tube lamp, in which the slot is electrically connected to the corresponding power line. In the embodiment shown in FIG. 12J, the connecting socket 102_LH and the base 101_LH are formed of one piece. In another embodiment, the connecting socket 102_LH is removably disposed on the base 101_LH. It is understood by those skilled in the art that the particular lamp socket 1_LH arrangement is not limited one of these embodiments but that other arrangements are also contemplated.

In some embodiments when the LED tube lamp is installed on the lamp socket 1_LH, the pins on both end caps 3 are respectively inserted into the slot of the corresponding connecting socket 102_LH, and thus the power line can be connected to the LED tube lamp for providing the external driving signal to the corresponding pins of the LED tube lamp. Taking the configuration of the left end cap 3 as an example, when the pins 501 and 502 are inserted into the slots of the connecting socket 102_LH, the auxiliary power module 760 is electrically connected to the pins 501 and 502 via the slots, so as to implement the connection configuration shown in FIG. 12D.

Compared to the embodiment of disposing the auxiliary power module 760 in the end cap 3, the connecting socket 102_LH and the auxiliary power module 760 can be integrated as a module since the connecting socket can be designed as a removable configuration in an exemplary embodiment. Under such configuration, when the auxiliary power module 760 has a fault or the service life of the energy storage unit in the auxiliary power module 760 has run out, a new auxiliary power module can be replaced for use by replacing the modularized connecting socket 102_LH, instead of replacing the entire LED tube lamp. Thus, in addition to reducing the thermal effect of the auxiliary power module, the modularized design of the auxiliary power module has the added advantage of making the replacement of the auxiliary power module easier. Therefore, the durability as well as the cost savings of the LED tube lamp is evident since it is no longer necessary to replace the entire LED tube lamp when a problem occurs to the auxiliary power module. In addition, in some embodiments, the auxiliary power module 760 is disposed inside the base 101_LH. In other embodiments, the auxiliary power module 760 is disposed outside the base 101_LH. It is understood that the particularly arrangement of the auxiliary power module 760 with respect to the base 101_LH is not limited to what is described in the present disclosure but that other arrangements are also contemplated.

In summary, the structural configuration of the auxiliary power module 760 can be divided into the following two types: (1) the auxiliary power module is integrated into the LED tube lamp; and (2) the auxiliary power module 760 is disposed independent from the LED tube lamp. Under the configuration of disposing the auxiliary power module 760 independent from the LED tube lamp, if the auxiliary power module 760 operates in the Off-line UPS mode, the auxiliary power module 760 and the external AC power source can provide power, through different pins or through sharing at least one pin, to the LED tube lamp. On the other hand, if the auxiliary power module 760 operates in the On-line UPS mode or the Line-Interactive mode, the external AC power source provides power through the auxiliary power module 760 rather than directly to the pins of the LED tube lamp. The detailed configuration of disposing the auxiliary power module independent from the LED tube lamp (hereinafter the independent auxiliary power module) is further described below.

It should be noted that the combination of the lamp and the lamp socket could be regarded as a light fixture, a lamp fixture, a light fitting or luminaries. For example, the lamp socket in the disclosure can be regarded as a part of the light fixture for securing, attaching or appending as to a house, apartment building, etc, and for holding and providing power to the lamps. In addition, the connecting sockets 102_LH can be described as tombstone sockets of the light fixture.

Figure 12K:
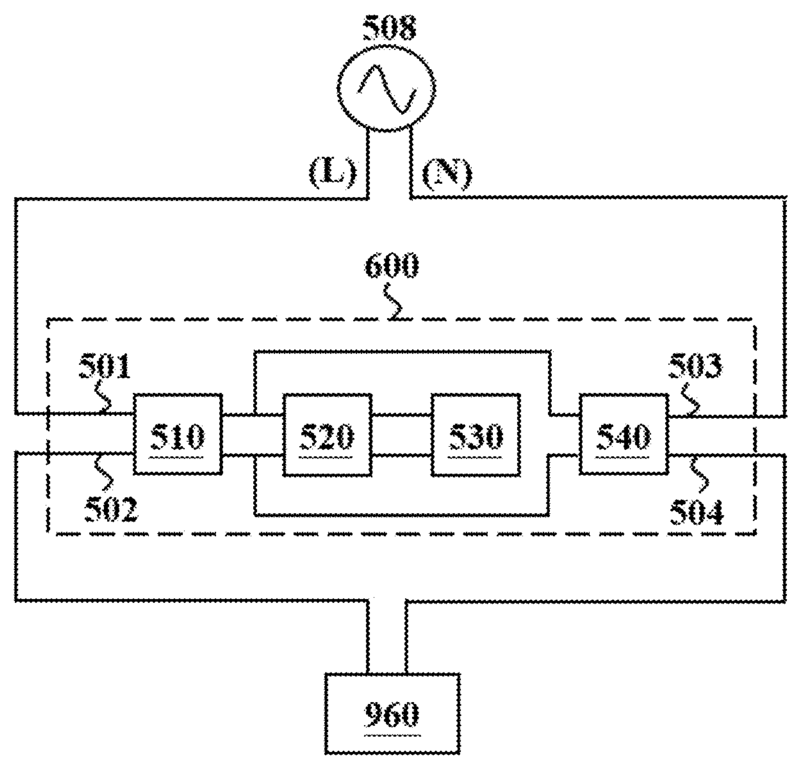
FIGS. 12K-12M are block diagrams of exemplary LED lighting systems according to some exemplary embodiments.

FIG. 12K is a block diagram of an LED lighting system according to an exemplary embodiment. Referring to FIG. 12K, the LED lighting system includes an LED tube lamp 600 and an auxiliary power module 960. The LED tube lamp 600 includes rectifying circuits 510 and 540, a filtering circuit 520, a driving circuit 530 and an LED module (not shown). The rectifying circuits 510 and 540 can be respectively implemented by the full-wave rectifier 610 illustrated in FIG. 7A or the half-wave rectifier 710 as shown in FIG. 7B, in which two input terminals of the rectifying circuit 510 are coupled to the pins 501 and 502 and two input terminals of the rectifying circuit 540 are coupled to the pins 503 and 504.

In the embodiment shown in FIG. 12K, the LED tube lamp 600 is configured as a dual-end power supply structure for example. The external AC power supply 508 is coupled to the pins 501 and 502 on the respective end caps of the LED tube lamp 600, and the auxiliary power module 960 is coupled to the pins 503 and 504 on the respective end caps of the LED tube lamp 600.

In this embodiment, the external AC power supply 508 and the auxiliary power module 960 provide power to the LED tube lamp 600 through different pairs of the pins. Although the present embodiment is illustrated in dual-end power supply structure for example, the present invention is not limited thereto. In another embodiment, the external AC power supply 508 can provide power through the pins 501 and 503 on the end cap at one side of the lamp tube (i.e., the single-end power supply structure), and the auxiliary power module 960 can provide power through the pins 502 and 504 on the end cap at the other side of the lamp tube. Accordingly, no matter whether the LED tube lamp 600 is configured in the single-end or the dual-end power supply structure, the unused pins of the original LED tube lamp (e.g., 503 and 504 illustrated in FIG. 12K) can be the interface for receiving the auxiliary power, so that the emergency lighting function can be integrated in the LED tube lamp 600.

Figure 12L:
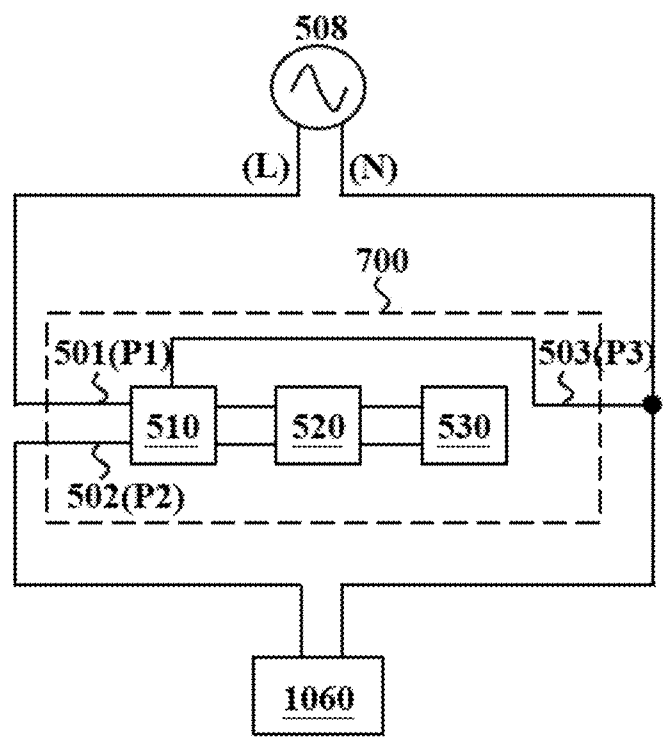

FIG. 12L is a block diagram of an LED lighting system according to another exemplary embodiment. Referring to FIG. 12L, the LED lighting system includes an LED tube lamp 700 and an auxiliary power module 1060. The LED tube lamp 700 includes a rectifying circuit 510, a filtering circuit 520, a driving circuit 530 and an LED module (not shown). The rectifying circuit 510 can be implemented by the rectifying circuit 910 having three bridge arms as shown in FIGS. 7D to 7F, in which the rectifying circuit 510 has a first signal input terminal P1 coupled to the pin 501, a second signal input terminal P2 coupled to the pin 502 and the auxiliary power module 1060 and a third input terminal P3 coupled to the auxiliary power module 1060.

In the present embodiment, the LED tube lamp 700 is configured as a dual-end power supply structure for example. The external AC power supply 508 is coupled to the pins 501 and 502 on the respective end caps of the LED tube lamp 500. The difference between the present embodiment shown in FIG. 12L and the embodiment illustrated in FIG. 12K is that besides being coupled to the pin 503, the auxiliary power module 1060 further shares the pin 502 with the external AC power supply 508. Under the configuration of FIG. 12L, the external AC power supply 508 provides power to the signal input terminals P1 and P2 of the rectifying circuit 510 through the pins 501 and 502, and the auxiliary power module 1060 provides power to the signal input terminals P2 and P3 of the rectifying circuit 510 through the pins 502 and 503. In detail, if the leads connected to the pins 501 and 503 are respectively configured as a live wire (denoted by "(L)") and a neutral wire (denoted by "(N)"), the auxiliary power module 1060 shares the lead (N) with the external AC power supply 508 and has a lead for transmitting power as a live wire distinct from the external AC power supply 508. In this manner, the signal input terminal P2 is a common terminal between the external AC power supply 508 and the auxiliary power module 1060.

In operation, when the external AC power source normally operates, the rectifying circuit 510 performs the full-wave rectification by the bridge arms corresponding to the signal input terminals P1 and P2, so as to provide power to the LED module 50 based on the external AC power supply 508. However, when the external AC power source is unstable or abnormal, the rectifying circuit 510 performs the full-wave rectification by the bridge arms corresponding to the signal input terminals P2 and P3, so as to provide power to the LED module 50 based on the auxiliary power provided by the auxiliary power module 1060.

In addition, since the LED tube lamp receives the auxiliary power provided by the auxiliary power module 1060 through sharing the pin 502, an unused pin (e.g., pin 504) can be used as a signal input interface of other control functions. These other control functions can be a dimming function, a communication function or a sensing function, though the present invention is not limited thereto. The embodiment of integrating the dimming function through the unused pin 504 is further described below.

Figure 12M:
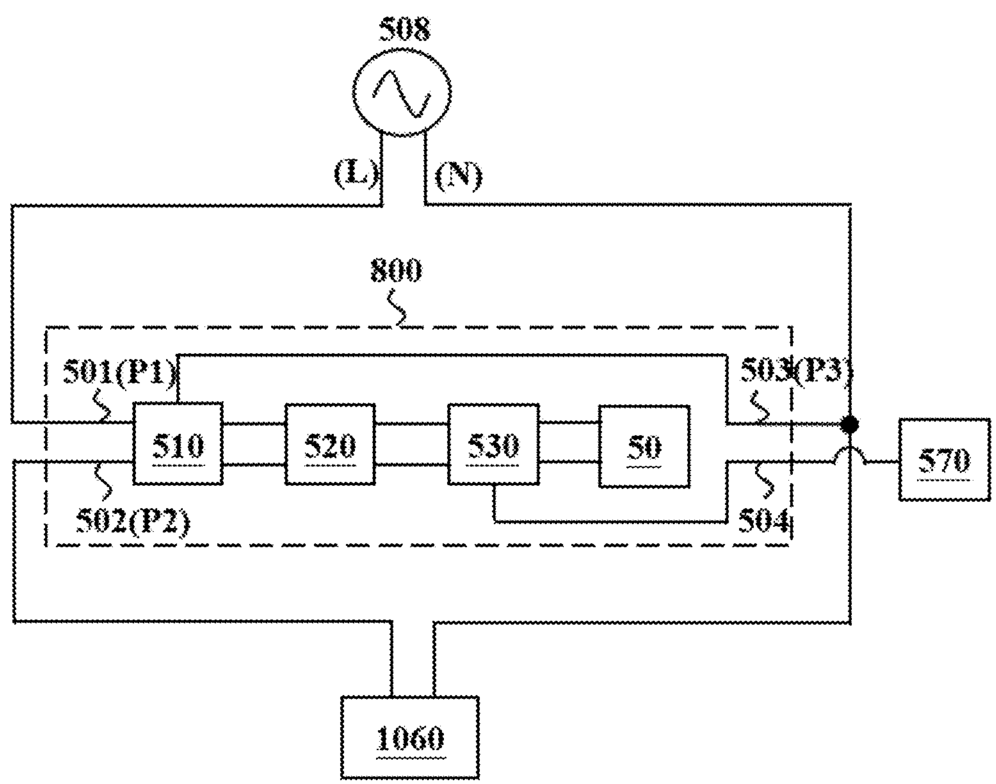

FIG. 12M is a block diagram of an LED lighting system according to still another exemplary embodiment. Referring to FIG. 12M, the LED lighting system includes an LED tube lamp 800 and an auxiliary power module 1060. The LED tube lamp 800 includes a rectifying circuit 510, a filtering circuit 520, a driving circuit 530 and an LED module 50. The configuration of the present embodiment is similar to the embodiment illustrated in FIG. 12L. The difference between the embodiments of FIGS. 12M and 12L is, as shown in FIG. 12M, the pin 504 of the LED tube lamp 800 is further coupled to a dimming control circuit 570, in which the dimming control circuit 570 is coupled to the driving circuit 530 through the pin 504, so that the driving circuit 530 can adjust the magnitude of the driving current, supplied to the LED module 50, according to a dimming signal received from the dimming control circuit 570. Therefore, the brightness and/or the color temperature of the LED module 50 can be varied according to the dimming signal.

For example, the dimming control circuit 570 can be implemented by a circuit including a variable impedance component (e.g., a variable resistor, a variable capacitor or a variable inductor) and a signal conversion circuit. The impedance of the variable impedance component can be tuned by a user, so that the dimming control circuit 570 generates the dimming signal having signal level corresponding to the impedance. After converting the signal formation (e.g., signal level, frequency or phase) of the dimming signal to conform the signal formation of the driving circuit 530, the converted dimming signal is transmitted to the driving circuit 530, so that the driving circuit 530 adjusts the magnitude of the driving current based on the converted dimming signal. In some embodiments, the brightness of the LED module 50 can be adjusted by tuning the frequency or the reference level of the lamp driving signal. In some embodiments, the color temperature of the LED module 50 can be adjusted by tuning the brightness of the red LED units.

It should be noted that, by utilizing the structural configurations as shown in FIGS. 12I and 12J, the auxiliary power module 960/1060 can obtain the similar benefits and advantages described in the embodiments of FIGS. 12I and 12J. In addition, although the dummy pins (i.e., the pins not used for receiving the external driving signal, such as the pins 503 and 504 illustrated in FIGS. 12K to 12M) are used for receiving the auxiliary power and the dimming signal, the invention is not limited thereto. In some embodiments, the dummy pins can be used for other functions, such as for receiving a remote control signal or outputting a sensing signal, by correspondingly disposing circuits connected to the dummy pins for performing the functions. For example, the dummy pins in the LED tube lamp can be configured to a signal input/output interface for performing certain functions.

In a configuration of a light fixture having multi LED tube lamps, which is similar to the embodiments described in FIG. 12A to FIG. 12C, the auxiliary power module can be disposed in one tube lamp, or in plural tube lamps, in which the multi tube lamps architectures based on the consideration of the uniformity of illumination are adapted to the present embodiment as well. The difference between the embodiment having multi tube lamps and the embodiments illustrated in FIG. 12A to FIG. 12Q is that the auxiliary power module disposed in one of the tube lamps may supply power to the other tube lamps.

It should be noted that, although the description of the lamp module having multi tube lamps herein is taking the four parallel LED tube lamps as an example, those skilled in the art should understand, based on the description mentioned above, how to implement an auxiliary power supply by selecting and disposing the suitable energy storage unit. Therefore, any embodiments illustrated in which the auxiliary power module 760 provides auxiliary power to one or plural tube lamps, such that the corresponding LED tube lamp has a specific illuminance in response to the auxiliary power, may be implemented according to the disclosed embodiments.

In another exemplary embodiment, the auxiliary power modules 560, 660, 760, 960 and 1060 determine whether to provide the auxiliary power to the LED tube lamp according to a lighting signal. Specifically, the lighting signal is an indication signal indicating the switching state of the lamp switch. For example, the signal level of the lighting signal can be adjusted to a first level (e.g., high logic level) or a second level different from the first level (e.g., low logic level) according to the switching of the lamp switch. When a user toggles the lamp switch to an on-position, the lighting signal is adjusted to the first level; and when the user toggles the lamp switch to an off-position, the lighting signal is adjusted to the second level. For example, the lamp switch may be switched to the on-position when the lighting signal is at the first level and to the off-position when the lighting signal is at the second level. The generation of the lighting signal can be implemented by a circuit, as is conventionally known to those of ordinary skill in the art, capable of detecting the switching state of the lamp switch.

In still another exemplary embodiment, the auxiliary power module 560/660/760/960/1060 further includes a lighting determination circuit for receiving the lighting signal and determining whether the energy storage unit provides the auxiliary power to the end of the LED tube lamp (e.g., to provide the auxiliary power to the LED module) according to the signal level of the lighting signal and the detection result of the voltage detection circuit. Specifically, based on the signal level of the lighting signal and the detection result, there are three different states as follows: (1) the lighting signal is at the first level and the external driving signal is normally provided; (2) the lighting signal is at the first level and the external driving signal stops being provided or the AC signal level of the external driving signal is insufficient; and (3) the lighting signal is at the second level and the external driving signal stops being provided. Herein, state (1) is the situation where a user turns on the lamp switch and the external driving signal is normally provided, state (2) is the situation where a user turns on the lamp switch however a problem occurs to the external power supply, and state (3) is the situation where a user turns off the lamp switch so that the external power supply is stopped.

In the present exemplary embodiment, states (1) and (3) belong to normal states, which means the external power is normally provided or stops in accordance with the user's control. Therefore, under states (1) and (3), the auxiliary power module does not provide auxiliary power to the end of the LED tube lamp (e.g., to the LED module). More specifically, the lighting determination circuit controls the energy storage unit not to provide the auxiliary power to the end of the LED tube lamp according to the determination result of states (1) and (3). In state (1), the external driving signal is directly input to the rectifying circuit 510 and charges the energy storage unit. In state (3), the external driving signal stops being provided so that the energy unit is not charged by the external driving signal.

State (2) represents the external power is not provided to the tube lamp when the user turns on the light, therefore, the lighting determination circuit controls the energy storage unit to provide the auxiliary power to the rear end according to the determination result indicating state (2), so that the LED module 530 emits light based on the auxiliary power provided by the energy storage unit.

Accordingly, based on the application of the lighting determination circuit, the LED module 530 may have three different luminance variations. The LED module 530 has a first luminance (e.g., 1600 to 2200 lm) when the external power is normally supplied; the LED module 50 has a second luminance (e.g., 200 to 250 lm) when the external power is abnormal and the power supply is changed to the auxiliary power; and the LED module 50 has a third luminance (e.g., does not light up the LED module) when the user turns off the power on their own such that the external power is not provided to the LED tube lamp.

More specifically, in accordance with the embodiment of FIG. 12C, the lighting determination circuit is, for example, a switch circuit (not shown) connected between the auxiliary power positive terminal 661 and the auxiliary power negative terminal 662 in series. The control terminal of the switch circuit receives the lighting signal. When the lighting signal is at the first level, the switch circuit is conducted in response to the lighting signal, such that the external driving signal charges the energy storage unit 663 via the auxiliary power positive terminal 661 and the auxiliary power negative terminal 662 when the external driving signal is normally supplied (state (1)), or makes the energy storage unit 663 discharge to the driving circuit 530 or LED module 50 via the auxiliary power positive terminal 661 and the auxiliary power negative terminal 662 when the external driving signal stops providing or the AC signal level of the external driving signal is insufficient (state (2)). On the other hand, when the lighting signal is at the second level, the switch circuit is cut off in response to the lighting signal (state (3)). At this time, even though the external driving signal stops being provided or the AC signal level is insufficient, the energy storage unit 663 won't provide the auxiliary power to the rear end (e.g., to the LED module).

In applications of the above auxiliary power module, the circuit of the auxiliary power supply unit (such as 762 or 862) is designed to be under open-loop control, i.e. for example the auxiliary power supply unit generates the output voltage without referring to a feedback signal indicating a load state. In this case when the load is in an open-circuit condition, this will cause the output voltage of the auxiliary power module to keep increasing so as to damage the auxiliary power module. To address this issue, this disclosure presents several circuit (block) embodiments of the auxiliary power module having open-circuit protection, as shown in FIGS. 12N and 12O.

Figure 12N:
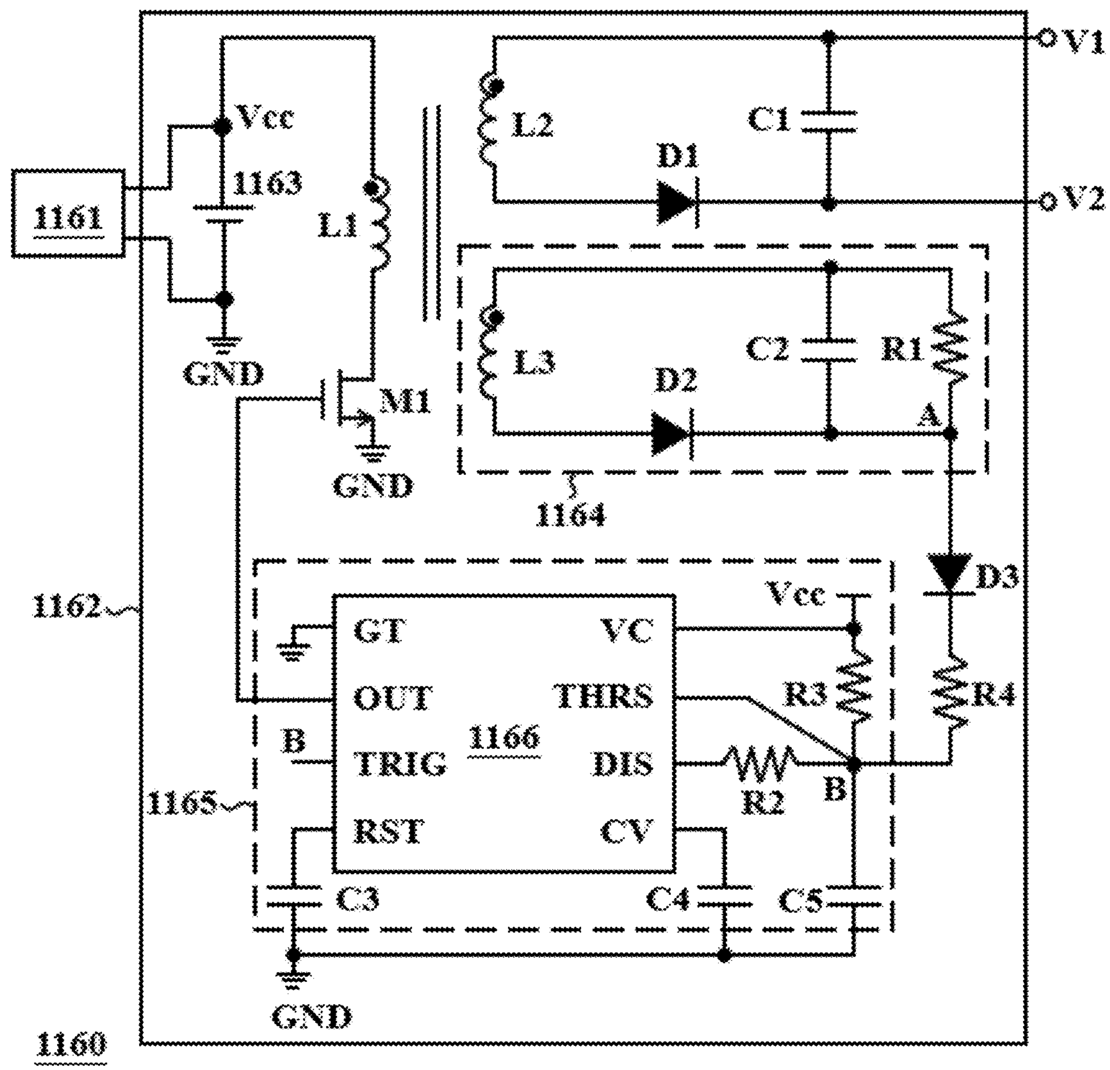
FIGS. 12N-12O are schematic circuit diagrams of auxiliary power modules according to some exemplary embodiments.
Figure 12O:
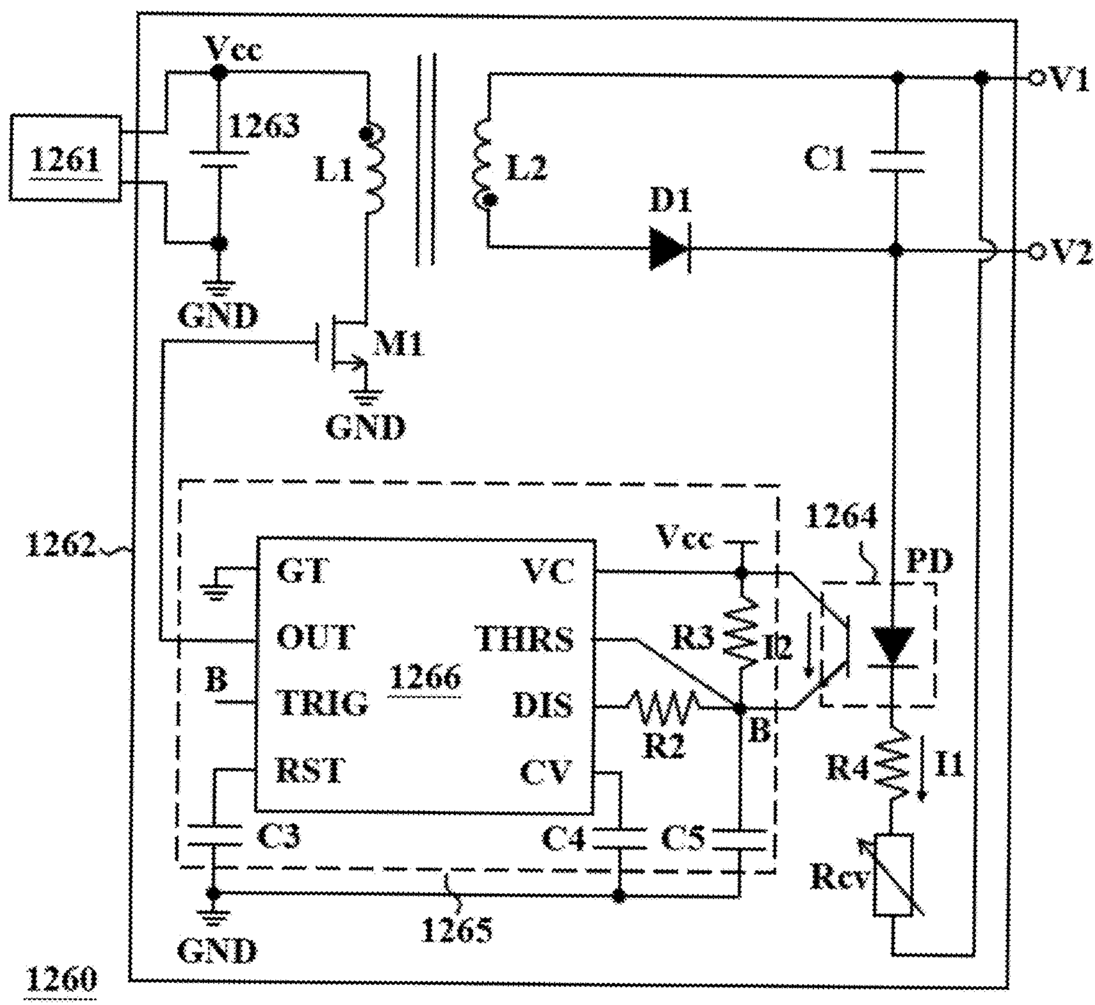

FIG. 12N is a circuit diagram of the auxiliary power module according to an embodiment. Referring to FIG. 12N, in this embodiment, the auxiliary power module 1160 includes a charging unit 1161 and an auxiliary power unit 1162. The auxiliary power unit 1162 includes a transformer, a sampling module 1164, a control module 1165, and an energy storage unit 1163 for providing a supply voltage Vcc. In the auxiliary power module 1160, also with reference to FIG. 12E, the transformer includes a primary winding L1 and a secondary winding L2. A terminal of the secondary winding L2 is electrically connected to switching unit 763 and therefore is electrically connected to an end of the LED tube lamp (or to input terminal(s) of rectifying circuit 510), and the other terminal of the secondary winding L2 is electrically connected to the other end of the LED tube lamp. Sampling module 1164 includes an auxiliary winding L3, which is wound along with the secondary winding L2 at the secondary side. Voltage of the secondary winding L2 is sampled by the auxiliary winding L3. If the sampled voltage exceeds a set threshold value, the sampled voltage is fed back to the control module 1165, and then the control module 1165 modulates switching frequency of a switch M1 electrically connected to the primary winding L1 based on the sampled voltage. This way of modulating the switching frequency of switch M1 then controls output voltage at the secondary side, thereby realizing open-circuit protection.

Specifically, the transformer includes a primary side unit and a secondary side unit. The primary side unit includes an energy storage unit 1163, a primary winding L1, and a switch M1. A positive electrode of the energy storage unit 1163 is electrically connected to a dotted terminal of the primary winding L1, and a negative electrode of the energy storage unit 1163 is electrically connected to a ground terminal. A non-dotted terminal of the primary winding L1 is electrically connected to the drain terminal of the switch M1 (such as a MOSFET). The gate terminal of the switch M1 is electrically connected to control module 1165, and the source terminal of switch M1 is connected to a ground terminal. The secondary side unit includes secondary winding L2, a diode D1, and a capacitor C1. A non-dotted terminal of the secondary winding L2 is electrically connected to the anode of diode D1, and a dotted terminal of secondary winding L2 is electrically connected to an end of the capacitor C1. The cathode of the diode D1 is electrically connected to the other end of the capacitor C1. The two ends of the capacitor C1 can be regarded as auxiliary power supply output terminals V1 and V2 (corresponding to two terminals of the auxiliary power module 960 in FIG. 12K, or two terminals of the auxiliary power module 1060 in FIGS. 12L and 12M).

Sampling module 1164 includes an auxiliary winding L3, a diode D2, a capacitor C2, and a resistor R1. A non-dotted terminal of the auxiliary winding L3 is electrically connected to the anode of diode D2, and a dotted terminal of auxiliary winding L3 is electrically connected to a first common end connecting the capacitor C2 and the resistor R1. The cathode of diode D2 is electrically connected to another common end (marked with "A" in FIG. 12N) connecting the capacitor C2 and the resistor R1. And the capacitor C2 and the resistor R1 are electrically connected to control module 1165 through the node A.

The control module 1165 includes a controller 1166, a diode D3, capacitors C3, C4 and C5, and resistors R2, R3, and R4. The ground pin GT of the controller 1166 is grounded to the ground terminal GND. The output pin OUT of the controller 1166 is electrically connected to the gate terminal of switch M1. The trigger pin TRIG of the controller 1166 is electrically connected to an end (marked with "B") of the resistor R2. The discharge pin DIS of the controller 1166 is electrically connected to the other end of resistor R2. The reset pin RST of the controller 1166 is electrically connected to an end of the capacitor C3, which has the other end connected to the ground terminal GND. The constant voltage pin CV of the controller 1166 is electrically connected to an end of the capacitor C4, which has the other end connected to the ground terminal GND. The discharge terminal DIS of the controller 1166 is coupled to an end of the capacitor C5 through the resistor R2, which capacitor C5 has the other end connected to the ground terminal GND. The power supply pin VC of the controller 1166 receives supply voltage Vcc and is electrically connected to an end of the resistor R3, which has the other end electrically connected to the node B. The anode of the diode D3 is electrically connected to the node A, the cathode of diode D3 is electrically connected to an end of the resistor R4, which has the other end electrically connected to the node B.

What follows here is a description of operations of the circuit embodiment in FIG. 12N. When the auxiliary power module 1160 is in a normal state, the output voltage between output terminals V1 and V2 of the auxiliary power module 1160 is low and usually lower than a specific value, for example 100 V. In the present embodiment, the output voltage between the output terminals V1 and V2 is in the range 60 V to 80 V. At this time the voltage, relative to the ground terminal GND, sampled at the node A of the sampling module 1164 is low such that a small current is flowing through the resistor R4 and can be ignored. When the auxiliary power module 1160 is in an abnormal state, the output voltage between the output terminals V1 and V2 of the auxiliary power module 1160 is relatively high, for example over 300 V, and then the voltage sampled at the node A of the sampling module 1164 is relatively high such that a relatively large current is flowing through the resistor R4. The relatively large current flowing through the resistor R4 increases the discharge time of the capacitor C5, whose charge time is unchanged, and this amounts to adjusting the duty cycle of the switch M1 to increase the cutoff time. With respect to the output side of the transformer, the adjusting of the duty cycle causes a smaller output energy, and thus the output voltage will not keep increasing, so as to achieve the purpose of open-circuit protection.

In this embodiment, the trigger terminal TRIG of the controller 1166 is electrically connected to the discharge terminal DIS of the controller 1166 through the resistor R2, and the discharge terminal DIS is triggered when the voltage at the node B is in the range (⅓)*Vcc to (⅔)*Vcc (the "*" denoting multiplication). When the auxiliary power module 1160 is in the normal state, i.e. its output voltage does not exceed a set threshold value, the voltage sampled at the node A may be lower than (⅓)*Vcc. When the auxiliary power module 1160 is in the abnormal state, the voltage sampled at the node A may reach or be higher than (½)*Vcc.

Figure 12P:
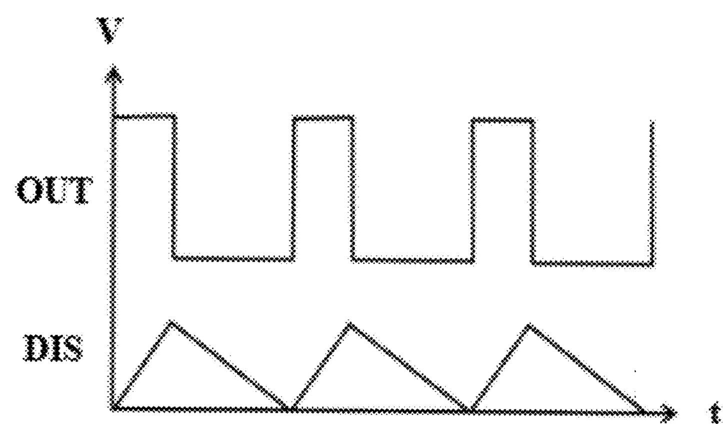
FIGS. 12P-12Q are charge-discharge waveforms of auxiliary power modules according to some exemplary embodiments.
Figure 12Q:
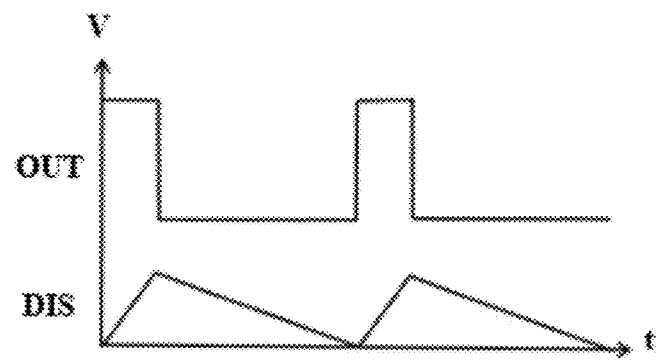

In this embodiment, during the normal state, the auxiliary power module 1160 supplies power normally when the discharge pin DIS of the controller 1166 is triggered. The waveforms of the voltages at the discharge pin DIS and the output pin OUT are shown in FIG. 12P. FIG. 12P shows charge-discharge waveform at the discharge pin DIS and the voltage waveform at the output terminal OUT along the time axis when auxiliary power module 1160 is in the normal state. As shown in FIG. 12P, when the discharge pin DIS is triggered, meaning the controller 1166 is in a discharge stage (to discharge the capacitor C5), a low voltage is output at the output pin OUT. When the discharge pin DIS is not triggered, meaning the controller 1166 is in a charge stage (to charge the capacitor C5), a high voltage is output at the output pin OUT. Accordingly, the high and low voltage levels output at the output pin OUT are respectively used to control current conduction and cutoff of the switch M1.

On the other hand, when the auxiliary power module 1160 is in the abnormal state, charge-discharge waveform at the discharge pin DIS and voltage waveform at the output pin OUT along the time axis are shown in FIG. 12Q. It is clear from FIGS. 12P and 12Q that no matter whether the auxiliary power module 1160 is in the normal state or the abnormal state, the period for which the discharge pin DIS is not triggered, which amounts to the period for which the capacitor C5 is charged, is the same for the two cases. And when auxiliary power module 1160 is in the abnormal state, since there is a current flowing from the node B to the discharge pin DIS, which results in the discharge time of the capacitor C5 being extended, a smaller or relatively small output energy results at the output side of the transformer or the auxiliary power module 1160 and thus the output voltage does not keep increasing, so as to achieve the purpose of open-circuit protection.

In the present embodiment, an example that can be chosen as or to constitute the control module 1166 is a chip with regulation function by time, such as a 555 timer IC, for example to control the cutoff period of the switch M1. And the present embodiment can be implemented by using resistors and capacitors to achieve the prolonging of discharge time, without using a complicated control scheme. And the voltage range for the supply voltage Vcc in this embodiment is 4.5V to 16V.

By using circuit in the embodiment discussed above, open-circuit output voltage of the auxiliary power module 1160 can be limited to be below a specific value, such as 300V, which can be determined by choosing appropriate values for parameters in the circuit.

It should be noted that in the circuit of the above embodiment, each electrical element or component depicted in the relevant figures, such as a resistor, capacitor, diode, or MOSFET (as switch M1), is intended to be a representative or equivalent of any plurality of such an element that may be actually used and connected according to relevant rules to implement this embodiment.

FIG. 12O is a circuit diagram of the auxiliary power module according to an embodiment. Referring to FIG. 12O, the auxiliary power module 1260 includes a charging unit 1261 and an auxiliary power unit 1262. The auxiliary power unit 1262 includes a transformer, a sampling module 1264, a control module 1265, and an energy storage unit 1263 for providing a supply voltage Vcc. The difference between embodiments of FIG. 12O and FIG. 12N is that the sampling module 1264 in the embodiment of FIG. 12O is implemented by an optical coupler.

The transformer includes a primary winding L1 and a secondary winding L2. Configuration of the primary winding L1 with a switch M1 is the same as that in the above described embodiment. A dotted terminal of the secondary winding L2 is electrically connected to the anode of a diode D1, and a non-dotted terminal of the secondary winding L2 is electrically connected to an end of a capacitor C1. The cathode of the diode D1 is electrically connected to the other end of the capacitor C1. And the two ends of the capacitor C1 can be regarded as auxiliary power supply output terminals V1 and V2.

The sampling module 1264 includes an optical coupler PD having at least one photodiode, whose anode is electrically connected to the cathode of the diode D1 and an end of the capacitor C1 and whose cathode is electrically connected to an end of a resistor R4. The other end of the resistor R4 is electrically connected to an end of a clamping component Rcv, which has the other end electrically connected to the other end of the capacitor C1. A bipolar junction transistor in the optical coupler PD has a collector and an emitter electrically connected to two ends of a resistor R3 respectively.

The control module 1265 includes a controller 1266, capacitors C3, C4 and C5, and resistors R2 and R3. The power supply pin VC of the controller 1266 is electrically connected to the collector of the bipolar junction transistor in the optical coupler PD. The discharge pin DIS of the controller 1166 is electrically connected to an end of the resistor R2, which has the other end electrically connected to the collector of the bipolar junction transistor in the optical coupler PD. The sample pin THRS of the controller 1166 is electrically connected to the emitter of the bipolar junction transistor in the optical coupler PD and is connected to an end of the capacitor C5, which capacitor C5 has the other end electrically connected to the ground terminal GND. The ground pin GT of the controller 1166 is grounded to the ground terminal GND. The reset pin RST of the controller 1166 is electrically connected to an end of the capacitor C3, which has the other end connected to the ground terminal GND. The constant voltage pin CV of the controller 1166 is electrically connected to an end of the capacitor C4, which has the other end connected to the ground terminal GND. The trigger pin TRIG of the controller 1166 is electrically connected to the sample pin THRS. And the output pin OUT of the controller 1166 is electrically connected to the gate terminal of the switch M1.

What follows here is a description of operations of the circuit embodiment in FIG. 12O. When the auxiliary power module 1260 is in a normal state, the output voltage between the output terminals V1 and V2 of the auxiliary power module 1260 is lower than a clamping voltage of the clamping component Rcv, so a current I1 flowing through the resistor R4 is small and can be ignored. And a current I2 flowing through the collector and emitter of the bipolar junction transistor in the optical coupler PD is also small.

When the load is in an open-circuit condition, the output voltage between the output terminals V1 and V2 of the auxiliary power module 1260 increases and, when the output voltage exceeding a threshold voltage value of the clamping component Rcv, then conducts the clamping component Rcv, causing the current I1 flowing through the resistor R4 to increase. The increase of the current I1 then lights up the photodiode of the optical coupler PD, which causes the current I2 flowing through the collector and emitter of the bipolar junction transistor in the optical coupler PD to proportionally increase. The increase of the current I2 then compensates for discharging of the capacitor C5 through the resistor R2, prolonging the discharging time of the capacitor C5 and thereby prolonging the cutoff time of the switch M1 (i.e., reducing the duty cycle of the switch M1). With respect to the output side of the transformer, this reducing or adjusting of the duty cycle causes a smaller output energy, and thus the output voltage will not keep increasing, so as to achieve the purpose of open-circuit protection.

In this embodiment of the auxiliary power module 1260, the clamping component Rcv may be or comprise for example a varistor, a transient voltage suppressor diode (TVS diode), or a voltage regulation diode such as a Zener diode. The trigger threshold value of the clamping component Rcv may be in the range 100 to 400 V, and is preferably in the range 150 to 350 V. In some example embodiments herein, 300 V is chosen as the trigger threshold value.

In one embodiment of the auxiliary power module 1260, the resistor R4 operates mainly to limit current, and its resistance may be in the range 20 k to 1M ohm (the "M" denoting a million) and is preferably in the range 20 k to 500 k ohm. In some disclosed embodiments herein, 50 k ohm is chosen as the resistance of the resistor 6511. And the resistor R3 operates mainly to limit current, and its resistance may be in the range 1 k to 100 k ohm and is preferably in the range 5 k to 50 k ohm. In the disclosed embodiments herein, 6 k ohm is chosen as the resistance of the resistor R3. In this embodiment of the auxiliary power module 1260, capacitance of the capacitor C5 may be in the range 1 nF to 1000 nF and is preferably in the range 1 nF-to 100 nF. In some disclosed embodiments herein, 2.2 nF is chosen as the capacitance of the capacitor C5. Capacitance of the capacitor C4 may be in the range 1 nF to 1 pF and is preferably in the range 5 nF to 50 nF. In some disclosed embodiments herein, 10 nF is chosen as the capacitance of the capacitor C4. And capacitance of the capacitor C1 may be in the range 1 uF to 100 uF and is preferably in the range 1 uF to 10 uF. In some disclosed embodiments herein, 4.7 uF is chosen as the capacitance of the capacitor C1. The specific values for components described above in connection with FIG. 12O may be combined in one embodiment, or some of them may be used with other components having different values from the specific values described above.

In the embodiments of FIG. 12N and FIG. 12O, the energy storage unit 1163 of the auxiliary power module 1160/1260 may comprise for example a battery or a supercapacitor. In the above embodiments, DC power supply by the auxiliary power module 1160/1260 may be managed by a BMS so as to charge the capacitor C5 when the LED tube lamp operates in a normal lighting mode. Or the capacitor C5 may be charged when the LED tube lamp operates in a normal lighting mode, without the BMS. Through choosing appropriate values of parameters of components of the auxiliary power module 1160/1260, a small current, for example not exceed 300 mA, can be used to charge the auxiliary power module 1160/1260.

Advantages of using the auxiliary power module 1160/1260 embodiments of FIGS. 12N and 12O include that it has relatively simple circuit topology; a specialized integrated circuit chip is not needed to implement it; relatively few components are used to implement the open-circuit protection and thus the reliability of the auxiliary power module can be improved. The topology of the auxiliary power module 1160/1260 can be implemented by an isolation circuit structure so as to reduce the risks of current leakage.

In summary, the principle of using the auxiliary power module 1160/1260 embodiments of FIGS. 12N and 12O is to sample an output voltage (or current) as by using the sampling module 1164; and if the voltage/current sample exceeds a predefined threshold value, to prolong the cutoff period of the switch M1 by prolonging time of discharge through the discharge terminal DIS/THRS of the controller 1166, thereby modulating the duty cycle of the switch M1. The operating voltage at the discharge terminal DIS/THRS of the controller 1166 is in the range between (⅓)*Vcc and (⅔)*Vcc, each charge time of the capacitor C5 is about the same, but its discharge time is prolonged. Therefore this adjusting of the duty cycle causes a smaller output energy, and thus the output voltage will not keep increasing, so as to achieve the purpose of open-circuit protection.

FIG. 12P shows a time diagram including corresponding waveforms of the voltage at the OUT terminal and the voltage at the DIS/THRS terminal of the control module 1165, when the auxiliary power module is working in the normal state. FIG. 12Q shows a time diagram including corresponding waveforms of the voltage at the OUT terminal and the voltage at the DIS/THRS terminal of the control module 1165, when the auxiliary power module is in an abnormal state (as when the load is open-circuited). The voltage at the OUT terminal is initially at a high level while the DIS/THRS terminal is not triggered (so the capacitor C5 is being charged). When the DIS/THRS terminal is triggered (so the capacitor C5 is discharging), the voltage at the OUT terminal falls to be at a low level. The waveform or signal of the voltage at the OUT terminal is thus used to control current conduction and cutoff of the switch M1.

Figure 13A:
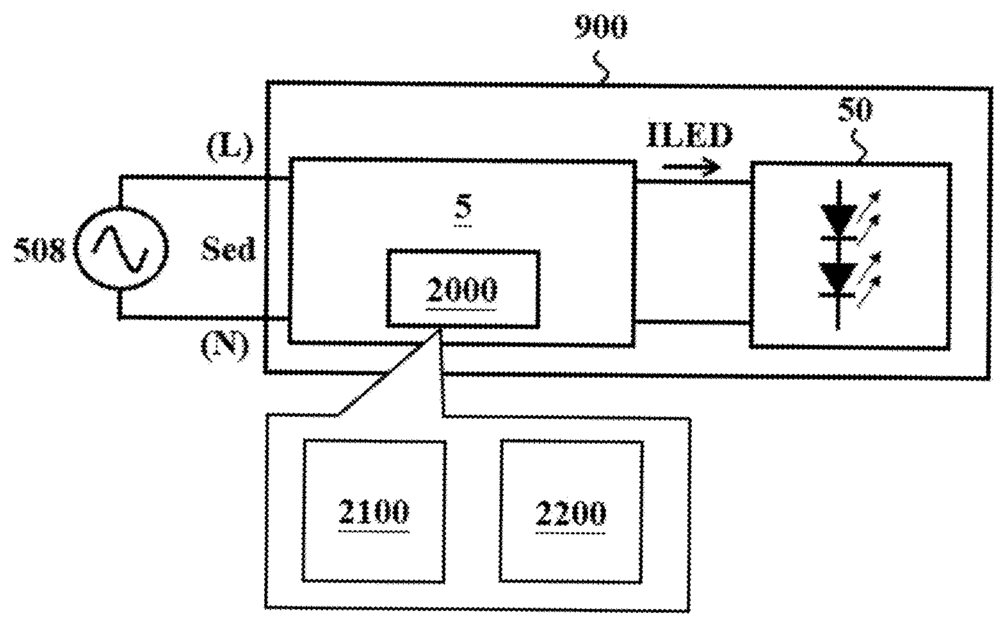
FIGS. 13A and 13B are block diagrams of exemplary LED lighting systems according to some exemplary embodiments.

FIG. 13A is a block diagram of exemplary LED lighting systems according to an exemplary embodiment. Referring to FIG. 13A, compared to the LED tube lamps 500, 600, 700 and 800 described above in different embodiments, a power supply module 5 of the LED tube lamp 900 includes a rectifying circuit 510, a filtering circuit 520, a driving circuit 530, and further includes an electric-shock detection module 2000 which includes a detection control circuit 2100 (which can be referred to a detection controller) and a current-limiting circuit 2200.

In the present embodiment, the detection control circuit 2100 is configured to perform an installation state detection/ impedance detection in the LED tube lamp 900, thereby to generate a corresponding control signal according to a detection result, in which the detection result indicates whether the LED tube lamp 900 is correctly/properly installed on a lamp socket or whether a foreign external impedance (e.g., human body resistor) contacts the LED tube lamp 900. The current-limiting circuit 2200 is configured to limit or determine whether to limit current flowing or to flow through the LED tube lamp 900 according to the control signal corresponding to the detection result. When the current-limiting circuit 2200 receives the control signal indicating that the LED tube lamp 900 is correctly/properly installed on a lamp socket or a foreign external impedance contacts or connects to the LED tube lamp, the current-limiting circuit 2200 allows the power supply module 5 providing electricity to the LED module 50 normally (i.e., the current-limiting circuit 2200 allows the current to normally flow through the power loop of the LED tube lamp 900). When the current-limiting circuit 2200 receives the control signal indicating that the LED tube lamp 900 is incorrectly/improperly installed on a lamp socket or a foreign external impedance contacts or connects to the LED tube lamp 900, the current-limiting circuit 2200 limits a current to flow through the LED tube lamp 900 to being under a safety threshold to avoid electric shock hazards. The safety threshold is for example 5 MIU as a root-mean-square (rms) value or 7.07 MIU as a peak value.

The power loop in the LED tube lamp 900 may refer to a path or a route for transmitting current from the power supply module 5 to the LED module 50. The installation state detection or the impedance detection may refer to a circuit operation for obtaining information on an installation state of or equivalent impedance in the LED tube lamp 900 by detecting electrical characteristics (such as voltage or current). Further, in some embodiments, the detection control circuit 2100 performs detection of electrical characteristics by controlling current continuity on the power loop or forming an additional detection path, which may reduce the risk of electric shock during performing detection. Detailed descriptions of specific circuit embodiments explaining how a detection control circuit performs detection of electrical characteristics are presented below with reference to FIGS. 14-37F.

Figure 13B:
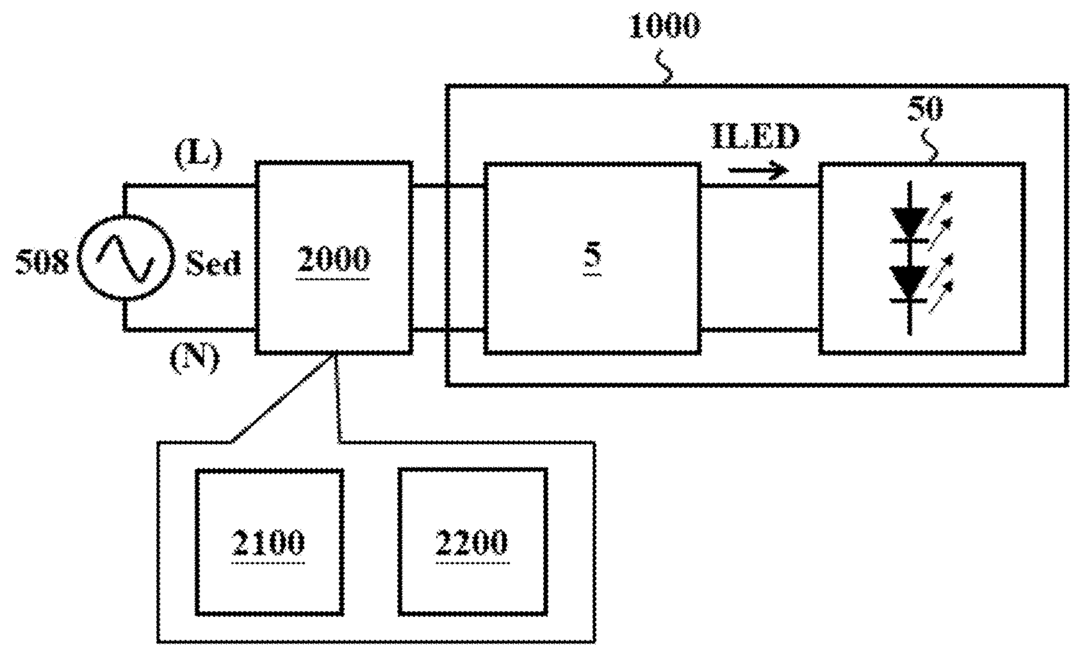

FIG. 13B is a block diagram of exemplary LED lighting systems according to another exemplary embodiment. Referring to FIG. 13B, compared to the embodiment of FIG. 13A, an electric-shock detection module 2000 of FIG. 13B is disposed external to the LED tube lamp 1000 and on a power supply path from an external AC power supply (e.g., AC grid) 508, and is for example disposed in a lamp socket or fixture. When external connection pins of the LED tube lamp 1000 are electrically connected to the external AC power supply 508, the electric-shock detection module 2000 is serially connected to a power loop in the LED tubal lamp 1000 through the corresponding pin(s), thereby the shock detection module 2000 can perform installation state detection/impedance detection in such ways as described above in FIG. 13A to determine whether the LED tube lamp 1000 is correctly/properly installed on a lamp socket or whether a user is exposed to risk of electric shock on the LED tube lamp 1000. In this embodiment of FIG. 13B, the configuration of the electric-shock detection module 2000 is similar to that in the embodiment of FIG. 13A, so it is not repeated herein.

In another embodiment, the structures of the power supply module in embodiments of FIG. 13A and FIG. 13B can be integrated. For example, a plurality of the electric-shock detection modules 2000 may be disposed in a lighting system of an LED tube lamp, wherein at least one of the electric-shock detection modules 2000 may be disposed on an internal power loop of the LED tube lamp, and at least another one of the electric-shock detection modules 2000 may be disposed to be external to the LED tube lamp, and for example disposed in the lamp socket. This external electric-shock detection module 2000 can be electrically connected to an internal power loop of the LED tube lamp through pins on an end cap of the LED tube lamp, to improve effects of protection from accidental electric shock.

It should be noted that the described shock detection module 2000 in either FIG. 13A or FIG. 13B is configured to be used in or with a power supply module of an LED tube lamp, which can be implemented, partially or entirely, by a discrete circuit or an integrated circuit, to which the present invention is not limited. In addition, the designation "shock detection module" herein for the module 2000 in FIGS. 13A and 13B serves to be representative but not to limit the scope of the module 2000 or the claimed invention. The scope of the "shock detection module" 2000 as described herein and as may be reflected in the claims encompasses any arrangement of a circuit or module comprising electrical components with their operations, functional/structural configurations, and connections consistent with or according to the relevant descriptions herein thereof. In practice and this disclosure, according to different ways of description, the shock detection module 2000 may be alternatively referred to as, but its different formulations are not limited to, a detection circuit, an installation detection module/circuit, a shock protection module/circuit, a shock protection detection module/circuit, an impedance detection module/circuit, or directly expressed as a circuitry for such a purpose. In addition, FIGS. 13A and 13B are diagrams merely to illustrate exemplary connection relationships between an LED tube lamp 900/1000 and an external power supply 508, but they are not to limit an external driving signal from the external power supply 508 to only being applied in a single-ended power-supply configuration at one end of the LED tube lamp 900/1000.

Explanatory descriptions of different schematic circuit and functional block embodiments under the embodiment configuration of FIG. 13A where a shock detection module 2000 is disposed inside the LED tube lamp 900 are presented below.

Figure 14:
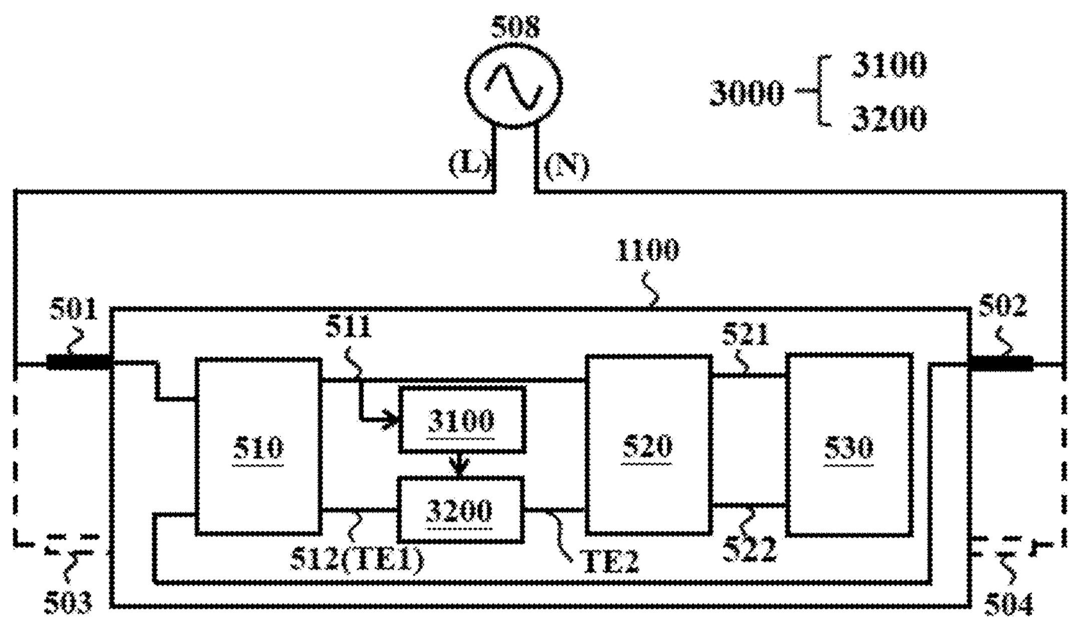
FIG. 14 is a block diagram of an exemplary power supply module in an LED tube lamp according to some exemplary embodiments.

Referring to FIG. 14, a block diagram of an LED tube lamp including a power supply module according to some exemplary embodiments is illustrated. Compared to the LED lamp shown in FIG. 5A, the LED tube lamp 1100 of FIG. 14 includes a rectifying circuit 510, a filtering circuit 520, and a driving circuit 530, and further includes a electric-shock detection module 3000 (also known as an electric shock protection module). In these embodiments, the LED tube lamp 1100 is configured to, for example, directly receive the external driving signal provided by the external AC power supply 508, wherein the external driving signal is input through the signal line (marked as "L") and the neutral line (marked as "N") to the two pins 501 and 502 on the two ends of the LED tube lamp 1100. In practical applications, the LED tube lamp 500 may further comprise two additional pins 503 and 504, also on its two ends as shown in FIG. 14. Under the structure of the LED tube lamp 1100 having the four pins 501-504, depending on design needs the two pins (such as the pins 501 and 503, or the pins 502 and 504) on an end cap disposed on one end of the LED tube lamp 1100 may be electrically connected or mutually electrically independent, but this invention is not limited to any of the two different cases.

The electric-shock detection module 3000 is disposed inside the LED tube lamp 1100 and includes a detection control circuit 3100 and a current-limiting circuit 3200. The electric-shock detection module 3000 may be and is hereinafter referred to as an installation detection module 3000. The current-limiting circuit 3200 is coupled to the rectifying circuit 510 via an installation detection terminal TE1 and is coupled to the filtering circuit 520 via an installation detection terminal TE2. So the current-limiting circuit 3200 is serially coupled to a power loop of the LED tube lamp 1100. Under a detection mode, the detection control circuit 3100 detects the signal passing through the installation detection terminals TE1 and TE2 (i.e., the signal passing through the power loop) and determines whether to cut off an LED driving signal (e.g., an external driving signal) passing through the LED tube lamp based on the detected result. The installation detection module 3000 includes circuitry configured to perform the steps of detecting the signal passing through the installation detection terminals TE1 and TE2 and determining whether to cut off an LED driving signal, and thus may be referred to as an installation detection circuit, or more generally as a detection circuit or cut-off circuit. When the LED tube lamp 1100 is not yet installed on a lamp socket or holder, or in some cases if it is not installed properly or is only partly installed (e.g., one side is connected to a lamp socket, but not the other side yet), the detection control circuit 3100 detects a smaller current compared to a predetermined current (or current value) and determines the signal is passing through a high impedance through the installation detection terminals TE1 and TE2. In this case, in certain embodiments, the current-limiting circuit 3200 is in a cut-off state to make the LED tube lamp 1100 stop working or limit the current flowing through the power loop to less than 5 MIU, which can be referred to 5 mA at a certain frequency and is the requirement, defined in the safety certification standard such as UL, of the LED tube lamp. In this manner, when the installation detection circuit 2520 is in the cut-off state, the LED module is not capable of emitting light because the current flowing through the power loop is limited. The unit of "MIU" is defined by American National Standards Institute (ANSI) C101-1992.

Otherwise, the installation detection module 2520 determines that the LED tube lamp has already been installed on the lamp socket or holder (e.g., when the detection control circuit 3100 detects a current equal to or larger than a predetermined current, and the current-limiting circuit 3200 determines the signal is passing through a low impedance through the installation detection terminals TE1 and TE2) and maintains conducting state/current limiting state to make the LED tube lamp 1100 working normally. In this manner, when the current-limiting circuit 3200 is in the conducting state, the LED module is capable of emitting light because the current flowing through the power loop is not limited.

For example, in some embodiments, when a current passing through the installation detection terminals TE1 and TE2 is greater than or equal to a specific, defined installation current (or a current value), which may indicate that the current supplied to the driving circuit 530 is greater than or equal to a specific, defined operating current, the current-limiting circuit 3200 is conducting to make the LED tube lamp 1100 operate in a conducting state. For example, a current greater than or equal to the specific current value may indicate that the LED tube lamp 1100 has correctly been installed in the lamp socket or holder. When the current passing through the installation detection terminals TE1 and TE2 is smaller than the specific, defined installation current (or the current value), which may indicate that the current supplied to the driving circuit 530 is less than a specific, defined operating current, the current-limiting circuit 3200 cuts off current to make the LED tube lamp 1100 enter in a non-conducting state based on determining that the LED tube lamp 1100 has been not installed in, or does not properly connect to, the lamp socket or holder. In other words, the installation detection module 3000 determines conducting or cutting off based on the impedance detection to make the LED tube lamp operate in a conducting state or enter non-conducting state. The LED tube lamp operating in a conducting state may refer to the LED tube lamp including a sufficient current passing through the LED module to cause the LED light sources to emit light. The LED tube lamp operating in a cut-off state may refer to the LED tube lamp including an insufficient current or no current passing through the LED module so that the LED light sources do not emit light. Accordingly, the occurrence of electric shock caused by touching the conductive part of the LED tube lamp which is incorrectly installed on the lamp socket or holder can be efficiently avoided.

When (part of) a human body touches or contacts the LED tube lamp, some impedance of the human body may cause a change in equivalent impedance on a power loop in the LED tube lamp, so the installation detection module 3000 can determine whether a human body has touched or contacted the LED tube lamp by e.g. detecting a change in current/voltage on the power loop, in order to implement the function of electric-shock prevention. The installation detection module 3000 can determine whether the LED tube lamp is correctly/properly installed onto a lamp socket or whether the body of a user has accidentally touched a conducting part of the LED tube lamp which is not yet correctly/properly installed onto a lamp socket, by detecting an electrical signal such as a voltage or current. In addition, compared with a general LED power supply module, since the power supply module provided with the installation detection module 3000 has the effect of preventing electric shock, there is no need to dispose a safety capacitor (i.e., X capacitor) between the input terminals of the rectifying circuit 510 (i.e., between the live wire (L) and the neutral wire (N)). From the perspective of the equivalent circuit of the power supply module, having no X capacitor disposed between the input terminals of the rectifying circuit 510 means the effective capacitance between the input terminals of the rectifying circuit 510 is, for example, smaller than 47 nF. In the present embodiment, the power loop refers to the current path in the LED tube lamp, for example, the path formed between the pins on the respective end caps.

More precisely, when an external AC power supply is applied to the LED tube lamp 500, the current flows from the pin on one end cap (e.g., left end cap) to the pin on the other end cap (e.g., right end cap) and passes through the leads and the components serially connected to the first terminal of the LED module (e.g., the positive terminal), the LED module, the leads and the components serially connected to the second terminal of the LED module (e.g., the negative terminal) in sequence. The pins, the leads, the components, and the LED module that the current passes through form the power loop.

It should be noted that, the issue of electric shock is raised since the power loop is formed between the respective ends of the LED tube lamp under the dual-end power supply structure.

It is noted that the illustrated position of the installation detection module 2520 in FIG. 14 is merely an exemplary position determined according to a possible or illustrated position of the current-limiting circuit 3200 in the installation detection module 3000, so figures illustrating the current-limiting circuit 3200 do not mean that the current-limiting circuit 3200 must be disposed in the same position as in FIG. 14 for connecting to other circuit(s) (such as the rectifying circuit 510, the filtering circuit 520, or the driving circuit 530). Further, it is merely an example embodiment to dispose the current-limiting circuit 3200 between the rectifying circuit 510 and the filtering circuit 520. In some embodiments, the function of preventing electric shock can be implemented by disposing the current-limiting circuit 3200 at the position that is capable of controlling turn-on and cut-off state of the power loop. For example, the switch circuit may be disposed between the driving circuit (530) and the LED module (50), but the present invention is not limited thereto.

Figure 38A:
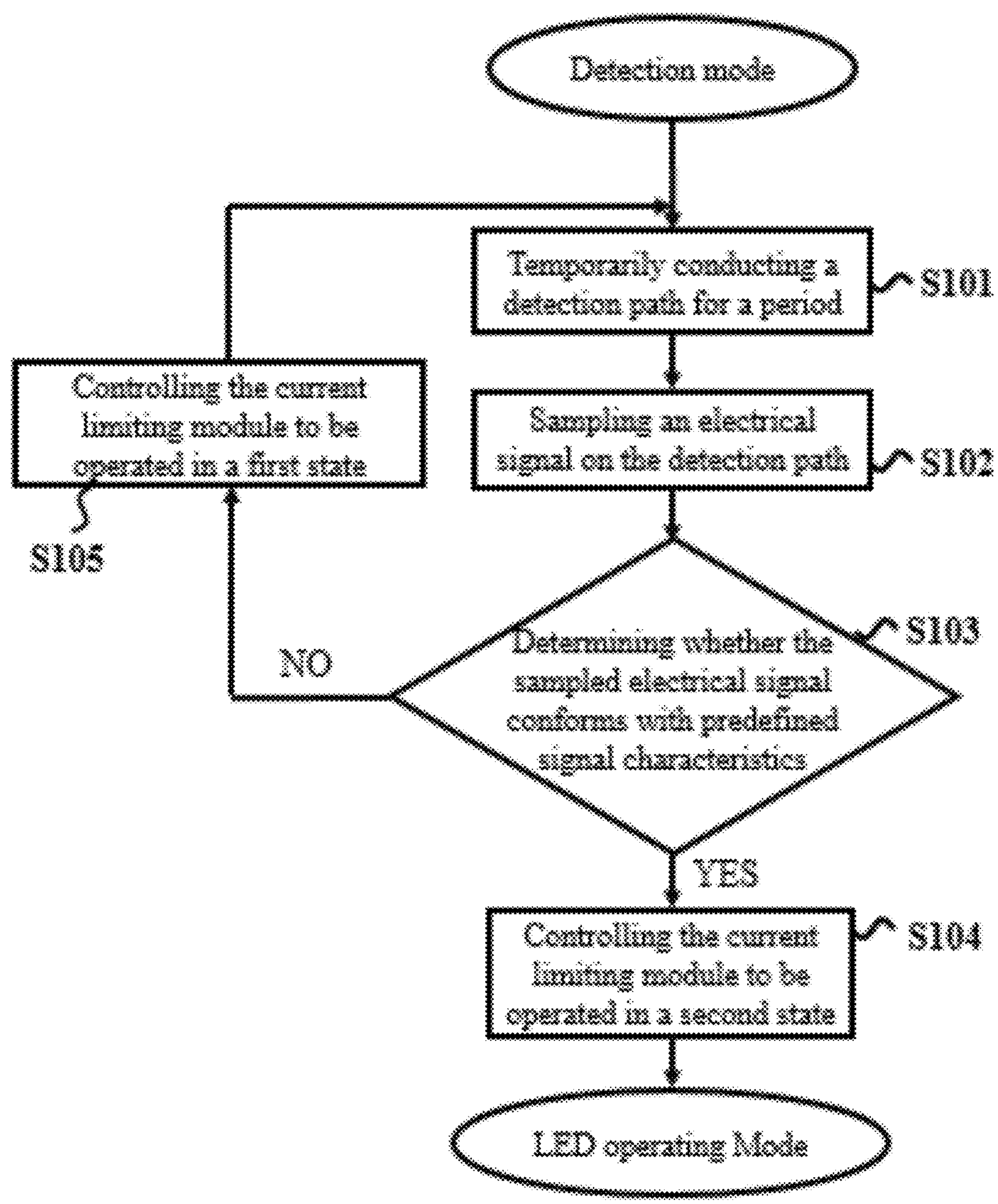
FIG. 38A is a flowchart of a relamping detection method according to some exemplary embodiments.

From circuit operation perspectives, a method performed by the detection control circuit 3100 and configured to determine, under a detection mode, whether the LED tube lamp 1100 is correctly/properly connected/installed to a lamp socket or whether there is any unintended external impedance being connected to the LED tube lamp is shown in FIG. 38A. The method includes the following steps: temporarily conducting a detection path for a period and then cutting it off (step S101); sampling an electrical signal on the detection path during the conduction period (step S102); determining whether the sample of electrical signal conforms with predefined signal characteristics (step S103); if the determination result in step S103 is positive, controlling the current-limiting circuit 3200 to operate in a first state (step S104); and if the determination result in step S103 is negative, controlling the current-limiting circuit 3200 to operate in a second state (step S105) and then returning to the step S101.

In the method of FIG. 38A, the detection path may refer to the power loop in the LED tube lamp described above or an independent current path coupled to an output terminal of the rectifying circuit 510 of FIG. 18. And detailed description of some embodiments of the method is presented below with reference to FIGS. 15A to 22B. And detailed description of how the described detection control circuit 3100 sets parameters such as the conduction period, intervals between multiple conduction periods, and the time point to trigger conduction, of the detection path is also presented below of different embodiments.

In the step S101, conducting the detection path for a period may be implemented by means using pulse signal to control switching of a switch.

In the step S102, the sample of electrical signal is a signal that can represent or express impedance variation on the detection path, which signal may comprise a voltage signal, a current signal, a frequency signal, a phase signal, etc.

In the step S103, the operation of determining whether the sampled electrical signal conforms with predefined signal characteristics may comprise, for example, a relative relation of the sampled electrical signal to a predefined signal. In some embodiments, the sampled electrical signal that is determined to conform with the predefined signal characteristics may correspond to a determination or state that the LED tube lamp is correctly/properly connected to the lamp socket or there is no unintended external impedance being coupled to the LED tube lamp, and the sampled electrical signal that is determined to not conform with the predefined signal characteristics may correspond to a determination or state where the LED tube lamp is not correctly/properly connected to the lamp socket or there is a foreign external impedance (e.g., a human body impedance, simulated/test human body impedance, or other impedance connected to the lamp and which the lamp is not designed to connect to for proper lighting operations) being coupled to the LED tube lamp.

In the steps S104 and S105, the first state and the second state are two distinct circuit-configuration states, and may be set according to the configured position and type of the current-limiting circuit 3200. For example, in the case or embodiment where the current-limiting circuit 3200 is independent of the driving circuit and refers to a switching circuit or a current-limiting circuit that is connected on the power loop in series, the first state refers to a conducting state (or non-current-limiting state) while the second state refers to a cutoff state (or current-limiting state).

Detailed operations and example circuit structures for performing the above method in FIG. 38A are illustrated by descriptions below of different embodiments of installation detection modules.

Figure 15A:
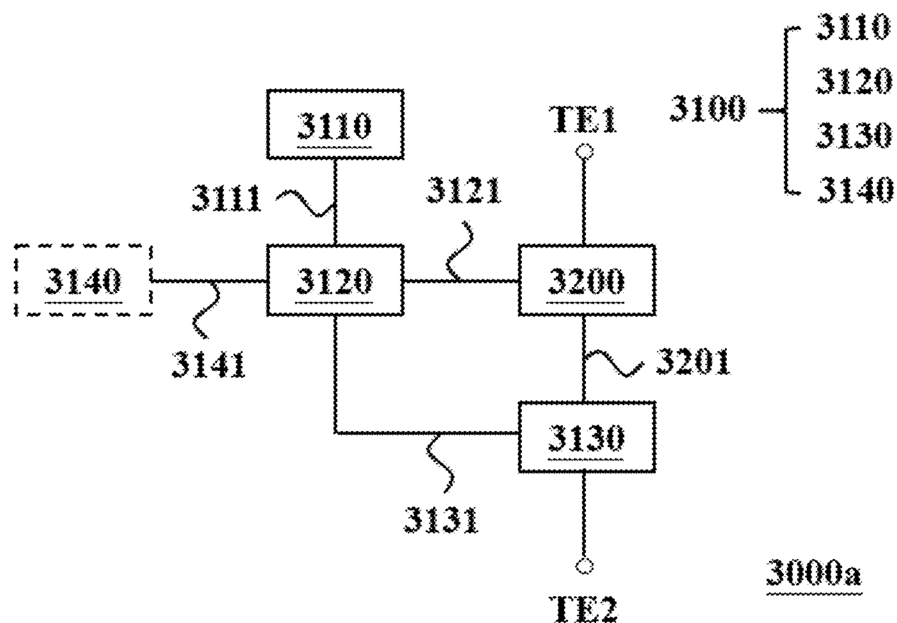
FIG. 15A is a block diagram of an installation detection module according to some exemplary embodiments.
Figure 15B:
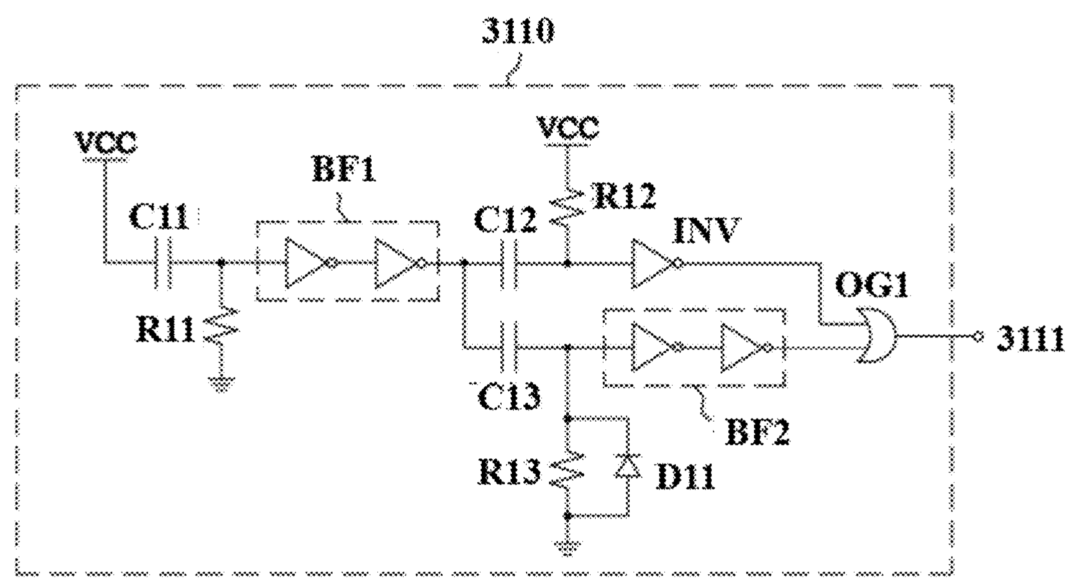
FIGS. 15B-15E are schematic circuit diagrams of an installation detection module according to some exemplary embodiments.

Referring to FIG. 15A, a block diagram of an installation detection module according to some certain embodiments is illustrated. The installation detection module 3000*a* includes a detection pulse generating module 3110, a detection result latching circuit 3120, a detection determining circuit 3130 and a current-limiting circuit 3200. The detection pulse generating module 3110, detection result latching circuit 3120, and detection determining circuit 3130 constitute a detection control circuit 3100. Certain of these circuits or modules may be referred to as first, second, third, etc., circuits as a naming convention to differentiate them from each other. The detection determining circuit 3130 is coupled to and detects the signal between the installation detection terminals TE1 (through a switch circuit coupling terminal 3201 and the current-limiting circuit 3200) and TE2. The detection determining circuit 3130 is also coupled to the detection result latching circuit 3120 via a detection result terminal 3131 to transmit the detection result signal to the detection result latching circuit 3120. The detection determining circuit 3130 may be configured to detect a current passing through terminals TE1 and TE2 (e.g., to detect whether the current is above or below a specific current value). The detection pulse generating module 3110 is coupled to the detection result latching circuit 3120 via a pulse signal output terminal 3111, and generates a pulse signal to inform the detection result latching circuit 3120 of a time point for latching (storing) the detection result. For example, the detection pulse generating module 3110 may be a circuit configured to generate a signal that causes a latching circuit, such as the detection result latching circuit 3120 to enter and remain in a state that corresponds to one of a conducting state or a cut-off state for the LED tube lamp. The detection result latching circuit 3120 stores the detection result according to the detection result signal (or detection result signal and pulse signal), and transmits or provides the detection result to the current-limiting circuit 3200 coupled to the detection result latching circuit 3120 via a detection result latching terminal 3121. The current-limiting circuit 3200 controls the state between conducting or cut off between the installation detection terminals TE1 and TE2 according to the detection result. In some embodiments, the current-limiting circuit 3200 comprises a switching circuit, and in the following description is referred to as the switching circuit 3200.

In some embodiments, the installation detection module 3000*a* further includes an emergency control module 3140 configured for determining whether an external driving signal is a DC signal provided by an auxiliary power supply module, in order for the detection result latching circuit 3120 to adjust its way of controlling the switching circuit 3200 according to the determination result, so as to avoid misoperation by the installation detection module 3000*a* when the LED tube lamp is used in an environment/application to be receiving auxiliary power input by an auxiliary power supply module. The structures and operations of other circuit(s)/module(s) in these embodiments with the emergency control module 3140 are similar to or correspond to those of the detection pulse generating module 3110, detection result latching circuit 3120, detection determining circuit 3130, and the switching circuit 3200 described above, and thus are not repeated herein.

Specifically, the emergency control module 3140 is connected to a detection result latching circuit 3120 through a path 3141, and is configured to determine whether the external driving signal being received by the LED tube lamp is a DC signal. If the emergency control module 3140 determines that the external driving signal is a DC signal, the emergency control module 3140 outputs a first state signal indicative of an emergency state to the detection result latching circuit 3120; or if the emergency control module 3140 determines that the external driving signal is not a DC signal, the emergency control module 3140 outputs a second state signal indicative of a non-emergency state to the detection result latching circuit 3120. When the detection result latching circuit 3120 receives the first state signal, regardless of the output of the detection pulse generating module 3110 and the output of the detection determining circuit 3130, the detection result latching circuit 3120 then maintains the switch circuit 3200 in a conduction or on state, which can be referred to as in an emergency lighting mode. On the other hand, when the detection result latching circuit 3120 receives the second state signal, the detection result latching circuit 3120 then operates according to its ordinary mechanism to control the conduction and cutoff of the switch circuit 3200 based on the pulse signal and the detection result signal.

Figure 38B:
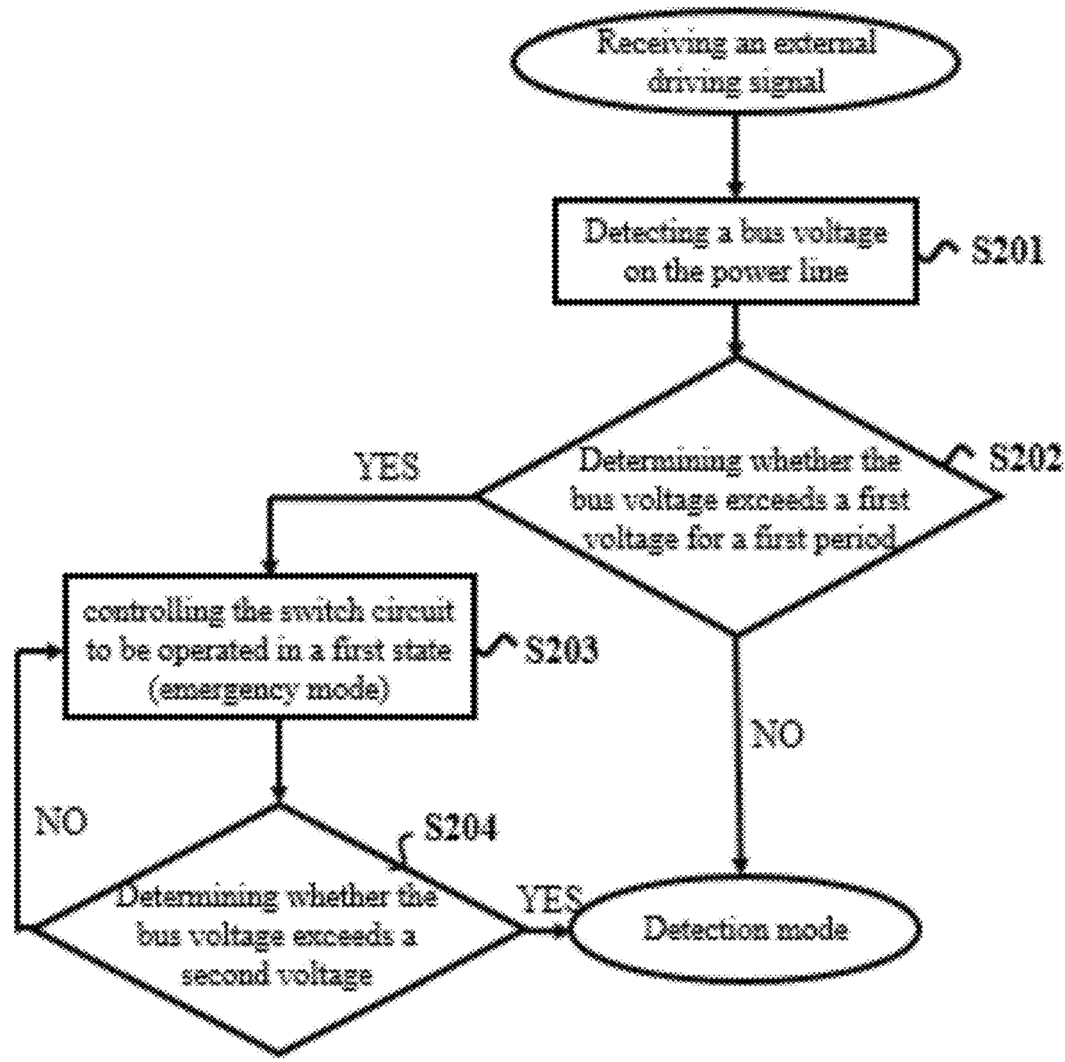
FIG. 38B is a flowchart of an emergency detection method according to some exemplary embodiments.

Next, detailed operation mechanisms of an installation detection module including the emergency control module 3140 are further described with reference to FIG. 38B. FIG. 38B is a flow chart of steps of a control method of the installation detection module with the emergency control module 3140 according to an exemplary embodiment. Referring to both FIG. 15A and FIG. 38B, when a power supply module of the LED tube lamp receives an external driving signal, the emergency control module 3140 operates to detect voltage on the power line (step S201) and then to judge whether the detected voltage on the power line is maintained above a first voltage level for a first period (step S202), wherein the first period may be for example 75 ms, and the first voltage level may be any level in the range of between 100V and 140V, such as 110V or 120V. For example, in an embodiment of the step S202, the emergency control module 3140 judges whether the detected voltage on the power line is maintained above 110V or 120V for over 75 ms.

If the determination result by the emergency control module 3140 in step S202 is positive, this means the received external driving signal is a DC signal, then the installation detection module 2520 enters into an emergency mode and causes the detection result latching circuit 3120 to direct the switch circuit 3200 to operate in a first configuration state (step S203), which is for example a conduction state. On the other hand, if the judgment by the emergency control module 3140 in step S202 is negative, this means the received external driving signal is not a DC signal but is an AC signal, then the installation detection module 2520 enters into a detection mode, causing the detection result latching circuit 3120 to judge the installation state of the LED tube lamp by outputting pulse(s) or pulse signal(s) to the switch circuit 3200. For detailed descriptions of operations of the installation detection module 2520 that includes the emergency control module 3140 under the installation detection mode according to certain embodiments, refer to those of embodiments of FIG. 38A presented above.

On the other hand, under the emergency mode, in addition to maintaining the switch circuit 3200 to operate in the first configuration, the emergency control module 3140 further determines whether a bus voltage (i.e., the voltage on the powerline of the power supply module) rises to exceed a second voltage level (step S204). When the emergency control module 3140 determines the bus voltage does not rise to exceed the second voltage level, which refers to the LED tube lamp remaining under the emergency mode, the switch circuit 3200 continues to operate in the first configuration. When the emergency control module 3140 determines the bus voltage rises to exceed the second voltage level from the first voltage level, which refers to the external driving signal received by the power supply module changing into the AC signal from the DC signal (e.g., AC powerline has been recovered), the emergency control module 3140 controls the installation detection module 3000*a* to enter into the detection mode. In some embodiments, the second voltage level can be any voltage level higher than the first voltage level but less than 277V. For example, when the first voltage level is 110V, the second voltage level can be 120V. According to some embodiments of the step S204, the emergency control module 3140 determines whether the bus voltage has a rising edge exceeding 120V, and enters into the detection mode when the determination result is positive.

In some embodiments, the detection pulse generating module 3110 may be referred to as a first circuit 3110, the detection result latching circuit 3120 may be referred to as a second circuit 3120, the switch circuit 3200 may be referred to as a third circuit 3200, the detection determining circuit 3130 may be referred to as a fourth circuit 3130, the switch circuit coupling terminal 3201 may be referred to as a first terminal 3201 and the detection result terminal 3131 may be referred to as a second terminal 3131, the pulse signal output terminal 3111 may be referred to as a third terminal 3111, the detection result latching terminal 3121 may be referred to as a fourth terminal 3121, the installation detection terminal TE1 may be referred to as a first installation detection terminal TE1, and the installation detection terminal TE2 may be referred to as a second installation detection terminal TE2. In this exemplary embodiment, the fourth circuit 3130 is coupled to the third circuit 3200 and the second circuit 3120 via the first terminal 3201 and the second terminal 3131, respectively, the second circuit 3120 is also coupled to the first circuit 3110 and the third circuit 3200 via the third terminal 3111 and the fourth terminal 3121, respectively.

In some embodiments, the fourth circuit 3130 is configured for detecting a signal between the first installation detection terminal TE1 and the second installation detection terminal TE2 through the first terminal 3201 and the third circuit 3200. For example, because of the above configuration, the fourth circuit 3130 is capable of detecting and determining whether a current passing through the first installation detection terminal TE1 and the second installation detection terminal TE2 is below or above a predetermined current value and transmitting or providing a detection result signal to the second circuit 3120 via the second terminal 3131.

In some embodiments, the first circuit 3110 generates a pulse signal through the second circuit 3120 to make the third circuit 3200 working in a conducting state during the pulse signal. Meanwhile, as a result, the power loop of the LED tube lamp between the installation detection terminals TE1 and TE2 is thus conducting as well. The fourth circuit 3130 detects a sample signal on the power loop and generates a signal based on a detection result to inform the second circuit 3120 of a time point for latching (storing) the detection result received by the second circuit 3120 from the fourth circuit 3130. For example, the fourth circuit 3130 may be a circuit configured to generate a signal that causes a latching circuit, such as the second circuit 3120 to enter and remain in a state that corresponds to one of a conducting state or a cut-off state for the LED tube lamp. The second circuit 3120 stores the detection result according to the detection result signal (or detection result signal and pulse signal), and transmits or provides the detection result to the third circuit 3200 coupled to the second circuit 3120 via the fourth terminal 3121. The third circuit 3200 receives the detection result transmitted from the second circuit 3120 and controls the state between conducting or cut off between the installation detection terminals TE1 and TE2 according to the detection result. It should be noted that the labels "first," "second," "third," etc., described in connection with these embodiments can be interchangeable and are merely used here in order to more easily differentiate the different circuits, nodes, and other components from each other.

In some embodiments, the first circuit 3110, the second circuit 3120 and the fourth circuit 3130 can be referred to a detection circuit or an electric shock detection/protection circuit, which is configured to control the switching state of the switch circuit/third circuit 3200.

In some embodiments, the detection pulse generating module 3110, detection determining circuit 3130, detection result latching circuit 3120, and the switching circuit 3200 of the installation detection module 3000*a* comprise or are implemented by, but are not limited to, circuit structures of FIGS. 15B-15E respectively, which figures are circuit structure diagrams of respective circuits and module of an installation detection module 3000*a* according to a first embodiment. Descriptions of the circuit embodiments of FIGS. 15B-15E are presented below.

Referring to FIG. 15B, a block diagram of a detection pulse generating module according to some certain embodiments is illustrated. A detection pulse generating module 3110 may be a circuit that includes multiple capacitors C11, C12, and C13, multiple resistors R11, R12, and R13, two buffers BF1 and BF2, an inverter INV, a diode D11, and an OR gate OG1. The capacitor C11 may be referred to as a first capacitor C11, the capacitor C12 may be referred to as a second capacitor C12, and the capacitor C13 may be referred to as a third capacitor C13. The resistor R11 may be referred to as a first resistor R11, the resistor R12 may be referred to as a second resistor R12, and the resistor R13 may be referred to as a third resistor R13. The buffer BF1 may be referred to as a first buffer BF1 and the buffer BF2 may be referred to as a second buffer BF2. The diode D11 may be referred to as a first diode D11 and the OR gate OG1 may be referred to as a first OR gate OG1. With use or operation, the capacitor C11 and the resistor R11 connect in series between a driving voltage (e.g., a driving voltage source, which may be a node of a power supply), such as VCC usually defined as a high logic level voltage, and a reference voltage (or potential), such as ground potential in this embodiment. The connection node between the capacitor C11 and the resistor R11 is coupled to an input terminal of the buffer BF1. In this exemplary embodiment, the buffer BF1 includes two inverters connected in series between an input terminal and an output terminal of the buffer BF1. The resistor R12 is coupled between the driving voltage, e.g., VCC, and an input terminal of the inverter INV. The resistor R13 is coupled between an input terminal of the buffer BF2 and the reference voltage, e.g. ground potential in this embodiment. An anode of the diode D11 is grounded and a cathode of the diode D11 is coupled to the input terminal of the buffer BF2. First ends of the capacitors C12 and C13 are jointly coupled to an output terminal of the buffer BF1, and second, opposite ends of the capacitors C12 and C13 are respectively coupled to the input terminal of the inverter INV and the input terminal of the buffer BF2. In this exemplary embodiment, the buffer BF2 includes two inverters connected in series between an input terminal and an output terminal of the buffer BF2. An output terminal of the inverter INV and an output terminal of the buffer BF2 are coupled to two input terminals of the OR gate OG1. According to certain embodiments, the voltage (or potential) for "high logic level" and "low logic level" mentioned in this specification are all relative to another voltage (or potential) or a certain reference voltage (or potential) in circuits, and further may be described as "high logic level" and "low logic level."

Figure 37A:
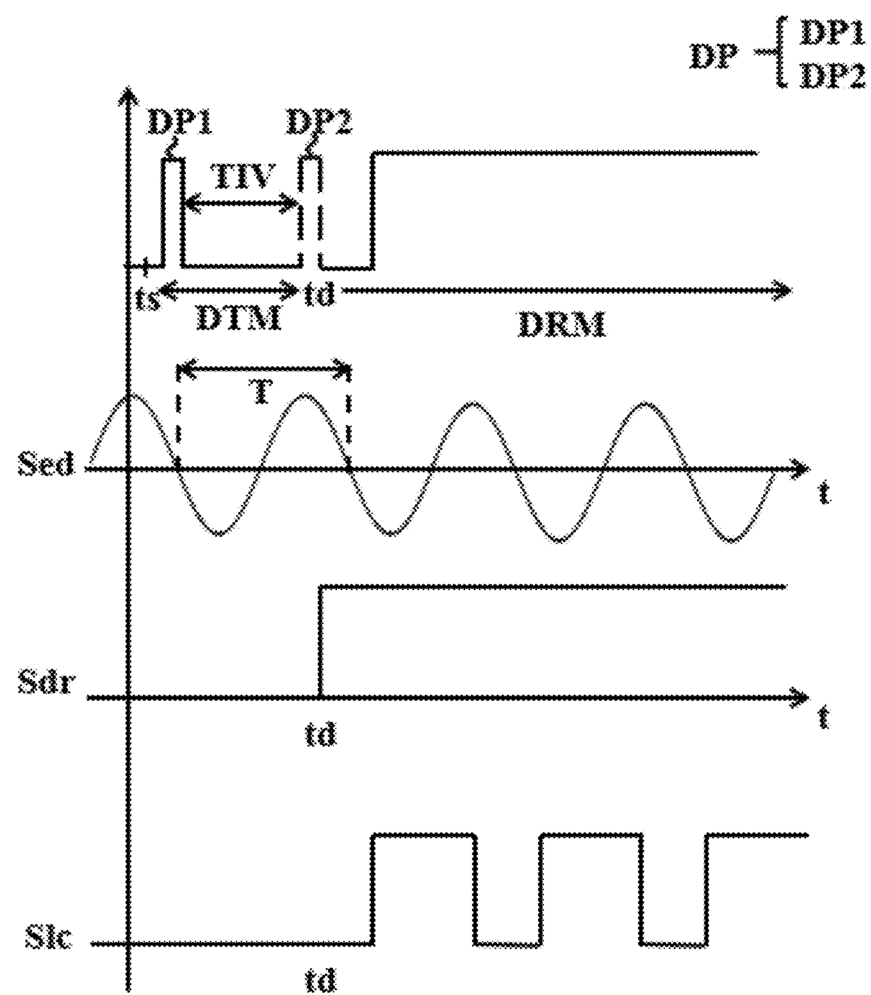
FIGS. 37A-37F are schematic signal waveform diagrams of power supply modules according to some exemplary embodiments.

FIG. 37A is a signal waveform diagram of an exemplary power supply module according to an exemplary embodiment. The installation detection operation is described further in accordance with FIG. 37A, which shows an example when an end cap of an LED tube lamp is inserted into a lamp socket and the other end cap thereof is electrically coupled to a human body, or when both end caps of the LED tube lamp are inserted into the lamp socket (e.g., at the timepoint ts), the LED tube lamp is conductive with electricity. At this moment, the installation detection module (e.g., the installation detection module 2520 as illustrated in FIG. 14) enters a detection mode DTM. The voltage on the connection node of the capacitor C11 and the resistor R11 is high initially (equals to the driving voltage, VCC) and decreases with time to zero finally. The input terminal of the buffer BF1 is coupled to the connection node of the capacitor C11 and the resistor R11, so the buffer BF1 outputs a high logic level signal at the beginning and changes to output a low logic level signal when the voltage on the connection node of the capacitor C11 and the resistor R11 decreases to a low logic trigger logic level. As a result, the buffer BF1 is configured to produce an input pulse signal and then remain in a low logic level thereafter (stops outputting the input pulse signal.) The width for the input pulse signal may be described as equal to one (initial setting) time period, which is determined by the capacitance value of the capacitor C11 and the resistance value of the resistor R11.

Next, the operations for the buffer BF1 to produce the pulse signal with the initial setting time period will be described below. Since the voltage on a first end of the capacitor C12 and on a first end of the resistor R12 is equal to the driving voltage VCC, the voltage on the connection node of both of them is also a high logic level. The first end of the resistor R13 is grounded and the first end of the capacitor C13 receives the input pulse signal from the buffer BF1, so the connection node of the capacitor C13 and the resistor R13 has a high logic level voltage at the beginning but this voltage decreases with time to zero (in the meantime, the capacitor stores the voltage being equal to or approaching the driving voltage VCC.) Accordingly, initially the inverter INV outputs a low logic level signal and the buffer BF2 outputs a high logic level signal, and hence the OR gate OG1 outputs a high logic level signal (a first pulse signal DP1) at the pulse signal output terminal 3111. At this moment, the detection result latching circuit 3120 (as illustrated in FIG. 15A) stores the detection result for the first time according to the detection result signal Sdr received from the detection determining circuit 3130 (as illustrated in FIG. 15A) and the pulse signal generated at the pulse signal output terminal 3111. During that initial pulse time period, as illustrated in FIG. 15A, the detection pulse generating module 3110 outputs a high logic level signal, which results in the detection result latching circuit 3120 outputting the result of that high logic level signal.

When the voltage on the connection node of the capacitor C13 and the resistor R13 decreases to the low logic trigger logic level, the buffer BF2 changes to output a low logic level signal to make the OR gate OG1 output a low logic level signal at the pulse signal output terminal 3111 (stops outputting the first pulse signal DP1.) The width of the first pulse signal DP1 output from the OR gate OG1 is determined by the capacitance value of the capacitor C13 and the resistance value of the resistor R13.

The operation after the buffer BF1 stops outputting the pulse signal is described as below. For example, the operation may be initially in an LED operating mode DRM. Since the capacitor C13 stores the voltage being almost equal to the driving voltage VCC, and when the buffer BF1 instantaneously changes its output from a high logic level signal to a low logic level signal, the voltage on the connection node of the capacitor C13 and the resistor R13 is below zero but will be pulled up to zero by the diode D11 rapidly charging the capacitor C13. Therefore, the buffer BF2 still outputs a low logic level signal.

In some embodiments, when the buffer BF1 instantaneously changes its output from a high logic level signal to a low logic level signal, the voltage on the one end of the capacitor C12 also changes from the driving voltage VCC to zero instantly. This makes the connection node of the capacitor C12 and the resistor R12 have a low logic level signal. At this moment, the output of the inverter INV changes to a high logic level signal to make the OR gate output a high logic level signal (a second pulse signal DP2) at the pulse signal output terminal 3111. The detection result latching circuit 3120 as illustrated in FIG. 15A stores the detection result for a second time according to the detection result signal Sdr received from the detection determining circuit 3130 (as illustrated in FIG. 15A) and the pulse signal generated at the pulse signal output terminal 3111. Next, the driving voltage VCC charges the capacitor C12 through the resistor R12 to make the voltage on the connection node of the capacitor C12 and the resistor R12 increase with time to the driving voltage VCC. When the voltage on the connection node of the capacitor C12 and the resistor R12 increases to reach a high logic trigger logic level, the inverter INV outputs a low logic level signal again to make the OR gate OG1 stop outputting the second pulse signal DP2. The width of the second pulse signal DP2 is determined by the capacitance value of the capacitor C12 and the resistance value of the resistor R12.

As those mentioned above, in certain embodiments, the detection pulse generating module 3110 generates two high logic level pulse signals in the detection mode DTM, which are the first pulse signal DP1 and the second pulse signal DP2. These pulse signals are output from the pulse signal output terminal 3111. Moreover, there is an interval TIV with a defined time between the first and second pulse signals DP2 (e.g., an opposite-logic signal, which may have a low logic level when the pulse signals have a high logic level). In embodiments using the circuits as shown in FIG. 15B to implement the detection pulse generating module 3110, the defined time is determined by the capacitance value of the capacitor C11 and the resistance value of the resistor R11. In other embodiments using digital circuits to implement the detection pulse generating module 3110, adjustment of the set interval TIV can be implemented by setting the signal frequency or period or other adjustable parameter(s) of the digital circuit of each embodiment.

From the detection mode DTM entering the LED operating mode DRM, the detection pulse generating module 3110 does not produce the pulse signal any more, and keeps the pulse signal output terminal 3111 on a low logic level potential. As described herein, the LED operating mode DRM is the stage following the detection mode (e.g., following the time after the second pulse signal DP2 ends). The LED operating mode DRM occurs when the LED tube lamp is at least partly connected to a power source, such as provided in a lamp socket. For example, the LED operating mode DRM may occur when part of the LED tube lamp, such as only one side of the LED tube lamp, is properly connected to one side of a lamp socket, and part of the LED tube lamp is either connected to a high impedance, such as a person, and/or is improperly connected to the other side of the lamp socket (e.g., is misaligned so that the metal contacts in the socket do not contact metal contacts in the LED tube lamp). The LED operating mode DRM may also occur when the entire LED tube lamp is properly connected to the lamp socket.

Figure 15C:
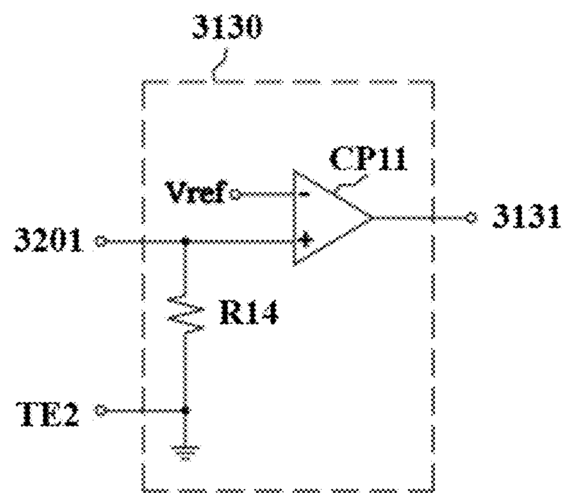

Referring to FIG. 15C, a detection determining circuit according to some certain embodiments is illustrated. An exemplary detection determining circuit 3130 includes a comparator CP11 and a resistor R14. The comparator CP11 may also be referred to as a first comparator CP11 and the resistor R14 may also be referred to as a fifth resistor R14. A negative input terminal of the comparator CP11 receives a reference logic level signal (or a reference voltage) Vref, a positive input terminal thereof is grounded through the resistor R14 and is also coupled to a switch circuit coupling terminal 3201. Referring to FIGS. 15A and 15C, the signal flowing into the switch circuit 3200 from the installation detection terminal TE1 outputs to the switch circuit coupling terminal 3201 to the resistor R14. When the current of the signal passing through the resistor R14 reaches a certain level (for example, bigger than or equal to a defined current for installation, (e.g. 2A) and this makes the voltage on the resistor R14 higher than the reference voltage Vref (referring to two end caps inserted into the lamp socket,) the comparator CP11 produces a high logic level detection result signal Sdr and outputs it to the detection result terminal 3131. For example, when an LED tube lamp is correctly installed on a lamp socket, the comparator CP11 outputs a high logic level detection result signal Sdr at the detection result terminal 3131, whereas the comparator CP11 generates a low logic level detection result signal Sdr and outputs it to the detection result terminal 3131 when a current passing through the resistor R14 is insufficient to make the voltage on the resistor R14 higher than the reference voltage Vref (referring to only one end cap inserted into the lamp socket.) Therefore, in some embodiments, when the LED tube lamp is incorrectly installed on the lamp socket or one end cap thereof is inserted into the lamp socket but the other one is grounded by an object such as a human body, the current will be too small to make the comparator CP11 output a high logic level detection result signal Sdr to the detection result terminal 3131.

Figure 15D:
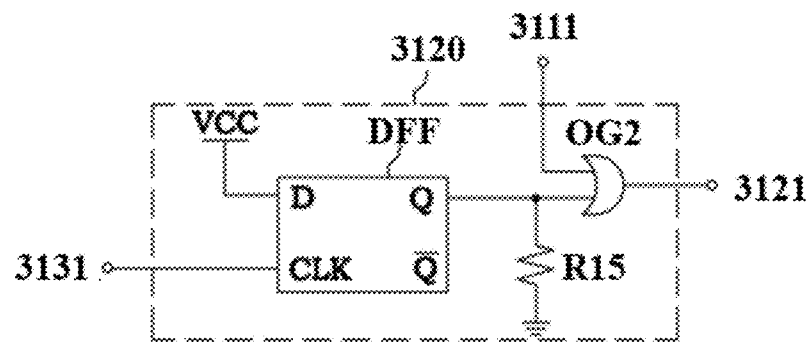

Referring to FIG. 15D, a schematic detection result latching circuit according to some embodiments of the present invention is illustrated. A detection result latching circuit 3120 includes a D flip-flop DFF, a resistor R15, and an OR gate OG2. The D flip-flop DFF may also be referred to as a first D flip-flop DFF, the resistor R15 may also be referred to as a fourth resistor R15, and the OR gate OG2 may also be referred to as a second OR gate OG2. The D flip-flop DFF has a CLK input terminal coupled to a detection result terminal 3131, and a D input terminal coupled to a driving voltage VCC. When the detection result terminal 3131 first outputs a low logic level detection result signal Sdr, the D flip-flop DFF initially outputs a low logic level signal at a Q output terminal thereof, but the D flip-flop DFF outputs a high logic level signal at the Q output terminal thereof when the detection result terminal 3131 outputs a high logic level detection result signal Sdr. The resistor R15 is coupled between the Q output terminal of the D flip-flop DFF and a reference voltage, such as ground potential. When the OR gate OG2 receives the first or second pulse signals DP1/DP2 from the pulse signal output terminal 3111 or receives a high logic level signal from the Q output terminal of the D flip-flop DFF, the OR gate OG2 outputs a high logic level detection result latching signal at a detection result latching terminal 3121. The detection pulse generating module 3110 only in the detection mode DTM outputs the first and the second pulse signals DP1/DP2 to make the OR gate OG2 output the high logic level detection result latching signal, and thus the D flip-flop DFF decides the detection result latching signal to be the high logic level or the low logic level the rest of the time, e.g., including the LED operating mode DRM after the detection mode DTM. Accordingly, when the detection result terminal 3131 has no high logic level detection result signal Sdr, the D flip-flop DFF keeps a low logic level signal at the Q output terminal to make the detection result latching terminal 3121 also keep a low logic level detection result latching signal in the detection mode DTM. On the contrary, once the detection result terminal 3131 has a high logic level detection result signal Sdr, the D flip-flop DFF outputs and keeps a high logic level signal (e.g., based on VCC) at the Q output terminal. In this way, the detection result latching terminal 3121 keeps a high logic level detection result latching signal in the LED operating mode DRM as well.

Figure 15E:
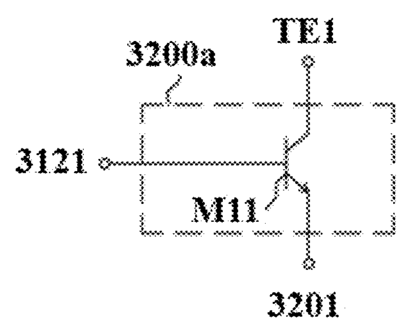

Referring to FIG. 15E, a schematic switch circuit according to some embodiments is illustrated. A switch circuit 3200*a* includes a transistor, such as a bipolar junction transistor (BJT) M11, as being a power transistor, which has the ability of dealing with high current/power and is suitable for the switch circuit. The BJT M11 may also be referred to as a first transistor M11. The BJT M11 has a collector coupled to an installation detection terminal TE1, a base coupled to a detection result latching terminal 3121, and an emitter coupled to a switch circuit coupling terminal 3201. When the detection pulse generating module 3110 produces the first and second pulse signals DP1/DP2, the BJT M11 is in a transient conducting state. This allows the detection determining circuit 3130 to perform the detection for determining the detection result latching signal to be a high logic level or a low logic level. When the detection result latching circuit 3120 outputs a high logic level detection result latching signal at the detection result latching terminal 3121, this means the LED tube lamp is correctly installed on the lamp socket, so that the BJT M11 is in the conducting state to make the installation detection terminals TE1 and TE2 conducting (i.e., make the power loop conducting). In the meantime, the driving circuit (not shown) in the power supply module starts to operate in response to the voltage received from the power loop and generates the lighting control signal Slc for controlling the conducting state of the power switch (not shown), so that the driving current can be produced to light up the LED module. In contrast, when the detection result latching circuit 3120 outputs a low logic level detection result latching signal at the detection result latching terminal 3121 and the output from detection pulse generating module 3110 is a low logic level, the BJT M11 is cut-off or in the blocking state to make the installation detection terminals TE1 and TE2 cut-off or blocking. In this case, the driving circuit of the power supply module would not be started, so that the lighting control signal Slc would not be generated.

Since the external driving signal Sed is an AC signal and in order to avoid the detection error resulting from the logic level of the external driving signal being just around zero when the detection determining circuit 3130 detects, the detection pulse generating module 3110 generates the first and second pulse signals DP1/DP2 to let the detection determining circuit 3130 perform two detections. So the issue of the logic level of the external driving signal being just around zero in a single detection can be avoided. In some cases, the time difference between the productions of the first and second pulse signals DP1/DP2 is not multiple times of half one cycle T of the external driving signal Sed. For example, it does not correspond to the multiple phase differences of 180 degrees of the external driving signal Sed. In this way, when one of the first and second pulse signals DP1/DP2 is generated and unfortunately the external driving signal Sed is around zero, it can be avoided that the external driving signal Sed is again around zero when the other pulse signal is generated.

The time difference between the productions of the first and second pulse signals DP1/DP2, for example, an interval TIV with a defined time between both of them can be represented as following:

$$TIV=(X+Y)(T/2),$$

where T represents the cycle of an external driving signal Sed, X is a natural number, $0<Y<1$, with Y in some embodiments in the range of 0.05-0.95, and in some embodiments in the range of 0.15-0.85.

A person of ordinary skill in the relevant art of the present disclosure can understand according to the above descriptions of embodiments that the method of generating two pulses or pulse signals so as to perform installation detection is merely an exemplary embodiment of how the detection pulse generating module operates, and that in practice the detection pulse generating module may be configured to generate at least one or two pulse signals so as to perform installation detection, although the present invention is not limited to any of these different numbers.

Furthermore, in order to avoid the installation detection module entering the detection mode DTM from misjudgment resulting from the logic level of the driving voltage VCC being too small, the first pulse signal DP1 can be set to be produced when the driving voltage VCC reaches or is higher than a defined logic level. For example, in some embodiments, the detection determining circuit 3130 works after the driving voltage VCC reaching a high enough logic level in order to prevent the installation detection module from misjudgment due to an insufficient logic level.

According to the examples mentioned above, when one end cap of an LED tube lamp is inserted into a lamp socket and the other one floats or electrically couples to a human body or other grounded object, the detection determining circuit outputs a low logic level detection result signal Sdr because of high impedance. The detection result latching circuit stores the low logic level detection result signal Sdr based on the pulse signal of the detection pulse generating module, making it as the low logic level detection result latching signal, and keeps the detection result in the LED operating mode DRM, without changing the logic value. In this way, the switch circuit keeps cutting-off or blocking instead of conducting continually. And further, the electric shock situation can be prevented and the requirement of safety standard can also be met. On the other hand, when two end caps of the LED tube lamp are correctly inserted into the lamp socket (e.g., at the timepoint td), the detection determining circuit outputs a high logic level detection result signal Sdr because the impedance of the circuit for the LED tube lamp itself is small. The detection result latching circuit stores the high logic level detection result signal Sdr based on the pulse signal of the detection pulse generating module, making it as the high logic level detection result latching signal, and keeps the detection result in the LED operating mode DRM. So the switch circuit keeps conducting to make the LED tube lamp work normally in the LED operating mode DRM.

In some embodiments, when one end cap of the LED tube lamp is inserted into the lamp socket and the other one floats or electrically couples to a human body, the detection determining circuit outputs a low logic level detection result signal Sdr to the detection result latching circuit, and then the detection pulse generating module outputs a low logic level signal to the detection result latching circuit to make the detection result latching circuit output a low logic level detection result latching signal to make the switch circuit cutting-off or blocking. As such, the switch circuit blocking makes the installation detection terminals, e.g. the first and second installation detection terminals, blocking. As a result, the LED tube lamp is in non-conducting or blocking state.

However, in some embodiments, when two end caps of the LED tube lamp are correctly inserted into the lamp socket, the detection determining circuit outputs a high logic level detection result signal Sdr to the detection result latching circuit to make the detection result latching circuit output a high logic level detection result latching signal to make the switch circuit conducting. As such, the switch circuit conducting makes the installation detection terminals, e.g. the first and second installation detection terminals, conducting. As a result, the LED tube lamp operates in a conducting state.

Thus, according to the operation of the installation detection module, a first circuit, upon connection of at least one end of the LED tube lamp to a lamp socket, generates and outputs two pulses, each having a pulse width, with a time period between the pulses. The first circuit may include various of the elements described above configured to output the pulses to a base of a transistor (e.g., a BJT transistor) that serves as a switch. The pulses occur during a detection mode DTM for detecting whether the LED tube lamp is properly connected to a lamp socket. The timing of the pulses may be controlled based on the timing of various parts of the first circuit changing from high to low logic levels, or vice versa.

The pulses can be timed such that, during that detection mode DTM time, if the LED tube lamp is properly connected to the lamp socket (e.g., both ends of the LED tube lamp are correctly connected to conductive terminals of the lamp socket), at least one of the pulse signals occurs when an AC current from an external driving signal is at a non-zero level. For example, the pulse signals can occur at intervals TIV that are different from half of the period of the AC signal. For example, respective start points or mid points of the pulse signals, or a time between an end of the first pulse signal DP1 and a beginning of the second pulse signal DP2 may be separated by an amount of time that is different from half of the period of the AC signal (e.g., it may be between 0.05 and 0.95 percent of a multiple of half of the period of the AC signal). During a pulse that occurs when the AC signal is at a non-zero level, a switch that receives the AC signal at the non-zero level may be turned on, causing a latch circuit to change states such that the switch remains permanently on so long as the LED tube lamp remains properly connected to the lamp socket. For example, the switch may be configured to turn on when each pulse is output from the first circuit. The latch circuit may be configured to change state only when the switch is on and the current output from the switch is above a threshold value, which may indicate a proper connection to a light socket. As a result, the LED tube lamp operates in a conducting state.

Accordingly, under the process of installing the LED tube lamp by a user, once the LED tube lamp is powered up (no matter whether the LED tube lamp is lighted up or not), the installation detection module of the LED tube lamp generates the pulse for detecting the installation state or the occurrence of electric shock before continuously conducting the power loop, so that the driving current is conducted through the power loop to drive the LED module after confirming the LED tube lamp is correctly installed or is not touched by the user. Therefore, the LED tube lamp would not be lighted up until the first pulse being generated, which means the power loop would not be conducted or the current on the power loop would be limited to less than 5 mA/MIU. In practical application, the period from the timepoint of the LED tube lamp being powered up to the timepoint of the first pulse being generated is substantially not less than 100 ms. For example, the LED tube lamp provided with the installation detection module of the present embodiment does not emit light until at least 100 ms after being installed and powered up. In some embodiments, since the installation detection module continuously generates the pulses before determining whether the installation state is correct or determining that the user does not touch the LED tube lamp, the LED tube lamp will be lighted up after at least the interval TIV (i.e., after the second pulse is generated) if the LED tube lamp is not lighted up after the first pulse is generated. In this example, if the LED tube lamp is not lighted up after 100 ms, the LED tube lamp does not emit light in at least 100+TIV ms as well. It should be noted that such an expression "the LED tube lamp is powered up" refers to the fact that an external power source (such as the AC powerline) is applied to the LED tube lamp, with a power loop of the LED tube lamp being electrically connected to a ground level so as to produce a voltage difference on the power loop. That the powered-up LED tube lamp is properly/correctly installed means the external power source is applied to the LED tube lamp and the LED tube lamp is electrically connected to the ground level through a ground line of the lamp fixture. And that the powered-up LED tube lamp is improperly/incorrectly installed refers to that the external power source is applied to the LED tube lamp and the LED tube lamp is electrically connected to the ground level not only through a ground line of the lamp fixture but also through a human body or other object of impedance, which means that in the state of being improperly/incorrectly installed an unexpected object or body of impedance happens to be serially connected on a current path in the power loop.

It should be noted that, the LED tube lamp being powered up refers to the external driving signal being applied to at least one pin of the LED tube lamp and causing a current flowing through the LED tube lamp, in which the current can be the driving current or the leakage current.

On the other hand, if both pulses occur when an external driving signal at the LED tube lamp has a near-zero current level, or a current level below a particular threshold, then the state of the latch circuit is not changed, and so the switch is only on during the two pulses, but then remains permanently off after the pulses and after the detection mode is over. For example, the latch circuit can be configured to remain in its present state if the current output from the switch is below the threshold value. In this manner, the LED tube lamp remains in a non-conducting state, which prevents electric shock, even though part of the LED tube lamp is connected to an electrical power source.

It is worth noting that according to certain embodiments, the pulse width of the pulse signal generated by the detection pulse generating module is between 1 μs to 1 ms, and it is used to make the switch circuit conducting for a short period when the LED tube lamp conducts instantaneously. In an exemplary embodiment, the pulse width of the pulse signal is between 10 μs to 1 ms. In another exemplary embodiment, the pulse width of the pulse signal is between 10 μs to 30 μs. In another exemplary embodiment, the pulse width of the pulse signal DP1/DP2 is in a broader range between 200 μs and 400 μs. In another exemplary embodiment, the pulse width of the pulse signal DP1/DP2 is within a range of between plus and minus 15% of 20 μs, 35 μs, or 45 μs. And in another exemplary embodiment, the pulse width of the pulse signal DP1/DP2 is within a range of between plus and minus 15% of 300 μs.

According to some embodiments, the pulse or pulse signal means a momentary occurrence of abrupt variation of a signal of voltage or current in a continual period of the signal, that is, in a short period of time the signal suddenly abruptly varies and then quickly returns to an initial value before variation. Thus the pulse signal may be a signal of voltage or current that varies or transitions from a low level to a high level and after a short time at the high level returns to the low level, or that varies or transitions from a high level to a low level and then returns to the high level, while the invention is not limited to any of these options. Such an expression "momentary occurrence of signal variation" corresponds to a period of time not sufficient for the LED tube lamp as a unit to change its state of operation and during which period the momentary signal variation is unlikely to cause an electric shock hazard on a touching human body. For example, when using the pulse signal DP1/DP2 to cause conduction of the switch circuit 3200/3200*a*, the duration of the conduction of the switch circuit 3200/3200*a* is so short as not to light up the LED module, and is so short as to cause an effective current on the power loop to not exceed a rated current upper limit (5 MIU). And the "abrupt variation of a signal" refers to an extent of variation of the pulse or pulse signal sufficient to cause an electrical element receiving it to respond thereto and then change the element's operation state. For example, when the switch circuit 3200/3200*a* receives the pulse signal DP1/DP2, the switch circuit 3200/3200*a* conducts or is cut off in response to switching of the signal level of the pulse signal DP1/DP2.

In some embodiments, a pulse current is generated to pass through the detection determining circuit for detecting and determining. Since the pulse is for a short time and not for a long time, the electric shock situation will not occur. Furthermore, the detection result latching circuit also keeps the detection result during the LED operating mode DRM (e.g., the LED operating mode DRM being the period after the detection mode DTM and during which part of the LED tube lamp is still connected to a power source), and no longer changes the detection result stored previously complying with the circuit state changing. A situation resulting from changing the detection result can thus be avoided. In some embodiments, the installation detection module, such as the switch circuit, the detection pulse generating module, the detection result latching circuit, and the detection determining circuit, could be integrated into a chip and then embedded in circuits for saving the circuit cost and layout space.

In addition, although the detection pulse generating module 3110 generates two pulse signals DP1 and DP2 for example, the detection pulse generating module 3110 of the present invention is not limited thereto. The detection pulse generating module 3110 is a circuit capable of generating a single pulse or plural pulses (greater than two pulses).

For an embodiment of the detection pulse generating module 3110 generating only one pulse or pulse signal, a simple circuit configuration using an RC circuit in combination with active electrical element(s) (having internal power source) can be used to implement the generation/issuance of only one pulse. For example, in some embodiments, the detection pulse generating module 3110 merely includes the capacitor C11, resistor R11 and buffer BF1. Under such configuration, the detection pulse generating module can only generate a single pulse signal DP1.

Under an embodiment of the detection pulse generating module 3110 generating a plurality of pulse signals, in some embodiments, the detection pulse generating module 3110 further includes a reset circuit (not shown). The reset circuit may reset the operation state of the circuits in the detection pulse generating module 3110 after the first pulse signal DP1 and/or the second pulse signal DP2 being generated, so that the detection pulse generating module 3110 can generate the first pulse signal DP1 and/or the second pulse signal DP2 again after a while. The generating of the plurality of pulse signals at intervals of a fixed period TIV may be for example generating a pulse signal every 20 ms to 2 s (that is, 20 ms TIV 2 s). In one embodiment, the fixed period TIV is between 500 ms and 2 s. In another embodiment, the fixed period TIV is in a range of between plus and minus 15% of 75 ms. In still another embodiment, the fixed period TIV is in a range of between plus and minus 15% of 45 ms. In still another embodiment, the fixed period TIV is in a range of between plus and minus 15% of 30 ms. And the generating of the plurality of pulse signals at intervals of a random period TIV may be for example performed by choosing a random value in a range of between 0.5 s and 2 s as the random period TIV between every two consecutive generated pulse signals.

In particular, the time and frequency for the detection pulse generating module 3110 to generate a pulse signal to perform installation detection may be set or adjusted taking account of effects of a detection current under a detection stage on a normal human body touching or exposed to the detection current. In general, as long as the magnitude and duration of the detection current which is flowing through the human body conform to limiting requirements of relevant standards, the detection current flowing through the human body will not cause the human body to feel or experience an electric shock hazard and will not endanger the safety of the human body. The magnitude and the duration of the detection current should be in inverse relation so as to conform to limiting requirements of relevant standards to avoid the electric shock hazard. For example, under the requirement that the detection current flowing through the human body does not endanger the safety of the human body, the larger the magnitude of the detection current, the shorter the duration of the detection current flowing through the human body should be; inversely, if the magnitude of the detection current is very small, a rather long duration of the detection current flowing through the human body still would or could not endanger the safety of the human body. Therefore, whether the detection current flowing through the human body endangers the safety of the human body or not is based on or determined by the amount of electric charge per unit time, or electric power, from the detection current and applied to or received by the human body, but not merely determined by the amount of electric charge received by the human body.

In some embodiments, the detection pulse generating module 3110 is configured to generate pulses or pulse signals for performing installation detection, only during a specific detection period, and outside the period to stop generating a pulse signal for installation detection, in order to prevent the detection current from causing electric shock on the touching human body. FIG. 37D is a signal waveform diagram of the detection current according to some embodiments, wherein the horizontal axis is the time axis (denoted by t) and the vertical axis represents value of the detection current (denoted by I). Referring to FIG. 37D, within a detection stage, the detection pulse generating module 3110 generates pulse signals for performing installation detection, during a specific detection period, to cause conduction of a detection path or a power loop in the LED tube lamp, wherein details of how the pulse width of each pulse and the interval between two consecutive pulses are set are referred to other described relevant embodiments elsewhere herein. Since the detection path or power loop is being conducted, a detection current signal Iin on the detection path or power loop, whose value may be obtained by measuring an input current to the power supply module of the LED tube lamp, includes a current pulse Idp generated corresponding to the time that each of the pulse signals is generated, and a detection determining circuit 3130 judges whether the LED tube lamp is correctly/properly installed on a lamp socket by measuring the value of the current pulse Idp. After the detection period Tw shown in FIG. 37D, the detection pulse generating module 3110 stops generating a pulse signal for installation detection, to cause the detection path or the power loop to be in a cutoff state. Viewing the detection current signal Iin broadly along the time axis, the detection pulse generating module 3110 generates a group of current pulses DPg during the detection period Tw, and judges whether the LED tube lamp is correctly/properly installed on a lamp socket by performing installation detection using the group of current pulses DPg. For example, in the embodiment of FIG. 37D, the detection pulse generating module 3110 generates current pulses Idp only during the detection period Tw, wherein the detection period Tw may be set in a range of between 0.5 s and 2 s and including every two-digit decimal number between and including the 0.5 s and 2 s, such as 0.51, 0.52, 0.53, . . . 0.60, 0.61, 0.62, . . . , 1.97, 1.98, 1.99, and 2, all in seconds, but this present invention is not limited to this range embodiment. And it is noted that by appropriately choosing a detection period Tw, it can be achieved that performing installation detection using the group of current pulses DPg does not generate excessive electrical power by the detection current that will endanger the touching human body, so the electric shock protection can be achieved.

With respect to circuit design, the way of the detection pulse generating module 3110 generating detection current pulses Idp only during the detection period Tw can be implemented by various different circuit embodiments. For example, in one embodiment, a detection pulse generating module 3110 is implemented by a pulse generating circuit (as illustrated in FIG. 15B or FIG. 16B) along with a timing circuit (not illustrated herein), wherein the timing circuit may be configured to, upon detecting a period, output a signal to cause the pulse generating circuit to stop generating the pulse(s). In another embodiment, a detection pulse generating module 3110 is implemented by a pulse generating module (as illustrated in FIG. 15B or FIG. 16B) along with a shielding/isolation circuit (not illustrated herein), wherein the shielding/isolation circuit may be configured to, after a predefined time, shield or prevent the detection pulse(s) from being generated or output by the pulse generating circuit, by any of a number of ways such as pulling (the voltage of) the output terminal of the detection pulse generating module to ground. Under the configuration with a shielding/isolation circuit, the shielding/isolation circuit may be implemented by a simple circuit such as an RC circuit, without the need to modify an original circuit design of the pulse generating circuit.

In some embodiments, the detection pulse generating module 3110 is configured to generate pulses or pulse signals for performing installation detection, at intervals each of which intervals between two consecutive pulses is set larger than or equal to a safety value, in order to prevent the detection current from causing electric shock on the touching human body. FIG. 37E is a signal waveform diagram of the detection current according to some exemplary embodiment. Referring to FIG. 37E, within a detection stage, the detection pulse generating module 3110 generates pulses for performing installation detection, at intervals each of which intervals between two consecutive pulses is set at TIVs (the 's' denoting second) larger than a specific safety value such as 1 second, to cause conduction of a detection path or a power loop in the LED tube lamp, wherein details of how the pulse width of each pulse is set are referred to other described relevant embodiments elsewhere herein. Since the detection path or power loop is being conducted, a detection current signal Iin on the detection path or power loop, whose value may be obtained by measuring an input current to the power supply module of the LED tube lamp, includes a current pulse Idp generated corresponding to the time that each of the pulse signals is generated, and a detection determining circuit 3130 judges whether the LED tube lamp is correctly/properly installed on a lamp socket by measuring the value of the current pulse Idp.

In some embodiments, the detection pulse generating module 3110 is configured to generate a group of pulses or pulse signals for performing installation detection, each group generated during a specific detection period Tw, periodically at intervals each of which intervals being larger than or equal to a specific safety value, in order to prevent the detection current from causing electric shock on the touching human body. FIG. 37F is a signal waveform diagram of the detection current according to a third embodiment. Referring to FIG. 37F, within a detection stage, the detection pulse generating module 3110 generates a group of pulse signals for performing installation detection, during a first detection period Tw, to cause conduction of a detection path or a power loop in the LED tube lamp, wherein details of how the pulse width of each pulse and the interval between two consecutive pulses are set are referred to other described relevant embodiments herein. Since the detection path or power loop is being conducted, a detection current signal Iin on the detection path or power loop includes a current pulse Idp generated corresponding to the time that each of the group of the pulse signals is generated, resulting in a first current pulse group DPg1 of the generated current pulses Idp for or during the first detection period Tw. After the first detection period Tw, during a set period TIV such as a period larger than or equal to 1 second, the detection pulse generating module 3110 stops generating a pulse signal for installation detection, to cause the detection path or the power loop to be in a cutoff state; and then the detection pulse generating module 3110 continues to generate again a group of pulse signals for performing installation detection, only upon entering into the next or a second detection period Tw. Similar to the operations and the waveform of the detection current signal Iin during the first detection period Tw, a second current pulse group DPg2 of generated current pulses Idp and a third current pulse group DPg3 of generated current pulses Idp are produced on the detection current signal Iin during the second detection period Tw and the third detection period Tw, respectively. And in this process, a detection determining circuit 3130 judges whether the LED tube lamp is correctly/properly installed on a lamp socket by measuring the value(s) of each of the first current pulse group DPg1, the second current pulse group DPg2, the third current pulse group DPg3, etc.

It's noted that in practice the magnitude of current of the current pulse Idp is related to or depends on impedance (such as resistance) on the detection path or power loop. Therefore when designing a detection pulse generating module 3110, the format of the output detection pulse may be designed according to the adopted choice and configuration of the detection path or power loop.

In some embodiments, the time point for generating the pulse signal DP1/DP2 can be determined by sampling the external driving signal/AC driving signal and the pulse width of the pulse signal DP1/DP2 is designed to be fixed. For example, the detection pulse generating module includes a sampling circuit and a pulse generating circuit. The sampling circuit outputs a pulse generating signal to the pulse generating circuit when the AC voltage of the external driving signal rises or falls to exceed a reference voltage, so that the pulse generating circuit outputs a pulse signal when receiving the pulse generating signal.

As discussed in the above examples, in some embodiments, an LED tube lamp includes an installation detection circuit comprising a first circuit configured to output two pulse signals, the first pulse signal DP1 output at a first time and the second pulse signal DP2 output at a second time after the first time, and a switch configured to receive an LED driving signal and to receive the two pulse signals, wherein the two pulse signals control turning on and off of the switch. The installation detection circuit may be configured to, during a detection mode DTM, detect during each of the two pulse signals whether the LED tube lamp is properly connected to a lamp socket. When it is not detected during either pulse signal that the LED tube lamp is properly connected to the lamp socket, the switch may remain in an off state after the detection mode DTM. When it is detected during at least one of the pulse signals that the LED tube lamp is properly connected to the lamp socket, the switch may remain in an on state after the detection mode DTM. The two pulse signals may occur such that they are separated by a time different from a multiple of half of a period of the LED driving signal, and such that at least one of them does not occur when the LED driving signal has a current value of substantially zero. It should be noted that although a circuit for producing two pulse signals is described, the disclosure is not intended to be limiting as such. For example, a circuit may be implemented such that a plurality of pulse signals may occur, wherein at least two of the plurality of pulse signals are separated by a time different from a multiple of half of a period of the LED driving signal, and such that at least one of the plurality of pulse signals does not occur when the LED driving signal has a current value of substantially zero.

Figure 16A:
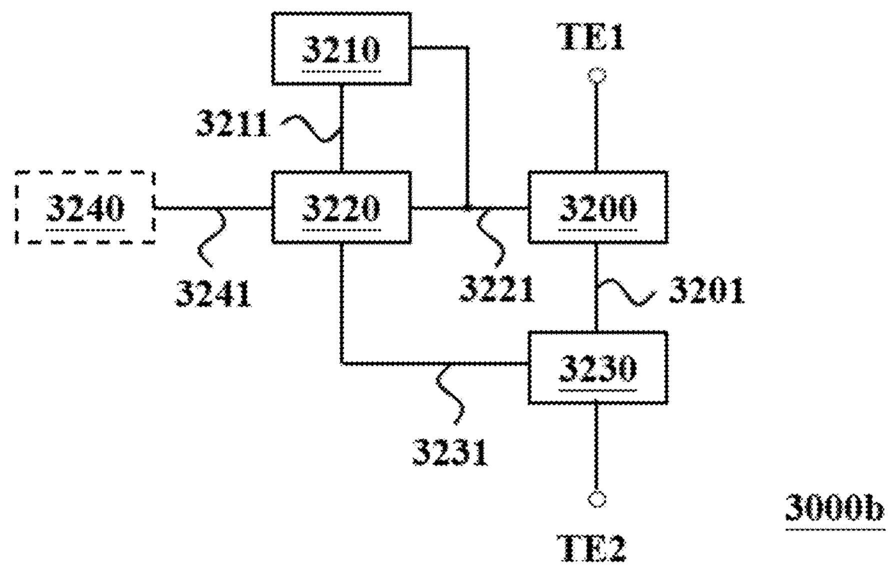
FIG. 16A is a block diagram of an installation detection module according to some exemplary embodiments.
Figure 16B:
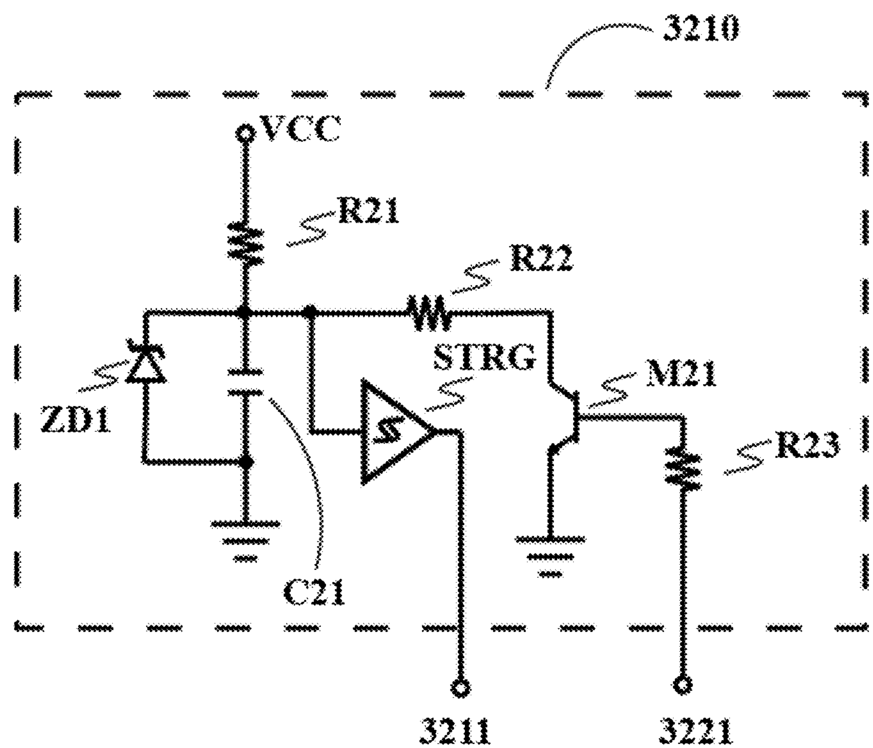
FIGS. 16B-16E are schematic circuit diagrams of an installation detection module according to some exemplary embodiments.

Referring to FIG. 16A, an installation detection module according to an exemplary embodiment is illustrated. The installation detection module 3000*b* includes a detection pulse generating module 3210 (which may also be referred to as a detection pulse generating circuit or a first circuit), a detection result latching circuit 3220 (which may also be referred to as a second circuit), a switch circuit 3200 (which may also be referred to as a third circuit), and a detection determining circuit 3230 (which may also be referred to as a fourth circuit). In some embodiments, the first circuit 3210, the second circuit 3220 and the fourth circuit 3230 can be referred to a detection circuit or an electric shock detection/protection circuit, which is configured to control the switching state of the switch circuit/third circuit 3200.

Figure 37B:
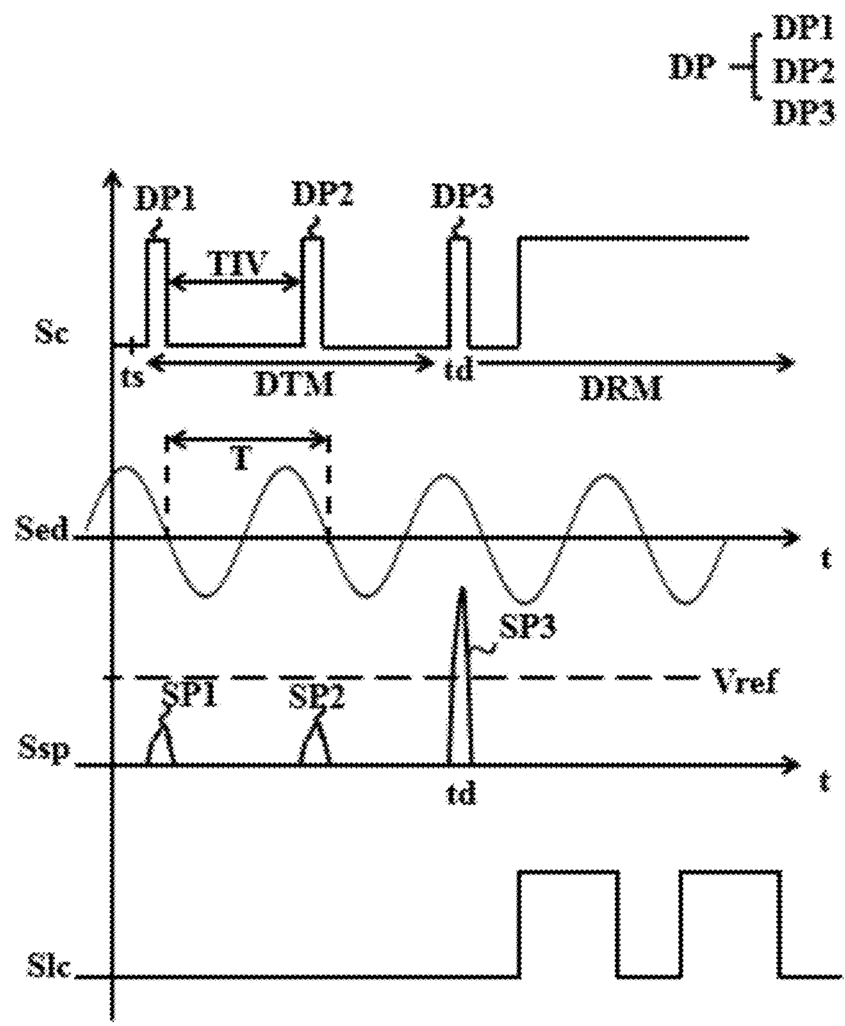

FIG. 37B is a signal waveform diagram of an exemplary power supply module according to an exemplary embodiment. The installation detection operation is described further in accordance with FIG. 37B. The detection pulse generating module 3210 is coupled (e.g., electrically connected) to the detection result latching circuit 3220 via a path 3211, and is configured to generate a control signal Sc having at least one pulse signal DP. A path as described herein may include a conductive line connecting between two components, circuits, or modules, and may include opposite ends of the conductive line connected to the respective components, circuits or modules. The detection result latching circuit 3220 is coupled (e.g., electrically connected) to the switch circuit 3200 via a path 3221, and is configured to receive and output the control signal Sc from the detection pulse generating module 3210. The switch circuit 3200 is coupled (e.g., electrically connected) to one end (e.g., a first installation detection terminal TE1) of a power loop of an LED tube lamp and the detection determining circuit 3230, and is configured to receive the control signal Sc output from the detection result latching circuit 3220, and configured to conduct (or turn on) during the control signal Sc so as to cause the power loop of the LED tube lamp to be conducting. The detection determining circuit 3230 is coupled (e.g., electrically connected) to the switch circuit 3200, the other end (e.g., a second installation detection terminal TE2) of the power loop of the LED tube lamp and the detection result latching circuit 3220, and is configured to detect at least one sample signal Ssp on the power loop when the switch circuit 3200 and the power loop are conductive, so as to determine an installation state between the LED tube lamp and a lamp socket. The power loop of the present embodiment can be regarded as a detection path of the installation detection module. The detection determining circuit 3230 is further configured to transmit detection result(s) to the detection result latching circuit 3220 for next control. In some embodiments, the detection pulse generating module 3210 is further coupled (e.g., electrically connected) to the output of the detection result latching circuit 3220 to control the time of the pulse signal DP.

In some embodiments, one end of a first path 3201 is coupled to a first node of the detection determining circuit 3230 and the opposite end of the first path 3201 is coupled to a first node of the switch circuit 3200. In some embodiments, a second node of the detection determining circuit 3230 is coupled to the second installation detection terminal TE2 of the power loop and a second node of the switch circuit 3200 is coupled to the first installation detection terminal TE1 of the power loop. In some embodiments, one end of a second path 3231 is coupled to a third node of the detection determining circuit 3230 and the opposite end of the second path 3231 is coupled to a first node of the detection result latching circuit 3220, one end of a third path 3211 is coupled to a second node of the detection result latching circuit 3220 and the opposite end of the third path 3211 is coupled to a first node of the detection pulse generating circuit 3210. In some embodiments, one end of a fourth path 3221 is coupled to a third node of the switch circuit 3200 and the opposite end of the fourth path 3221 is coupled to a third node of the detection result latching circuit 3220. In some embodiments, the fourth path 3221 is also coupled to a second node of the detection pulse generating circuit 3210.

In some embodiments, the detection determining circuit 3230 is configured for detecting a signal between the first installation detection terminal TE1 and the second installation detection terminal TE2 through the first path 3201 and the switch circuit 3200. For example, because of the above configuration, the detection determining circuit 3230 is capable of detecting and determining whether a current passing through the first installation detection terminal TE1 and the second installation detection terminal TE2 is below or above a predetermined current value and transmitting or providing a detection result signal Sdr to the detection result latching circuit 3220 via the second path 3231.

In some embodiments, the detection pulse generating circuit 3210, also referred to generally as a pulse generating circuit, generates a pulse signal DP through the detection result latching circuit 3220 to make the switch circuit 3200 remain in a conducting state during the pulse signal. For example, the pulse signal DP generated by the detection pulse generating circuit 3210 controls turning on the switch circuit 3200 which is coupled to the detection pulse generating circuit 3210. As a result of maintaining a conducting state of the switch circuit 3200, the power loop of the LED tube lamp between the installation detection terminals TE1 and TE2 is also maintained in a conducting state. The detection determining circuit 3230 detects a sample signal Ssp on the power loop and generates a signal based on a detection result to inform the detection result latching circuit 3220 of a time point for latching (storing) the detection result received by the detection result latching circuit 3220 from the detection determining circuit 3230. For example, the detection determining circuit 3230 may be a circuit configured to generate a signal that causes a latching circuit, such as the detection result latching circuit 3220 to enter and remain in a state that corresponds to one of a conducting state (e.g., "on" state) and a cut-off state for the LED tube lamp. The detection result latching circuit 3220 stores the detection result according to the detection result signal Sdr (or detection result signal Sdr and pulse signal DP1/DP2), and transmits or provides the detection result to the switch circuit 3200 coupled to the third node of the detection result latching circuit 3220 via the fourth path 3221. The switch circuit 3200 receives the detection result transmitted from the detection result latching circuit 3220 via the third node of the switch circuit 3200 and controls the state between conducting or cut off between the installation detection terminals TE1 and TE2 according to the detection result. For example, when the detection determining circuit 3230 detects during the pulse signal DP that the LED tube lamp is not properly installed on the lamp socket, the pulse signal DP controls the switch circuit 3200 to remain in an off state to cause a power loop of the LED tube lamp to be open, and when the detection determining circuit 3230 detects during the pulse signal DP that the LED tube lamp is properly installed on the lamp socket, the pulse signal DP controls the switch circuit 3200 to remain in a conducting state to cause the power loop of the LED tube lamp to maintain a conducting state.

In some embodiments, the installation detection module **3000*b* further includes an emergency control module 3240, whose configurations and operations are similar to those of the described emergency control module 3140** above and thus are not repeatedly described again here.

In some embodiments, the detection pulse generating module 3210, detection determining circuit 3230, detection result latching circuit 3220, and the switching circuit 3200 of the installation detection module **3000*b* comprise or are implemented by, but are not limited to, circuit structures of FIGS. 16B-16E respectively, which FIGS. 16B-16E are circuit structure diagrams of respective circuits and module of an installation detection module 3000*b* according to a second embodiment. Descriptions of the circuit embodiments of FIGS. 16B-16**E are presented below.

Referring to FIG. 16B, a detection pulse generating module according to an exemplary embodiment is illustrated. The detection pulse generating module 3210 includes: a resistor R21 (which also may be referred to as a sixth resistor), a capacitor C21 (which also may be referred to as a fourth capacitor), a Schmitt trigger STRG, a resistor R22 (which also may be referred to as a seventh resistor), a transistor M21 (which also may be referred to as a second transistor), and a resistor R23 (which also may be referred to as an eighth resistor).

In some embodiments, one end of the resistor R21 is connected to a driving signal, for example, VCC, and the other end of the resistor R21 is connected to one end of the capacitor C21. The other end of the capacitor C21 is connected to a ground node. In some embodiments, the Schmitt trigger STRG has an input end and an output end, the input end connected to a connection node of the resistor R21 and the capacitor C21, the output end connected to the detection result latching circuit 3220 via the third path 3211 (FIG. 16A). In some embodiments, one end of the resistor R22 is connected to the connection node of the resistor R21 and the capacitor C21 and the other end of the resistor R22 is connected to a collector of the transistor M21. An emitter of the transistor M21 is connected to a ground node. In some embodiments, one end of the resistor R23 is connected to a base of the transistor M21 and the other end of the resistor R23 is connected to the detection result latching circuit 3220 (FIG. 16A) and the switch circuit 3200 (FIG. 16A) via the fourth path 3221. In certain embodiments, the detection pulse generating module 3210 further includes: a Zener diode ZD1, having an anode and a cathode, the anode connected to the other end of the capacitor C21 to the ground, the cathode connected to the end of the capacitor C21 (the connection node of the resistor R21 and the capacitor C21). The detection pulse generating modules 3110 and 3210 in the embodiments of FIG. 15B and FIG. 16B are merely examples, and in practice specific operations of a detection pulse generating circuit may be performed based on configured functional modules in an embodiment of FIG. 33, and thus will be described in detail below with reference to FIG. 33.

Figure 16C:
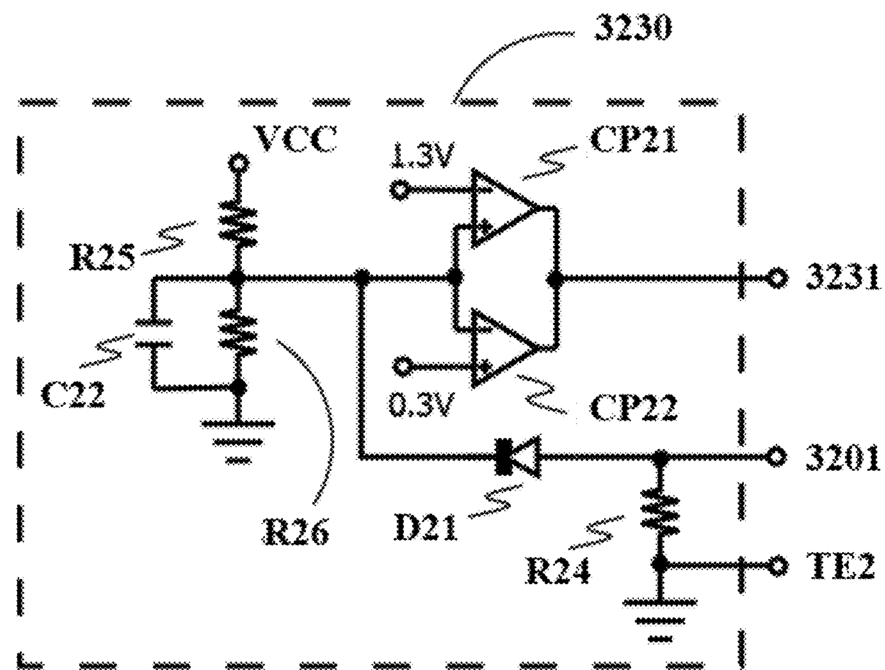

Referring to FIG. 16C, a detection determining circuit according to an exemplary embodiment is illustrated. The detection determining circuit 3230 includes: a resistor R24 (which also may be referred to as a ninth resistor), one end of the resistor R24 connected to the emitter of the transistor M22 (FIG. 16E), the other end of the resistor R24 connected to the other end of the power loop, such as the second installation detection terminal TE2; a diode D21 (which also may be referred to as a second diode), having an anode and a cathode, the anode connected to an end of the resistor STRG that is not connected to a ground node; a comparator CP21 (which also may be referred to as a second comparator), having a first input end, a second input end, and an output end; a comparator CP22 (which also may be referred to as a third comparator), having a first input end, a second input end, and an output end; a resistor R25 (which also may be referred to as a tenth resistor); a resistor R26 (which also may be referred to as an eleventh resistor); and a capacitor C22 (which also may be referred to as a fifth capacitor).

Figure 16D:
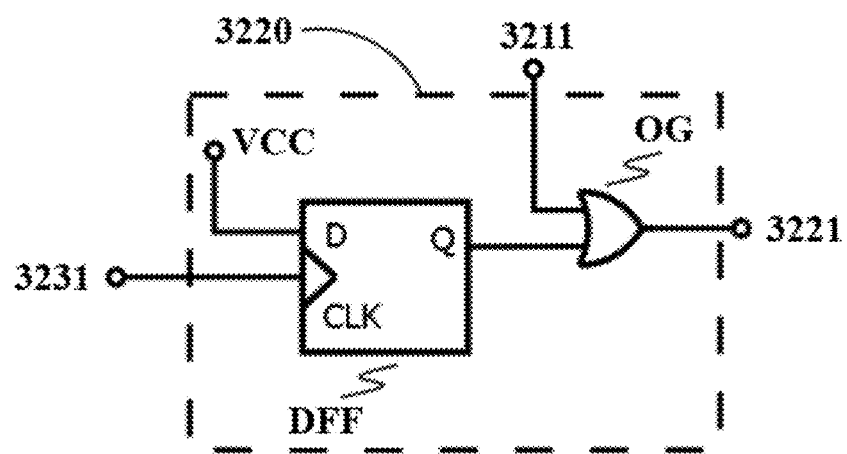

In some embodiments, the first input end of the comparator CP21 is connected to a predefined signal, for example, a reference voltage, Vref=1.3V, but the reference voltage value is not limited thereto, the second input end of the comparator CP21 is connected to the cathode of the diode D21, and the output end of the comparator CP21 is connected to the clock input end of the D flip-flop DFF (FIG. 16D). In some embodiments, the first input end of the comparator CP22 is connected to the cathode of the diode D21, the second input end of the comparator CP22 is connected to another predefined signal, for example, a reference voltage, Vref=0.3V, but the reference voltage value is not limited thereto, and the output end of the comparator CP22 is connected to the clock input end of the D flip-flop DFF (FIG. 16D). In some embodiments, one end of the resistor R25 is connected to the driving signal mentioned above (e.g., VCC) and the other end of the resistor R25 is connected to the second input end of the comparator CP21 and one end of the resistor R26 that is not connected to a ground node and the other end of the resistor R26 is connected to the ground node. In some embodiments, the capacitor C22 is connected to the resistor R26 in parallel. In certain embodiments, the diode D21, the comparator CP22, the resistors R25 and R26, and the capacitor C22 may be omitted, and the second input end of the comparator CP21 may be directly connected to the end of the resistor R24 (e.g., the end of the resistor R24 that is not connected to the ground node) when the diode D21 is omitted. In certain embodiments, the resistor R24 may include two resistors connected in parallel based on the consideration of power consumption having an equivalent resistance value ranging from about 0.1 ohm to about 5 ohm.

Referring to FIG. 16D, a detection result latching circuit according to an exemplary embodiment is illustrated. The detection result latching circuit 3220 includes: a D flip-flop DFF (which also may be referred to as a second D flip-flop), having a data input end D, a clock input end CLK, and an output end Q, the data input end D connected to the driving signal mentioned above (e.g., VCC), the clock input end CLK connected to the detection determining circuit 3230 (FIG. 16C); and an OR gate OG (which also may be referred to as a third OR gate), having a first input end, a second input end, and an output end, the first input end connected to the output end of the Schmitt trigger STRG (FIG. 16B), the second input end connected to the output end Q of the D flip-flop DFF, the output end of the OR gate OG connected to the other end of the resistor R23 (FIG. 16B) and the switch circuit 3200 (FIG. 16A).

Figure 16E:
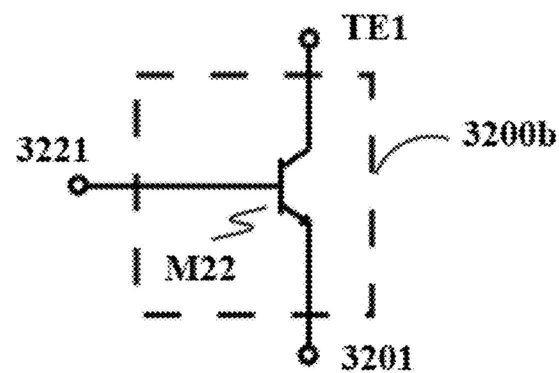

Referring to FIG. 16E, a switch circuit according to an exemplary embodiment is illustrated. The switch circuit 3200 includes: a transistor M22 (which also may be referred to as a third transistor), having a base, a collector, and an emitter, the base connected to the output of the OR gate OG via the fourth path 3221 (FIG. 16D), the collector connected to one end of the power loop, such as the first installation detection terminal TE1, the emitter connected to the detection determining circuit 3230 (FIG. 16A). In some embodiments, the transistor M22 may be replaced by other equivalently electronic parts, e.g., a MOSFET.

In some embodiments, some parts of the installation detection module may be integrated into an integrated circuit (IC) in order to provide reduced circuit layout space resulting in reduced manufacturing cost of the circuit. For example, the Schmitt trigger STRG of the detection pulse generating module 3210, the detection result latching circuit 3220, and the two comparators CP21 and CP22 of the detection determining circuit 3230 may be integrated into an IC, but the disclosure is not limited thereto.

An operation of the installation detection module will be described in more detail according to some example embodiments. In one exemplary embodiment, the capacitor voltage may not mutate; the voltage of the capacitor in the power loop of the LED tube lamp before the power loop is conductive is zero and the capacitor's transient response may appear to have a short-circuit condition; when the LED tube lamp is correctly installed to the lamp socket, the power loop of the LED tube lamp in a transient response may have a smaller current-limiting resistance and a bigger peak current; and when the LED tube lamp is incorrectly installed to the lamp socket, the power loop of the LED tube lamp in transient response may have a bigger current-limiting resistance and a smaller peak current. This embodiment may also meet the UL standard to make the leakage current of the LED tube lamp less than 5 MIU (Measurement Indication Unit), in which the unit "MIU" is defined by. The following table illustrates the current comparison in a case when the LED tube lamp works normally (e.g., when the two end caps of the LED tube lamp are correctly installed to the lamp socket) and in a case when the LED tube lamp is incorrectly installed to the lamp socket (e.g., when one end cap of the LED tube lamp is installed to the lamp socket but the other one is touched by a human body).

| | Correct installation | Incorrect installation |
|---|---|---|
| Maximum transient current | | $i_{pk\_max} = \frac{V_{in\_pk}}{R_{fuse} + 500} = \frac{305 \times 1.414}{10 + 50} = 845\text{ mA}$ |
| Minimum transient current | $i_{pk\_max} = \frac{V_{in}}{R_{fuse}} = \frac{50}{10} = 5A$ | |

As illustrated in the above table, in the part of the denominator: $R_{fuse}$ represents the resistance of the fuse of the LED tube lamp. For example, 10 ohm may be used, but the disclosure is not limited thereto, as resistance value for $R_{fuse}$ in calculating the minimum transient current $i_{pk\_min}$ and 510 ohm may be used as resistance value for $R_{fuse}$ in calculating the maximum transient current $i_{pk\_max}$ (an additional 500 ohms is used to emulate the conductive resistance of human body in transient response). In the part of the numerator: maximum voltage from the root-mean-square voltage (Vmax=Vrms*1.414=305*1.414) is used in calculating the maximum transient current $i_{pk\_max}$ and minimum voltage difference, for example, 50V (but the disclosure is not limited thereto) is used in calculating the minimum transient current $i_{pk\_min}$. Accordingly, when the LED tube lamp is correctly installed to the lamp socket (e.g., when two end caps of the LED tube lamp are installed to the lamp socket correctly) and works normally, its minimum transient current is 5 A. But, when the LED tube lamp is incorrectly installed to the lamp socket (e.g., when one end cap is installed to the lamp socket but the other one is touched by human body), its maximum transient current is only 845 mA. Therefore, certain examples of the disclosed embodiments use the current which passes transient response and flows through the capacitor in the LED power loop, such as the capacitor of the filtering circuit, to detect and determine the installation state between the LED tube lamp and the lamp socket. For example, such embodiments may detect whether the LED tube lamp is correctly installed to the lamp socket. Certain examples of the disclosed embodiments further provide a protection mechanism to protect the user from electric shock caused by touching the conductive part of the LED tube lamp which is incorrectly installed to the lamp socket. The embodiments mentioned above are used to illustrate certain aspects of the disclosed invention but the disclosure is not limited thereto.

Further, referring to FIG. 16A again, in some embodiments, when an LED tube lamp is being installed to a lamp socket, after a period (e.g., the period utilized to determine the cycle of a pulse signal), the detection pulse generating module 3210 outputs a first high level voltage rising from a first low level voltage to the detection result latching circuit 3220 through a path 3211 (also referred to as a third path). The detection result latching circuit 3220 receives the first high level voltage, and then simultaneously outputs a second high level voltage to the switch circuit 3200 and the detection pulse generating module 3210 through a path 3221 (also referred to as a fourth path). In some embodiments, when the switch circuit 3200 receives the second high level voltage, the switch circuit 3200 conducts to cause the power loop of the LED tube lamp to be conducting as well. In this exemplary embodiment, the power loop at least includes the first installation detection terminal TE1, the switch circuit 3200, the path 3201 (also referred to as a first path), the detection determining circuit 3230, and the second installation detection terminal TE2. In the meantime, the detection pulse generating module 3210 receives the second high level voltage from the detection result latching circuit 3220, and after a period (e.g., the period utilized to determine the width (or period) of pulse signal), its output from the first high level voltage falls back to the first low level voltage (the first time of the first low level voltage, the first high level voltage, and the second time of the first low level voltage form a first pulse signal DP1). In some embodiments, when the power loop of the LED tube lamp is conductive, the detection determining circuit 3230 detects a first sample signal, such as a voltage signal, on the power loop. When the first sample signal is greater than or equal to a predefined signal, such as a reference voltage, the installation detection module determines that the LED tube lamp is correctly installed to the lamp socket according to the application principle of this disclosed embodiments described above. Therefore, the detection determining circuit 3230 included in the installation detection module outputs a third high level voltage (also referred to as a first high level signal) to the detection result latching circuit 3220 through a path 3231 (also referred to as a second path). The detection result latching circuit 3220 receives the third high level voltage (also referred to as the first high level signal) and continues to output a second high level voltage (also referred to as a second high level signal) to the switch circuit 3200. The switch circuit 3200 receives the second high level voltage (also referred to as the second high level signal) and maintains conducting state to cause the power loop to remain conducting. The detection pulse generating module 3210 does not generate any pulse signal while the power loop remains conductive.

However, in some embodiments, when the first sample signal is smaller than the predefined signal, the installation detection module, according to certain exemplary embodiments as described above, determines that the LED tube lamp has not been correctly installed to the lamp socket. Therefore, the detection determining circuit 3230 outputs a third low level voltage (also referred to as a first low level signal) to the detection result latching circuit 3220. The detection result latching circuit 3220 receives the third low level voltage (also referred to as the first low level signal) and continues to output a second low level voltage (also referred to as a second low level signal) to the switch circuit 3200. The switch circuit 3200 receives the second low level voltage (also referred to as the second low level signal) and then keeps blocking to cause the power loop to remain open. Accordingly, the occurrence of electric shock caused by touching the conductive part of the LED tube lamp which is incorrectly installed on the lamp socket can be sufficiently avoided.

In some embodiments, when the power loop of the LED tube lamp remains open for a period (a period that represents the width (or period) of pulse signal DP or the pulse-on period of the control signal Sc), the detection pulse generating module 3210 outputs the first high level voltage rising from the first low level voltage to the detection result latching circuit 3220 through the path 3211 once more. The detection result latching circuit 3220 receives the first high level voltage, and then simultaneously outputs a second high level voltage to the switch circuit 3200 and the detection pulse generating module 3210. In some embodiments, when the switch circuit 3200 receives the second high level voltage, the switch circuit 3200 conducts again to cause the power loop of the LED tube lamp (in this exemplary embodiment, the power loop at least includes the first installation detection terminal TE1, the switch circuit 3200, the path 3201, the detection determining circuit 3230, and the second installation detection terminal TE2) to be conducting as well. In the meantime, the detection pulse generating module 3210 receives the second high level voltage from the detection result latching circuit 3220, and after a period (a period that is utilized to determine the width (or period) of pulse signal DP), its output from the first high level voltage falls back to the first low level voltage (the third time of the first low level voltage, the second time of the first high level voltage, and the fourth time of the first low level voltage form a second pulse signal DP2). In some embodiments, when the power loop of the LED tube lamp is conductive again, the detection determining circuit 3230 also detects a second sample signal SP2, such as a voltage signal, on the power loop yet again. When the second sample signal SP2 is greater than or equal to the predefined signal (e.g., the reference voltage Vref), the installation detection module determines, according to certain exemplary embodiments described above, that the LED tube lamp is correctly installed to the lamp socket. Therefore, the detection determining circuit 3230 outputs a third high level voltage (also referred to as a first high level signal) to the detection result latching circuit 3220 through the path 3231. The detection result latching circuit 3220 receives the third high level voltage (also referred to as the first high level signal) and continues to output a second high level voltage (also referred to as a second high level signal) to the switch circuit 3200. The switch circuit 3200 receives the second high level voltage (also referred to as the second high level signal) and maintains a conducting state to cause the power loop to remain conducting. The detection pulse generating module 3210 does not generate any pulse signal while the power loop remains conductive.

In some embodiments, when the second sample signal SP2 is smaller than the predefined signal, the installation detection module determines, according to certain exemplary embodiments described above, that the LED tube lamp has not been correctly installed to the lamp socket. Therefore, the detection determining circuit 3230 outputs the third low level voltage (also referred to as the first low level signal) to the detection result latching circuit 3220. The detection result latching circuit 3220 receives the third low level voltage (also referred to as the first low level signal) and continues to output the second low level voltage (also referred to as the second low level signal) to the switch circuit 3200. The switch circuit 3200 receives the second low level voltage (also referred to as the second low level signal) and then keeps blocking to cause the power loop to remain open. According to the disclosure mentioned above, the pulse width (i.e., pulse on-time) and the pulse period are dominated by the pulse signal provided by the detection pulse generating module 3210 during the detection mode DTM; and the signal level of the control signal is determined according to the detection result signal Sdr provided by the detection determining circuit 3230 after the detection mode DTM.

According to the embodiments of FIG. 37B, since the signal level of the first sample signal SP1 generated based on the first pulse signal DP1 and the second sample signal SP2 generated based on the second pulse signal DP2 are smaller than the reference voltage Vref, the switch circuit 3200 is maintained to be cut off and the driving circuit (not shown) does not perform effective power conversion during the timepoint is to td (i.e., the detection mode DTM). The effective power conversion refers to generating sufficient power for driving the LED module to emit light. The detection determining circuit 3230 generates a detection result, indicating the LED tube lamp has been correctly installed or is not touched by a user, according to the third sample signal SP3 greater than the reference voltage Vref during the pulse-on period of the third pulse signal DP3, so that the switch circuit 3200 is maintained in the conducting state in response to the high level voltage output by the detection result latching circuit 3220 and the power loop is therefore maintained in the conducting state as well. After the power loop is conducting, the driving circuit of the power supply module starts to operate based on the voltage on the power loop, so as to generate the lighting control signal Slc for controlling the conducting state of the power switch (not shown).

Next, referring to FIG. 16B to FIG. 16E at the same time, in some embodiments when an LED tube lamp is being installed to a lamp socket, the capacitor C21 is charged by the driving signal VCC, for example, Vcc, through the resistor R21. And when the voltage of the capacitor C21 rises enough to trigger the Schmitt trigger STRG, the Schmitt trigger STRG outputs a first high level voltage rising from a first low level voltage in an initial state to an input end of the OR gate OG. After the OR gate OG receives the first high level voltage from the Schmitt trigger STRG, the OR gate OG outputs a second high level voltage to the base of the transistor M22 and the resistor R23. When the base of the transistor M22 receives the second high level voltage from the OR gate OG, the collector and the emitter of the transistor M22 are conducting to further cause the power loop of the LED tube lamp (in this exemplary embodiment, the power loop at least includes the first installation detection terminal TE1, the transistor M22, the resistor STRG, and the second installation detection terminal TE2) to be conducting as well. In the meantime, the base of the transistor M21 receives the second high level voltage from the OR gate OG through the resistor R23, and then the collector and the emitter of the transistor M21 are conductive and grounded to cause the voltage of the capacitor C21 to be discharged to the ground through the resistor R22. In some embodiments, when the voltage of the capacitor C21 is not enough to trigger the Schmitt trigger STRG, the Schmitt trigger STRG outputs the first low level voltage falling from the first high level voltage (a first instance of a first low level voltage at a first time, followed by a first high level voltage, followed by a second instance of the first low level voltage at a second time form a first pulse signal DP1). When the power loop of the LED tube lamp is conductive, the current passing through the capacitor in the power loop, such as, the capacitor of the filtering circuit, by transient response flows through the transistor M22 and the resistor R24 and forms a voltage signal on the resistor R24. The voltage signal is compared to a reference voltage, for example, 1.3V, but the reference voltage is not limited thereto, by the comparator CP21. When the voltage signal is greater than and/or equal to the reference voltage, the comparator CP21 outputs a third high level voltage to the clock input end CLK of the D flip-flop DFF. In the meantime, since the data input end D of the D flip-flop DFF is connected to the driving signal VCC, the D flip-flop DFF outputs a high level voltage (at its output end Q) to another input end of the OR gate OG. This causes the OR gate OG to keep outputting the second high level voltage to the base of the transistor M22, and further results in the transistor M22 and the power loop of the LED tube lamp remaining in a conducting state. Besides, since the OR gate OG keeps outputting the second high level voltage to cause the transistor M21 to be conducting to the ground, the capacitor C21 is unable to reach an enough voltage to trigger the Schmitt trigger STRG.

However, when the voltage signal on the resistor R24 is smaller than the reference voltage, the comparator CP21 outputs a third low level voltage to the clock input end CLK of the D flip-flop DFF. In the meantime, since the initial output of the D flip-flop DFF is a low level voltage (e.g., zero voltage), the D flip-flop DFF outputs a low level voltage (at its output end Q) to the other input end of the OR gate OG. Moreover, the Schmitt trigger STRG connected by the input end of the OR gate OG also restores outputting the first low level voltage, the OR gate OG thus keeps outputting the second low level voltage to the base of the transistor M22, and further results in the transistor M22 to remain in a blocking state (or an off state) and the power loop of the LED tube lamp to remain in an open state. Still, since the OR gate OG keeps outputting the second low level voltage to cause the transistor 2764 to remain in a blocking state (or an off state), the capacitor C21 is charged by the driving voltage VCC through the resistor R21 once again for next (pulse signal) detection.

In some embodiments, the cycle (or interval TIV) of the pulse signal is determined by the values of the resistor R21 and the capacitor C21. In certain cases, the cycle of the pulse signal may include a value ranging from about 3 milliseconds to about 500 milliseconds or may be ranging from about 20 milliseconds to about 50 milliseconds. In some cases, the cycle of the pulse signal may include a value ranging from about 500 milliseconds to about 2000 milliseconds. In some embodiments, the width (or period) of the pulse signal is determined by the values of the resistor R22 and the capacitor C21. In certain cases, the width of the pulse signal may include a value ranging from about 1 microsecond to about 100 microseconds or may be ranging from about 10 microseconds to about 20 microseconds. In the embodiments of FIG. 16B and FIG. 16C, descriptions of mechanisms for generating pulse signal(s) and of corresponding states of applied detection current are according to certain embodiments can be seen referring to those of the embodiments of FIGS. 37D-37F, and thus are not presented here again.

The Zener diode ZD1 provides a protection function but it may be omitted in certain cases. The resistor STRG may include two resistors connected in parallel based on the consideration of power consumption in certain cases, and its equivalent resistance may include a value ranging from about 0.1 ohm to about 5 ohm. The resistors R25 and R26 provides the function of voltage division to make the input of the comparator CP22 bigger than the reference voltage, such as 0.3V, but the value of the reference voltage is not limited thereto. The capacitor C22 provides the functions of regulation and filtering. The diode D21 limits the signal to be transmitted in one way. In addition, the installation detection module disclosed by the example embodiments may also be adapted to other types of LED lighting equipment with dual-end power supply, e.g., the LED lamp directly using commercial power as its external driving signal. However, the invention is not limited to the above example embodiments.

Based on the embodiments illustrated in FIG. 16A to FIG. 16E, compared to the installation detection module of FIG. 15A, the installation detection module illustrated in FIG. 16A uses the control signal output by the detection result latching circuit 3220 for the reference of determining the end of the pulse or resetting the pulse signal by feeding back the control signal to the detection pulse generating module 3210. Since the pulse on-time is not merely determined by the detection pulse generating module 3210, the circuit design of the detection pulse generating module can be simplified. Compared to the detection pulse generating module illustrated in FIG. 15B, the number of the components of the detection pulse generating module illustrated in FIG. 16B is less than the detection pulse generating module 3110, and thus the detection pulse generating module 3210 may have lower power consumption and may be more suitable for integrated design.

Figure 17A:
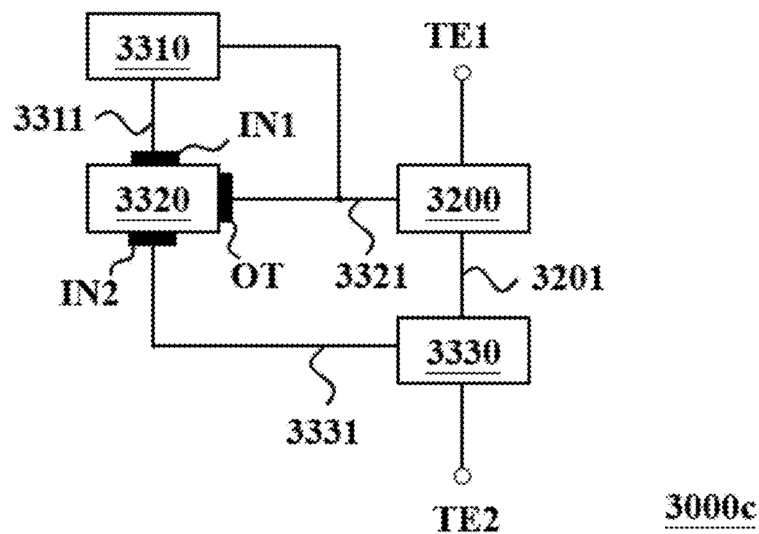
FIG. 17A is a block diagram of an installation detection module according to some exemplary embodiments.

Referring to FIG. 17A, a block diagram of an installation detection module according to an exemplary embodiment is illustrated. The installation detection module 3000*c* includes a pulse generating auxiliary circuit 3310, an integrated control module 3320, a switch circuit 3200, and a detection determining auxiliary circuit 3330. The operation of the installation detection module of the present embodiment is similar to the embodiment of FIGS. 16A to 16C, and thus the signal waveform of the present embodiment can refer to the embodiment illustrated in FIG. 37B. The integrated control module 3320 includes at least three pins such as two input terminals IN1 and IN2 and an output terminal OT. The pulse generating auxiliary circuit 3310 is connected to the input terminal IN1 and the output terminal OT of the integrated control module 3320 and configured to assist the integrated control module 3320 for generating a control signal. The detection determining auxiliary circuit 3330 is connected to the input terminal IN2 of the integrated control module 3320 and the switch circuit 3200 and configured to transmit a sample signal related to the signal passing through the LED power loop to the input terminal IN2 of the integrated control module 3320 when the switch circuit 3200 and the LED power loop are conducting, such that the integrated control module 3320 may determine an installation state between the LED tube lamp and the lamp socket according to the sample signal. For example, the sample signal may be based on an electrical signal passing through the power loop during the pulse-on period of the pulse signal (e.g., the rising portion of the pulse signal). Switch circuit 3200 is connected between one end of the LED power loop and the detection determining auxiliary circuit 3330 and configured to receive the control signal, outputted by the integrated control module 3320, in which the LED power loop is conducting during an enable period of the control signal (i.e., the pulse-on period).

Specifically, under the detection mode DTM, the integrated control module 3320 temporarily causes the switch circuit 3200 to conduct, according to the signal received from the input terminal IN1, by outputting the control signal having at least one pulse. During the detection mode DTM, the integrated control module 3320 may detect whether the LED tube lamp is properly connected to the lamp socket and latch the detection result according to the signal on the input terminal IN2. The detection result is regarded as the basis of whether to cause the switch circuit 3200 to conduct after the detection mode DTM (i.e., it determines whether to provide power to LED module). The detail circuit structure and operations of the present embodiment will be described below.

Figure 17B:
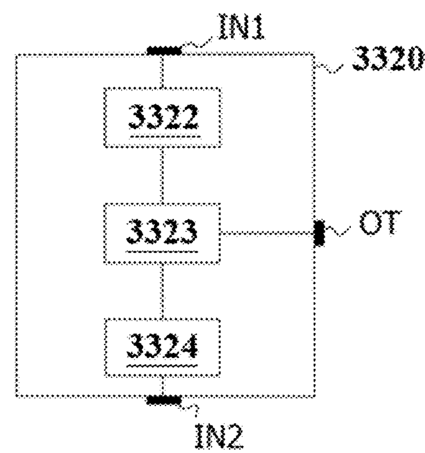
FIGS. 17B-17E are schematic circuit diagrams of an installation detection module according to some exemplary embodiments.

Referring to FIG. 17B, an inner circuit diagram of an integrated control module according to some exemplary embodiments is illustrated. The integrated control module 3320 includes a pulse generating unit 3322, a detection result latching unit 3323, and a detection unit 3324. The pulse generating unit 3322 receives the signal provided by the pulse generating auxiliary circuit 3310 from the input terminal IN1 and accordingly generates a pulse signal. The generated pulse signal will be provided to the detection result latching unit 3323. In an exemplary embodiment, the pulse generating unit 3322 can be implemented by a Schmitt trigger (not shown, it can use a Schmitt trigger such as STRG illustrated in FIG. 16B). According to the exemplary embodiment mentioned above, the Schmitt trigger has an input end coupled to the input terminal IN1 of the integrated control module 3320 and an output terminal coupled to the output terminal OT of the integrated control module 3320 (e.g., through the detection result latching unit 3323). It should be noted that, the pulse generating unit 3322 is not limited to be implemented by the Schmitt trigger, any analog/digital circuit capable of implementing the function of generating the pulse signal having at least one pulse may be utilized in some disclosed embodiments.

The detection result latching unit 3323 is connected to the pulse generating unit 3322 and the detection unit 3324. During the detection mode DTM, the detection result latching unit 3323 outputs the pulse signal generated by the pulse generating unit 3322 as the control signal to the output terminal OT. On the other hand, the detection result latching unit 3323 further stores the detection result signal Sdr provided by the detection unit 3324 and outputs the stored detection result signal Sdr to the output terminal OT after the detection mode DTM, so as to determine whether to cause the switch circuit 3200 to conduct according to the installation state of the LED tube lamp. In an exemplary embodiment, the detection latching unit 3323 can be implemented by a circuit structure constituted by a D flip-flop and an OR gate (not shown, for example it can use the D flip-flop DFF and OR gate OG illustrated in FIG. 16D). According to the exemplary embodiment mentioned above, the D flip-flop has a data input end connected to the driving voltage VCC, a clock input end connected to the detection unit 3324, and an output end. The OR gate has a first input end connected to the pulse generating unit 3322, a second input end connected to the output end of the D flip-flop, and an output end connected to the output terminal OT. It should be noted that, the detection result latching unit 3323 is not limited to be implemented by the aforementioned circuit structure, any analog/digital circuit capable of implementing the function of latching and outputting the control signal to control the switching of the switch circuit may be utilized in the present invention.

The detection unit 3324 is coupled to the detection result latching unit 3323. The detection unit 3324 receives the signal provided by the detection determining auxiliary circuit 3330 from the input terminal IN2 and accordingly generates the detection result signal Sdr indicating the installation state of the LED tube lamp, in which the generated detection result signal Sdr will be provided to the detection result latching unit 3323. In an exemplary embodiment, detection unit 3324 can be implemented by a comparator (not shown, it can be, for example, the comparator CP21 illustrated in FIG. 16C). According to the exemplary embodiment mentioned above, the comparator has a first input end receiving a setting signal, a second input end connected to the input terminal IN2, and an output end connected to the detection result latching unit 3323. It should be noted that, the detection unit 3324 is not limited to be implemented by the comparator, any analog/digital circuit capable of implementing the function of determining the installation state based on the signal on the input terminal IN2 may be utilized in some disclosed embodiments.

Figure 17C:
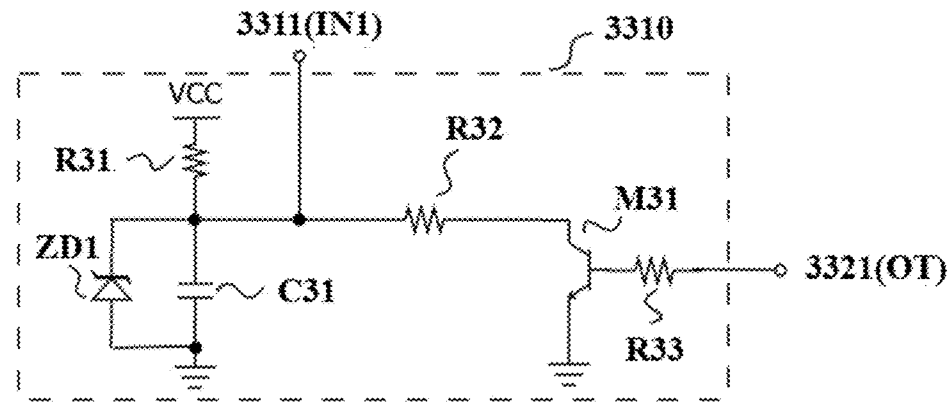

Referring to FIG. 17C, a circuit diagram of a pulse generating auxiliary circuit according to some exemplary embodiments is illustrated. The pulse generating auxiliary circuit 3310 includes resistors R31, R32, and R33, a capacitor C31, and a transistor M31. The resistor R31 has an end connected to a driving voltage (e.g., VCC). The capacitor C31 has an end connected to another end of the resistor R31, and another end connected to ground. The resistor R32 has an end connected to the connection node of the resistor R31 and the capacitor C31. The transistor M31 has a base, a collector connected to another end of the resistor R32, and an emitter connected to the ground. The resistor R33 has an end connected to the base of the transistor M31, and another end connected to the output terminal OT of the integrated control module 3320 and the control terminal of the switch circuit 3200 via the path 3311. The pulse generating auxiliary circuit 3310 further includes a Zener diode ZD1. The Zener diode ZD1 has an anode connected to another end of the capacitor C31 and the ground and a cathode connected to the end connecting the capacitor C31 and the resistor R31.

Figure 17D:
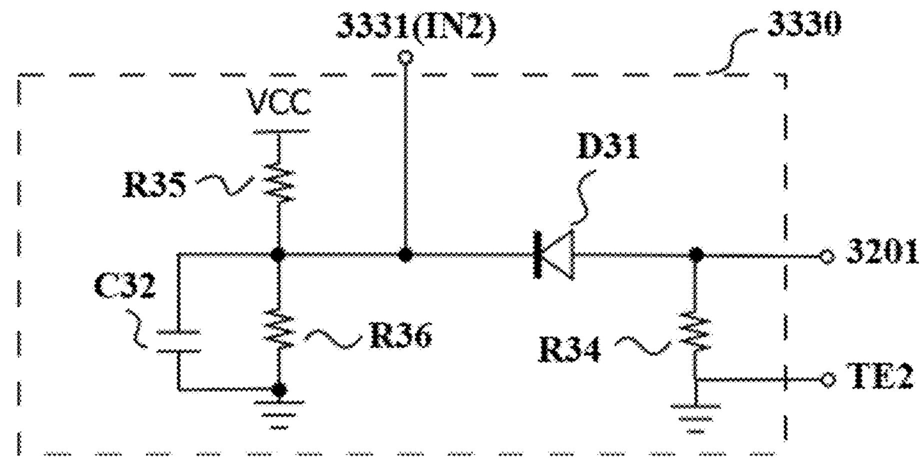

Referring to FIG. 17D, a circuit diagram of a detection determining auxiliary circuit according to some exemplary embodiments is illustrated. The detection determining auxiliary circuit 3330 includes resistors R34, R35 and R36, a capacitor C32 and diode D31. The resistor R34 has an end connected to the switch circuit 3200, and another end connected to another end of the LED power loop (e.g., the second installation detection terminal TE2). The resistor R35 has an end connected to the driving voltage (e.g., VCC). The resistor R36 has an end connected to another end of the resistor R35 and the input terminal IN2 of the integrated control module 3320 via the path 3331, and another end connected to the ground. The capacitor C32 is connected to the resistor R36 in parallel. The diode D31 has an anode connected to the end of the resistor R34 and a cathode connected to the connection node of the resistors R35 and R36. In one exemplary embodiment, the resistors R35 and R36, the capacitor C32, and the diode D31 can be omitted. When the diode D31 is omitted, one end of the resistor R34 is directly connected to the input terminal IN2 of the integrated control module 3320 via the path 3331. In another one exemplary embodiment, the resistor R34 can be implemented by two paralleled resistors based on the power consideration, in which the equivalent resistance of each resistors can be 0.1 ohm to 5 ohm.

Figure 17E:
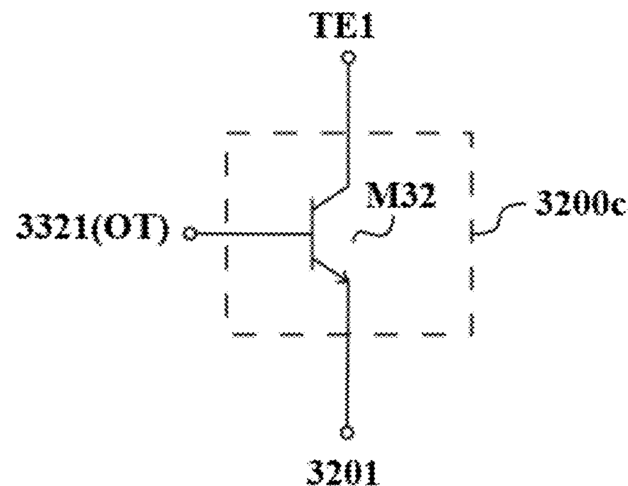

Referring to FIG. 17E, a circuit diagram of a switch circuit according to some exemplary embodiments is illustrated. The switch circuit 3200*c* includes a transistor M32. The transistor M32 has a base connected to the output terminal OT of the integrated control module 3320 via the path 3321, a collector connected to one end of the LED power loop (e.g., the first installation detection terminal TE1), and an emitter connected to the detection determining auxiliary circuit. In some embodiments, the transistor M32 may be replaced by other equivalently electronic parts, e.g., a MOSFET.

It should be noted that, the installation detection module of the present embodiment utilizes the same installation detection principle as the aforementioned embodiment. For example, the capacitor voltage may not mutate; the voltage of the capacitor in the power loop of the LED tube lamp before the power loop being conductive is zero and the capacitor's transient response may appear to have a short-circuit condition; when the LED tube lamp is correctly installed to the lamp socket, the power loop of the LED tube lamp in transient response may have a smaller current-limiting resistance and a bigger peak current; and when the LED tube lamp is incorrectly installed to the lamp socket, the power loop of the LED tube lamp in transient response may have a bigger current-limiting resistance and a smaller peak current. This embodiment may also meet the UL standard to make the leakage current of the LED tube lamp less than 5 MIU. For example, the present embodiment may determine whether the LED tube lamp is correctly/properly connected to the lamp socket by detecting the transient response of the peak current. Therefore, the detail operation of the transient current under the correct installation state and the incorrect installation state may be seen by referring to the aforementioned embodiment, and it will not be repeated herein. The following disclosure will focus on describing the entire circuit operation of the installation detection module illustrated in FIG. 17A to 17E.

Referring to FIG. 17A again, when an LED tube lamp is being installed to a lamp socket, the driving voltage may be provided to modules/circuits within the installation detection module 3000*c* when power is provided to at least one end cap of the LED tube lamp. The pulse generating auxiliary circuit 3310 starts charging in response to the driving voltage. The output voltage (referred to "first output voltage" hereinafter) of the pulse generating auxiliary circuit 3310 rises from a first low level voltage to a voltage level greater than a forward threshold voltage after a period (e.g., the period utilized to determine the cycle of a pulse signal), in which the first output voltage may output to the input terminal of the integrated control module 3320 via the path 3311. After receiving the first output voltage from the input terminal IN1, the integrated control module 3320 outputs an enabled control signal (e.g., a high level voltage) to the switch circuit 3200*c* and the pulse generating auxiliary circuit 3310. When the switch circuit 3200*c* receives the enabled control signal, the switch circuit 3200*c* is turned on so that a power loop of the LED tube lamp is conducted as well. Herein, at least the first installation detection terminal TE1, the switch circuit 3200*c*, the path 3201, the detection determining auxiliary circuit 3330 and the second installation detection terminal TE2 are included in the power loop. In the meantime, the pulse generating auxiliary circuit 3310 conducts a discharge path for discharging in response to the enabled control signal. The first output voltage falls down to the first low level voltage from the voltage greater than the forward threshold voltage. When the first output voltage is less than a reverse threshold voltage (which can be defined based on the circuit design), the integrated control module 3320 pulls the enabled control signal down to a disable level in response to the first output voltage (i.e., the integrated control module 3320 outputs a disabled control signal, in which the disabled control signal is, for example, a low level voltage), and thus the control signal has a pulse-type signal waveform (i.e., the first time of the first low level voltage, the first high level voltage, and the second time of the first low level voltage form a first pulse signal DP1). When the power loop is conducting, the detection determining auxiliary circuit 3330 detects a first sample signal (e.g., voltage signal) on the power loop and provides the first sample signal to the integrated control module 3320 via the input terminal IN2. When the integrated control module 3320 determines the first sample signal is greater than or equal to a setting signal (e.g., a reference voltage), which may represent the LED tube lamp has been properly installed on the lamp socket, the integrated control module 3320 outputs and keeps the enabled control signal to the switch circuit 3200*c*. Since receiving the enabled control signal, the switch circuit 3200*c* remains in the conductive state so that the power loop of the LED tube lamp is kept on the conductive state as well. During the period when the switch circuit 3200*c* receives the enabled control signal, the integrated control module 3320 does not output the pulses anymore.

On the contrary, when the integrated control module 3320 determines the first sample signal is less than the setting signal, which may represent the LED tube lamp has not been properly installed on the lamp socket yet, the integrated control module 3320 outputs and keeps the disabled control signal to the switch circuit 3200*c*. As a result of receiving the disabled control signal, the switch circuit 3200*c* remains in the non-conducting state so that the power loop of the LED tube lamp is kept on the non-conducting state as well.

Since the discharge path of the pulse generating auxiliary circuit 3310 is cut off, the pulse generating auxiliary circuit 3310 starts to charge again. Therefore, after the power loop of the LED tube lamp remains in a non-conducting state for a period (i.e., pulse on-time), the first output voltage of the pulse generating auxiliary circuit 3310 rises from the first low level voltage to the voltage greater than the forward threshold voltage again, in which the first output voltage may output to the input terminal of the integrated control module 3320 via the path 3311. After receiving the first output voltage from the input terminal IN1, the integrated control module 3320 pulls up the control signal from the disable level to an enable level (i.e., the integrated control module 3320 outputs the enabled control signal) and provides the enabled control signal to the switch circuit 3200*c* and the pulse generating auxiliary circuit 3310. When the switch circuit 3200*c* receives the enabled control signal, the switch circuit 3200*c* is turned on so that the power loop of the LED tube lamp is conducted as well. Herein, at least the first installation detection terminal TE1, the switch circuit 3200*c*, the path 3201, the detection determining auxiliary circuit 3330 and the second installation detection terminal TE2 are included in the power loop. In the meantime, the pulse generating auxiliary circuit 3310 conducts, in response to the enabled control signal, a discharge path again for discharging. The first output voltage gradually falls down to the first low level voltage from the voltage greater than the forward threshold voltage again. When the first output voltage is less than a reverse threshold voltage (which can be defined based on the circuit design), the integrated control module 3320 pulls the enabled control signal down to a disable level in response to the first output voltage (i.e., the integrated control module 3320 outputs a disabled control signal, in which the disabled control signal is, for example, a low level voltage), and thus the control signal has a pulse-type signal waveform (i.e., the third time of the first low level voltage, the second time of the high level voltage, and the fourth time of the first low level voltage form a second pulse signal DP2). When the power loop is conducted again, the detection determining auxiliary circuit 3330 detects a second sample signal (e.g., voltage signal) on the power loop and provides the second sample signal to the integrated control module 3320 via the input terminal IN2. When the integrated control module 3320 determines the second sample signal is greater than or equal to a setting signal (e.g., a reference voltage), which may represent the LED tube lamp has been properly installed on the lamp socket, the integrated control module 3320 outputs and keeps the enabled control signal to the switch circuit 3200*c*. Since receiving the enabled control signal, the switch circuit 3200*c* remains in the conductive state so that the power loop of the LED tube lamp is kept on the conductive state as well. During the period when the switch circuit 3200*c* receives the enabled control signal, the integrated control module 3320 does not output the pulses anymore.

When the integrated control module 3320 determines the second sample signal is less than the setting signal, which may represent the LED tube lamp has not been properly installed on the lamp socket yet, the integrated control module 3320 outputs and keeps the disabled control signal to the switch circuit 3200*c*. Since receiving the disabled control signal, the switch circuit 3200*c* remains in the non-conducting state so that the power loop of the LED tube lamp is kept on the non-conducting state as well. Based on the above operation, when the LED tube lamp has not been properly installed on the lamp socket, the problem in which users may get electric shock caused by touching the conductive part of the LED tube lamp can be prevented.

Operation of circuits/modules within the installation detection module is further described below. Referring to FIG. 17B to 17E, when the LED tube lamp is installed in the lamp socket, the capacitor C31 is charged by a driving voltage VCC via resistor R31. When the voltage of the capacitor C31 is raised to trigger the pulse generating unit 3322 (i.e., the voltage of the capacitor C31 is raised greater than the forward threshold voltage), the output of the pulse generating unit 3322 changes to a first high level voltage from an initial first low level voltage and provides to the detection result latching unit 3323. After receiving the first high level voltage outputted by the pulse generating unit 3322, the detection result latching unit 3323 outputs a second high level voltage to the base of the transistor M32 and the resistor R33 via the output terminal OT. After the second high level voltage outputted from the detection result latching unit 3323 is received by the base of the transistor M32, the collector and the emitter of the transistor are conducted so as to conduct the power loop of the LED tube lamp. Herein, at least the first installation detection terminal TE1, the transistor M32, the resistor R34, and the second installation detection terminal TE2 are included in the power loop.

In the meantime, the base of the transistor M31 receives the second high level voltage on the output terminal OT via the resistor R33. The collector and the emitter of the transistor M31 are conducting and connected to the ground, such that the capacitor C31 discharges to the ground via the resistor R32. When the voltage of the capacitor C31 is insufficient so that the pulse generating unit 3322 cannot be triggered, the output of the pulse generating unit 3322 is pulled down to the first low level voltage from the first high level voltage (i.e., the first time of the first low level voltage, the first high level voltage, and the second time of the first low level voltage form a first pulse signal DP1). When the power loop is conducting, the current, generated by the transient response, passing through a capacitor (e.g., filtering capacitor in the filtering circuit) in the LED power loop flows through the transistor M32 and the resistor R34 so as to build a voltage signal on the resistor R34. The voltage signal is provided to the input terminal IN2, and thus the detection unit 3324 may compare the voltage signal on the input terminal IN2 (i.e., the voltage on the resistor R34) with a reference voltage.

When the detection unit 3324 determines the voltage signal on the resistor R34 is greater than or equal to the reference voltage, the detection unit outputs a third high level voltage to the detection result latching unit 3323. On the contrary, when the detection unit 3324 determines the voltage signal on the resistor R34 is less than the reference voltage, the detection unit 3324 outputs a third low level voltage to the detection result latching unit 3323.

The detection result latching unit 3323 latches/stores the third high level voltage/third low level voltage provided by the detection unit 3324 and performs a logic operation based on the latched/stored signal and the signal provided by the pulse generating unit 3322, such that the detection result latching unit 3323 outputs the control signal. Herein, the result of the logic operation determines whether the signal level of the outputted control signal is the second high level voltage or the second low level voltage.

More specifically, when the detection unit 3324 determines that the voltage signal on the resistor is greater than or equal to the reference voltage, the detection result latching unit 3323 may latch the third high level voltage outputted by the detection unit 3324, and the second high level voltage is maintained to be output to the base of the transistor M32, so that the transistor M32 and the power loop of the LED tube lamp maintain the conductive state. Since the detection result latching unit 3323 may continuously output the second high level voltage, the transistor M31 is conducted to the ground as well, so that the voltage of the capacitor C31 cannot rise enough to trigger the pulse generating unit 3322. When the detection unit 3324 determines that the voltage signal on the resistor R34 is less than the reference voltage, both the detection unit 3324 and the pulse generating unit 3322 provide a low level voltage, and thus the detection result latching unit 3323 continuously outputs, after performing the OR logical operation, the second low level voltage to the base of the transistor M32. Therefore, the transistor M32 is maintained to be cut off and the power loop of the LED tube lamp is maintained in the non-conducting state. However, since the control signal on the output terminal OT is maintained at a second low level voltage, the transistor M31 is thus maintained in a cut-off state as well, and repeatedly performs the next (pulse) detection until the capacitor C31 is charged by the driving voltage VCC via the resistor R31 again.

It should be noted that, the detection mode DTM described in this embodiment can be defined as the period that the driving voltage VCC is provided to the installation detection module 3000*c*, however, the detection unit 3324 has not yet determined that the voltage signal on the resistor R34 is greater than or equal to the reference voltage. During the detection mode DTM, since the control signal outputted by the detection result latching unit 3323 alternatively conducts and cuts off the transistor M31, the discharge path is periodically conducted and cut off, correspondingly. Thus, the capacitor C31 is periodically charged and discharged in response to the conducting state of the transistor M31, so that the detection result latching unit 3323 outputs the control signal having a periodic pulse waveform during the detection mode DTM. The detection mode DTM ends when the detection unit 3324 determines that the voltage signal on the resistor R34 is greater than or equal to the reference voltage or the driving voltage VCC is stopped. The detection result latching unit 3323 is maintained to output the control signal having the second high level voltage or the second low level voltage after the detection mode DTM.

In one embodiment, compared to the exemplary embodiment illustrated in FIG. 16A, the integrated control module 3320 is constituted by integrating part of the circuit components in the detection pulse generating module 3210, the detection result latching circuit 3220, and the detection determining circuit 3230 (e.g., as part of an integrated circuit). Another part of the circuit components which are not integrated in the integrated control module 3320 constitutes the pulse generating auxiliary circuit 3310 and the detection determining auxiliary circuit 3330 of the embodiment illustrated in FIG. 17A. In some embodiments, the function/circuit configuration of the combination of the pulse generating unit 3322 in the integrated control module 3320 and the pulse generating auxiliary circuit 3310 can be equivalent to the detection pulse generating module 3210. The function/circuit configuration of the detection result latching unit 3323 in the integrated control module 3320 can be equivalent to the detection result latching module 3220. The function/circuit configuration of the combination of the detection unit 3324 in the integrated control module 3320 and the detection determining auxiliary circuit 3330 can be equivalent to the detection determining circuit 3230. In these embodiments, the circuit elements included in the pulse generating unit 3322, the detection result latching unit 3323, and the detection unit 3324 are included in an integrated circuit (e.g., formed on a die or chip).

Figure 18A:
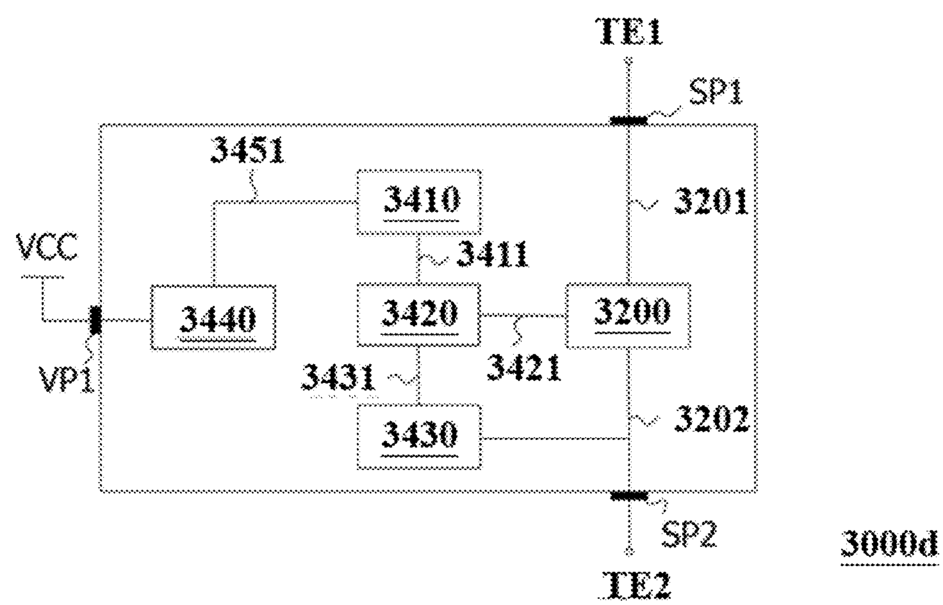
FIG. 18A is a block diagram of an installation detection module according to some exemplary embodiments.

Referring to FIG. 18A, an internal circuit block diagram of a three-terminal switch device according to an exemplary embodiment is illustrated. The installation detection module according to one embodiment is, for example, a three-terminal switch device 3000*d* including a power terminal VP1, a first switching terminal SP1, and a second switching terminal SP2. The power terminal VP1 of the three-terminal switch device 3000*d* is adapted to receive a driving voltage VCC. The first switching terminal SP1 is adapted to connect one of the first installation detection terminal TE1 and the second installation detection terminal TE2 (the first switching terminal SP1 is illustrated as being connected to the first installation detection terminal TE1 in FIG. 18A, but the invention is not limited thereto), and the second switching terminal SP2 is adapted to connect to the other one of the first installation detection terminal TE1 and the second installation detection terminal TE2 (the second switching terminal SP2 is illustrated as being connected to the second installation detection terminal TE2 in FIG. 18A, but the invention is not limited thereto).

The three-terminal switch device 3000*d* includes a signal processing unit 3420, a signal generating unit 3410, a signal capturing unit 3430, and a switch unit 3200. In addition, the three-terminal switch device 3000*d* further includes an internal power detection unit 3440. The signal processing unit 3420 outputs a control signal having a pulse or multi-pulse waveform during a detection mode DTM, according to the signal provided by the signal generating unit 3410 and the signal capturing unit 3430. The signal processing unit 3420 outputs the control signal, in which the signal level of the control signal remains at a high level voltage or a low voltage level, after the detection mode DTM, so as to control the conducting state of the switch unit 3200 and determine whether to conduct the power loop of the LED tube lamp. The pulse signal generated by the signal generating unit 3410 can be generated according to a reference signal received from outside, or by itself, and the present invention is not limited thereto. The term "outside" described in this paragraph is relative to the signal generating unit 3410, which means the reference signal is not generated by the signal generating unit 3410. As such, whether the reference signal is generated by any of the other circuits within the three-terminal switch device 3000*d*, or by an external circuit of the three-terminal switch device 3000*d*, those embodiments belong the scope of "the reference signal received from the outside" as described in this paragraph. The signal capturing unit 3430 samples an electrical signal passing through the power loop of the LED tube lamp to generate a sample signal and detects an installation state of the LED tube lamp according to the sample signal, so as to transmit a detection result signal Sdr indicating the detection result to the signal processing unit 3420 for processing.

In an exemplary embodiment, the three-terminal switch device 3000*d* can be implemented by an integrated circuit. For example, the three-terminal switch device 3000*d* can be a three-terminal switch control chip, which can be utilized in any type of the LED tube lamp having two end caps for receiving power so as to provide the function of preventing electric shock. It should be noted that, the three-terminal switch device 3000*d* is not limited to merely include three pins/connection terminals. For example, a multi-pins switch device (with more than three pins) having at least three pins having the same configuration and function as the embodiment illustrated in FIG. 18A can include additional pins for other purposes, even though those pins may be not described in detail herein. It should be noted that the various "units" described herein, in some embodiments, are circuits, and will be described as circuits.

In an exemplary embodiment, the signal processing unit 3420, the signal generating unit 3410, the signal capturing unit 3430, the switch unit 3200, and the internal power detection unit 3440 can be respectively implemented the circuit configurations illustrated in FIG. 18B to 18F, but the present invention is not limited thereto. Detail exemplary operation of each of the units in the three-terminal control chip are described below.

Figure 18B:
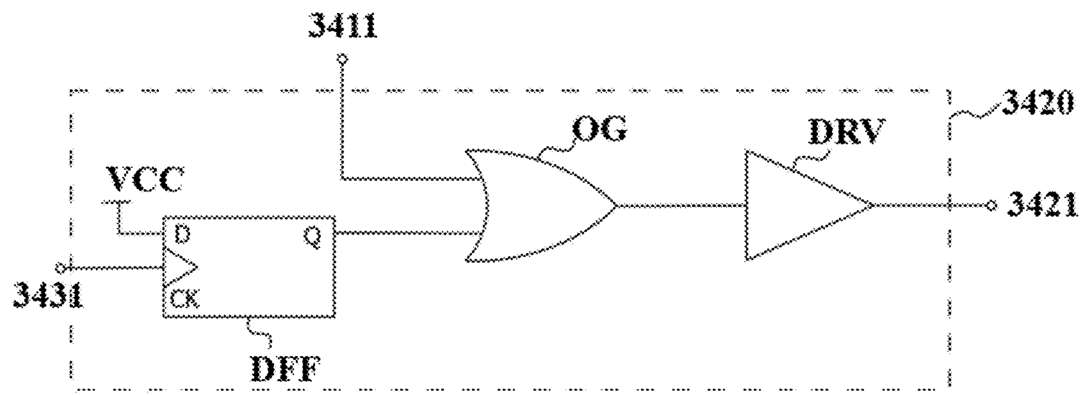
FIGS. 18B-18F are schematic circuit diagrams of an installation detection module according to some exemplary embodiments.

Referring to FIG. 18B, a block diagram of a signal processing unit according to an exemplary embodiment is illustrated. The signal processing unit 3420, which in one embodiment is a circuit, includes a driver DRV, an OR gate OG, and a D flip-flop DFF. The driver DRV has an input end, and has an output end connected to the switch unit 3200 via the path 3421, in which the driver DRV provides the control signal to the switch unit 3200 via the output end and the path 3421. The OR gate OG has a first input end connected to the signal generating unit 3410 via the path 3411, a second input end, and an output end connected to the input end of the driver DRV. The D flip-flop DFF has a data input end (D) receiving a driving voltage VCC, a clock input end (CK) connected to the signal capturing unit 3430 via the path 3431, and an output connected to the second input terminal of the OR gate OG.

Figure 18C:
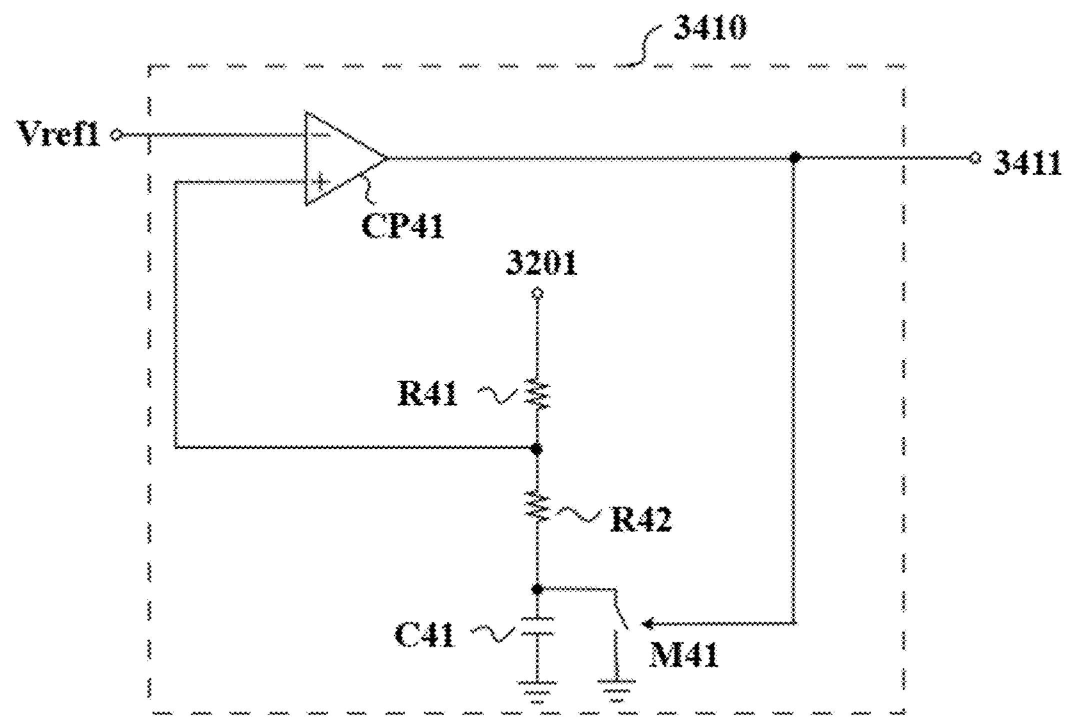

Referring to FIG. 18C, a block diagram of a signal generating unit according to an exemplary embodiment is illustrated. The signal generating unit 3410 includes resistors R41 and R42, a capacitor C41, a switch M41, and a comparator CP41. One end of the resistor R41 receives the driving voltage VCC, and the resistors R41 and R42 and the capacitor C41 are serial connected between the driving voltage VCC and the ground. The switch M41 is connected to the capacitor C41 in parallel. The comparator CP41 has a first input end connected to the connection node of the resistors R41 and R42, a second input end receives a reference voltage Vref, and an output end connected to the control terminal of the switch M41.

Figure 18D:
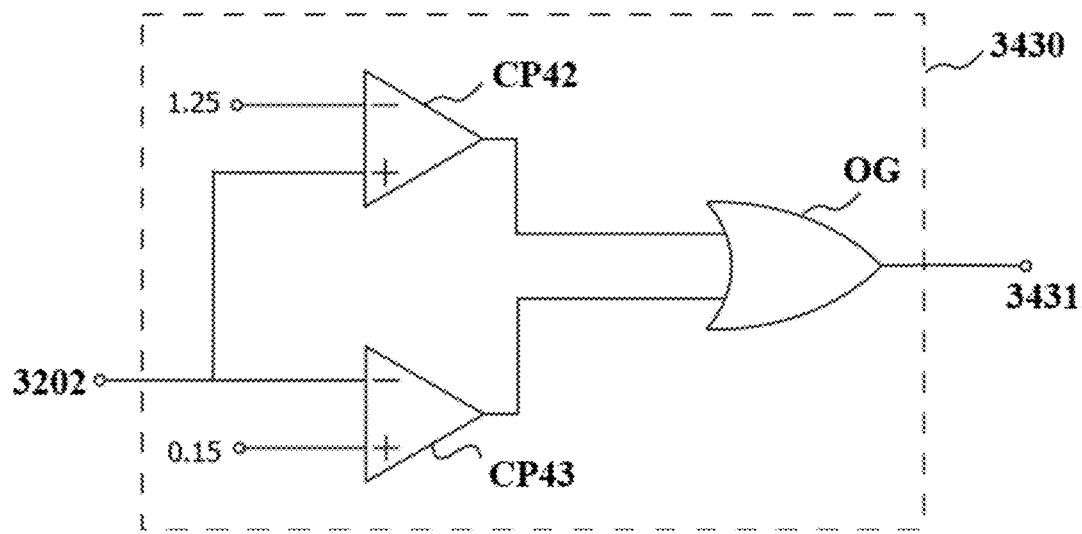

Referring to FIG. 18D, a block diagram of a signal capturing unit according to an exemplary embodiment is illustrated. The signal capturing unit 3430 includes an OR gate and comparators CP42 and CP43. The OR gate OG has a first input end and a second input end, and an output end connected to the signal processing unit 3420 via the path 3431. The comparator CP42 has a first input end connected to one end of the switch unit 3200 (i.e., a node on the power loop of the LED tube lamp) via the path 3202, a second input end receiving a first reference voltage (e.g., 1.25V, but not limited thereto), and an output end connected to the first input end of the OR gate OG. The comparator CP43 has a first input end connected to a second reference voltage (e.g., 0.15V, but not limited thereto), a second input end connected to the first input end of the comparator CP42, and an output end connected to the second input end of the OR gate OG.

Figure 18E:
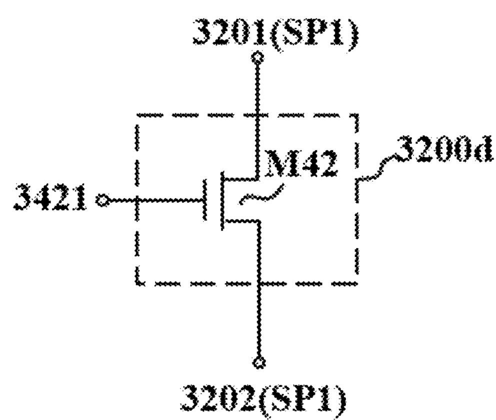

Referring to FIG. 18E, a block diagram of a switch unit according to an exemplary embodiment is illustrated. The switch unit 3200*d* includes a transistor M42. The transistor M42 has a gate connected to the signal processing unit 3420 via the path 3421, a drain connected to the first switch terminal SP1 via the path 3201, and a source connected to the second switch terminal SP2, the first input end of the comparator CP42, and the second input end of the comparator CP43 via the path 3202. In one embodiment, for example, the transistor M42 is an NMOS transistor.

Figure 18F:
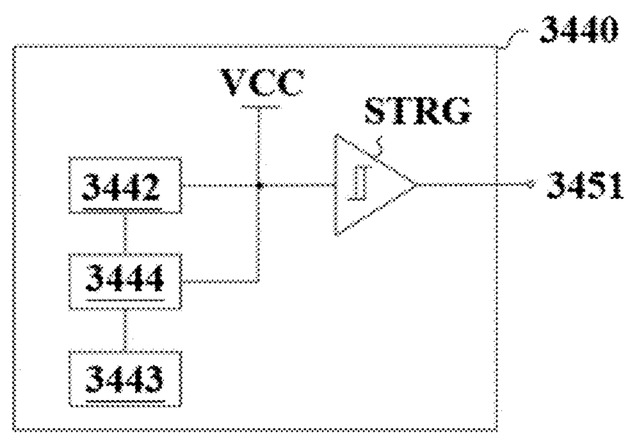

Referring to FIG. 18F, a block diagram of an internal power detection unit according to an exemplary embodiment is illustrated. The internal power detection unit 3440 includes a clamp circuit 3442, a reference voltage generating circuit 3443, a voltage adjustment circuit 3444, and a Schmitt trigger STRG. The clamp circuit 3442 and the voltage adjustment circuit 3444 are respectively connected to the power terminal VP1 for receiving the driving voltage, so as to perform a voltage clamp operation and a voltage level adjustment operation, respectively. The reference voltage generating circuit 3443 is coupled to the voltage adjustment circuit 3444 and is configured to generate a reference voltage to the voltage adjustment circuit 3444. The Schmitt trigger STRG has an input end coupled to the clamp circuit 3442 and the voltage adjustment circuit 3444, and an output end to output a power confirmation signal for indicating whether the driving voltage VCC is normally supplied. If the driving voltage VCC is normally supplied, the Schmitt trigger STRG outputs the enabled power confirmation signal, such that the driving voltage VCC is allowed to be provided to the component/circuit within the three-terminal switch device 3000*d*. On the contrary, if the driving voltage VCC is abnormal, the Schmitt trigger STRG outputs the disabled power confirmation signal, such that the component/circuit within the three-terminal switch device 3000*d* won't be damaged based on working under the abnormal driving voltage VCC.

Referring to FIG. 18A to 18F, under the circuit operation of the present embodiment, when the LED tube lamp is installed on the lamp socket, the driving voltage VCC is provided to the three-terminal switch device 3000*d* via the power terminal VP1. At this time, the driving voltage VCC charges the capacitor C41 via the resistors R41 and R42. When the capacitor voltage is raised greater than the reference voltage Vref, the comparator CP41 switches to output a high level voltage to the first input end of the OR gate OG and the control terminal of the switch M41. The switch M41 is conducted in response to the received high level voltage, such that the capacitor starts to discharge to the ground. The comparator CP41 outputs an output signal having pulse-type waveform through this charge and discharge process.

During the period when the comparator CP41 outputs the high level voltage, the OR gate OG correspondingly outputs the high level voltage to conduct the transistor M42, such that the current flows through the power loop of the LED tube lamp. When the current passes the power loop, a voltage signal corresponding to the current size can be established on the path 3202. The comparator CP42 samples the voltage signal and compares the signal level of the voltage signal with the first reference voltage (e.g., 1.25V).

When the signal level of the sampled voltage signal is greater than the first reference voltage, the comparator CP42 outputs the high level voltage. The OR gate OG generates another high level voltage to the clock input end of the D flip-flop DFF in response to the high level voltage outputted by the comparator CP42. The D flip-flop DFF continuously outputs the high level voltage based on the output of the OR gate OG. Driver DRV generates an enabled control signal to conduct the transistor M42 in response to the high level voltage on the input terminal. At this time, even if the capacitor C41 has been discharged to below the reference voltage Vref and thus the output of the comparator CP41 is pulled down to the low level voltage, the transistor M42 still remains in the conductive state since the output of the D flip-flop DFF is kept on the high level voltage.

When the sampled voltage signal is less than the first reference voltage (e.g., 1.25V), the comparator CP42 outputs the low level voltage. The OR gate OG generates another low level voltage in response to the low level voltage outputted by the comparator, and provides the generated low level voltage to the clock input end of the D flip-flop DFF. The output end of the D flip-flop DFF remains on the low level voltage based on the output of the OR gate OG. At this time, once the capacitor C41 discharges to the capacitor voltage below the reference voltage Vref, the output of comparator CP41 is pulled down to the low level voltage which represents the end of the pulse on-time (i.e., the fallen edge of the pulse). Since the two input ends of the OR gate OG are at the low level voltage, the output end of the OR gate OG also outputs the low level voltage, therefore, the driver DRV generates the disabled control signal to cut off the transistor M42 in response to the received low level voltage, so as to cut off the power loop of the LED tube lamp.

As noted above, the operation of the signal processing unit 3420 of the present embodiment is similar to that of the detection result latching circuit 3220 illustrated in FIG. 16D, the operation of the signal generating unit 3410 is similar to that of the detection pulse generating module 3210 illustrated in FIG. 16B, the operation of the signal capturing unit 3430 is similar to that of the detection determining circuit 3230 illustrated in FIG. 16C, and the operation of the switch unit 3200*d* is similar to that of the switch circuit 3200*b* illustrated in FIG. 16E.

Figure 19A:
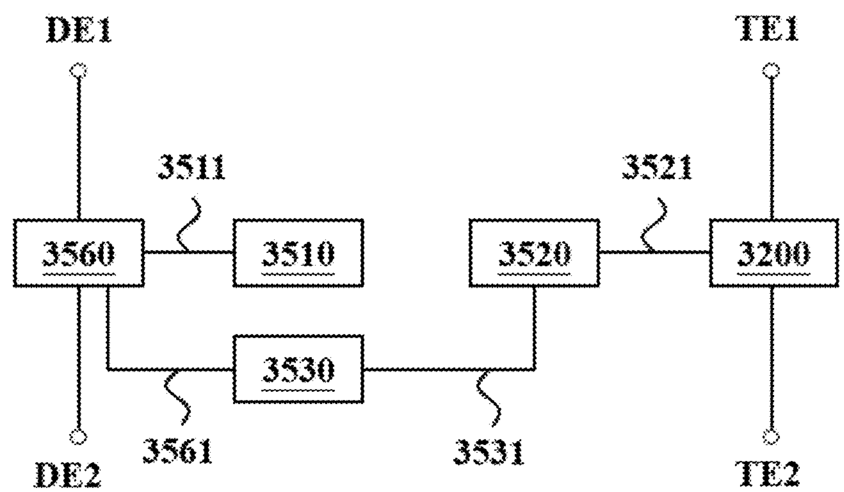
FIG. 19A a block diagram of an installation detection module according to some exemplary embodiments.

Referring to FIG. 19A, a block diagram of an installation detection module according to an exemplary embodiment is illustrated. The installation detection module 3000*e* includes a detection pulse generating module 3510, a control circuit 3520, a detection determining circuit 3530, a switch circuit 3200, and a detection path circuit 3560. The detection determining circuit 3530 is coupled to the detection path circuit 3560 via the path 3561 for detecting the signal on the detection path circuit 3560. The detection determining circuit 3530 is coupled to the control circuit 3520 via the path 3531 for transmitting the detection result signal Sdr to the control circuit 3520 via the path 3531. The detection pulse generating module 3510 is coupled to the detection path circuit 3560 via the path 3511 and generates a pulse signal to inform the detection path circuit 3560 of a time point for conducting the detection path or performing the installation detection. The control circuit 3520 outputs a control signal according to the detection result signal Sdr and is coupled to the switch circuit 3200 via the path 3521, so as to transmit the control signal to the switch circuit 3200. The switch circuit 3200 determines whether to conduct the current path between the installation detection terminals TE1 and TE2 (i.e., part of the power loop). The detection path circuit 3560 is coupled to the power loop of the power supply module through a first detection connection terminal DE1 and a second detection connection terminal DE2.

In some embodiments, the detection pulse generating module 3510, the control circuit 3520, the detection determining circuit 3530, and the detection path circuit 3200 can be referred to a detection circuit or an electric shock detection/protection circuit, which is configured to control the switching state of the switch circuit 3200.

In the present embodiment, the configuration of the detection pulse generating module 3510 can correspond to the configurations of the detection pulse generating module 3110 shown in FIG. 15B or the detection pulse generating module 3210 shown in FIG. 16B. Referring to FIG. 15B, when the detection pulse generating module 3110 is applied to implement the detection pulse generating module 3510, the path 3511 of the present embodiment can correspond to the path 3111, which means the OR gate OG1 is connected to the detection path circuit 3560 via the path 3511. Referring to FIG. 16B, when the detection pulse generating module 3210 is applied to implement the detection pulse generating module 3510, the path 3511 can correspond to the path 3211. In one embodiment, the detection pulse generating module is also connected to the output terminal of the control circuit 3520 via the path 3521, so that the path 3521 can correspond to the path 3221.

The control circuit 3520 can be implemented by a control chip or any circuit capable of performing signal processing. When the control circuit 3520 determines the tube lamp is properly installed (e.g., the pins on both ends of the tube lamp are plugged into the lamp socket) according to the detection result signal Sdr, the control circuit 3520 may control the switch state of the switch circuit 3200 so that the external power can be normally provided to the LED module when the tube lamp is properly installed into the lamp socket. In this case, the detection path will be cut off by the control circuit 3520. On the contrary, when the control circuit 3520 determines the tube lamp is not properly installed (e.g., a user is touching the pins on one end of the tube lamp with the other end plugged in) according to the detection result signal Sdr, the control circuit 3520 keeps the switch circuit 3200 at the off-state since the user has the risk from getting electric shock.

In an exemplary embodiment, the control circuit 3520 and the switch circuit 3200 can be part of the driving circuit in the power supply module. For example, if the driving circuit is a switch-type DC-to-DC converter, the switch circuit 3200 can be the power switch of the converter, and the control circuit 3520 can be the controller of the power switch.

An example of the configuration of the detection determining circuit 3530 can be seen referring to the configurations of the detection determining circuit 3130 shown in FIG. 15C or the detection determining circuit 3230 shown in FIG. 16C. Referring to FIG. 15C, when the detection determining circuit 3130 is applied to implement the detection determining circuit 3530, the resistor R14 can be omitted. The path 3561 of the present embodiment can correspond to the path 3201, which means the positive input terminal of the comparator CP11 is connected to the detection path circuit 3560. The path 3531 of the present embodiment can correspond to the path 3131, which means the output terminal of the comparator CP11 is connected to the control circuit 3520. Referring to FIG. 16C, when the detection determining circuit 3230 is applied to implement the detection determining circuit 3530, the resistor R24 can be omitted. The path 3561 of the present embodiment can correspond to the path 3201, which means the anode of the diode D21 is connected to the detection path circuit 3560. The path 3531 of the present embodiment can correspond to the path 3231, which means the output terminal of the comparators CP21 and CP22 are connected to the control circuit 3520.

The configuration of the switch circuit 3200 can correspond to the configurations of the switch circuit 3200*a* shown in FIG. 15E or the switch circuit 3200*b* shown in FIG. 16E. Since the switch circuit in both embodiments of FIG. 15E and FIG. 16E are similar to each other, the following description discusses the switch circuit 3200*a* shown in FIG. 15E as an example. Referring to FIG. 15E, when the switch circuit 3200*a* is applied to implement the switch circuit 3200, the path 3521 of the present embodiment can correspond to the path 3121. The path 3201 is not connected to the detection determining circuit 3130, but directly connected to the installation detection terminal TE2.

Figure 19B:
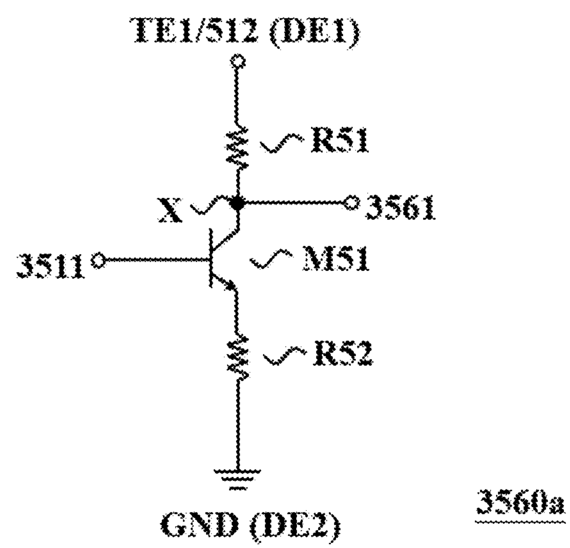
FIGS. 19B-19D are schematic circuit diagrams of an installation detection module according to some exemplary embodiments.
Figure 19C:
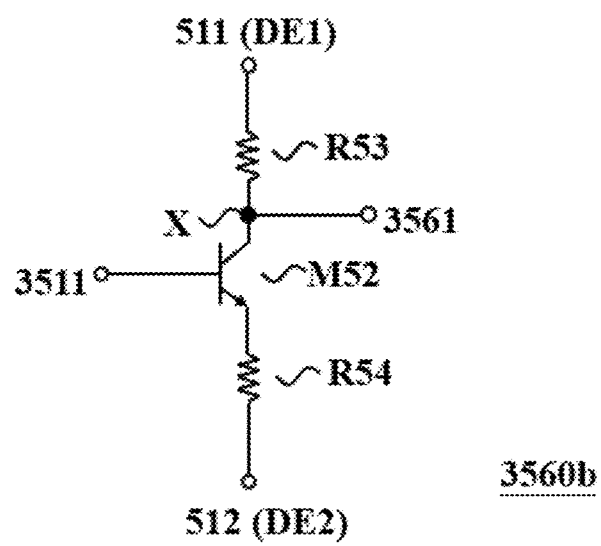
Figure 19D:
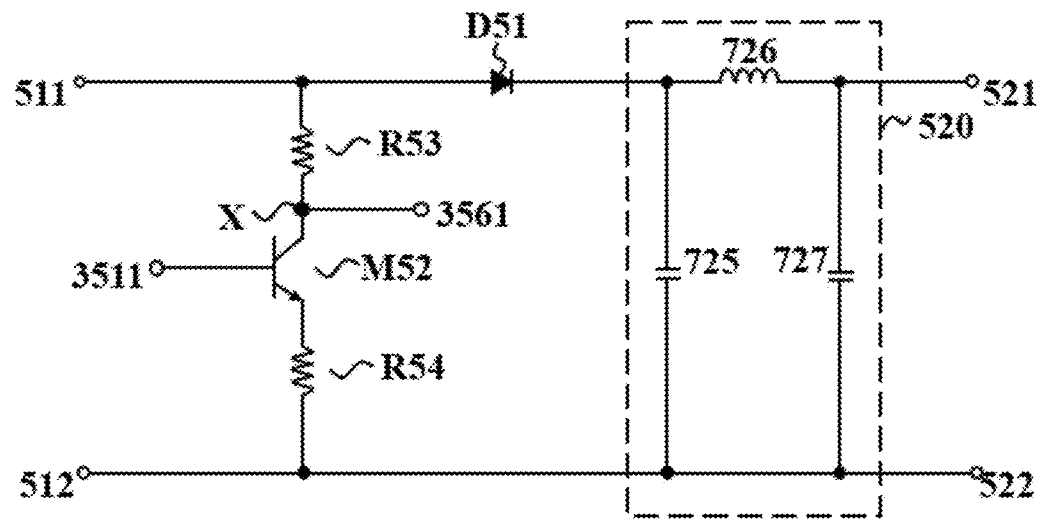

Exemplary configurations of the detection path circuit 3560 is shown in FIG. 19B, FIG. 19C or FIG. 19D. Referring to FIG. 19B, the detection path circuit 3560*a* includes a transistor M51 and resistors R51 and R52. The transistor M51 has a base, a collector, and an emitter. The base of the transistor M51 is connected to the detection pulse generating module 3510 via the path 3511. The resistor R52 has a first end connected to the emitter of the transistor M51, and has a second end acting as the second detection connection terminal DE2 connected to the ground terminal GND, so the resistor R52 is serially connected between the emitter of the transistor M51 and the ground terminal GND. The resistor R51 has a first end acting as the first detection connection terminal DE1 connected to the first installation detection terminal TE1, which installation detection terminal TE1 is for example connected to the second rectifying output terminal 512 in the embodiment of FIG. 19B, so the resistor R51 is serially connected between the emitter of the transistor M51 and the installation detection terminal TE1/second rectifying output terminal 512. Regarding the configured position of the detection path, the detection path in the embodiment of FIG. 19B is in effect disposed between a rectifying output terminal and the ground terminal GND.

In the present embodiment, the transistor M51 is conducting during a pulse-on period when receiving the pulse signal provided by the detection pulse generating module 3510. Under the situation where at least one end of the tube lamp is inserted into the lamp socket, a detection path is formed between the installation detection terminal TE1 and the ground terminal (via the resistor R52, the transistor M51, and the resistor R51) in response to the conducted transistor M51, so as to establish a voltage signal on the node X of the detection path. In one embodiment, the detection path is built from one of the rectifying circuit input terminals to another one of the rectifying circuit input terminals (via the rectifying diodes, the resistors R51 and R52, and the transistor M51). When the user does not touch the tube lamp (but one end of the tube lamp is plugged into the lamp socket) or when the both ends of the tube lamp are plugged into the lamp socket, the signal level of the voltage signal is determined by the voltage division of the resistors R51 and R52. When the user touches the tube lamp, a body impedance is equivalent to connect between the resistor R52 and the ground terminal GND, which means it is connected to the resistors R51 and R52 in series. At this time, the signal level of the voltage signal is determined by the voltage division of the resistor R51, the resistor R52, and the impedance of body impedance. The body impedance refers to an equivalent impedance of human body. The value of the body impedance is usually between 500 ohm to 2000 ohm, depending on the skin humidity. Accordingly, by setting the resistors R51 and R52 having reasonable resistance, the voltage signal on the node X may reflect or indicate the state of whether the user touches the tube lamp, and thus the detection determining circuit 3530 may generate the corresponding detection result signal Sdr according to the voltage signal on the node X. In addition to temporarily turning on during the detection mode, the transistor M51 remains in a cut-off state when the control circuit 3520 determines the LED tube lamp has been correctly installed on the lamp socket, so that the power supply module is capable of providing power normally to the LED module.

Referring to FIG. 19C, the detection path circuit 3560 includes the transistor M52 and the resistors R53 and R54, in which the configuration and operations of an embodiment of the detection path circuit 3560*b* in FIG. 19C are largely similar to those in the embodiment of FIG. 19B, with a main difference that the detection path circuit 3560 in FIG. 19C is disposed between the first rectifying output terminal 511 and the second rectifying output terminal 512. In this embodiment, the resistor R53 has a first end (or the first detection connection terminal DE1) connected to the first rectifying output terminal 511, and the resistor R54 has a second end (or the second detection connection terminal DE2) connected to the second rectifying output terminal 512.

In the present embodiment, the transistor M52 is conducting during a pulse-on period when receiving a pulse signal provided by the detection pulse generating module 3510. Under the situation where at least one end of the LED tube lamp is inserted into the lamp socket, a detection path between the first rectifying output terminal 511 and the second rectifying output terminal 512 of FIG. 14 is conducted through the resistor R53, the transistor M52, and the resistor R54 in response to the conducted transistor M52, so as to establish a voltage signal on the node X of the detection path. When the user does not touch the tube lamp or when both ends of the tube lamp are correctly plugged into the lamp socket, the signal level of the voltage signal is determined by the voltage division between the resistors R53 and R54, wherein the second detection connection terminal DE2 and the ground terminal GND are at the same voltage level. When the user touches the tube lamp, some equivalent body impedance is as connected between the resistor R54/the second detection connection terminal DE2 and the ground terminal GND, which means it is connected to the resistors R53 and R54 in series (by the transistor M52). At this time, the signal level of the voltage signal is determined by the voltage division between the resistor R53, the resistor R54, and the equivalent body impedance. Accordingly, by setting appropriate values of the resistors R53 and R54, the voltage signal on the node X may reflect or indicate the state of whether the user touches the LED tube lamp, and thus the detection determining circuit 3530 may generate a corresponding detection result signal according to the voltage signal on the node X. In addition to being temporarily turned on during the detection mode, the transistor M52 remains in a cut-off state when the control circuit 3520 determines the LED tube lamp has been correctly installed on the lamp socket, so that the power supply module is capable of providing power normally to the LED module.

Referring to FIG. 19D, the detailed configuration and operation of the detection path circuit 3560*c* in the present embodiment are similar to those of the previous embodiments, and the main difference is that the detection path circuit 3560 further includes a current limiting element D51. In some embodiments, the current limiting element D51 can be a diode (hereinafter "diode D51") disposed between the rectifying output terminal 511 and the input terminal of the filtering circuit 520 (i.e., the connection terminal of the capacitor 725 and the inductor 726), as illustrated in FIG. 19D. The filtering circuit 520 includes a pi-type (π-type) filter as an example, but the present invention is not limited thereto. The addition of the diode D51 can limit the direction of current on the power loop, so as to prevent the charged capacitor 725 from reverse discharging to the detection path during the transistor M51 being turned on. Therefore, the accuracy of electric shock detection can be enhanced. It should be noted that, the configuration of the diode D51 is merely an embodiment of the current limiting element. In another embodiment, the current limiting element can be implemented by electronic elements capable of limiting the current direction on the power loop, the present invention is not limited thereto.

In summary, whether a user is exposed or liable to the risk of electric shock on the LED tube lamp can be determined by conducting a detection path and then detecting a voltage signal on the detection path. In addition, compared to the above embodiments of FIGS. 15A, 16A, 17A and 18A, instead of forming a detection path directly connected to or on a power loop of the power supply module, the detection path circuit 3560 illustrated in FIGS. 19A-19D forms/causes an additional detection path separate from, independent of, or other than the power loop, i.e., the power loop and the detection path do not overlap at least partially. In some embodiments, since the number of electrical components on the separate detection path is substantially smaller than that of the electrical components on the power loop, the detected voltage signal on the additional detection path can reflect more accurately the state of whether a user has touched and thus been exposed to the risk of electric shock on part of the LED tube lamp which is not yet correctly installed on the lamp socket.

Figure 20A:
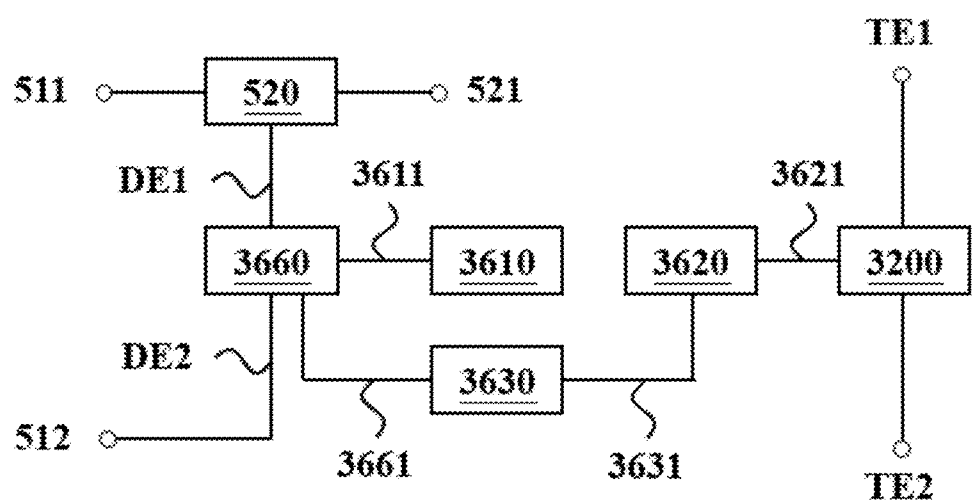
FIG. 20A is a block diagram of an installation detection module according to some exemplary embodiments.

FIG. 20A is a block diagram of an installation detection module according to an exemplary embodiment. Referring to FIG. 20A, the installation detection module 3000*f* includes a detection pulse generating module 3610, a control circuit 3620, a detection determining circuit 3630, a switch circuit 3200 and a detection path circuit 3660. Connection relationship of the detection pulse generating module 3610, the control circuit 3620, the detection determining circuit 3630 and the switch circuit 3200 are similar to the embodiment illustrated in FIG. 19A, and thus are not repeated herein. The difference between the present embodiment and the embodiment of FIG. 19A is the configuration and operation of the detection path circuit 3660. Specifically, the detection path circuit 3660 has a first detection connection terminal DE1 coupled to a low level terminal of the filtering circuit 520 and a second detection connection terminal DE2 coupled to the rectifying output terminal 512. In this manner, the detection path circuit 3660 can be regarded as connecting between the low level terminal of the filtering circuit 520 and the rectifying output terminal 512. For example, the low level terminal of the filtering circuit 520 is connected to the rectifying output terminal 512 via the detection path circuit 3660.

Figure 20B:
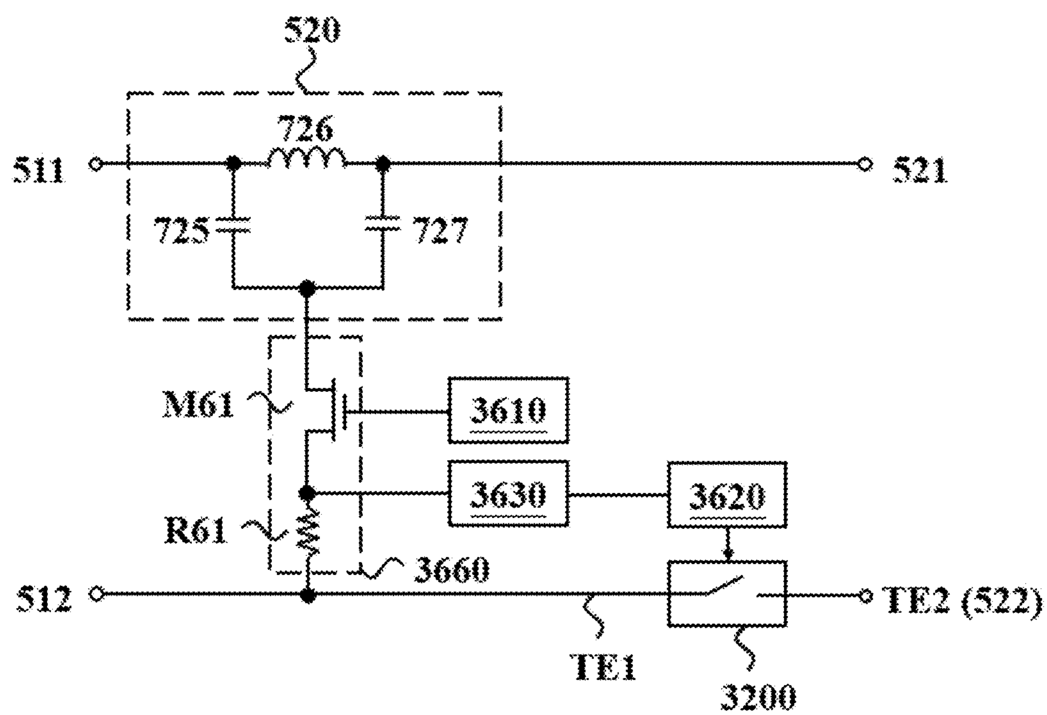
FIGS. 20B-20C are schematic circuit diagrams of an installation detection module according to some exemplary embodiments.
Figure 20C:
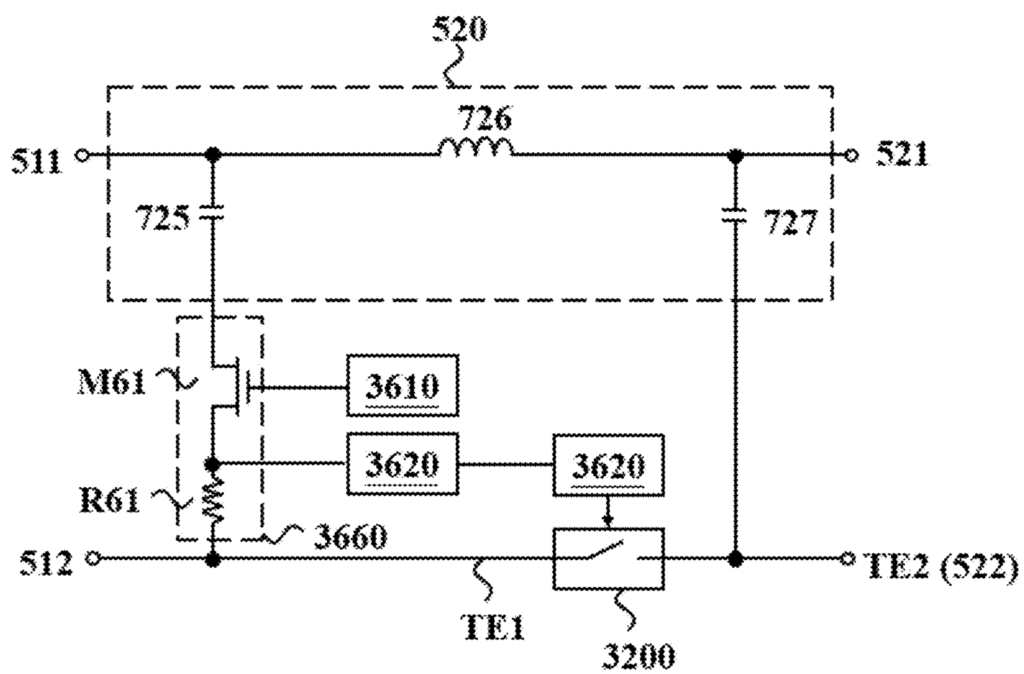

The configuration of the detection path circuit 3660 can be seen in FIG. 20B or FIG. 20C, which illustrates a schematic diagram of the installation detection module according to some embodiments. Referring to FIG. 20B, the filtering circuit 520 includes, for example, capacitors 725 and 727 and an inductor 726, which are configured as a pi-type filter. The inductor 726 has a first end connected to the rectifying output terminal 511 and a second end connected to the filtering output terminal 512, which means the inductor 726 is connected between the rectifying output terminal 511 and the filtering output terminal 521 in series. The capacitor 725 has a first end connected to the first end of the inductor 726 and a second end connected to the detection path circuit 3660. The capacitor 726 has a first end connected to the second end of the inductor 726 and a second end connected to the second end of the capacitor 725, and the second ends of the capacitors 725 and 727 can be regarded as the low level terminal. The installation detection module includes a detection pulse generating module 3610, a control circuit 3620, a detection determining circuit 3630, a switch circuit 3200 and a detection path circuit 3660. The detection path circuit 3660 includes a resistor R61 and a transistor M61. The transistor M61 has a gate electrode coupled to the detection pulse generating module 3610, a source electrode coupled a first end of the resistor R61, and a drain electrode coupled to the second ends of the capacitors 725 and 727. A second end of the resistor R61 can be regarded as the second detection connection terminal (e.g., DE2) and coupled to the rectifying output terminal 512 and the first installation detection terminal TE1. The detection determining circuit 3630 is coupled to the first end of the resistor R61 to detect magnitude of the current flowing through the detection path. In the present disclosed embodiment, the detection path can be regarded as formed by the capacitors 725 and 727, the inductor 726, the resistor R61 and the transistor M61.

In some embodiments, when the transistor M61 receives a pulse signal provided from the detection pulse generating module 3610, which means the LED tube lamp (or power supply module) is under the detection mode, the transistor is turned on during the pulse-on period. Under the condition that at least one end of the LED tube lamp is correctly installed on the lamp socket, a current path formed, via the detection path, between the output rectifying terminals 511 and 512 is conducted in response to the transistor M61 being turned on, and therefore generates a voltage signal on the first end of the resistor R61. When there is no person touching the conductive part of the LED tube lamp (or the LED tube lamp is correctly installed on the lamp socket), a level of the voltage signal is determined by the voltage division of the equivalent impedance of the filtering circuit 520 and the resistor R61. When there is a person touching the conductive part of the LED tube lamp (or the LED tube lamp is not correctly installed on the lamp socket), a body impedance is equivalent to serially connect between the second detection connection terminal (e.g., DE2) and the ground terminal. In addition to temporarily turning on the transistor M61 during the detection mode, in some embodiments, the transistor M61 further remains being cut off when the control circuit 3620 determines that the LED tube lamp is correctly installed on the lamp socket, so that the power supply module can operate normally and provide current to the LED module.

Referring to FIG. 20C, the installation detection module includes a detection pulse generating circuit 3610, a control circuit 3620, a detection determining circuit 3630, a switch circuit 3200, and a detection path circuit 3660. The configuration and operation of the installation detection module of the present embodiment are substantially the same as the embodiment illustrated in FIG. 20B, the difference between the embodiments of FIGS. 20B and 17C is that the detection path circuit 3660 of FIG. 20C is disposed between the second end of the capacitor 725 and the rectifying output terminal 512, and the second end of the capacitor 727 is directly connected to the second installation detection terminal TE2 (or second filtering output terminal 522).

Compared to the embodiments illustrated in FIG. 19A, since the passive components of the filtering circuit 520 become part of the detection path, the current size of the current flowing through the detection path circuit 3660 is much smaller than the detection path circuit 3560, and thereby the transistor (e.g., transistor M61 or R61) of the detection path circuit 3660 can be implemented by the components with smaller size to effectively reduce the cost.

Figure 21A:
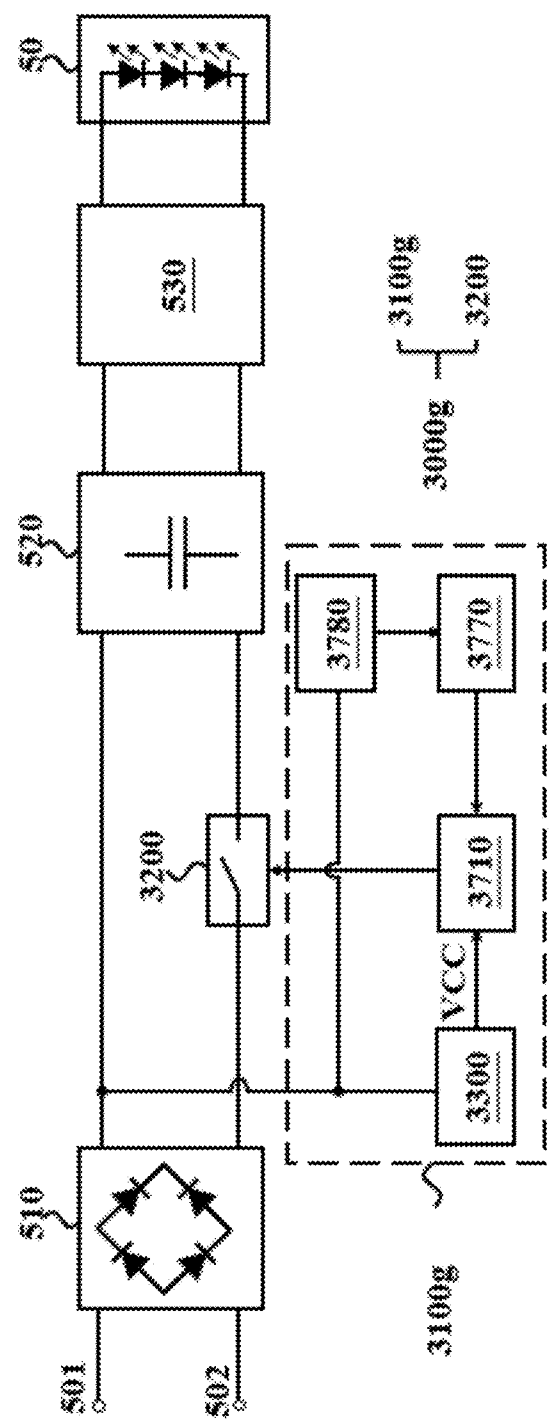
FIG. 21A is a block diagram of an installation detection module according to some exemplary embodiments.

Referring to FIG. 21A, FIG. 21A is a circuit block diagram of a power supply module of an LED tube lamp according to some embodiments of the present disclosure. The power supply module of these embodiments includes a rectifying circuit 510, a filtering circuit 520, a driving circuit 530 and an installation detection module 3000*g*. The installation detection module 3000*g* includes a detection controller 3100*g*, a switch circuit 3200 and a bias circuit 3300. The detection controller 3100*g* includes a control module 3710, an activation control circuit 3770 and a detection period determining circuit 3780. The configurations and operations of rectifying circuit 510, filtering circuit 520, and driving circuit 530 can refer to the descriptions of the related above embodiments, and the relevant details are not described herein again.

In installation detection module 3000*g*, the switch circuit 3200 is electrically connected in series to the power supply loop/power loop of the power supply module (in FIG. 21A, the switch circuit 3200 is disposed between the rectifying circuit 510 and the filtering circuit 520, as an exemplary embodiment), and is controlled by the control module 3710 to switch the turn on/off state. The control module 3710 outputs a control signal in a detection mode to temporarily turn on the switch circuit 3200, in order to detect whether an external impedance is electrically connected to the detection path of the power supply module (which means the user may be exposed to an electric shock risk) during the period in which the switch circuit 3200 is turned on (i.e., during the period in which the power supply loop/power loop is turned on/conducted). The detection result determines whether to maintain the detection mode so that the switch circuit 3200 is temporarily turned on in a discontinuous form, or to enter into an operating mode so that switch circuit 3200 responds to the installation status to remain turned-on or cut-off. The length of the period represented by “temporarily turning on the switch circuit” refers to the length of the period in which the current on the power loop passes through the human body and does not cause any harm to the human body. For example, the length of the period is less than 1 millisecond. However, the present disclosure is not limited thereto. In general, the control module 3710 can achieve the operation of temporarily turning on the switch circuit 3200 by transmitting a control signal having pulse waveform. The specific duration of the pulse-on period can be adjusted according to the impedance of the detection path. Descriptions of the circuit configuration examples and the related control actions of the control module 3710 and the switch circuit 3200 can refer to those description of other embodiments related to the installation detection module.

The bias circuit 3300 is electrically connected to the power loop to generate a driving voltage VCC based on the rectified signal (i.e., the bus voltage). The driving voltage VCC is provided to control module 3710 to activate/enable the control module 3710, and for the control module 3710 operate in response to the driving voltage.

The activation control circuit 3770 is electrically connected to the control module 3710, and is configured to determine whether to affect the operating state of control module 3710 according to the output signal of detection period determining circuit 3780. For example, when detection period determining circuit 3780 outputs an enable signal, activation control circuit 3770 will respond to the enable signal and control module 3710 to stop operating when detection period determining circuit 3780 outputs a disable signal, activation control circuit 3770 will respond to the disable signal and control the control module 3710 to maintain a normal operating state (i.e., which does not affect the operational state of the control module 3710), where activation control circuit 3770 can control the control module 3710 to stop operation by using the driving voltage VCC or providing a low-level start signal to the enable pin of the control module 3710 However, the present disclosure is not limited to these particular examples.

The detection period determining circuit 3780 is configured to sample the electrical signal on the detection path/power loop, thereby calculating the operation time of the control module 3710, and outputting a signal indicating the calculation result to activation control circuit 3770, so that activation control circuit 3770 controls the operating state of the control module 3710 based on the indicated the calculation result.

The operation of installation detection module 3000*g* of the embodiment of FIG. 21A is described below. When rectifying circuit 510 receives an external power source through pins 501 and 502, bias circuit 3300 generates a driving voltage VCC according to the rectified bus voltage. The control module 3710 is activated or enabled in response to the driving voltage VCC and enters the detection mode. In the detection mode, control module 3710 periodically outputs a pulse-shaped control signal to switch circuit 3200, so that switch circuit 3200 is periodically turned on and turned off. Under the operation of the detection mode, the current waveform on the power loop is similar to the current waveform within the detection period Tw in FIG. 37D (i.e., a plurality of spaced-apart current pulses Idp). In addition, detection period determining circuit 3780, upon receiving the bus voltage on the power loop, starts calculating the operation time of the control module 3710 in the detection mode, and outputs a signal indicating the calculation result to activation control circuit 3770.

In the case when the operation time of the control module 3710 has not reached the preset time length, the activation control circuit 3770 does not affect the operating state of the control module 3710. At this time, the control module 3710 determines to maintain the detection mode or enter into the operational mode according to its own detection result. If the control module 3710 determines to enter into the operating mode, the control module 3710 controls the switch circuit 3200 to remain in the turn-on state and block the effect of other signals on its operating state. In this case, in the operating mode, regardless the output by the activation control circuit 3770, the operating state of the control module 3710 is not affected.

In the case when the operation time of the control module 3710 has reached the preset time length, and the control module 3710 is still in the detection mode, the activation control circuit 3770 controls, in response to the output of the detection period determining circuit 3780, the control module 3710 to stop operating. At this time, the control module 3710 no longer outputs a pulse signal, and maintains the switch circuit 3200 in the turn-off state until the control module 3710 is reset. The preset time length can be regarded as the detection period Tw shown in FIG. 37D.

According to operation described above, the installation detection module 3000*g* can let the power supply module have input current (Iin) waveforms as shown in FIGS. 37D to 37F by setting the pulse interval and the reset cycle of the control signal, thereby ensuring that the electric power in the detection mode is still within a reasonably safe range, to avoid any danger to the human body by the detection current.

From the point of view of circuit operation, the activation control circuit 3770 and the detection period determining circuit 3780 can be regarded as a delay control circuit, which is capable of turning on a specific path, after the LED tube lamp is powered up for a preset delay, to control a target circuit (e.g., the control module 3710). By selecting the setting of the specific path, a delay conduction for the power loop or a delay turning-off/cut-off for the installation detection module can be implemented by the delay control circuit in the LED tube lamp.

Figure 21B:
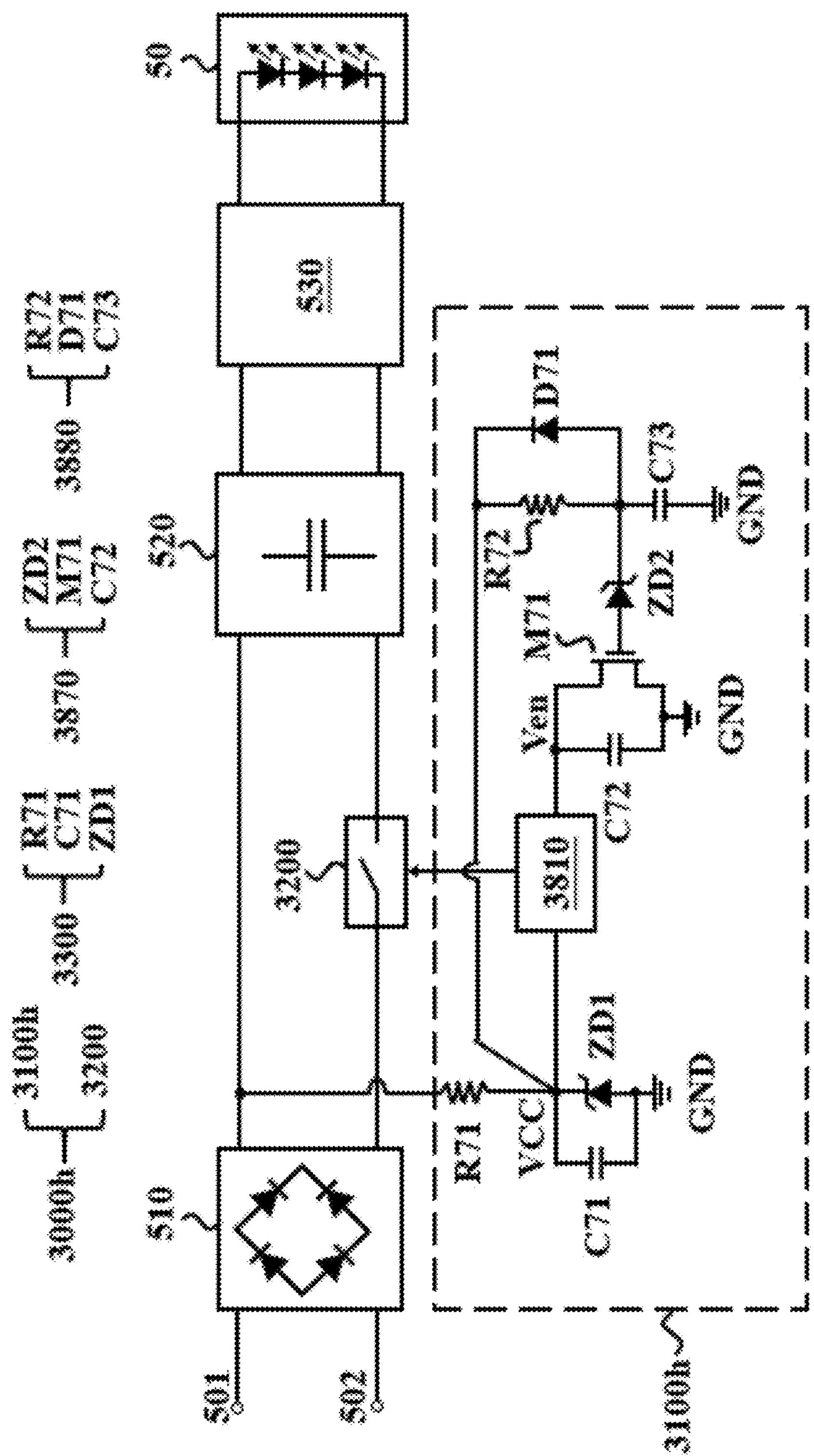
FIGS. 21B-21D are schematic circuit diagrams of an installation detection module according to some exemplary embodiments.

Referring to FIG. 21B, FIG. 21B is a circuit block diagram of an installation detection module for an LED tube lamp according to some embodiments of the present disclosure. The power supply module includes a rectifying circuit 510, a filtering circuit 520, a driving circuit 530, and an installation detection module 3000*h*. The installation detection module 3000*h* includes a detection controller 3100*h*, a switch circuit 3200, and a bias circuit 3300. The detection controller 3100*h* includes a control module 3810, an activation control circuit 3870, and a detection period determining circuit 3880. The configurations and operations of rectifying circuit 510, filtering circuit 520, and driving circuit 530 can refer to the descriptions of the related embodiments. In addition, the configurations and operations of control module 3810 and switch circuit 3200 can refer to the descriptions of the embodiment of FIG. 21A above, and details are not described herein again.

In one embodiment, bias circuit 3300 includes a resistor R71, a capacitor C71, and a Zener diode ZD1. The first end of resistor R71 is electrically connected to the rectified output terminal (i.e., electrically connected to the bus). Capacitor C71 and Zener diode ZD1 are electrically connected in parallel with each other, and their first ends are both electrically connected to the second end of resistor R71. The power input terminal of control module 3810 is electrically connected to a common node of resistor R71, capacitor C71, and Zener diode ZD1 (i.e., the bias node of bias circuit 3300) to receive the driving voltage VCC on the common node.

Activation control circuit 3870 includes a Zener diode ZD2, a transistor M71, and a capacitor C72. The anode of Zener diode ZD2 is electrically connected to the control terminal of transistor M71. The first end of transistor M71 is electrically connected to control module 3810, and the second end of transistor M71 is electrically connected to the ground terminal GND. Capacitor C72 is electrically connected between the first end and the second end of transistor M71.

Detection period determining circuit 3880 includes a resistor R72, a diode D71, and a capacitor C73. The first end of resistor R72 is electrically connected to the bias node of bias circuit 3300, and the second end of resistor R72 is electrically connected to the cathode of Zener diode ZD2. The anode of diode D71 is electrically connected to the second end of resistor R72, and the cathode of diode D71 is electrically connected to the first end of resistor R72. The first end of capacitor C73 is electrically connected to the second end of resistor R72 and the anode of diode D71, and the second end of capacitor C73 is electrically connected to the ground terminal GND.

The operation of installation detection module 3000*h* of the embodiment of FIG. 21A is described below. When rectifying circuit 510 receives an external power source through pins 501 and 502, the rectified bus voltage charges capacitor C71, thereby establishing a driving voltage VCC at the bias node. Control module 3810 is enabled in response to the driving voltage VCC and enters into the detection mode. In the detection mode, in the first signal cycle, control module 3810 outputs a pulse-shaped control signal to the switch circuit 3200, so that the switch circuit 3200 is temporarily turned on and then cut off.

During the switch circuit 3200 being turned-on, the capacitor C73 is charged in response to the driving voltage VCC on the bias node, such that the voltage across capacitor C73 gradually rises. In the first signal period, because the increased voltage across capacitor C73 has not reached the threshold level of transistor M71, transistor M71 will remain in the off state. As a result, the enable signal Ven is maintained at a high level accordingly. Then, during the switch circuit 3200 being turned-off or cut-off, capacitor C73 will substantially maintain the voltage level or slowly discharge, wherein the voltage change caused by the discharge of capacitor C73 during the switch circuit being turned-off is less than that caused by the charging during the switch circuit being turned-on. In other words, the voltage across capacitor C73 during the switch being turned off will be less than or equal to the highest voltage level during the switch being turned on, and the lowest voltage level will not be lower than its initial level at the charging start point, so transistor M71 will always remain in the off state in the first signal period, and the start signal Ven is maintained at a high level. Control module 3810 is maintained in an enabled state in response to a high level enable signal Ven. In the enabled state, control module 3810 determines whether the LED tube lamp is correctly installed according to the signal on the detection path (i.e., determines whether there is additional impedance is introduced). The installation detection mechanism of this part is the same as the previous embodiment, and details are not further described herein.

When control module 3810 determines that the LED tube lamp has not been properly installed to the socket, control module 3810 maintains the detection mode and continuously outputs a pulse-shaped control signal to control switch circuit 3200. In the following signal periods, activation control circuit 3870 and detection period determining circuit 3880 continue to operate in a manner similar to the operation of the first signal period. Specifically, capacitor C73 is charged during the on period of each signal period, so that the voltage across capacitor C73 rises step by step in response to the pulse width and the pulse period. When the voltage across capacitor C73 exceeds the threshold level of transistor M71, transistor M71 is turned on so that the enable signal Ven is pulled down to the ground level/low level. At this time, control module 3810 is turned off in response to the low level enable signal Ven. When control module 3810 is turned off, switch circuit 3200 is maintained in turn-off/cut-off state regardless of whether or not an external power source is electrically connected.

When the control module 3810 determines that the LED tube lamp has been properly installed on the lamp socket, the control module 3810 enters an operational mode and outputs a control signal to maintain the switch circuit 3200 in a turn-on state. In the operating mode, the control module 3810 does not change the output control signal in response to the enable signal Ven. In other words, even if the enable signal Ven is pulled down to a low level, the control module 3810 does not turn off switch circuit 3200 again.

From the point of view of the multiple signal periods in the detection mode, the current waveform measured on the power loop is as shown in FIG. 37D, in which the period of capacitor C73 charged from the initial level to the threshold level of transistor M71 corresponds to the detection period Tw. In other words, in the detection mode, control module 3810 continues outputting pulse signal until capacitor C73 is charged to the threshold level of transistor M71, resulting in intermittent current in the power loop. And when the voltage across capacitor C73 exceeds the threshold, the pulse signal is stopped to avoid any danger to the human body by the increased electric power in power loop.

From another perspective, the detection period determining circuit 3880 can be regarded as calculating the pulse-on period of the calculation control signal. When the preset value is reached during the pulse-on period, the control signal is sent out to control activation control circuit 3870, then activation control circuit 3870 affects the operation of control module 3810 to block the pulse output.

In the circuit architecture of this embodiment, the length of the detection period Tw (i.e., the time required for capacitor C73 to reach the threshold voltage of transistor M71) is mainly controlled by adjusting the capacitance value of capacitor C73. The main function of the components such as resistor R72, diode D71, Zener diode ZD2, and capacitor C72 is to support activation control circuit 3870 and detection period determining circuit 3880 to provide voltage stability, voltage limit, current limit, or protection.

Figure 21C:
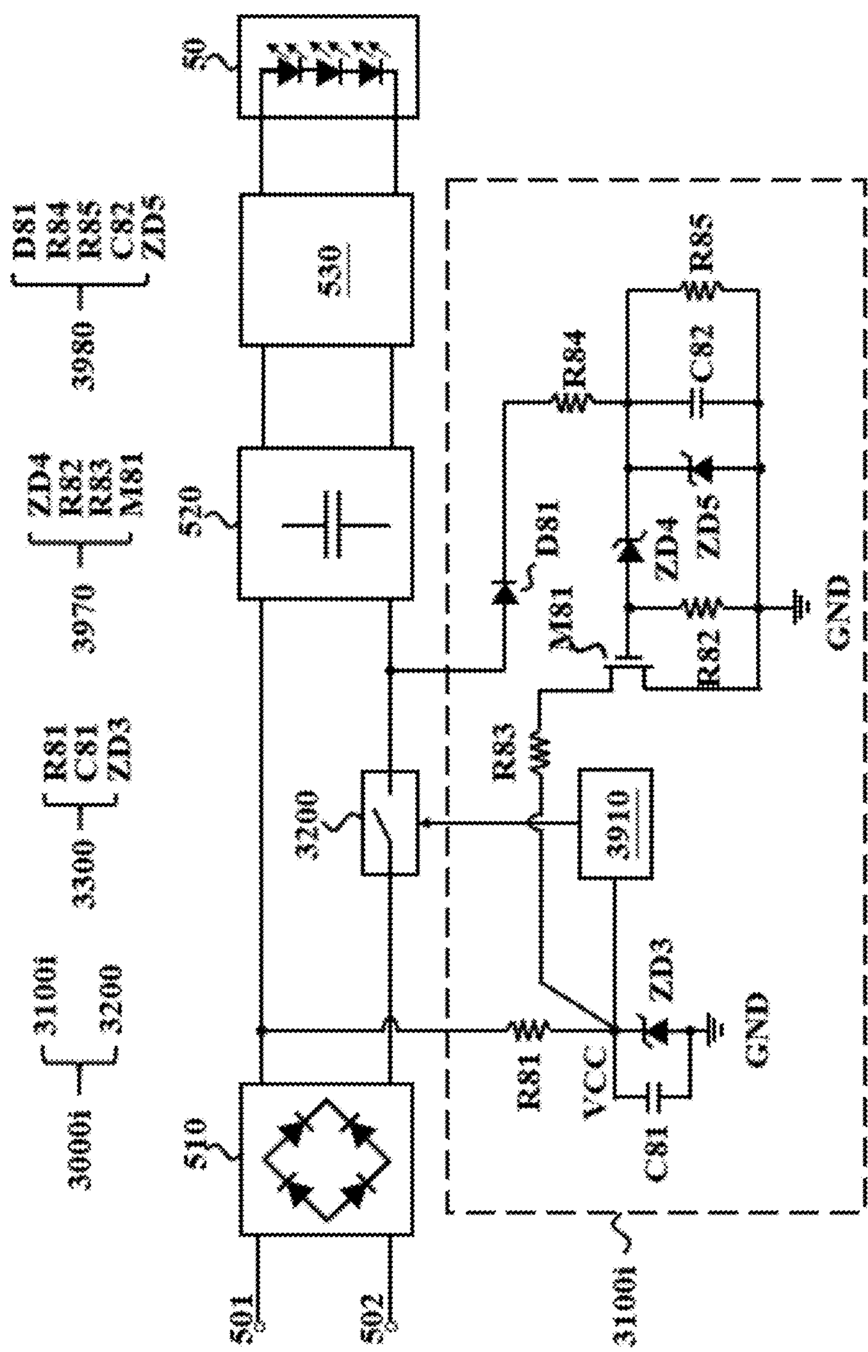

Referring to FIG. 21C, FIG. 21C is a circuit diagram of an installation detection module for a LED tube lamp according to some embodiments of the present disclosure. The power supply module of the embodiment includes rectifying circuit 510, filtering circuit 520, driving circuit 530, and an installation detection module 3000*i*. Installation detection module 3000*i* includes a detection controller 3100*i*, a switch circuit 3200, and a bias circuit 3300. The detection controller 3100*i* includes a control module 3910, an activation control circuit 3970 and a detection period determining circuit 3980. The configurations and operations of rectifying circuit 510, filtering circuit 520, and driving circuit 530 can refer to the descriptions of the related embodiments. In addition, the configurations and operations of control module 3910 and switch circuit 3200 can refer to the descriptions of the embodiment of FIG. 21A mentioned above, and the details are not described herein again.

Bias circuit 3300 includes a resistor R81, a capacitor C81, and a Zener diode ZD3. The first end of resistor R81 is electrically connected to the rectified output (i.e., electrically connected to the bus). Capacitor C81 and Zener diode ZD3 are electrically connected in parallel with each other, and their first ends are both electrically connected to the second end of resistor R81. The power supply input of control module 3910 is electrically connected to a common node of resistor R81, capacitor C81, and Zener diode ZD3 (i.e., the bias node of bias circuit 3300) to receive the driving voltage VCC.

Activation control circuit 3970 includes a Zener diode ZD4, a transistor M81, and resistors R82 and R83. The anode of Zener diode ZD2 is electrically connected to the control terminal of transistor M81. The first end of resistor R82 is electrically connected to the anode of Zener diode ZD4 and the control terminal of transistor M81, and the second end of resistor R82 is electrically connected to the ground terminal GND. The first end of transistor M81 is electrically connected to the bias node of bias circuit 3300 through a resistor R83, and the second end of transistor M81 is electrically connected to the ground terminal GND.

Detection period determining circuit 3980 includes a diode D81, resistors R84 and R85, a capacitor C82, and a Zener diode 3775. The anode of diode D81 is electrically connected to one end of switch circuit 3200, which can be regarded as the detecting node of detection period determining circuit 3980. The first end of resistor R84 is electrically connected to the cathode of diode D81, and the second end of resistor R84 is electrically connected to the cathode of Zener diode ZD4. The first end of resistor R85 is electrically connected to the second end of resistor R84, and the second end of resistor R85 is electrically connected to the ground terminal GND. Capacitor C82 and Zener diode ZD5 are both electrically connected in parallel with resistor R85, wherein the cathode and the anode of Zener diode ZD5 are electrically connected to the first end and the second end of resistor R85 respectively.

The operation of the installation detection module 3000*i* of this embodiment is described below. When rectifying circuit 510 receives an external power source through pins 501 and 502, the rectified bus voltage charges capacitor C81, thereby establishing a driving voltage VCC at the bias node. Control module 3910 is enabled in response to the driving voltage VCC and enters the detection mode. In the detection mode, in the first signal cycle, control module 3910 sends a pulse-shaped control signal to switch circuit 3200, so that switch circuit 3200 is temporarily turned on and then turned off.

During the period that switch circuit 3200 is turned on, the anode of diode D81 can be regarded as electrically connected to ground, so capacitor C82 is not charged. During the first signal period, the voltage across capacitor C82 will remain at the initial level during the switch circuit 3200 being turned on, and transistor M81 will remain in the turn-off/cut-off state, and thus will not affect the operation of control module 3910. Next, during the switch circuit 3200 being turned off/cut off, the power loop causes the voltage level on the detecting node to rise in response to the external power supply, wherein the voltage applied to the capacitor C82 is equal to the voltage division of the resistors R84 and R85. Therefore, during the period that the switch circuit 3200 is turned off, the capacitor C82 is charged in response to the voltage division of resistors R84 and R85, and the voltage across the capacitor C82 gradually rises. During the first signal period, because the increased voltage across the capacitor C82 has not reached the threshold level of the transistor M81, the transistor M81 remains in an off state, so that the driving voltage VCC remains unchanged. Since the transistor M81 remains in the off state during the first signal period no matter whether the switch circuit 3200 is turned on or cut off, the driving voltage VCC is not affected. Therefore, control module 3910 is maintained in the enabled or activated state in response to the driving voltage VCC. In the activated state, control module 3910 determines whether the LED tube lamp is correctly installed according to the signal on the detection path (i.e., determines whether an external impedance is introduced). The installation detection mechanism of this part is the same as the previous embodiment, and details are not described herein again.

When control module 3910 determines that the LED tube lamp has not been properly installed to the socket, control module 3910 maintains the detection mode and continuously outputs a pulse-shaped control signal to control switch circuit 3200. In the following signal periods, activation control circuit 3970 and detection period determining circuit 3980 continue to operate in a manner similar to the operation of the first signal period. That is, capacitor C82 is charged during the off period of each signal period, so that the voltage across capacitor C82 rises step by step in response to the pulse width and the pulse period. When the voltage across capacitor C82 exceeds the threshold level of transistor M81, transistor M81 is turned on causing the bias node to be shorted to the ground terminal GND, thereby causing the driving voltage VCC to be pulled down to the ground/low voltage level. At this time, the control module 3910 is disabled or deactivated in response to the driving voltage VCC of the low voltage level. When the control module 3910 is disabled or deactivated, the switch circuit 3200 is maintained in an off state regardless of whether or not an external power source is electrically connected.

When the control module 3910 determines that the LED tube lamp has been properly installed on the lamp socket, the control module 3910 will enter an operating mode and issue a control signal to maintain the switch circuit 3200 in a conductive state or turn-on state. In the operating mode, since the switch circuit 3200 remains turned on, the transistor M81 is maintained in an off state, so that the driving voltage VCC is not affected, and the control module 3910 can operate normally.

From the point of view of the multiple signal periods in the detection mode, the current waveform measured on the power loop is as shown in FIG. 37D, in which the period of capacitor C82 charged from the initial level to the threshold level of transistor M81 corresponds to the detection period Tw. In other words, in the detection mode, control module 3910 continues outputting pulse signal until capacitor C82 is charged to the threshold level of transistor M81, resulting in intermittent current in the power loop. And when the voltage across capacitor C82 exceeds the threshold, the pulse signal is stopped to avoid any danger to human body by the increased electric power in power loop.

From another perspective, the detection period determining circuit 3980 is in effect used to calculate the pulse-off period of the control signal, and when the calculated pulse-off period has reached a preset value, then to output a signal to control the activation control circuit 3970, causing the activation control circuit 3970 to affect operation of the control module 3910 so as to block or stop outputting of the pulse signal.

In the circuit architecture, the length of the detection period Tw (i.e., the time required for capacitor C82 to reach the threshold voltage of transistor M81) is mainly controlled by adjusting the capacitance value of capacitor C82 and resistance values of resistors R84, R85, and R82. Components such as diode D81, Zener diodes ZD5 and ZD4, and resistor R83 are used to assist in the operations of activation control circuit 3970 and the detection period determining circuit 3980 to provide the function of voltage stabilization, voltage limiting, current limiting, or protection.

Figure 21D:
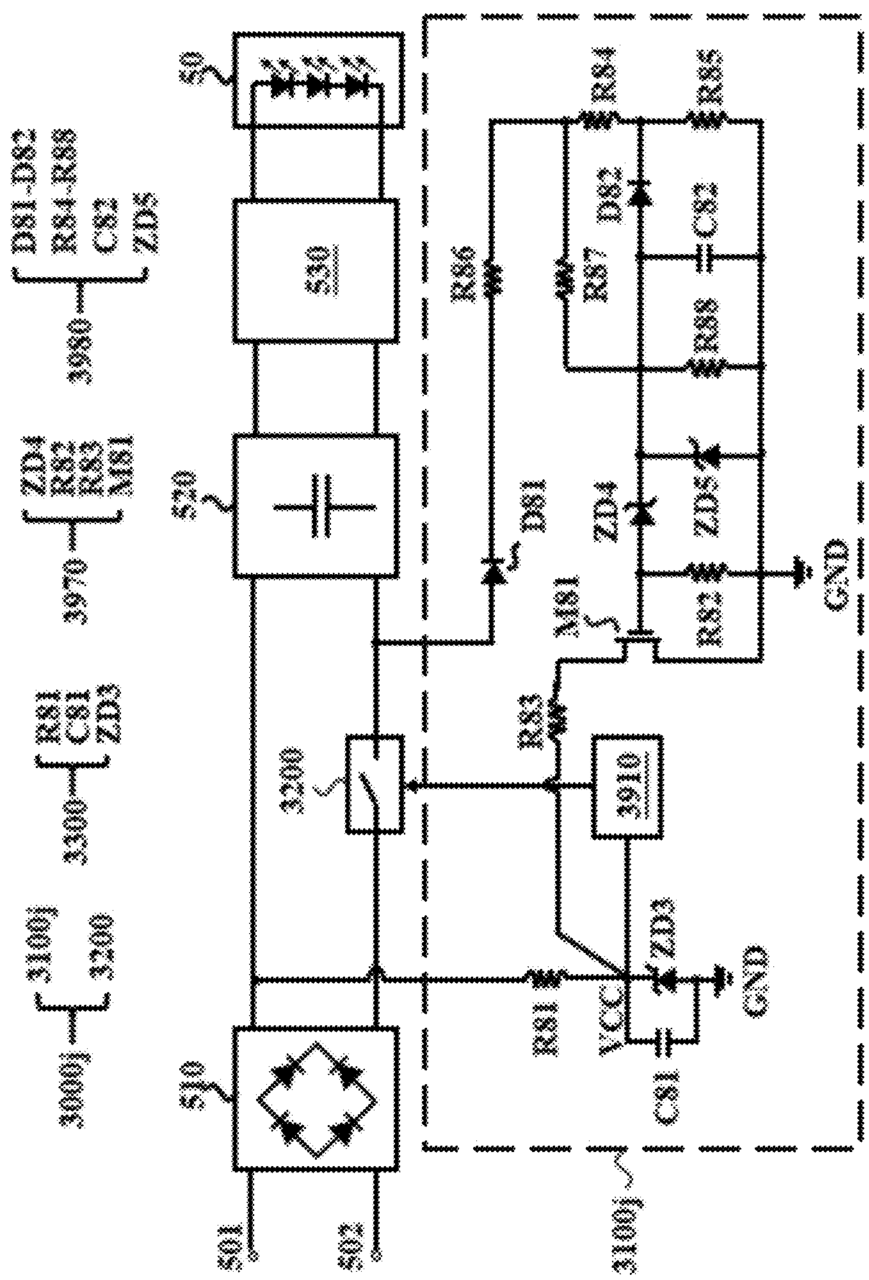

Referring to FIG. 21D, FIG. 21D is a circuit diagram of an installation detection module for an LED tube lamp according to some embodiments of the present disclosure. The power supply module of the embodiment includes rectifying circuit 510, filtering circuit 520, driving circuit 530, and installation detection module 3000*j*. Installation detection module 3000*j* includes detection controller 3100*j*, switch circuit 3200, and bias circuit 3300. The detection controller 3100*j* includes control module 3910, activation control circuit 3970, and detection period determining circuit 3980. In the present embodiment, the configurations and operations of installation detection module 3000*j* is almost the same as these of the embodiment of FIG. 21C. The main difference between FIGS. 21C and 21D is that detection period determining circuit 3980 of the present embodiment in FIG. 21D includes not only diode D81, resistors R84 and R85, capacitor C82 and Zener diode ZD5, but also resistors R86, R87 and R88 and diode D82. Resistor R86 is disposed in series between diode D81 and resistor R84. The first end of resistor R87 is electrically connected to the first end of resistor R84, and the second end of resistor R87 is electrically connected to the cathode of Zener diode ZD4. Resistor R88 and capacitor C82 are electrically connected in parallel with each other. The anode of diode D82 is electrically connected to the first end of capacitor C82 and the cathode of Zener diode ZD4, and the cathode of diode D82 is electrically connected to the second end of resistor R84 and the first end of resistor R85.

In the circuit architecture of this embodiment, the circuit for charging capacitor C82 is changed from resistors R84 and R85 to resistors R87 and R88. Capacitor C82 is charged based on the voltage division of resistors R87 and R88. Specifically, the voltage on the detecting node first generates a first-order partial voltage on the first end of resistor R84 based on the voltage division of resistors R86, R84, and R85, and then the first-order partial pressure generates a second order partial voltage at the first end of capacitor C82 based on the voltage division of resistors R87 and R88. In this configuration, the charging rate of capacitor C82 can be controlled by adjusting the resistance values of resistors R84, R85, R86, R87, and R88, and not limited by just adjusting capacitor value. As a result, the size of capacitor C82 can be effectively reduced. On the other hand, since resistor R85 is no longer working as a component on the charging circuit, a smaller resistance value can be selected, so that the discharging rate of capacitor C82 can be increased, thereby the reset time for the detection period determining circuit 3980 can be reduced.

Although the modules/circuits are named by their functionality in the embodiments described in the present disclosure, it should be understood by those skilled in the art that the same circuit component may be considered to have different functions based on the circuit design and different modules/circuits may share the same circuit component to implement their respective circuit functions. Thus, the functional naming of the present disclosure is not intended to limit a particular unit, circuit, or module to particular circuit components.

For example, the installation detection module of the above embodiments may be alternatively referred to as a detection circuit/module, a leakage current detection circuit/module, a leakage current protection circuit/module, an impedance detection circuit/module, or generically referred to as circuitry. The detection result latching module of the above embodiments may be alternatively referred to as a detection result storage circuit/module, or a control circuit/module. And the detection controller of the above embodiments may be a circuit including the detection pulse generating module, the detection result latching module, and the detection determining circuit, although the present invention is not limited to such a circuit of detection controller.

Figure 22A:
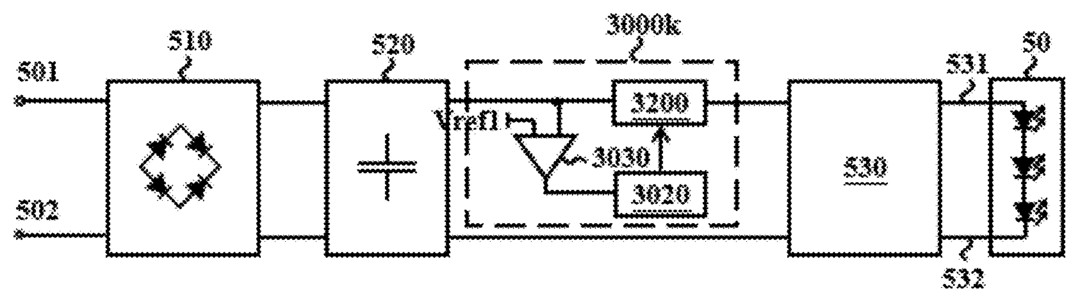
FIGS. 22A-22B are block diagrams of installation detection modules according to some exemplary embodiments.

FIG. 22A is a block diagram of an exemplary power supply module in an LED tube lamp according to some exemplary embodiments. Referring to FIG. 22A, the installation detection module 3000*k* has a circuit configuration for continuously detecting the signal on the power loop. The installation detection module 3000*k* includes the control circuit 3020, the detection determining circuit 3030 and the current limiting circuit 3200. The control circuit 3620 is configured to control the current limiting circuit 3200 according to the detection result generated by the detection determining circuit 3030, so that the current limiting circuit 3200 determines whether to perform the current limiting operation, for limiting the current on the power loop, based on the control of the control circuit 3020. In the present embodiment, the control circuit 3020 is preset to not perform the current limiting operation, which means the current on the power loop is not limited by the current limiting circuit 3200 at the preset state. Therefore, under the preset state, as long as the external AC power source is connected to the LED tube lamp, the input power can be provided to the LED module 50 through the power loop.

The following description describes the operation of detecting the signal on the power loop for example, but the invention is not limited thereto. In detail, when the external AC power source connects to the LED tube lamp, the input power enables the detection determining circuit 3030 for starting to detect the signal on a specific node of the power loop, and the detection result is transmitted to the control circuit 3020. The control circuit 3020 determines whether the conductive part is touched by a user according to at least one signal feature, such as the voltage/current level, the waveform, the frequency and other features, of the detection result signal. When the control circuit 3020 determines the LED tube lamp is touched by a user according to the detection result signal, the control circuit 3020 controls the current limiting circuit 3200 to perform the current limiting operation, so that the current on the power loop is limited to lower than a predetermined value, and therefore the occurrence of electric shock can be prevented/avoided.

Figure 22B:
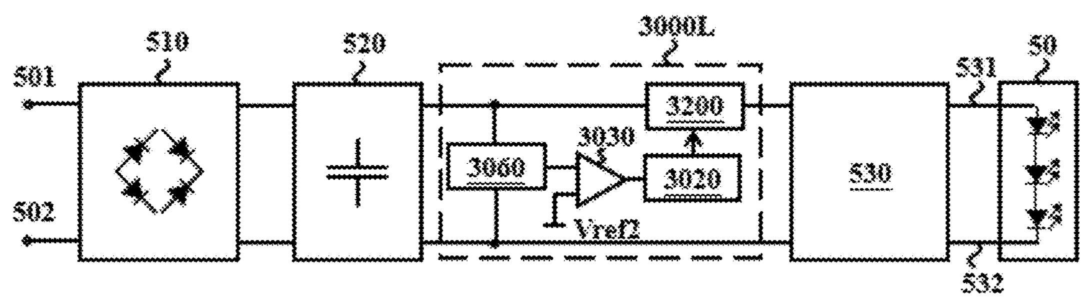

FIG. 22B is a block diagram of an exemplary power supply module in an LED tube lamp according to some exemplary embodiments. Referring to FIG. 22B, the installation detection module 3000L of the present embodiment is substantially the same as the installation detection module 3000*k*. The difference is the installation detection module 3000L has a circuit configuration for continuously detecting the signal on the detection path. The installation detection module 3000L includes a control circuit 3020, a detection determining circuit 3030, a current limiting circuit 3200 and a detection path circuit 3060. The operation of the control circuit 3020, detection determining circuit 3030 and the current limiting circuit 3200 can be referred to in connection with the embodiments of FIG. 22A, and it will not be repeated herein.

The detection path circuit 3060 can be disposed on the input side or the output side of one of the rectifying circuit 510, the filtering circuit 520, the driving circuit 530 and the LED module 50, and the present invention is not limited thereto. In addition, in the practical application, the detection path circuit 3060 can be implemented by any circuit structure capable of responding the impedance variation caused by the human body. For example, the detection path circuit 3060 can be formed by at least one passive component (e.g., resistor, capacitor, inductor), at least one active component (e.g., MOSFET, silicon controlled rectifier (SCR)) or the combination of the above.

In summary, the power supply modules illustrated in FIGS. 22A and 22B are configured in a continuous detection setting, which refers to the power supply module having a circuit (e.g., the installation detection module 3000*k*/3000L) for continuously detecting the installation state or the risk of electric shock. In some embodiments, under the continuous detection setting, the power loop/detection path is preset to be in a conducting state or a non-limiting state, and the current on the power loop would not be limited until the incorrect installation state or the risk of electric shock (the LED tube lamp is touched by a user) is detected.

Some embodiments of the power supply module are configured in a pulse detection setting, which refers to the power supply module having a circuit (e.g., the installation detection module 3000) for detecting the installation state or the risk of electric shock in certain duration (e.g., the pulse-on period). For example, under the pulse detection setting, the power loop/detection path is preset to be in a non-conducting state or a current limiting state. Before confirming the installation state or the risk of electric shock, the power loop/detection path is only turned on when the pulse-on period occurs. In addition, the current on the power would be limited until the correct installation state or no risk of electric shock (the LED tube lamp is not touched by a user) is detected. From the perspective of the current limiting circuit such as the switch circuit 3200, 3200*a*, 3200*b*, 3200*c* or 3200*d*, the current limiting circuit being disabled refers to the current limiting circuit not limiting the current on the power loop, which causes the power loop to be in the conducting state or the non-limiting state. On the other hand, the current limiting circuit being enabled refers to the current limiting circuit limiting the current on the power loop, which causes the power loop to be in the non-conducting state or the current limiting state.

In some embodiments, the continuous detection setting can be independently used for implementing the installation detection and the electric shock protection mechanism.

In some embodiments, the continuous detection setting and the pulse detection setting can be used together for implementing the installation detection and the electric shock protection mechanism. For example, the LED tube lamp can utilize the pulse detection setting before the LED module is lighted up and can then change to the continuous detection setting during the LED tube lamp emitting light.

From the perspective of the circuit operation, the switching of the pulse detection setting and the continuous detection setting can be determined based on the current on the power loop. For example, when the current on the power loop is smaller than the predetermined value (e.g., 5 MIU), the installation detection module enables the pulse detection setting. If the current on the power loop is detected to be greater than the predetermined value, the installation detection module changes to enable the continuous detection setting. From the perspective of the operation and the installation of the LED tube lamp, the installation detection module is preset to enable the pulse detection setting, so that the installation detection module utilizes the pulse detection setting for detecting the installation state (or the risk of electric shock) and performing the electric shock protection when the LED tube lamp is powered up. As long as the correct installation state is detected, the installation detection module changes to utilize the continuous detection setting for detecting whether the conductive part of the LED tube lamp is touched by a user during the LED tube lamp emitting light. In addition, the installation detection module will be reset to the pulse detection setting if the LED tube lamp is powered off.

With respect to hardware configuration of the LED tube lamp system, no matter whether the installation detection module is disposed inside the LED tube lamp (as shown in FIG. 13A) or externally on the lamp socket/fixture (as shown in FIG. 13B), a designer according to needs can selectively apply the continuous detection setting or the pulse detection setting in the LED tube lamp system. In this manner, no matter whether the installation detection module 3000 is configured inside the LED tube lamp or externally on the lamp socket, the installation detection module 3000 can perform installation detection and electric shock protection of the LED tube lamp, according to the above description of various embodiments.

A difference between internally disposing an installation detection module and externally disposing an installation detection module is that the first installation detection terminal TE1 and the second installation detection terminal TE2 of the external installation detection module are connected to and between an external power grid and a conductive pin of the LED tube lamp, for example, the first installation detection terminal TE1 and the second installation detection terminal TE2 are serially connected on a signal line of the external driving signal; and they are electrically coupled to the power loop of the LED tube lamp through the conductive pins. In another respect, although not shown in the described figures, a person of ordinary skill in the art can understand that in some embodiments of the installation detection module of this disclosure, the installation detection module may have or include a bias circuit for generating a driving voltage configured to provide power for operations of circuits in the installation detection module.

The embodiments of the installation detection module illustrated in FIG. 15A, FIG. 16A, FIG. 17A, FIG. 18A, FIG. 19A, FIG. 20A and FIG. 21A teach the installation detection module includes a pulse generating mechanism such as the detection pulse generating modules 3110,3210, and 3510, the pulse generating auxiliary circuit 3310, and the signal generating unit 3410 for generating a pulse signal, however, the present invention is not limited thereto. In an exemplary embodiment, the installation detection module can use the original clock signal in the power supply module to replace the function of the pulse generating mechanism in the above embodiments. For example, in order to generate a lighting control signal having a pulse waveform, the driving circuit (e.g., DC-to-DC converter) in the power supply module has a reference clock, originally. The function of the pulse generating mechanism can be implemented by using the reference clock of the lighting control signal as a reference, so that the hardware of the detection pulse generating module 3110, 3210, 3510/pulse generating auxiliary module 3310/signal generating unit 3410 can be omitted. In this case, the installation detection module can share the circuit configuration with another part of the circuit in the power supply module, so as to realize the function of generating the pulse signal. In addition, the duty cycle of the pulse generating mechanism can be any value in the interval of a real number greater than 0 to 1, in which the duty cycle equal to 0 means the power loop is normally closed, and the duty cycle equal to 1 means the power loop is normally open.

In some embodiments, when the duty cycle is set to smaller than 1, the detection operation of the installation detection module is performed by temporarily conducting a current on the power loop/detection path and detecting a signal on the power loop/detection path to obtain the installation state of the LED tube lamp without causing electric shock. When the LED tube lamp is correctly installed on the lamp socket (i.e., the pins on the both end caps are correctly connected to the connecting sockets), the current limiting module is disabled for conducting the driving current on the power loop, so as to drive/light up the LED module. Under such configuration, the current limiting module is preset to be in an enable state, so that the power loop can be maintained in the non-conducting state before confirming whether there is the risk of electric shock (or whether the LED tube lamp is correctly installed). The current limiting module is switched to a disable state when the LED tube lamp is correctly installed. Taking the switch circuit for example, the enable state of the current limiting module refers to the switch circuit being cut-off, and the disable state of the current limiting module refers to the switch circuit being turned on. Such configuration can be referred to as a pulse detection setting (the duty cycle is greater than 0 and smaller than 1). Under the pulse detection setting, the installation detection means performs during the pulse-on period of each pulse after powering up, and the electric shock protection means is implemented by suspending the current flowing through the power loop until the correct installation state is detected or the risk of electric shock is excluded.

In some embodiments, when the duty cycle is set to equal to 1, the detection operation of the installation detection module is performed by continuously monitoring/sampling the signal on the power loop/detection path. The sample signal can be used for determining the equivalent impedance of the power loop/detection path. When the equivalent impedance indicates there is a risk of electric shock (i.e., a user touches the conductive part of the LED tube lamp), the current limiting module is switched to be in the enable state for cutting off the power loop. Under such configuration, the current limiting module is preset to be in the disable state, so that the power loop can be maintained in the conducting/non-limiting state before confirming whether there is the risk of electric shock (or whether the LED tube lamp is correctly installed), in which case the LED tube lamp can be lighted up in the preset condition. The current limiting module is switched to the enable state when the risk of electric shock is detected. Such configuration can be referred to a continuous detection setting (the duty cycle equals to 1). Under the continuous detection setting, the installation detection means performs continuously without considering whether the LED tube lamp is lighted up or not, after powering up, and the electric shock protection means is implemented by allowing the current to flow through the power loop until the incorrect installation state or the risk of electric shock is detected. Either the incorrect installation state or the risk of electric shock being detected can be referred to an abnormal state.

Specifically, the risk of electric shock may occur as long as one end of the LED tube lamp is connected to the external power. Therefore, no matter whether installing or removing the LED tube lamp, once the user touches the conductive part of the tube lamp, the user is exposed to the risk of electric shock. In order to avoid the risk of electric shock, no matter whether the LED tube lamp is lighted up or not, the installation detection module operates based on the pulse detection setting or the continuous detection setting to detect the installation state and the user touching state and protect the user from being electrically shocked. Therefore, the safety of the LED tube lamp can be further improved.

Under the continuous detection setting, the pulse generating mechanism can be referred to as a path enabling mechanism, which is configured to provide a conduction signal for turning on the power loop/detection path. In some embodiments, for circuit structures of the detection pulse generating modules 3110, 3210 and 3510, the pulse generating auxiliary module 3310 and signal generating unit 3410 can be correspondingly modified to a circuit for providing fixed voltage. In addition, the switch circuits 3200, 3200*a*, 3200*b*, 3200*c* and 3200*d* can be modified to be preset to be in the conducting state/turn-on state, and to switch to the non-conducting state/cut-off state when the risk of electric shock is detected (it can be implemented by modifying the logic gate of the detection result latching circuit). In some embodiments, the circuit for generating a pulse can be omitted by modifying the circuit structure of the detection determining circuit and the detection path circuit. For example, under the continuous detection setting, the detection pulse generating module 3110 in the installation detection module of FIG. 15A and the detection pulse generating module 3210 in the installation detection module of FIG. 16A can be omitted, and so on. In addition, according to the embodiment of disposing the additional detection path in the installation detection module, the detection pulse generating module 3510 can be omitted if the continuous detection setting is applied, and the detection path circuit 3560 is maintained in the conducting state (e.g., the transistor M51 is omitted).

Figure 23:
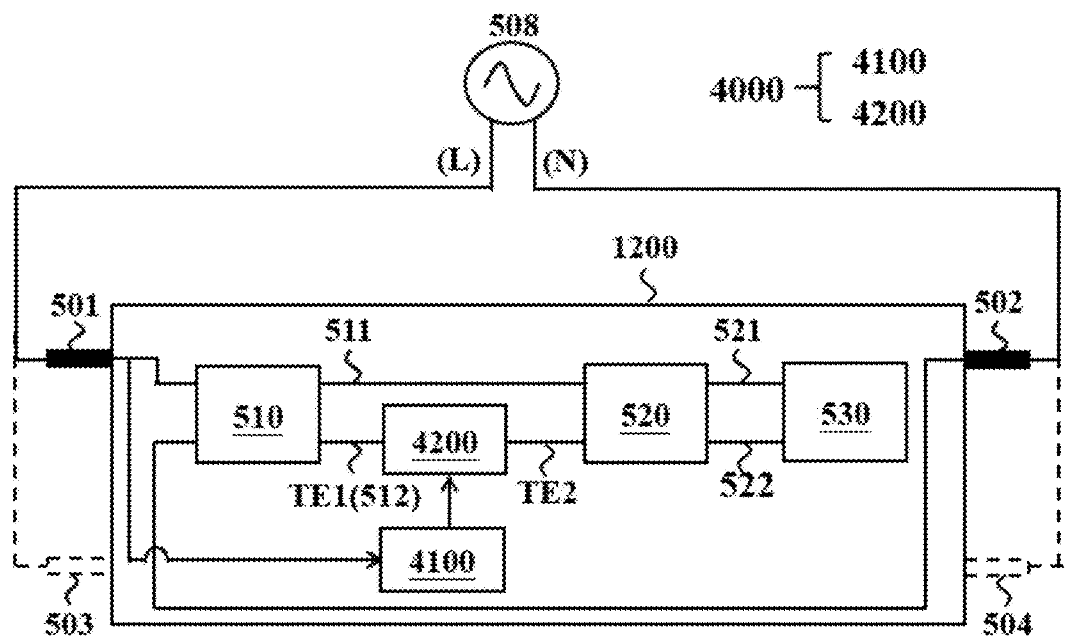
FIG. 23 is a block diagram of an exemplary power supply module in an LED tube lamp according to some exemplary embodiments.

FIG. 23 is a circuit block diagram of a power supply module in an LED tube lamp according to some embodiments. Referring to FIG. 23, the LED tube lamp 1200 is, for example, configured to receive an external driving signal directly provided by an external AC power source 508, wherein the external driving signal is input through the live wire (marked as "L") and the neutral wire (marked as "N") to two pins 501 and 502 on two ends of the LED tube lamp 1200. In practical applications, the LED tube lamp 1200 may further have two additional pins 503 and 504, also on the two ends. Under the structure of the LED tube lamp 1200 having the four pins 501-504, depending on design requirements two pins (such as the pins 501 and 503, or the pins 502 and 504) on an end cap coupled to one end of the LED tube lamp 1200 may be electrically connected or mutually electrically independent, but the invention is not limited to any of the mentioned cases. An electric-shock detection module 4000 is disposed inside the LED tube lamp 1200 and includes a detection control circuit 4100 and a current-limiting circuit 4200. The electric-shock detection module 4000 may be and is hereinafter referred to as an installation detection module 4000. The current-limiting circuit 4200 is coupled to a rectifying circuit 510 through a first installation detection terminal TE1 and coupled to a filtering circuit 520 through a second installation detection terminal TE2, so is serially connected on a power loop in the LED tube lamp 1200. Under a detection mode, the detection control circuit 4100 is configured to detect a signal on an input side of the rectifying circuit 510 such as an input signal provided by the external AC power source 508, and configured to determine whether to prevent a current from passing through the LED tube lamp 1200 according to the detection result. When the LED tube lamp 1200 is not yet correctly/properly installed onto a lamp socket, the detection control circuit 4100 detects a relatively small current signal and then assumes/presumes it to be facing or passing through relatively high impedance, so the current-limiting circuit 4200 in response cuts off a current path between the first installation detection terminal TE1 and second installation detection terminal TE2 to prevent the LED tube lamp 1200 from operating (i.e., suspending the LED tube lamp 1200 from lighting up). On the other hand, when a relatively large current signal is detected or a relatively small current signal is not detected, the detection control circuit 4100 determines that the LED tube lamp 1200 is correctly/properly installed onto a lamp socket, and then the current-limiting circuit 4200 causes or allows the LED tube lamp 1200 to operate in a normal lighting mode (i.e., allowing the LED tube lamp 1200 being lighted up) by maintaining current conduction between the first installation detection terminal TE1 and second installation detection terminal TE2. In some embodiments, when a current signal passing on the input side of the rectifying circuit 510 sampled and detected by the detection control circuit 4100 is equal to or higher than a defined or set current value, the detection control circuit 4100 determines that the LED tube lamp 1200 is correctly/properly installed onto a lamp socket and then causes the current-limiting circuit 4200 to conduct current, thereby causing the LED tube lamp 1200 to operate in a normal lighting mode. When the current signal is lower than a defined or set current value, the detection control circuit 4100 determines that the LED tube lamp 1200 is not correctly/properly installed onto a lamp socket and thus cuts off the current-limiting circuit 4200 or a current path thereof, thereby causing the LED tube lamp 1200 to enter into a non-conducting state or limiting an effective current value on a power loop in the LED tube lamp 1200 to being smaller than, for example, 5 mA (or 5 MIU according to certain certification standards). In other words, the installation detection module 4000 can be regarded as determining whether to allow or limit current conduction based on the detected impedance, thereby causing the LED tube lamp 1200 to operate in a conducting state or enter into a cutoff or current-limited state. Accordingly, the LED tube lamp 1200 using such an installation detection module 4000 has the benefit of avoiding or reducing the risk of electric shock hazard occurring on the body of a user when accidentally touching or holding a conducting part of the LED tube lamp 1200 which is not yet correctly/properly installed onto a lamp socket.

Specifically, when (part of) a human body touches or contacts the LED tube lamp, impedance of the human body may cause a change in equivalent impedance on a power loop in the LED tube lamp, so the installation detection module 4000 of FIG. 23 can determine whether a human body has touched or contacted the LED tube lamp by e.g., detecting a change in current/voltage on the power loop, in order to implement the function of electric-shock prevention. The installation detection module 4000 of the present embodiment can determine whether the LED tube lamp 1200 is correctly/properly installed onto a lamp socket or whether the body of a user has accidentally touched a conducting part of the LED tube lamp which is not yet correctly/properly installed onto a lamp socket, by detecting an electrical signal such as a voltage or current. Further, compared to the embodiment of FIG. 14, since a signal used for determining the installation state is detected/sampled, by the detection control circuit 4100, from the input side of the rectifying circuit 510, the signal characteristics may not be easily influenced by other circuits in the power supply module, so that the possibility of misoperation of the detection control circuit 4100 can be reduced.

From circuit operation perspectives, a method performed by the detection control circuit 4100 and configured to determine, under a detection mode, whether the LED tube lamp 1200 is correctly/properly installed to a lamp socket or whether there is any unintended external impedance being connected to the LED tube lamp 1200 is shown in FIG. 38A. The method includes the following steps: temporarily conducting a detection path for a period and then cutting it off (step S101); sampling an electrical signal on the detection path during the conduction period (step S102); determining whether the sample of electrical signal conforms with predefined signal characteristics (step S103); if the determination result in step S103 is positive, controlling the current-limiting circuit 4200 to operate in a first state (step S104); and if the determination result in step S103 is negative, controlling the current-limiting circuit 4200 to operate in a second state (step S105) and then returning to the step S101.

In the method of FIG. 38A performed in the embodiment of FIG. 23, the detection path can be a current path connected between the input side of the rectifying circuit 510 and a ground terminal, and its detailed circuit configurations in the embodiment are presented and illustrated below with reference to FIGS. 24A and 24B. In addition, the detailed description of how to set parameters such as the conduction period, intervals between multiple conduction periods, and the time point to trigger conduction, of the detection path in the detection control circuit 4100 can refer to the relevant embodiments described in the disclosure.

In the step S101, conducting the detection path for a period may be implemented by means using pulse signal to control switching of a switch.

In the step S102, the sample of electrical signal is a signal that can represent or express impedance variation on the detection path, which signal may comprise a voltage signal, a current signal, a frequency signal, a phase signal, etc.

In the step S103, the operation of determining whether the sampled electrical signal conforms to predefined signal characteristics may comprise, for example, a relative relation of the sampled electrical signal to a predefined signal. In some embodiments, the sampled electrical signal that is determined by the detection control circuit 4100 to conform to the predefined signal characteristics may correspond to a determination or state that the LED tube lamp 1200 is correctly/properly connected to the lamp socket or there is no unintended external impedance being coupled to the LED tube lamp 1200, and the sampled electrical signal that is determined by the detection control circuit 4100 to not conform to the predefined signal characteristics may correspond to a determination or state where the LED tube lamp 1200 is not correctly/properly connected to the lamp socket or there is a foreign external impedance (e.g., a human body impedance, simulated/test human body impedance, or other impedance connected to the lamp and which the lamp is not designed to connect to for proper lighting operations) being coupled to the LED tube lamp 1200.

In the steps S104 and S105, the first state and the second state can refer to two distinct circuit-configuration states, and may be set according to the configured position and type of the current-limiting circuit 4200. For example, in the case or embodiment where the current-limiting circuit 4200 is independent of the driving circuit 530 and refers to a switching circuit or a current-limiting circuit that is serially connected on the power loop, the first state is a conducting state (or non-current-limiting state) while the second state is a cutoff state (or current-limiting state).

Detailed operations and example circuit structures for performing the above method in FIG. 38A as under the structure of FIG. 23 are illustrated by descriptions herein of different embodiments of an installation detection module.

Figure 24A:
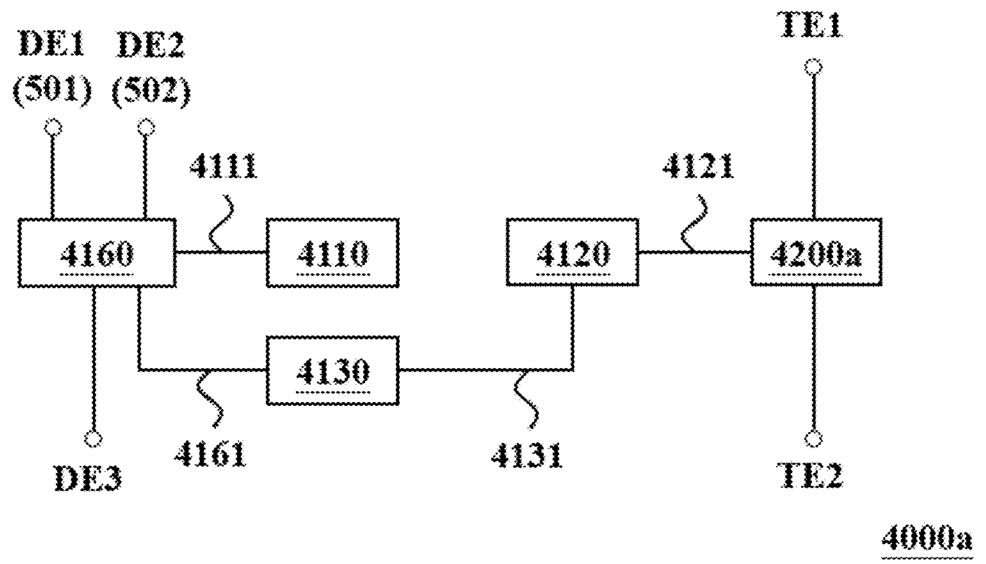
FIG. 24A is a block diagram of an installation detection module according to some exemplary embodiments.

FIG. 24A is a block diagram of an installation detection module according to some exemplary embodiments. Referring to FIG. 24A, the installation detection module **4000*a* includes a detection pulse generating module 4110, a control circuit 4120, a detection determining circuit 4130, a switching circuit 4200*a*, and a detection path circuit 4160. The detection determining circuit 4130 is coupled to the detection path circuit 4160 through a path 4161, in order to detect a signal on the detection path circuit 4160. The detection determining circuit 4130 is also coupled to the control circuit 4120 through a path 4131, in order to transmit a detection result signal to the control circuit 4120 through the path 4131. The detection pulse generating module 4110 is coupled to the detection path circuit 4160 through a path 4111 and generates a pulse signal to inform the detection path circuit 4160 of a time point to conduct a detection path or perform the installation detection. The control circuit 4120 stores or latches a detection result according to the detection result signal and is coupled to the switching circuit 4200*a* through a path 4121, in order to transmit or reflect the detection result to the switching circuit 4200*a*. The switching circuit 4200*a* determines whether to conduct the current path between the installation detection terminals TE1 and TE2 (i.e., part of the power loop). The detection path circuit 4160 is coupled to the power loop of the power supply module through a first detection connection terminal DE1 and a second detection connection terminal DE2. Detailed descriptions related to the detection pulse generating module 4110, control circuit 4120, detection determining circuit 4130, and switching circuit 4200*a* are similar to those of the embodiment of FIG. 19**A, and thus are not repeated here again.

In the present embodiment, the detection path circuit 4160 has the first detection connection terminal DE1, the second detection connection terminal DE2, and a third detection connection terminal DE3, in which the first detection connection terminal DE1 and second detection connection terminal DE2 are electrically connected to two input terminals of a rectifying circuit 510 respectively to receive or sample an external driving signal through a first pin 501 and a second pin 502. The detection path circuit 4160 is configured to rectify the received/sampled external driving signal and to determine under the control of the detection pulse generating module 4110 whether to conduct the rectified external driving signal through a detection path. For example, the detection path circuit 4160 is configured to determine whether to conduct the detection path, in response to the control of the detection pulse generating module 4110. Detailed circuit operations such as using a pulse signal for conducting the detection path and detecting whether there is any external impedance being connected to a conductive part of the LED tube lamp are similar to those described in the embodiments of FIGS. 19B-19D, and thus are not repeatedly described here again.

Figure 24B:
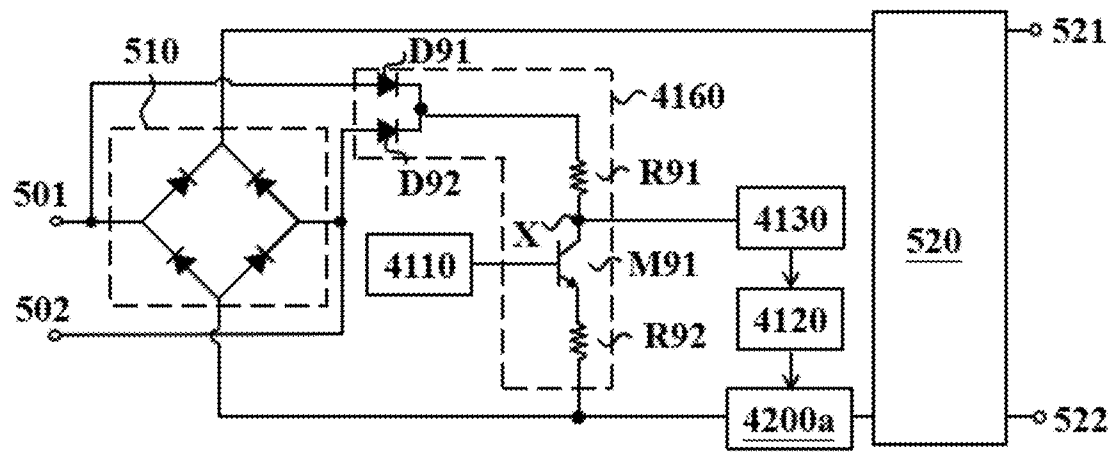
FIG. 24B is a schematic circuit diagram of an installation detection module according to some exemplary embodiments.

FIG. 24B is a schematic circuit diagram of an installation detection module according to some exemplary embodiments. Configurations and operations of a detection path circuit 4160 of the present embodiment is different from those in above embodiments of installation detection module (as of FIGS. 19A-19C). A main difference is that the detection path circuit 4160 of FIG. 24B has current-limiting elements D91 and D92, which are for example, and hereinafter referred to as, a diode D91 connected between a first rectifying input terminal (or the first pin 501) and a first end of a resistor R91, and a diode D92 connected between a second rectifying input terminal (or the second pin 502) and the first end of the resistor R91, respectively. The diode D91 has an anode coupled to the first rectifying input terminal or a terminal of the rectifying circuit 510 connected to the first pin 501, and has a cathode coupled to the first end of the resistor R91. The diode D92 has an anode coupled to the second rectifying input terminal or a terminal of the rectifying circuit 510 connected to the second pin 502, and has a cathode coupled to the first end of the resistor R91. In this embodiment of FIG. 28B, an external driving signal or AC signal received by the first and second pins 501 and 502 are provided to the first end of the resistor R91 via the diodes D91 and D92. During the positive half cycle of the external driving signal, the diode D91 is turned on as being forward-biased and the diode D92 is turned off as being reverse-biased, making the detection path circuit 4160 equivalently form a detection path between the first rectifying input terminal (or pin 501) and a second rectifying output terminal 512, which in this embodiment of FIG. 24B is coupled to a second filtering output terminal 522 (through the switching circuit 4200*a*). During the negative half cycle of the external driving signal, the diode D91 is turned off as being reverse-biased and the diode D92 is turned on as being forward-biased, making the detection path circuit 4160 equivalently form a detection path between the second rectifying input terminal (or pin 502) and the second rectifying output terminal 512.

The diodes D91 and D92 of the present embodiment serve to limit the direction of the input AC signal, so that the first end of the resistor R91 receives a positive voltage (compared to the ground level) during both the positive half cycle and the negative half cycle of the input AC signal, and therefore the phase change of the input AC signal, which may affect the voltage on the node X to cause a wrong detection result, is unlikely to affect the voltage on the node X when the diodes D91 and D92 are included. Further, compared to some above embodiments, instead of forming a detection path directly connected on the power loop of the power supply module, such as the detection path illustrated in FIGS. 19B to 19D, the detection path circuit 4160 forms a detection path between (either of) the two rectifying input terminals and the second rectifying output terminal 512 (or the ground terminal) through the diodes D91 and D92, which the detection path is separate from or substantially independent from the power loop. Since the detection path circuit 4160 is not directly connected to the power loop and only turned on under a detection mode, the current on the power loop for driving the LED module would not flow through the detection path circuit 4160 when the LED tube lamp is correctly/properly installed on the lamp socket and its power supply module is operating normally. Therefore, since the detection path circuit 4160 does not need to withstand high current when the LED tube lamp's power supply module is operating normally, there is higher flexibility in selecting specifications of the components of the detection path circuit 4160, and accordingly the power consumption on the detection path circuit 4160 can be lower due to the flexible selecting. Compared to the embodiments illustrated in FIGS. 19B to 19D where a detection path is directly connected to the power loop, since the detection path circuit 4160 of FIG. 24B is not directly connected to the filtering circuit 520 in the power loop, the issue of reverse discharging from a filtering capacitor of the filtering circuit 520 can be avoided, which makes the circuit design simpler.

Figure 25:
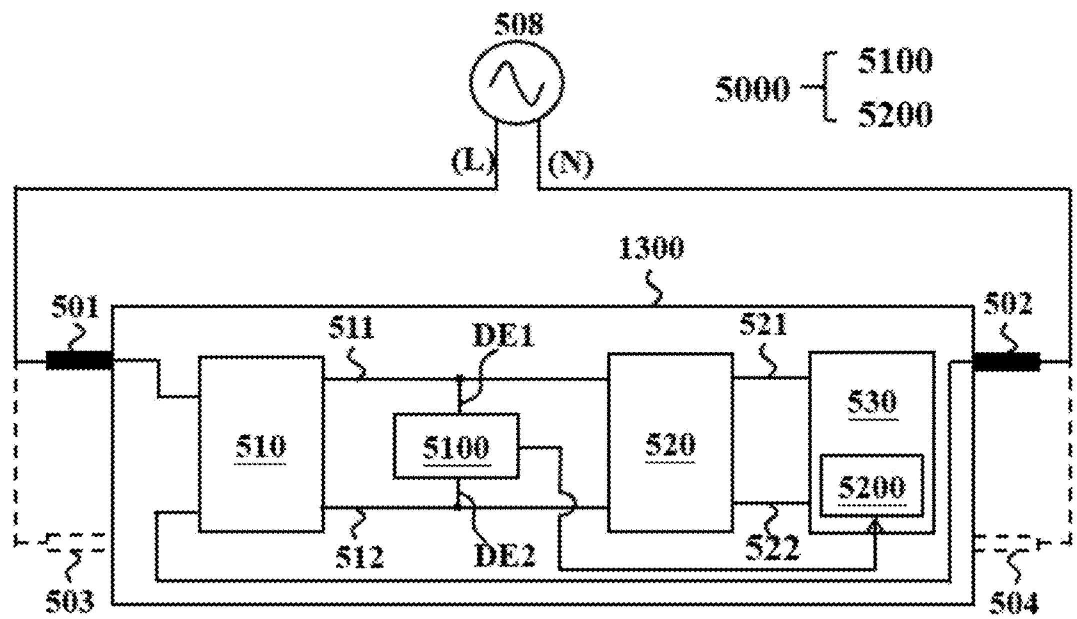
FIG. 25 is a block diagram of an exemplary power supply module in an LED tube lamp according to some exemplary embodiments.

FIG. 25 is a block diagram of an exemplary power supply module in an LED tube lamp according to some exemplary embodiments. Referring to FIG. 25, the LED tube lamp 1300 is, for example, configured to receive an external driving signal directly provided by an external AC power source 508, wherein the external driving signal is input through the live wire (marked as "L") and the neutral wire (marked as "N") to two pins 501 and 502 on two ends of the LED tube lamp 1300. In practical applications, the LED tube lamp 1300 may further have two additional pins 503 and 504, also on the two ends. Under the structure of the LED tube lamp 1300 having the four pins 501-504, depending on design needs two pins (such as the pins 501 and 503, or the pins 502 and 504) on an end cap coupled to one end of the LED tube lamp 1300 may be electrically connected or mutually electrically independent, but the invention is not limited to any of the mentioned cases. A shock detection module 5000 is disposed inside the LED tube lamp 1300 and includes a detection control circuit 5100 and a current-limiting circuit 5200. The shock detection module 5000 may be and is hereinafter referred to as an installation detection module 5000. The current-limiting circuit 5200 may be disposed in combination with a driving circuit 530, and may be the driving circuit 530 itself or may comprise a bias adjustment circuit (to be further described in embodiments below) configured for controlling the enabling/disabling of the driving circuit 530. The detection control circuit 5100 is electrically connected to a power loop of the LED tube lamp 1300 through a first detection connection terminal DE1 and a second detection connection terminal DE2, in order to sample and detect, under a detection mode, a signal on the power loop, and is configured to control the current-limiting circuit 5200 according to the detection result, so as to determine whether to prevent a current from passing through the LED tube lamp 1300. When the LED tube lamp 1300 is not yet correctly/properly installed onto a lamp socket, the detection control circuit 5100 detects a relatively small current signal and then assumes/presumes it to be facing or passing through relatively high impedance, so the current-limiting circuit 5200 in response disables the driving circuit 530 to prevent the LED tube lamp 1300 from operating in a normal lighting mode (i.e., suspending the LED tube lamp 1300 from lighting up). On the other hand, when a relatively large current signal is detected or a relatively small current signal is not detected, the detection control circuit 5100 determines that the LED tube lamp 1300 is correctly/properly installed onto a lamp socket, and then the current-limiting circuit 5200 allows the LED tube lamp 1300 to operate in a normal lighting mode (i.e., allowing the LED tube lamp 1300 being lighted up) by enabling the driving circuit 530. In some embodiments, when a current signal on the power loop sampled and detected by the detection control circuit 5100 is equal to or higher than a defined or set current value, the detection control circuit 5100 determines that the LED tube lamp 1300 is correctly/properly installed onto a lamp socket and then causes the current-limiting circuit 5200 to enable the driving circuit 530. But when the current signal sampled and detected by the detection control circuit 5100 is lower than a defined or set current value, the detection control circuit 5100 determines that the LED tube lamp 1300 is not correctly/properly installed onto a lamp socket and thus causes the current-limiting circuit 5200 to disable the driving circuit 530, thereby causing the LED tube lamp 1300 to enter into a non-conducting state or limiting an effective current value on a power loop in the LED tube lamp 1300 to being smaller than, for example, 5 mA (or 5 MIU according to certain certification standards). The installation detection module 5000 can be regarded as determining whether to cause current conduction or cutoff of the current-limiting circuit 5200 based on the detected impedance, thereby causing the LED tube lamp 1300 to operate in a conducting or normally driven state or enter into a current-limited state or non-driven state. Accordingly, an LED tube lamp 1300 using such an installation detection module 5000 has the benefit of avoiding or reducing the risk of electric shock hazard occurring on the body of a user when accidentally touching or holding a conducting part of the LED tube lamp 1300 which is not yet correctly/properly installed onto a lamp socket.

Specifically, when (part of) a human body touches or contacts the LED tube lamp, impedance of the human body may cause a change in equivalent impedance on a power loop in the LED tube lamp, so the installation detection module 5000 of FIG. 25 can determine whether a human body has touched or contacted the LED tube lamp by e.g. detecting a change in current/voltage on the power loop, in order to implement the function of electric-shock prevention. The installation detection module 5000 of the present embodiment can determine whether the LED tube lamp 1300 is correctly/properly installed onto a lamp socket or whether the body of a user has accidentally touched a conducting part of the LED tube lamp which is not yet correctly/properly installed onto a lamp socket, by detecting an electrical signal such as a voltage or current. Further, compared to the embodiments of FIGS. 14 and 23, since the current limiting function is implemented by controlling the driving circuit 530, an additional switching circuit, which may be designed for withstanding large current, serially connected on the power loop for providing electric shock protection is not required. The sizes of selected transistor(s) in such a switching circuit are often strictly limited, so when such a switching circuit is omitted or not required, the overall cost of manufacturing the installation detection module 5000 can be significantly reduced.

From circuit operation perspectives, a method performed by the detection control circuit 5100 and configured to determine under a detection mode whether the LED tube lamp 1300 is correctly/properly installed to a lamp socket or whether there is any unintended external impedance being connected to the LED tube lamp 1300 is shown in FIG. 38A. The method includes the following steps: temporarily conducting a detection path for a period and then cutting it off (step S101); sampling an electrical signal on the detection path during the conduction period (step S102); determining whether the sample of electrical signal conforms with predefined signal characteristics (step S103); if the determination result in step S103 is positive, controlling the current-limiting circuit 5200 to operate in a first state (step S104); and if the determination result in step S103 is negative, controlling the current-limiting circuit 5200 to operate in a second state (step S105) and then returning to the step S101.

In the method of FIG. 38A performed in the embodiment of FIG. 25, the detection path may be a current path connected to the output side of the rectifying circuit 510, and its detailed circuit configurations in the embodiment are presented and illustrated below with reference to FIGS. 26A to 28B. And detailed description of how to set parameters such as the conduction period, intervals between multiple conduction periods, and the time point to trigger conduction, of the detection path in the detection control circuit 5100 is also presented below for different embodiments.

In the step S101, conducting the detection path for a period may be implemented by means using pulse signal to control switching of a switch.

In the step S102, the sample of electrical signal is a signal that can represent or express impedance variation on the detection path, which signal may comprise a voltage signal, a current signal, a frequency signal, a phase signal, etc.

In the step S103, the operation of determining whether the sampled electrical signal conforms to predefined signal characteristics may comprise, for example, a relative relation of the sampled electrical signal to a predefined signal. In some embodiments, the sampled electrical signal that is determined by the detection control circuit 5100 to conform with the predefined signal characteristics may correspond to a determination or state that the LED tube lamp 1300 is correctly/properly connected to the lamp socket or there is no unintended external impedance being coupled to the LED tube lamp 1300, and the sampled electrical signal that is determined to not conform by the detection control circuit 5100 to the predefined signal characteristics may correspond to a determination or state where the LED tube lamp 1300 is not correctly/properly connected to the lamp socket or there is a foreign external impedance (e.g., a human body impedance, simulated/test human body impedance, or other impedance connected to the lamp and which the lamp is not designed to connect to for proper lighting operations) being coupled to the LED tube lamp 1300.

In the steps S104 and S105 performed in the embodiment of FIG. 29, the first state and the second state are two distinct circuit-configuration states, and may be set according to the configured position and type of the current-limiting circuit 5200. For example, in the case or embodiment where the current-limiting circuit 5200 refers to a bias adjustment circuit connected to a power supply terminal or enable terminal of a controller of the driving circuit 530, the first state is a cutoff state (or normal bias state, which allows the driving voltage to be normally supplied to the driving controller) while the second state is a conducting state (or bias adjustment state, which suspends the driving voltage from being supplied to the driving controller). And in the case or embodiment where the current-limiting circuit 5200 refers to a power switch in the driving circuit 530, the first state is a driving-control state, where switching of the current-limiting circuit 5200 is only controlled by the driving controller in the driving circuit 530 and not affected by the detection control circuit 5100; while the second state is a cutoff state.

Detailed operations and example circuit structures for performing the above method in FIG. 38A as under the structure of FIG. 25 are illustrated by descriptions herein of different embodiments of an installation detection module.

Figure 26A:
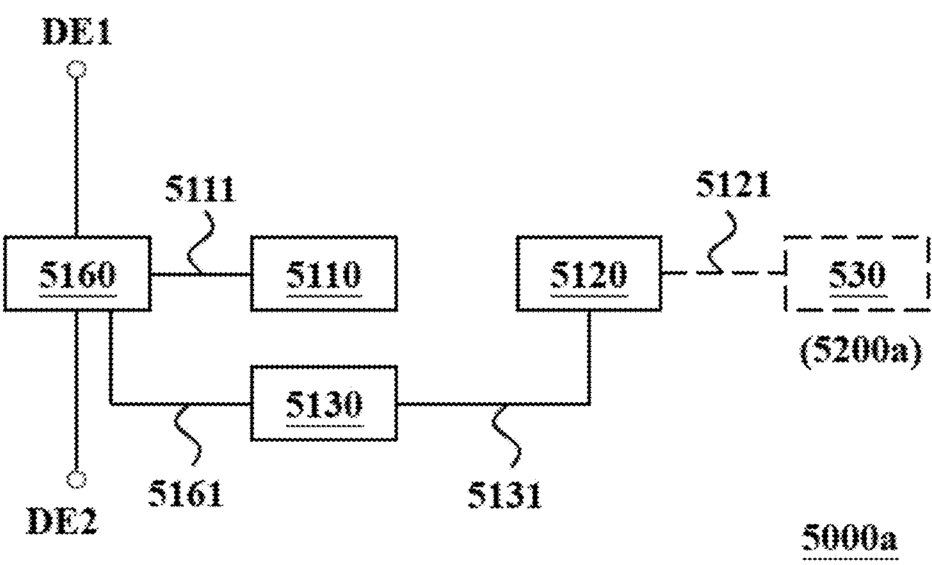
FIG. 26A is a block diagram of an installation detection module according to some exemplary embodiments.

FIG. 26A is a block diagram of an installation detection module according to an exemplary embodiment. Referring to FIG. 26A, the installation detection module 5000*a* includes a detection pulse generating module 5110 (which may be referred to a first circuit 5110), a control circuit 5120 (which may be referred to a third circuit 3480), a detection determining circuit 5130 (which may be referred to a second circuit 5130), and a detection path circuit 5160 (which may be referred to a fourth circuit 5160). The detection pulse generating module 5110 is electrically connected to the detection path circuit 5160 via a path 5111 and is configured to generate a control signal having at least one pulse. The detection path circuit 5160 is electrically connected to the power loop of the power supply module via a first detection connection terminal DE1 and a second detection connection terminal DE2 and is configured to turn on a detection path during pulse-on period of the control signal. The detection determining circuit 5130 is electrically connected to the detection path via a path 5161, and is configured to determine an installation state between the LED tube lamp and the lamp socket according to a signal feature on the detection path. A detection result signal corresponding to the determination result is generated and transmitted to the control circuit 5120 via a path 5131. The control circuit 5120 is electrically connected to the driving circuit 530 via a path 5121 and is configured to affect or adjust the bias of the driving circuit to control the operating state of the driving circuit 530.

Based on the aspects of the operation of the installation detection module 5000*a*, when the LED tube lamp is powered up, the detection pulse generating module 5110 is enabled in response to the connected power source and generates pulse to temporarily turn-on or conduct the detection path formed by the detection path circuit 5160. During the period of the detection path being turned on, the detection determining circuit 5130 samples signal on the detection path to determine whether the LED tube lamp is correctly installed on the lamp socket or whether a leakage current is generated by touching the conductive part of the LED tube lamp. The detection determining circuit 5130 generates a corresponding detection result signal, according to the determination result, and transmits it to the control circuit 5120. When the control circuit 5120 receives the detection result signal indicating the LED tube lamp has been correctly installed on the lamp socket, the control circuit 5120 transmits a corresponding installation state signal to control the driving circuit 530 to normally perform power conversion for providing electricity to the LED module. On the contrary, when the control circuit 5120 receives the detection result signal indicating the LED tube lamp is not correctly installed on the lamp socket, the control circuit 5120 transmits a corresponding installation state signal to control the driving circuit 530 to stop its normal operation or to be disabled. Since the driving circuit 530 disables, the current flowing through the power loop can be limited to less than a safety value (e.g., 5 MIU).

The configuration and operation of the detection pulse generating module 5110, the detection determining circuit 5130 and the detection path circuit 5160 can be seen referring to the description of relevant embodiments of the present disclosure. The difference between the embodiment illustrated in FIG. 26A and the other relevant embodiments is that the control circuit 5120 can be configured for controlling the operation of the driving circuit 530 in the back end, so that the driving circuit 530 can be disabled by adjusting the bias voltage when the LED tube lamp is not correctly installed or when the risk of electric shock exists. Under such configuration, the switch circuit (e.g., switch circuit 3200, 3200*a*, 3200*b*, 3200*c*, or 3200*d*), which is disposed on the power loop and thus required to withstand high current, can be omitted, and therefore the cost of the overall installation detection module can be significantly reduced. On the other hand, since the leakage current is limited by controlling the bias voltage of the driving circuit 530 through the control circuit 5120, the circuit design of the driving circuit 530 does not need to be changed, so as to make the commercialization easier.

In an exemplary embodiment, the detection pulse generating module 5110, detection path circuit 5160, detection determining circuit 5130, and control circuit 5120 can be respectively implemented by, but not limited to, the circuit configurations illustrated in FIGS. 26B to 26F. Detailed operations of each of the module and circuits are described below with reference to FIGS. 26B to 26F.

Figure 26B:
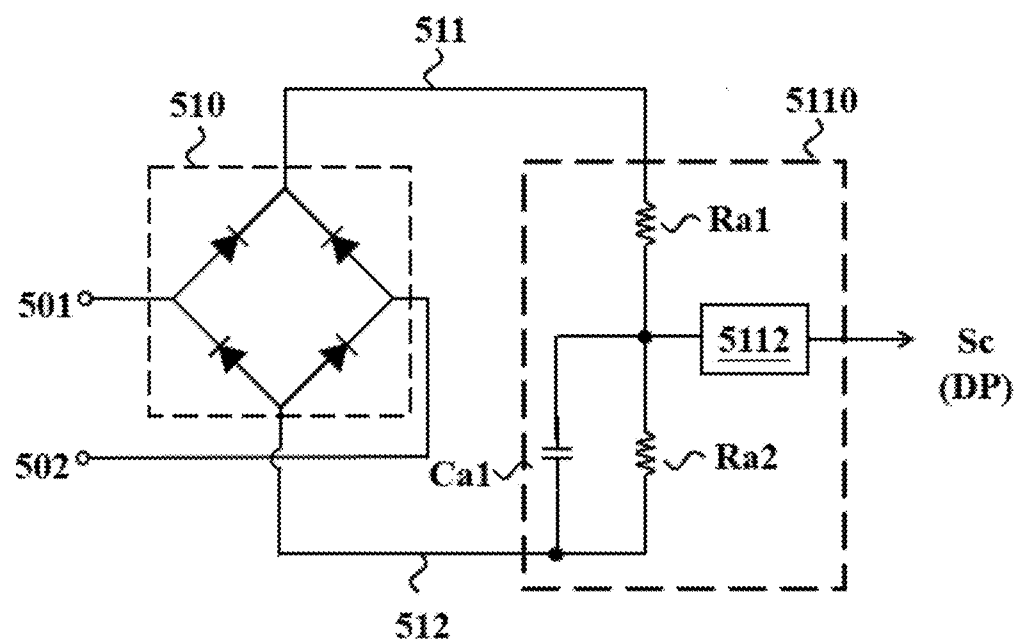
FIGS. 26B-26G are schematic circuit diagrams of an installation detection module according to some exemplary embodiments.

FIG. 26B is a schematic circuit diagram of the detection pulse generating module according to some embodiments. Referring to FIG. 26B, the detection pulse generating module 5110 includes resistors Ra1 and Ra2, a capacitor Cal and a pulse generating circuit 5112. The resistor Ra1 has a first end and a second end, wherein the first end of the resistor Ra1 is electrically connected to the rectifying circuit 510 via the rectifying output terminal 511. The resistor Ra2 has a first end electrically connected to the second end of the resistor Ra1 and a second end electrically connected to the rectifying circuit 510 via the rectifying output terminal 512. The capacitor Cal is connected to the resistor Ra2 in parallel. The pulse generating circuit 5112 has an input terminal connected to a connection terminal of the resistors Ra2 and Cal and an output terminal connected to the detection path circuit 5160 and for outputting a control signal having pulse DP.

In some embodiments, the resistors Ra1 and Ra2 form a voltage division resistor string configured to sample a bus voltage (i.e., the voltage on the powerline of the power supply module). The pulse generating circuit 5112 determines a time point for generating the pulse DP according to the bus voltage and outputs the pulse DP as the control signal Sc based on a pulse-width setting. For example, the pulse generating circuit 5112 may output the pulse DP after the bus voltage rises or falls across zero-voltage point for a period, so that the issue of misjudgment caused by performing installation detection on the zero-voltage point can be addressed. The characteristics of the pulse waveform and the pulse interval setting can be seen by referring to the description of relevant embodiments, and thus are not repeated herein.

Figure 26C:
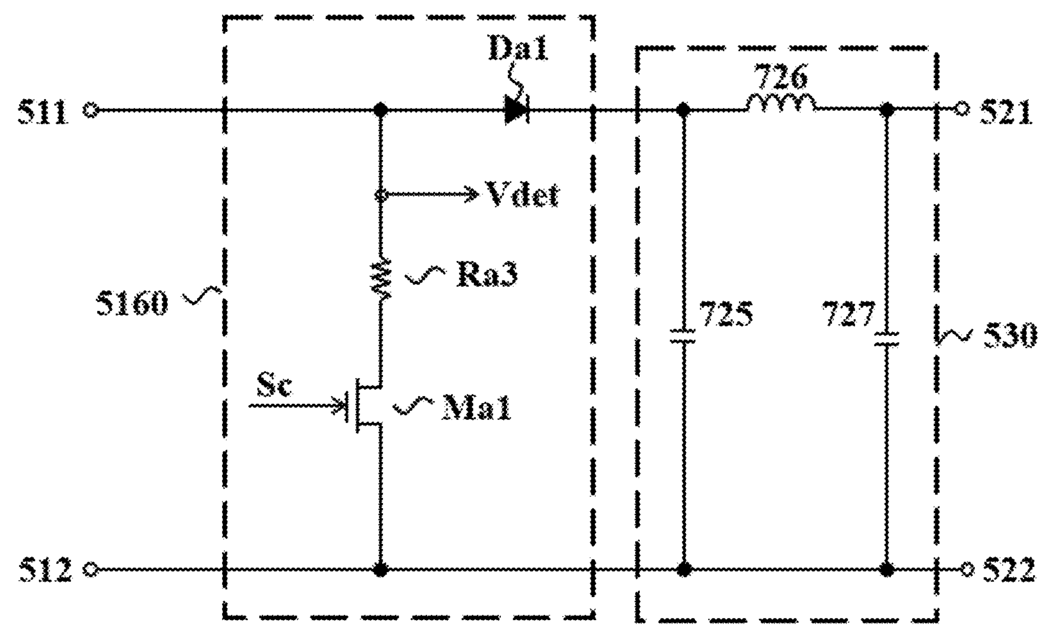

FIG. 26C is a schematic circuit diagram of the detection path circuit according to some embodiments. Referring to FIG. 26C, the detection path circuit 5160 includes a resistor Ra3, a transistor Ma1 and a diode Da1. The resistor Ra3 has a first end connected to the rectifying output terminal 511. The transistor Ma1 is, for example, a MOSFET or a BJT, and has a first terminal connected to a second end of the resistor Ra3, a second terminal connected to the rectifying output terminal 512, and a control terminal receiving the control signal Sc. The diode Da1 has an anode connected to the first end of the resistor Ra3 and the rectifying output terminal 511 and a cathode connected to the input terminal of the filtering circuit in the back end. Taking a pi-filter as an example, the cathode of the diode Da1 can be regarded as electrically connected to the connection terminal of the capacitor 725 and the inductor 726.

In the embodiment illustrated in FIG. 26C, the resistor Ra3 and the transistor Ma1 form a detection path, which can be conducted when the transistor Ma1 is turned on by the control signal Sc. During the period of the detection path being conducted, the detection voltage Vdet changes due to current flowing through the detection path, and the amount of the voltage changes is determined according to the equivalent impedance of the detection path. Taking the detection voltage Vdet, which samples from the first end of the resistor Ra3, as shown in FIG. 26C as an example, during the period of the detection path being conducted, the detection voltage Vdet substantially equals the bus voltage on the rectifying output terminal 511 if there is no body impedance being electrically connected (e.g., if the LED tube lamp is correctly installed); and if there is a body impedance electrically connected between the rectifying output terminal 511 and the ground terminal, the detection voltage Vdet changes into a voltage division of the resistor and the body impedance. Accordingly, the detection voltage Vdet can indicate whether a body impedance is electrically connected to the LED tube lamp.

Figure 26D:
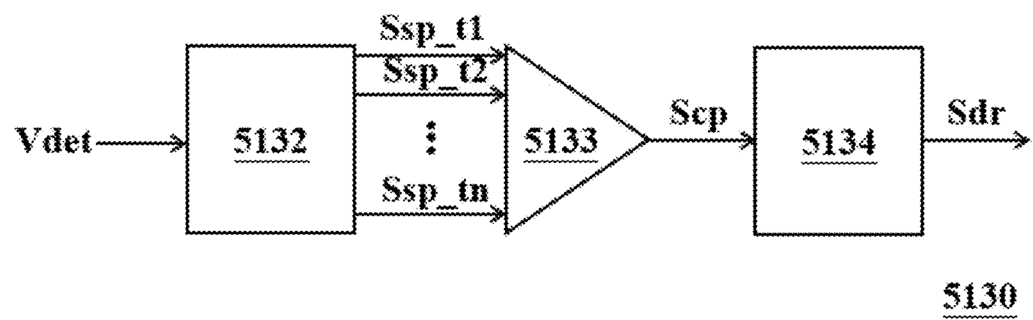

FIG. 26D is a schematic circuit diagram of the detection determining circuit according to some embodiments. Referring to FIG. 26D, the detection determining circuit 5130 includes a sampling circuit 5132, a comparison circuit 5133 and a determining circuit 5134. According to some embodiments, the sampling circuit 5133 may sample the detection voltage Vdet according to a set time point and generate a plurality of sample signals Ssp_t1 to Ssp_tn, respectively corresponding to the detection voltage Vdet at different time points. The comparison circuit 5133 is electrically connected to the sampling circuit 5132 and receives the sample signals Ssp_t1 to Ssp_tn. In some embodiments, part or all of the sample signals Ssp_t1 to Ssp_tn are selected to be compared with each other by the comparison circuit 5133 to generate a comparison result Scp. In some embodiments, the comparison circuit 5133 compares the sample signals Ssp_t1 to Ssp_tn with a preset signal to generate a comparison result Scp. In some embodiments, the comparison circuit 5133 compares two sample signals at adjacent time points to generate a corresponding comparison result Scp. The comparison result Scp will be outputted to the determining circuit 5134 after being generated.

Specifically, when the LED tube lamp is correctly installed onto a lamp socket (or when there is no touching/connecting external impedance), the first detection connection terminal DE1 (as the first rectifying output terminal 511) and second detection connection terminal DE2 (as the second rectifying output terminal 512) of the detection path circuit 5160 are equivalently directly connected to the external power source, so no matter whether the detection path of the detection path circuit 5160 is conducted or not, the voltage waveform of the detected voltage Vdet varies along with the phase change in the external driving signal and thus is in a complete waveform of a sinusoidal signal. Therefore, when the LED tube lamp is correctly installed onto a lamp socket, no matter whether the detection path of the detection path circuit 5160 is conducted or not, the sampling circuit 5132 may generate the plurality of sample signals Ssp_t1 to Ssp_tn having the same voltage level or close voltage levels respectively.

Figure 26E:
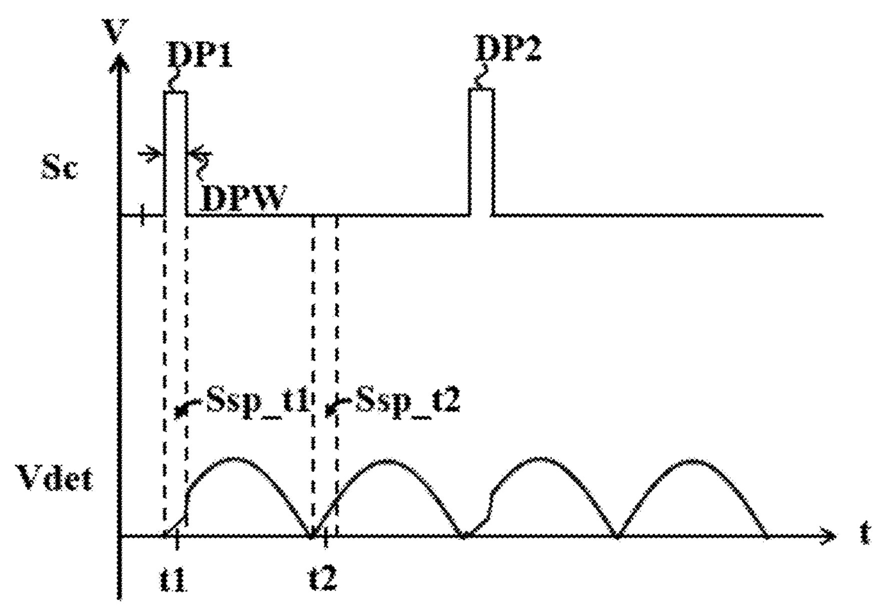

On the other hand, when the LED tube lamp is not correctly installed onto a lamp socket, or when there is touching/connecting external impedance (e.g., body impedance), the first detection connection terminal DE1 is equivalent to electrically connect, through the external impedance, to the external power source. During the detection path is being conducted, the detected voltage Vdet is dropped due to voltage division between the external impedance and the impedance on the detection path. During the detection path is not being conducted, since at this time there is typically no conducting current path in the power loop of the LED tube lamp, there is almost and ideally no voltage drop at the first detection connection terminal DE1, and thus the waveform of the detected voltage Vdet maintains its normal complete sinusoidal form. As shown in FIG. 26E, which is a signal waveform diagram of an installation detection module according to some embodiments, when the LED tube lamp is not correctly installed onto a lamp socket, a signal level sampled by the sampling circuit 5132 during the pulse period DPW (e.g., the sample signal Ssp_t1) is lower than that sampled by the sampling circuit 5132 outside of each pulse period DPW (e.g., the sample signals Ssp_t2). As a result, the comparison result Scp corresponding to the installation state can be generated by selecting and comparing part or all of the sample signals Ssp_t1 to Ssp_tn or by comparing part or all of the sample signals Ssp_t1 to Ssp_tn with a defined signal. For example, the comparison circuit 5133 may generate a comparison result Scp with a first logic level when the voltage levels of the sample signals Ssp_t1 and Ssp_t2 are the same or very close, and may generate a comparison result Scp with a second logic level when the difference between the voltage levels of the sample signals Ssp_t1 and Ssp_t2 reaches a set value. The comparison result Scp with the first logic level refers to the condition that the LED tube lamp is correctly installed onto a lamp socket, while the comparison result Scp with the second logic level refers to the condition that the LED tube lamp is not correctly installed onto a lamp socket.

The determining circuit 5134 receives the comparison result Scp and outputs a detection result signal Sdr. In some embodiments, the determining circuit 5134 can be configured to output the detection result signal Sdr indicating correct installation after (continuously or discontinuously) receiving a certain number of positive comparison results Scp, wherein the positive comparison result Scp refers to the comparison result Scp meeting the requirement of a correct installation condition, for example, the level of the sample signal is higher than the preset signal.

Figure 26F:
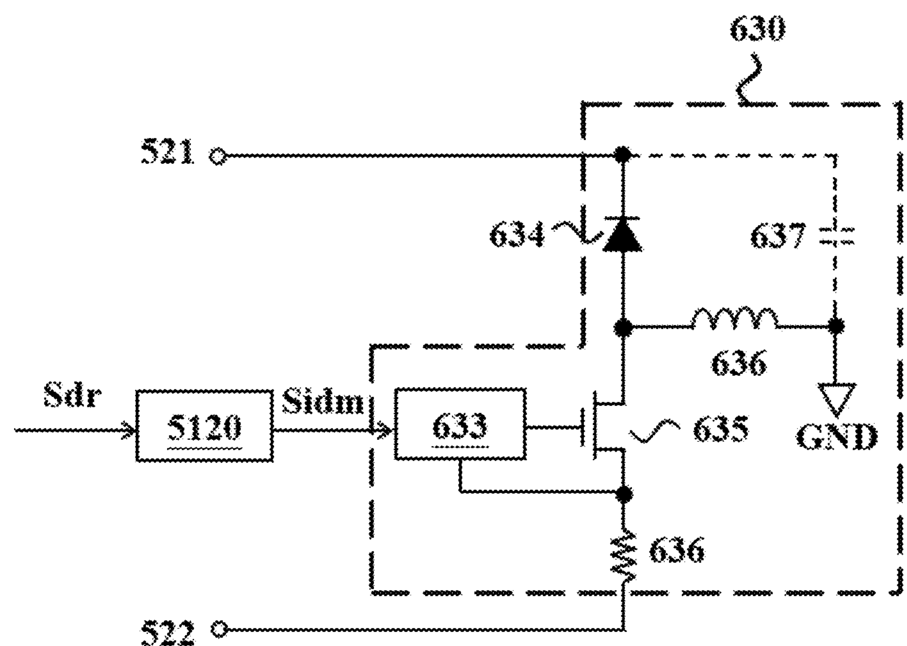

FIG. 26F is a circuit diagram illustrating a control circuit of an installation detection module according to some embodiments. Referring to FIG. 26F, the control circuit 5120 has an input terminal configured to receive a detection result signal Sdr and an output terminal electrically connected to a controller 633 of a driving circuit 630, which driving circuit 630 may have configurations similar to those of a described embodiment herein of FIG. 16B. So the driving circuit 630's configurations are not repeatedly described.

When the control circuit 5120 receives a detection result signal Sdr indicating correct installation state (the external impedance does not connect to the LED tube lamp), the control circuit 5120 transmits a corresponding installation state signal Sidm to the controller 633 of the driving circuit 630, which controller 633 is then enabled or activated in response to the installation state signal Sidm and controls the operation of a switch 635 so as to generate a driving signal to drive an LED module. On the other hand, when the control circuit 5120 receives a detection result signal Sdr indicating incorrect/improper installation state (the external impedance connects to the LED tube lamp), the control circuit 5120 transmits a corresponding installation state signal Sidm to the controller 633 of the driving circuit 630, which controller 633 is then disabled or not activated, in response to the installation state signal Sidm.

Here an exemplary embodiment is described with reference to FIG. 26G which illustrates a circuit diagram of the detection circuit and the driving circuit according to one embodiment. The detection circuit of the present embodiment is similar to the embodiments of FIGS. 26B to 26F and includes a detection pulse generating module 5110, a control circuit 5120, a detection determining circuit 5130, and a detection path circuit 5160. The driving circuit 1030 takes the power conversion circuit structure in FIG. 9B for example and includes a controller 1033, a diode 1034, a transistor 1035, an inductor 1036, a capacitor 1037, and a resistor 1038.

Compared to the embodiments of FIGS. 26B to 26F, the detection path circuit 5160 is for example in a configuration similar to that of a detection path circuit 3660 in FIG. 20B, and includes a transistor Ma1 and a resistor Rat. The drain terminal of the transistor Ma1 is connected to the common end of the capacitors 725 and 727, and the source terminal of the transistor Ma1 is connected to a first end of the resistor Ra1. The second end of the resistor Ra1 is coupled to the first ground terminal GND1. And it is noted that the first ground terminal GND1 and the second ground terminal GND2 of the LED module 50 may be the same ground terminal or two electrically independent ground terminals, while the present invention is not limited to any one of these options.

The detection pulse generating module 5110 is coupled to the gate terminal of the transistor, and is used to control conduction state of the transistor Ma1. The detection determining circuit 5130 is coupled to a first end of the resistor Ra1 and the controller 1033, and is configured to sample an electrical signal on the first end of the resistor Ra1 and then compare the sampled electrical signal with a reference signal, so as to determine whether the LED tube lamp is correctly installed. The detection determining circuit 5130 generates and transmits an installation detection signal Sidm to the controller 1033 according to the comparison result. In this embodiment, operation details and characteristics about the detection pulse generating module 5110, the control circuit 5120, the detection determining circuit 5130, and the detection path circuit 5160 can be similar to those about the detection pulse generating module 3610, the detection path circuit 3660, and the detection determining circuit 3630 of FIG. 20B and thus are not repeatedly described here.

In summary, regarding the power supply module described above, the installation detection function and the electric shock protection function are integrated into the driving circuit, so that the driving circuit becomes the driving circuit having the installation detection function and the electric shock protection function. Specifically, for the circuit structure in one embodiment, only an additional detection circuit, for detecting the electrical signal on the power loop/detection path, is used to implement the installation detection function and the electric shock protection function with the driving circuit 1030. For example, through adjusting a control method in the driving circuit 1030, the detection pulse generating module, the detection result latching circuit, the detection determining circuit and the switch circuit of the installation detection module 3000 can be implemented by the hardware circuit structure of an existing driving circuit 1030, without requiring additional circuit elements. Since the detection pulse generating module, the detection result latching circuit, the detection determining circuit and the switch circuit are not required, the cost of the overall power supply module can be effectively reduced. In addition, since the circuit components/elements are reduced, the power supply module may have more area for layout and the power consumption can be reduced. The saved power can be used for driving the LED module so as to enhance the luminous efficiency, and the heat caused by the power supply module can be reduced as well.

Figure 26G:
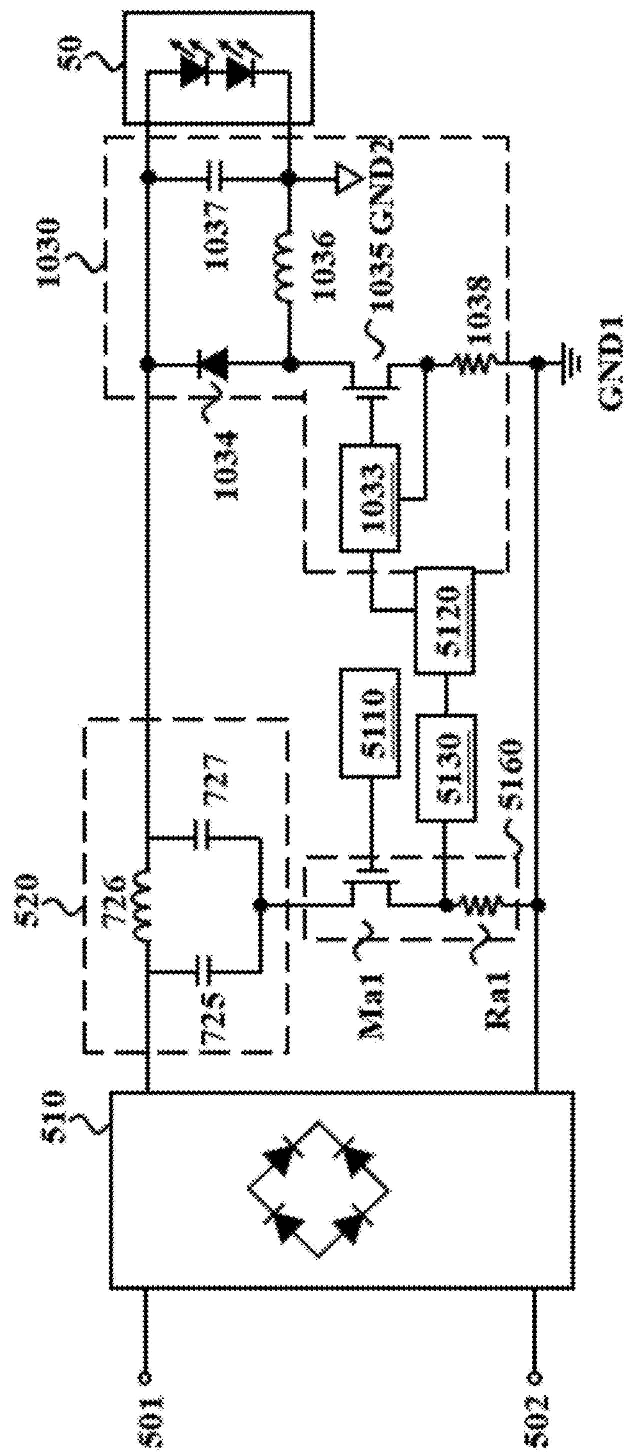

Configuration and operation method of the detection circuit in the exemplary embodiment of FIG. 26G can be similar to the detection pulse generating module, the detection path circuit, and the detection determining circuit of the installation detection module 3000, and the detection result latching circuit and the switch circuit of the installation detection module 3000 are replaced in the exemplary embodiment of FIG. 26G by existing controller and power switch of the driving circuit 1030. In the exemplary embodiment of FIG. 26C, through a specific configuration of the detection path circuit 5160, the format of the installation detection signal Sidm can easily be designed to be compatible with signal format of the controller 1033, so that circuit design difficult can be significantly reduced on the basis of a reduced circuit complexity.

It's noted that although the embodiment of FIG. 26G is described and illustrated to include the configuration of the detection path circuit 3660 in FIG. 20B, the present invention is not limited to this configuration of FIG. 20B. In other applications, the detection path circuit may be configured as in the above other embodiments described, to implement the transient sampling or detection of the electrical signal.

Figure 27A:
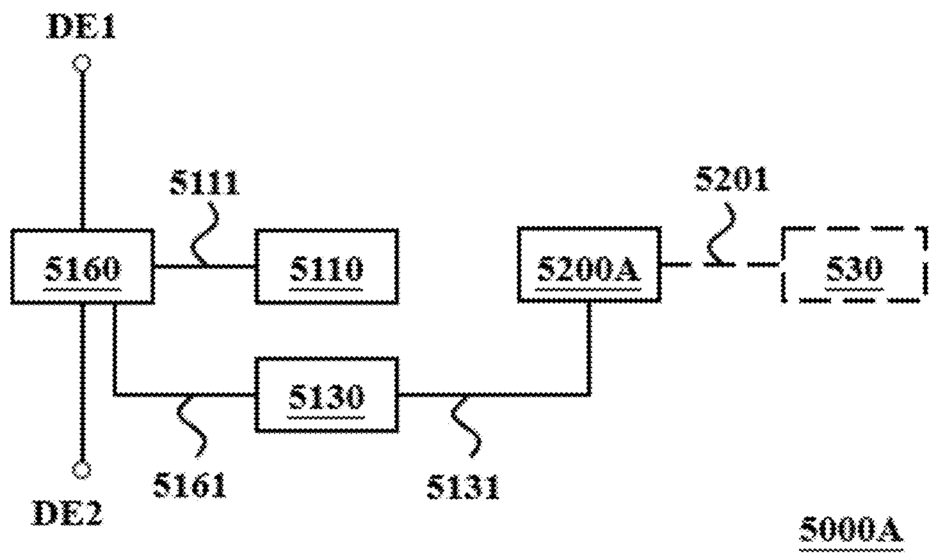
FIG. 27A is a block diagram of an installation detection module according to some exemplary embodiments.

FIG. 27A is a block diagram of an installation detection module according to some embodiments. Referring to FIG. 27A, the installation detection module 5000A includes a detection pulse generating module 5110, a detection determining circuit 5130, a detection path circuit 5160, and a current-limiting circuit 5200A. Configurations and operations of the detection pulse generating module 5110, detection determining circuit 5130, and detection path circuit 5160 are similar to those of the above analogous embodiments of FIGS. 26A-26E, and thus are not repeatedly described here.

A difference between the embodiment illustrated in FIG. 27A and the other analogous embodiments is that the current-limiting circuit 5200A of FIG. 27A comprises or is implemented by a bias adjustment circuit 5200A. The detection determining circuit 5130 is configured to transmit a detection result signal Sdr to the bias adjustment circuit 5200A, which is coupled to a driving circuit 530 through a path 5201 and is configured to affect or adjust the bias voltage of the driving circuit 530 in order to control the operation state of the driving circuit 530.

Figure 27B:
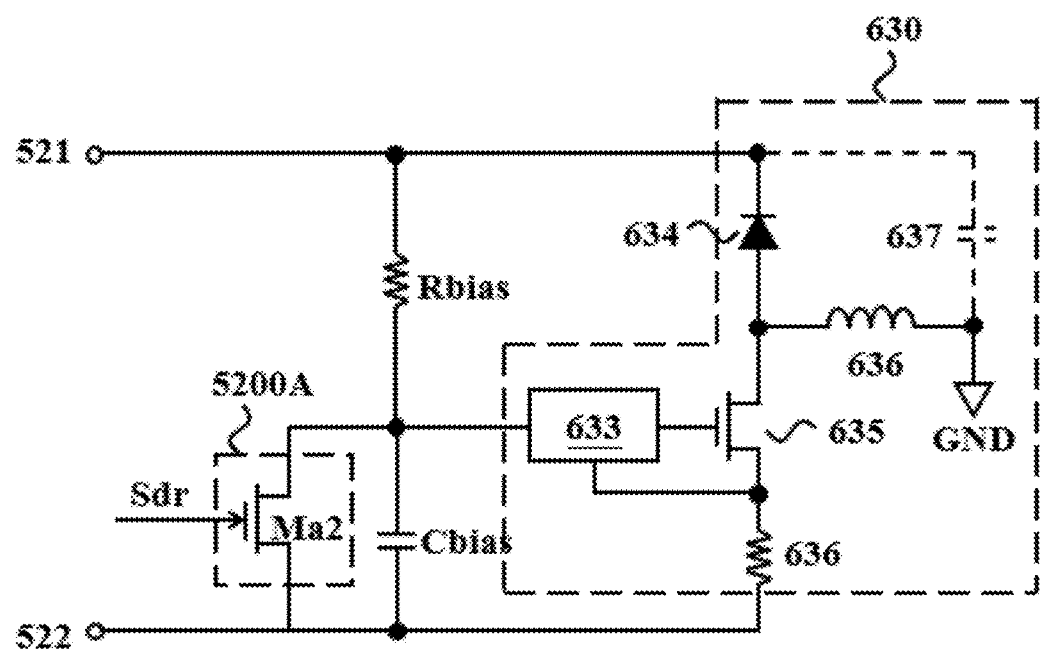
FIG. 27B is a schematic circuit diagram of an installation detection module according to some exemplary embodiments.

FIG. 27B is a schematic circuit diagram of the control circuit according to some embodiments. Referring to FIG. 27B, the bias adjustment circuit 5200A includes a transistor Ma2, which has a first terminal electrically connected to the connection terminal of a resistor Rbias and a capacitor Cbias and the power input terminal of the controller 633, a second terminal electrically connected to the second filtering output terminal 522, and a control terminal for receiving the adjustment control signal Vctl. In some embodiments, the resistor Rbias and the capacitor Cbias can be regarded as an external bias circuit of the driving circuit 630, which is configured to provide an operating power for the controller 633.

When the detection determining circuit 5130 determines that the LED tube lamp has been correctly installed on the lamp socket (no body impedance introduced), the detection determining circuit 5130 outputs a disabling detection result signal Sdr to the transistor Ma2, and the transistor Ma2 cuts off in response to the disabling detection result signal Sdr. Under such state, the bias voltage can be provided to the controller 633 and thus enables the controller 633 to control the switching of the switch, and the lamp driving signal can be therefore generated to drive the LED module.

When the detection determining circuit 5130 determines that the LED tube lamp is not correctly installed on the LED tube lamp (body impedance introduced), the detection determining circuit 5130 outputs an enabling detection result signal Sdr to the transistor Ma2 to turn the transistor Ma2 on, so as to electrically connect the power input terminal of the controller 633 to the ground terminal. Under such a state, the controller 633 disables due to the power input terminal being grounded. It worth noting that an additional leakage path may be formed through the transistor Ma2 when the transistor Ma2 is turned on, however, the leakage current does not harm the human body, and meets the safety requirement since the bias voltage applied to the controller 633 is relatively low.

Figure 28A:
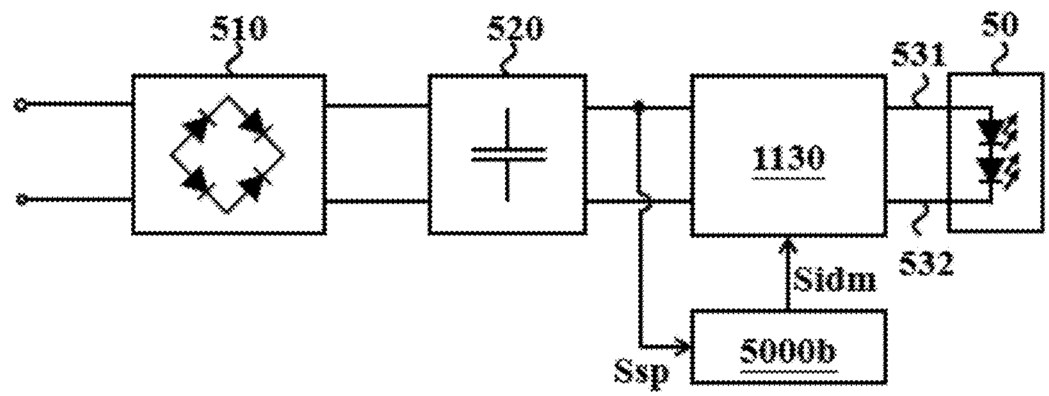
FIG. 28A is a block diagram of an installation detection module according to some exemplary embodiments.

FIG. 28A is a block diagram of an installation detection module according to some exemplary embodiments. Referring to FIG. 28A, the LED tube lamp includes a rectifying circuit 510, a filtering circuit 520 and a driving circuit 1130. Compared with the embodiment of FIG. 5A, the LED tube lamp of the present embodiment further includes a detection circuit 5000*b*. The connection between the rectifying circuit 510, the filtering circuit 520, the driving circuit 1130 and the LED module 50 are similar to the embodiment illustrated in FIG. 5A, and thus is not described in detail herein. The detection circuit 5000*b* has an input terminal coupled to the power loop of the LED tube lamp and an output terminal coupled to the driving circuit 1130.

Specifically, after the LED tube lamp is powered up (no matter whether or not the LED tube lamp is correctly installed on the lamp socket), the driving circuit 1130 enters an installation detection mode. Under the installation detection mode, the driving circuit 1130 provides a lighting control signal having narrow pulse (e.g., the pulse-on period is smaller than 1 ms) for driving the power switch (not shown), so that the driving current, generated under the installation detection mode, is smaller than 5 MIU or 5 mA. On the other hand, under the installation detection mode, the detection circuit 5000*b* detects an electrical signal on the power loop/detection path and generates an installation detection signal Sidm, in which the installation detection signal Sidm is transmitted to the driving circuit. The driving circuit 1130 determines whether to enter a normal driving mode according to the received installation detection signal Sidm. If the driving circuit 1130 determines to maintain in the installation detection mode, which means the LED tube lamp is not correctly installed on the lamp socket during the first pulse, the next pulse is output, according to a frequency setting, for temporarily conducting the power loop/detection path, so that the electrical signal on the power loop/detection path can be detected by the detection circuit 5000*b* again. On the contrary, if the driving circuit 1130 determines to enter the normal driving mode, the driving circuit 1130 generates, according to at least one of the input voltage, the output voltage, the input current, the output current and the combination of the above, the lighting control signal capable of modulating the pulse width for maintaining the brightness of the LED module 50. In the present embodiment, the input/output voltage and the input/output current can be sampled by a feedback circuit (not shown) in the driving circuit 1130.

Figure 28B:
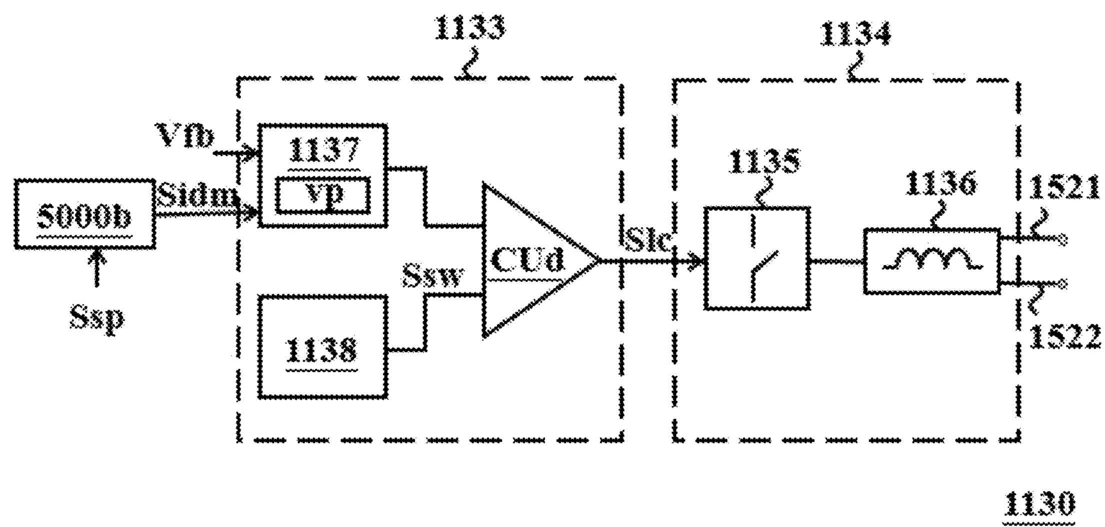
FIG. 28B is schematic diagram of a driving circuit with an electric shock detection function according some exemplary embodiments.

FIG. 28B is a schematic diagram of an exemplary driving circuit according to some exemplary embodiments. Referring to FIG. 28B, the driving circuit 1130 includes a controller 1133 and a conversion circuit 1134. The controller 1133 includes a signal receiving unit 1137, a sawtooth wave generating unit 1138 and a comparison unit CUd, and the conversion circuit 1134 includes a switch circuit (also known as power switch) 1135 and energy release circuit 1136. The signal receiving unit 1137 has input terminals for receiving a feedback signal Vfb and installation detection signal Sidm and an output terminal coupled to a first input terminal of the comparison unit CUd. The sawtooth wave generating unit 1138 has an output terminal coupled to a second input terminal of the comparison unit CUd. An output terminal of the comparison unit CUd is coupled to a control terminal of the switch circuit 1135. The circuit arrangement of the switch circuit 1135 and the energy release circuit 1136 can be referred to with respect to the embodiments of FIGS. 9A to 9E, and it will not be repeated herein.

In the controller 1133, the signal receiving unit 1137 can be implemented by, for example, a circuit constituted by an error amplifier. The error amplifier is configured to receive the feedback signal Vfb related to the voltage/current information of the power supply module and the installation detection module Sidm. In the present embodiment, the signal receiving unit 1137 selectively outputs a preset voltage Vp or the feedback signal Vfb to the first input terminal of the comparison unit CUd. The sawtooth wave generating unit 1138 is configured to generate and provide a sawtooth signal Ssw to the second input terminal of the comparison unit CUd. In the waveform of the sawtooth signal Ssw of each cycle, the slope of at least one of the rising edge and the falling edge is not infinity. In some embodiments, the sawtooth wave generating unit 1138 generates the sawtooth signal Ssw, according to a fixed operation frequency, no matter what the operation mode of the driving circuit 1130 is. In some embodiments, the sawtooth wave generating unit 1138 generates the sawtooth signal Ssw according to different operation frequencies when operating in different operation modes. For example, the sawtooth wave generating unit 1138 can change the operation frequency according to the installation detection signal Sidm. The comparison unit CUd compares the signal level of the signal on the first and the second input terminal, in which the comparison unit CUd outputs the lighting control signal Slc with high voltage level when the signal level on the first input terminal is greater than the second input terminal and outputs the lighting control signal Slc with low voltage level when the signal level on the first input terminal is not greater than the second input terminal. For example, the comparison unit CUd outputs high voltage when the signal level of the sawtooth signal Ssw is greater than the preset voltage Vp or the feedback signal Vfb, so as to generate the lighting control signal having pulse waveform.

Figure 37C:
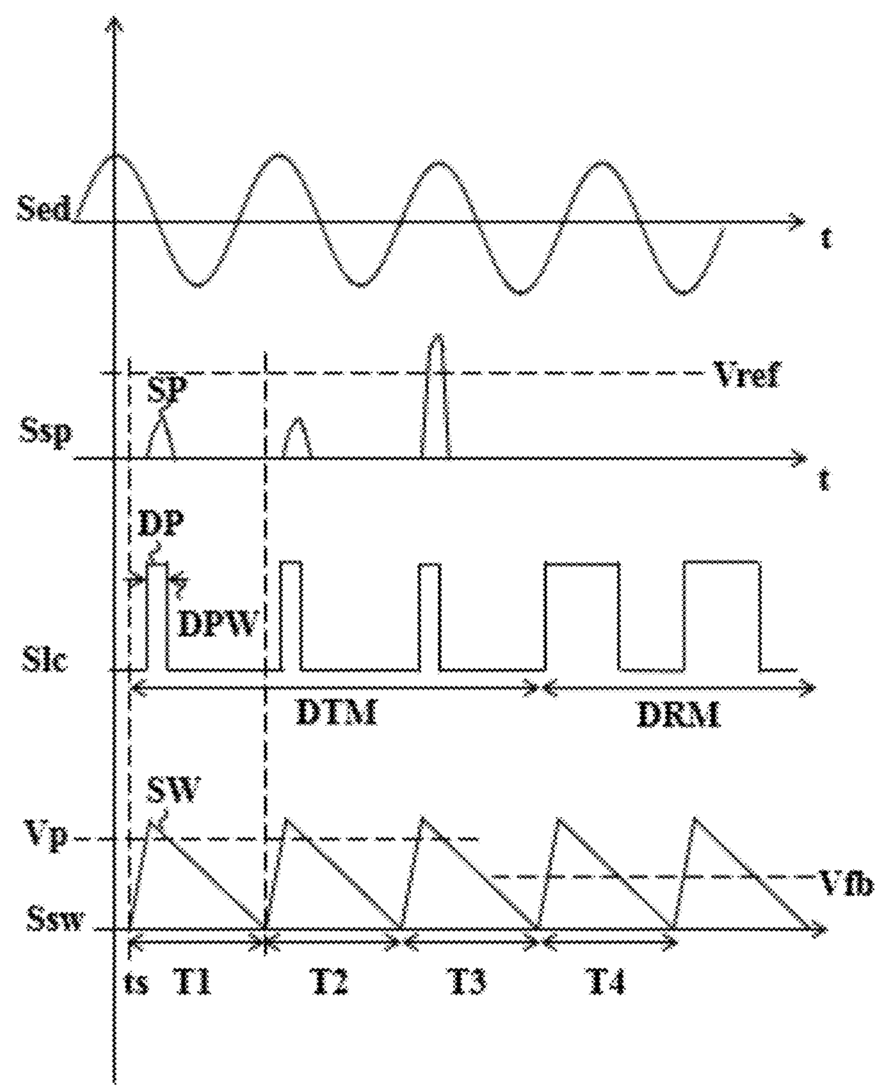
Figure 37D:
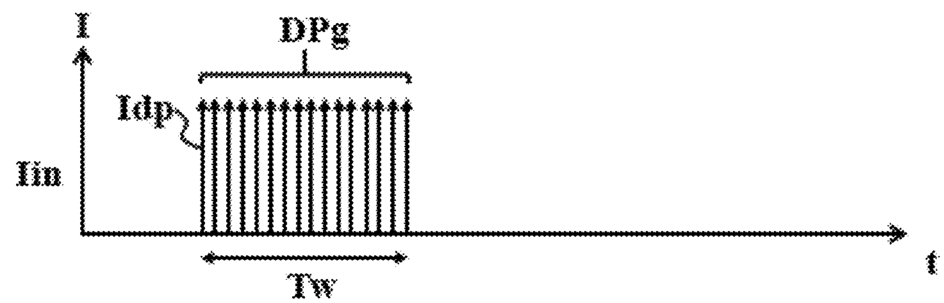
Figure 37E:
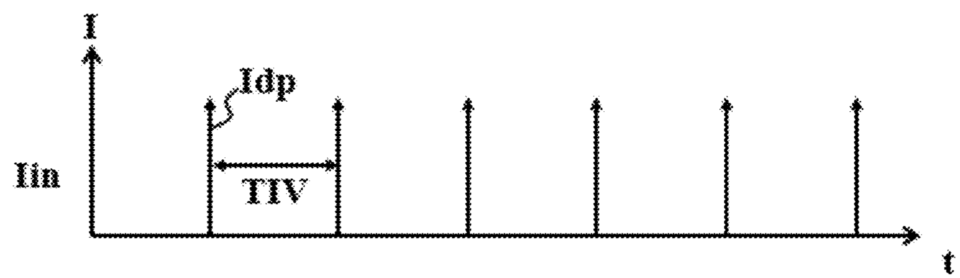
Figure 37F:
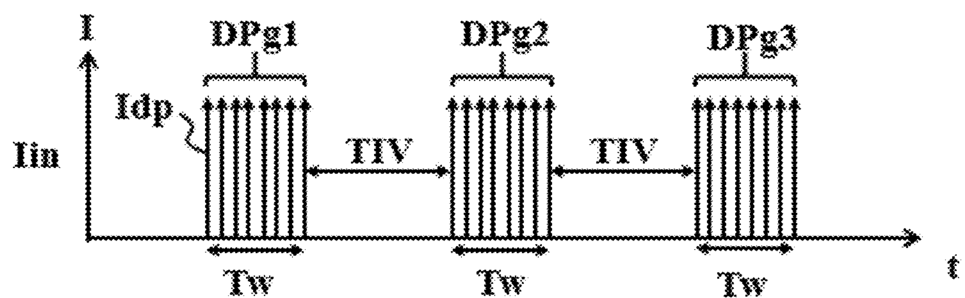

FIG. 37C is a signal waveform diagram of an exemplary power supply module according to an exemplary embodiment. Referring to FIGS. 28B and 37C, when the LED tube lamp is powered up (including the pins on the both end caps being connected to the connecting sockets, or the pins on one end cap being connected to the corresponding connecting socket and the pins on the other end cap being touched by the user), the driving circuit 1130 starts to operate and enter the installation detection mode DTM. The operation in the first period T1 is described below. Under the installation detection mode, the signal receiving unit 1137 outputs the preset voltage Vp to the first input terminal of the comparison unit CUd, and the sawtooth wave generating unit 1138 provides the sawtooth signal SW to the second input terminal of the comparison unit CUd. From the perspective of the variation of the sawtooth wave SW, the signal level of the sawtooth wave SW gradually increases, after the start timepoint ts, from the initial level to a peak level. After reaching the peak level, the sawtooth wave SW is gradually decreased to the initial level. Before the signal level of the sawtooth wave SW rises to the preset voltage Vp, the comparison unit CUd outputs the lighting control signal Slc with low voltage. During the period from the timepoint of the signal level rising to exceed the preset voltage Vp to the timepoint falling back below the preset voltage Vp, the comparison unit CUd pulls the signal level up to the high voltage. After the signal level falling to lower than the preset voltage Vp, the comparison unit CUd pulls the signal level down to the low voltage again. By performing the above operation, the comparison unit CUd can generate the pulse DP based on the sawtooth wave SW and the preset voltage Vp, in which the pulse width/pulse-on period DPW of the pulse DP is the duration that the signal level of the sawtooth wave SW is higher than the preset voltage Vp.

The lighting control signal Slc having the pulse DP is transmitted to the control terminal of the switch circuit 1135, so that the switch circuit 1135 is turned on during the pulse-on period DPW. Therefore, the energy release unit 1136 absorbs power and a current is generated on the power loop/detection path in response to the switch circuit being turned on. Since the current generated on the power loop/detection path leads to a signal feature, such as signal level, waveform, and/or frequency changing, the signal feature variation of the sample signal Ssp will be detected by the detection circuit 5000*b*. In the present embodiment, the detection circuit 5000*b* detects the voltage for example, but the invention is not limited thereto. Under the first period T1, since the voltage variation SP does not exceed the reference voltage Vref, the detection circuit 5000*b* output the corresponding installation detection signal Sidm to the signal receiving unit 1137, so that the signal receiving unit 1137 is maintained in the installation detection mode DTM and continuously outputs the preset voltage Vp to the comparison unit 1137. Since the voltage variation of the sample signal Ssp under the second period T2 is similar to the sample signal Ssp under the first period T1, the circuit operation under the first and the second periods T1 and T2 are similar, so that the detailed description is not repeated herein.

Conclusively, under the first and the second periods T1 and T2, the LED tube lamp is determined to be not correctly installed. In addition, during the first and the second periods T1 and T2, although the driving circuit 1130 generates the driving current on the power loop, the current value of the driving current does not cause electric shock to the human body because of the turn-on time of the switch circuit 1135 is relatively short, in which the current value is smaller than 5 MIU/mA and can be reduced to 0.

After entering the third period T3, the detection circuit 5000*b* determines the voltage variation of the sample signal Ssp exceeds the reference voltage Vref, so as to provide the corresponding installation detection signal Sidm, indicating the LED tube lamp is correctly installed, to the signal receiving unit 1137. When the signal receiving unit 1137 receives the installation detection signal Sidm indicating the correct installation state, the driving circuit 1130 enters, after the end of the third period T3, the normal driving mode DRM from the installation detection mode DTM. Under the fourth period T4 of the normal driving mode DRM, the signal receiving unit 1137 generates the corresponding signal to the comparison unit CUd according to the feedback signal Vfb instead of the preset voltage Vp, so that the comparison unit CUd is capable of dynamically modulating the pulse-on period of the lighting control signal Slc according to the driving information such as the input voltage, the output voltage and/or the driving current. From the perspective of the signal waveform of the lighting control signal Sc, since the pulse DP is configured to detect the installation state/risk of electric shock, the pulse width of the pulse DP is relatively narrow, compared to the pulse width under the normal driving mode DRM. For example, the pulse width of the pulse under the installation detection mode DTM (e.g., DP) is less than the minimum pulse width under the normal driving mode DRM.

In some embodiments, the detection circuit 5000*b* stops operating under the normal driving mode DRM. In some embodiments, under the normal driving mode DRM, the signal receiving unit 1137 ignores the installation detection signal Sidm regardless of whether the detection circuit 5000*b* continuously operates.

Referring to FIG. 28A again, in some exemplary embodiments, when the LED tube lamp is powered up (no matter whether it's correctly installed or not), the detection circuit 5000*b* would be enabled based on forming of a current path in the LED tube lamp, and the enabled detection circuit 5000*b* detects an electrical signal on a power loop in a short period of time and then according to the detection result transmits an installation detection signal Sidm to the driving circuit 1130, wherein the driving circuit 1130 determines whether to operate or be enabled to perform power conversion, according to the received installation detection signal Sidm. Upon the detection circuit 5000*b* transmitting an installation detection signal Sidm indicating the LED tube lamp is correctly installed, the driving circuit 1130 in response is enabled and then generates a lighting control signal to drive a power switch, so as to convert received power to output power for the LED module. In this case, after transmitting the installation detection signal Sidm indicating the LED tube lamp is correctly installed, the detection circuit 5000*b* would switch into an operation mode not affecting the power conversion by the driving circuit 1130. On the other hand, upon the detection circuit 5000*b* transmitting an installation detection signal Sidm indicating the LED tube lamp is incorrectly installed, the driving circuit 1130 in response remains disabled until receiving an installation detection signal Sidm indicating the LED tube lamp is correctly installed. In this case when the driving circuit 1130 remains disabled, the detection circuit 5000*b* continues in the detection mode for detecting the electrical signal on the power loop until detecting that the LED tube lamp is correctly installed.

In summary, compared to the power supply module described above, the installation detection function and the electric shock protection function are integrated into the driving circuit, so that the driving circuit becomes a driving circuit having the installation detection function and the electric shock protection function. Specifically, for the circuit structure in one embodiment as illustrated in FIG. 28A, only an additional detection circuit (as 5000*b*), for detecting the electrical signal on the power loop/detection path, is needed to implement the installation detection function and the electric shock protection function with a driving circuit 1130. That is, through arranging a control logic in the driving circuit 1130, the function of the detection pulse generating module, the detection result latching circuit, the detection determining circuit, and the switching circuit of the installation detection module 5000*b* can be implemented by the existing hardware of the driving circuit 1030, without adding circuit elements. Since the complex circuit designs such as the detection pulse generating module, the detection result latching circuit, the detection determining circuit, and the switching circuit of the installation detection module are not required in the power supply module, the cost of the overall power supply module can be effectively reduced. Further, since the circuit components/elements are reduced, the power supply module may have more area for layout and the power consumption can be reduced. The saved power can be used for driving the LED module so as to enhance the luminous efficiency, and the heat caused by the power supply module can be reduced as well.

Figure 29A:
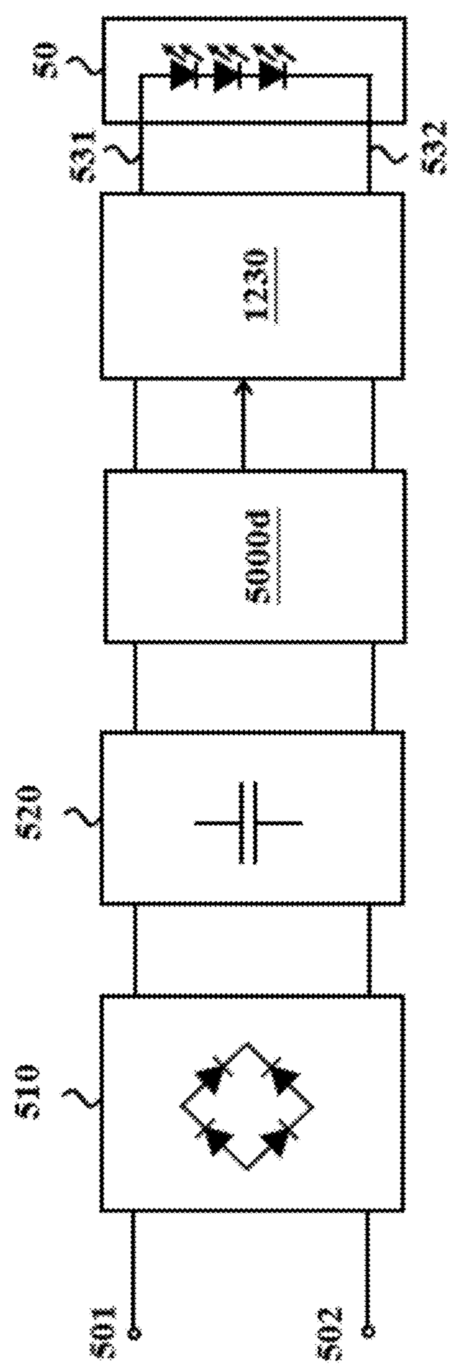
FIG. 29A is a block diagram of an installation detection module according to some exemplary embodiments.

FIG. 29A is a block diagram of an installation detection module according to some embodiments. Referring to FIG. 29A, the power supply module in this embodiment includes a rectifying circuit 510, a filtering circuit 520, an installation detection module 5000*d*, and a driving circuit 1230, wherein the rectifying circuit 510 and the filtering circuit 520 are configured in a way similar to the above described embodiments. The installation detection module 5000*d* includes a detection triggering circuit which is disposed on the power loop of the LED tube lamp, for example after the stage of the filtering circuit 520 as shown in FIG. 29A, but the present embodiment is not limited to this position of the detection triggering circuit 5000*d*. The detection triggering circuit 5000*d* is coupled to an input power terminal or voltage detection terminal of the driving circuit 1230, whose output terminal(s) is/are coupled to the LED module 50.

In this embodiment, the detection triggering circuit 5000*d* is enabled when external power is applied to the power supply module of the LED tube lamp, to transform an electrical signal at the output terminal of the filtering circuit 520 into an electrical signal of a first waveform to be provided to the input power terminal or voltage detection terminal of the driving circuit 1230. The driving circuit 1230 then enters into a detection mode when receiving the first-waveform electrical signal, in order to output a narrow-width pulse signal, conforming to a specific detection need, to drive the power switch; and the driving circuit 1230 further determines whether the LED tube lamp is properly/correctly installed on a lamp socket, by detecting the magnitude of current flowing through the power switch or the LED module 50. Upon determining that the LED tube lamp is properly/correctly installed, the driving circuit 1230 will switch or enter into a normal operating mode (or LED operating mode) to drive the power switch, in which mode the driving circuit 1230 is able to provide stable output power to light up the LED module 50. During this normal operating mode, the detection triggering circuit 5000*d* is disabled so as not to affect power provided from the filtering circuit 520 to the driving circuit 1230, and therefore the electrical signal being provided to the input power terminal or voltage detection terminal of the driving circuit 1230 is not of the first waveform. On the other hand, upon determining that the LED tube lamp is not properly/correctly installed, the driving circuit 1230 will continually output the narrow-width pulse signal to drive the power switch.

Figure 29B:
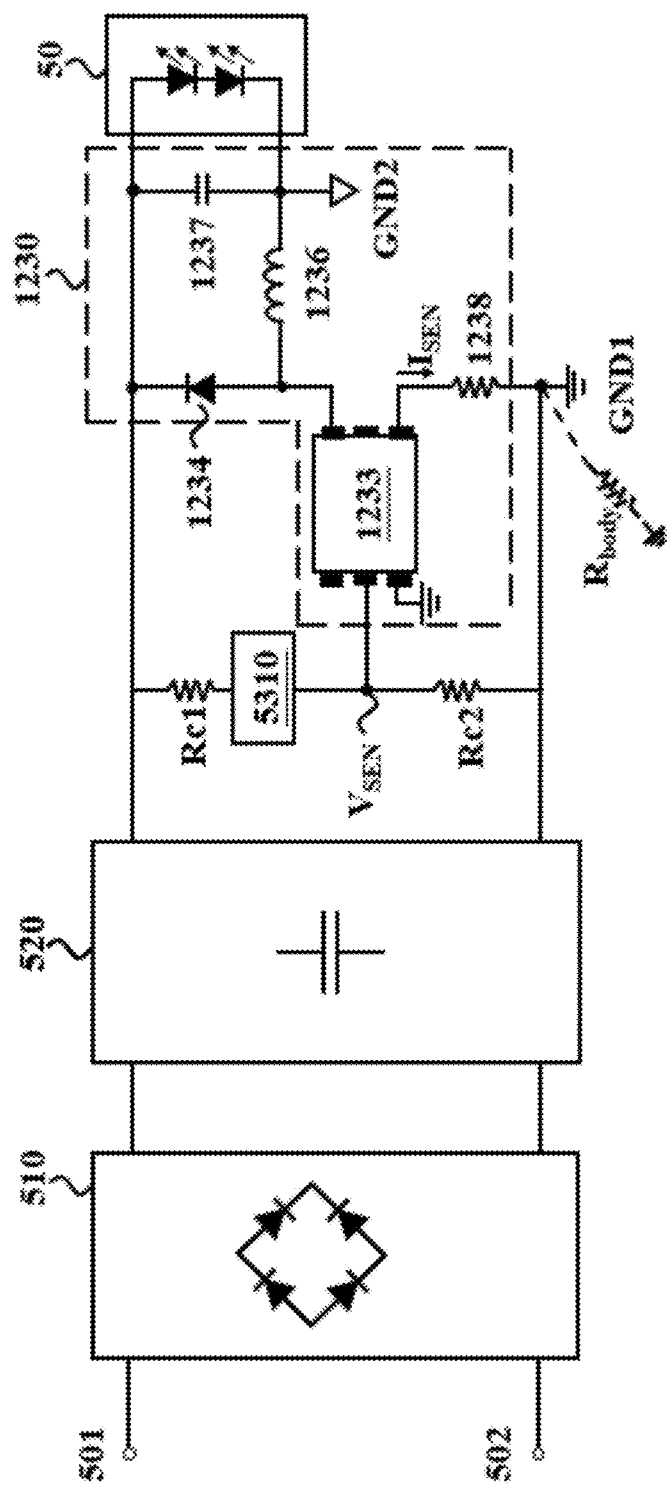
FIG. 29B is a schematic circuit diagram of a driving circuit with an electric shock detection function and a detection triggering circuit thereof according to some exemplary embodiments.
Figure 29C:
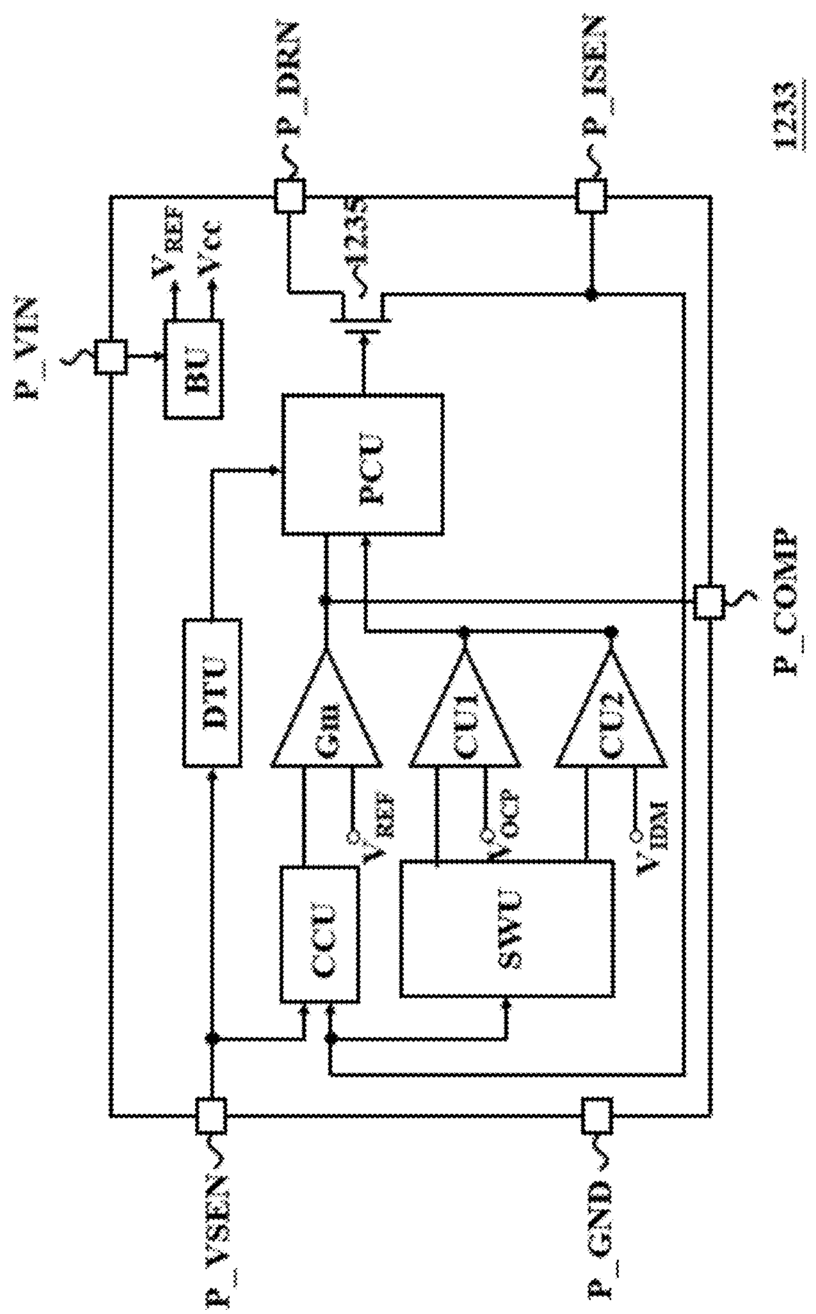
FIG. 29C is an internal block diagram of an integrated controller of a driving circuit with an electric shock detection function according to some exemplary embodiments.

The embodiment illustrated by FIG. 29A is further elaborated in detail here taking the specific circuits in FIGS. 29B and 29C as examples of the circuit blocks in FIG. 29A. FIG. 29B is a circuit diagram illustrating the detection triggering circuit 5310 and the driving circuit 1230 according to some embodiments, and FIG. 29C is an application circuit diagram illustrating an integrated controller 1233 of the driving circuit 1230 according to some embodiments. In this embodiment of the driving circuit 1230, the driving circuit 1230 includes the controller 1233, an inductor 1236, a diode 1234, a capacitor 1237, and a resistor 1238, wherein the integrated controller 1233 has several signal receiving terminals, such as a power supply terminal P_VIN, a voltage detection terminal P_VSEN, a current detection terminal P_ISEN, a driving terminal P_DRN, a compensation terminal P_COMP, and a reference ground P_GND. An end of the inductor 1236 and the anode of the diode 1234 are connected to the driving terminal P_DRN of the controller 1233. The resistor 1238 is connected to the current detection terminal P_ISEN of the controller 1233. The detection triggering circuit 5310 in this embodiment may comprise for example a switch circuit, which is connected to the voltage detection terminal P_VSEN of the controller 1233. In addition, for meeting operation needs of the integrated controller 1233, the power supply module of the LED tube lamp may further include one or more auxiliary circuits external to the integrated controller 1233, such as resistors Rc1 and Rc2 connected to output terminals of the filtering circuit 520. Other external auxiliary circuits not illustrated in FIG. 29B may be included in the power supply module.

The integrated controller 1233 includes a pulse control unit PCU, a power switch unit PSW, a current control unit CCU, a gain amplification unit Gm, a bias unit BU, a detection triggering unit DTU, a switching unit SWU, and comparison units CU1 and CU2. The pulse control unit PCU is configured to generate a pulse signal to control the power switch unit PSW. The power switch unit PSW is connected to the inductor 1236 and the diode 1234 through the driving terminal P_DRN, and is configured to switch on or off in response to the control by the pulse signal, enabling the inductor 1236 to alternately store and release power under normal operating mode in order to provide a stable output current to the LED module 50. The current control unit CCU receives a voltage detection signal VSEN through the voltage detection terminal P_VSEN, and through the current detection terminal P_ISEN receives a current detection signal $I_{SEN}$ indicating the magnitude of current flowing through the resistor 1238. Therefore the current control unit CCU under the normal operating mode can learn about the real-time operating state of the LED module 50 according to the voltage detection signal VSEN and the current detection signal $I_{SEN}$, and then generate an output regulation signal according to the real-time operating state of the LED module 50. The output regulation signal is processed by the gain amplification unit Gm and thereby provided to the pulse control unit PCU as a reference signal for the pulse control unit PCU to generate the pulse signal. The bias unit BU is configured to receive a filtered signal output by the filtering circuit 520, and then generate both stable driving voltage VCC and reference voltage $V_{REF}$ to be used by the units in the integrated controller 1233. The detection triggering unit DTU is connected to the detection triggering circuit 5310 and the resistors Rc1 and Rc2 through the voltage detection terminal P_VSEN, and is configured to detect whether characteristics of the voltage detection signal VSEN received through the voltage detection terminal P_VSEN conform to that of the first waveform. The detection triggering unit DTU then according to the detection result outputs a detection result signal to the pulse control unit PCU. The switching unit SWU is connected to a first end of the resistor 1238 through the current detection terminal P_ISEN, and is configured to provide the current detection signal $I_{SEN}$ selectively to the comparison unit CU1 or the comparison unit CU2, according to the detection result of the detection triggering unit DTU. The comparison unit CU1 is mainly used for overcurrent protection, and is configured to compare the received current detection signal $I_{SEN}$ with an overcurrent reference signal $V_{OCP}$ and then output a comparison result to the pulse control unit PCU. And the comparison unit CU2 is mainly used for electric shock protection, and is configured to compare the received current detection signal $I_{SEN}$ with an installation reference signal $V_{IDM}$ and then output a comparison result to the pulse control unit PCU.

Specifically, when the LED tube lamp is powered up, the detection triggering circuit 5310 would first be enabled and would then affect or adjust, by for example switching of a switch, the voltage detection signal VSEN (to be) provided at the voltage detection terminal P_VSEN, so as to make the voltage detection signal VSEN have the first waveform. For example, taking a switch as the detection triggering circuit 5310, upon being enabled the detection triggering circuit 5310 may in a short period continually switch for several times between a conduction state and a cutoff state on predefined intervals, to cause the voltage detection signal VSEN to vary/fluctuate in a voltage waveform reflecting the switching of the detection triggering circuit 5310. The default state of the integrated controller 1233 upon initially receiving electrical power is disabled. For example, during this state the pulse control unit PCU does not output the pulse signal to drive the power switch unit PSW to light up the LED module 50. But during this state of the integrated controller 1233 the detection triggering unit DTU determines whether the voltage detection signal VSEN has (characteristics of) the first waveform and then transmits the determination result to the pulse control unit PCU.

When the pulse control unit PCU receives from the detection triggering unit DTU a signal indicating that the voltage detection signal VSEN conforms with (characteristics of) the first waveform, the integrated controller 1233 enters into an installation detection mode. Under the installation detection mode, the pulse control unit PCU outputs a narrow-width pulse signal to drive the power switch unit PSW, limiting a current flowing through the power loop of the LED tube lamp to being below a level (such as 5 MIU) over which level there will be substantial risk of electric shock on a human body. Detailed configuration of the pulse signal under the installation detection mode is similar to and can be set with reference to that in the above described embodiments of the installation detection module. In one respect, under the installation detection mode, the switching unit SWU switches into a circuit configuration for transmitting the current detection signal $I_{SEN}$ to the comparison unit CU2, such that the comparison unit CU2 compares the received current detection signal $I_{SEN}$ with the installation reference signal $V_{IDM}$ and generates a comparison result. In this configuration of the switching unit SWU, when the LED tube lamp is improperly/incorrectly installed, the second end of the resistor 1238 can be regarded as connected to the ground terminal GND1 via the body impedance Rbody. Since the intervening of the body impedance Rbody may cause the equivalent impedance increases, the body impedance Rbody can be reflected in variation of the current detection signal $I_{SEN}$, and thus the pulse control unit PCU can correctly determine, according to the comparison result of the comparison unit CU2, whether the LED tube lamp is properly/correctly installed to a lamp socket or whether the risk of electric shock may occurred. Thus if the pulse control unit PCU determines that the LED tube lamp is improperly/incorrectly installed to a lamp socket according to the comparison result of the comparison unit CU2, then the integrated controller 1233 remains operating in the installation detection mode, for example, the pulse control unit PCU continues to output a narrow-width pulse signal to drive the power switch unit PSW and judges whether the LED tube lamp is properly/correctly installed to a lamp socket according to the current detection signal $I_{SEN}$. But if the pulse control unit PCU determines that the LED tube lamp is properly/correctly installed to a lamp socket according to the comparison result, the integrated controller 1233 then enters into a normal operating mode.

Under the normal operating mode, the detection triggering circuit 5000*d* is inactive or disabled, for example, the detection triggering circuit 5000*d* doesn't affect or adjust the voltage detection signal VSEN. In this case, the voltage detection signal VSEN is determined merely by voltage division between the resistors Rc1 and Rc2, and in the integrated controller 1233 the detection triggering unit DTU may be disabled or the pulse control unit PCU doesn't use the detection result signal from the detection triggering unit DTU. Also in this case, the pulse control unit PCU adjusts the pulse width of the pulse signal mainly according to signal(s) output by the current control unit CCU and the gain amplification unit Gm, in a way to output a pulse signal having a corresponding rated power to drive the power switch unit PSW, thereby providing a stable output current to the LED module 50. In one respect, under the normal operating mode, the switching unit SWU switches into a circuit configuration for transmitting the current detection signal $I_{SEN}$ to the comparison unit CU1, to enable the comparison unit CU1 to compare the received current detection signal $I_{SEN}$ with the overcurrent reference signal $V_{OCP}$, so that the pulse control unit PCU can adjust its output pulse signal during an overcurrent condition to prevent circuit damage. It should be noted that the overcurrent protection function available in the integrated controller 1233 is merely optional. In other embodiments, the comparison unit CU1 may be omitted, and the switching unit SWU is accordingly omitted, in the integrated controller 1233, resulting in the current detection signal $I_{SEN}$ being directly provided to an input terminal of the comparison unit CU2.

Figure 29D:
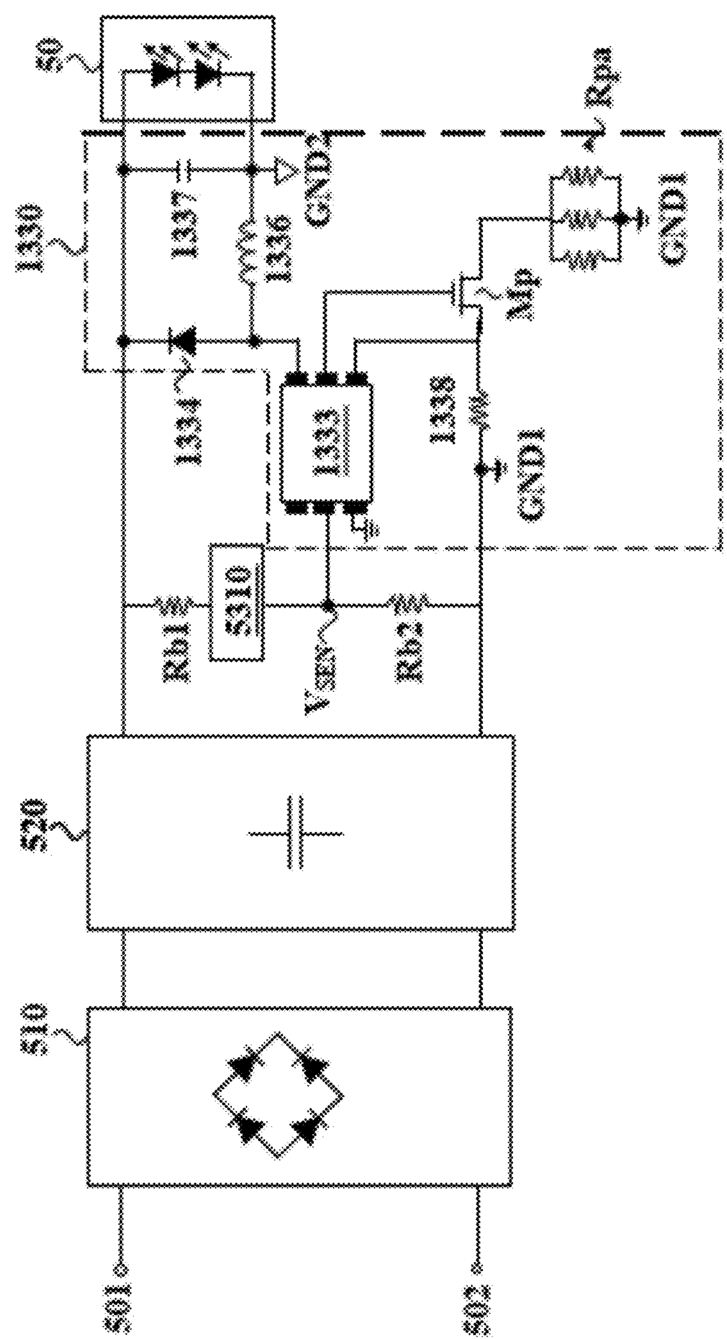
FIG. 29D is a schematic circuit diagram of a driving circuit with an electric shock detection function and a detection triggering circuit thereof according to some exemplary embodiments.

FIG. 29D is a circuit diagram illustrating the detection triggering circuit 5000*d* and the driving circuit 1330 according to some embodiments. The embodiment is similar to that in FIG. 29B, with a main difference that the embodiment of FIG. 29B further includes a configuration of a transistor Mp and an array Rpa of parallel-connected resistors, wherein the transistor Mp has a drain terminal connected to the first end of the resistor 1338, a gate terminal connected to a detection control terminal of the integrated controller 1333, and a source terminal connected to a first common end of the resistor array Rpa. The resistor array Rpa includes a plurality of parallel-connected resistors, whose resistances can be set based on that of the resistor 1338, and the second common end of the resistor array Rpa is connected to the ground terminal GND1.

In some embodiments, the integrated controller 1333 outputs a signal via the detection control terminal to the gate terminal of the transistor Mp according to its current operation mode, so that the transistor Mp can be turned on in response to the received signal, or can be cut off or turned off in response to the received signal during the normal operating mode. In the case of where the transistor Mp is turned on, the resistor array Rpa can be equivalent to connect to the resistor 1338 in parallel, which reduces the equivalent impedance to lower than the resistor 1338 alone. The lower equivalent resistance then can match an order of magnitude of the body impedance. Therefore, during the installation detection mode, when the LED tube lamp is improperly/incorrectly installed (e.g., a user touches the conductive part of the LED tube lamp, or an external impedance is electrically connected to a power loop of the LED tube lamp), the introduction of the resistor array Rpa can adjust the equivalent impedance and thus increase the amount of variation in the current detection signal $I_{SEN}$. As a result, the sensibility of reflecting the body impedance can be enhanced, and thereby improving the accuracy of the installation detection result.

Figure 30:
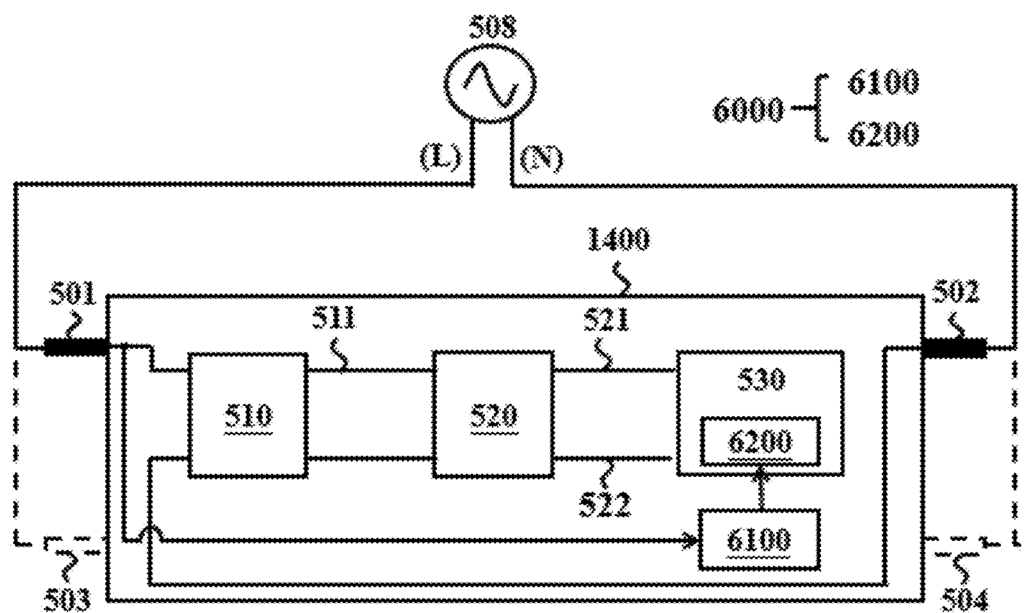
FIG. 30 is a block diagram of an exemplary power supply module in an LED tube lamp according to some exemplary embodiments.

FIG. 30 is a block diagram of an exemplary power supply module in an LED tube lamp according to some exemplary embodiments. Referring to FIG. 30, the LED tube lamp 1400 is, for example, configured to receive an external driving signal directly provided by an external AC power source 508, wherein the external driving signal is input through the live wire (marked as "L") and the neutral wire (marked as "N") to two pins 501 and 502 on two ends of the LED tube lamp 1400. In practical applications, the LED tube lamp 1400 may further have two additional pins 503 and 504, also on the two ends. Under the structure of the LED tube lamp 1400 having the four pins 501-504, depending on design needs two pins (such as the pins 501 and 503, or the pins 502 and 504) on an end cap coupled to one end of the LED tube lamp 1400 may be electrically connected or mutually electrically independent, but the invention is not limited to any of the mentioned cases. A shock detection module 6000 is disposed inside the LED tube lamp 1400 and includes a detection control circuit 6100 and a current-limiting circuit 6200. The shock detection module 6000 may be and is hereinafter referred to as an installation detection module 6000. The current-limiting circuit 6200 may be disposed in combination with a driving circuit 530, and may be the driving circuit 530 itself or may comprise a bias adjustment circuit (to be further described in embodiments below) configured for controlling the enabling/disabling of the driving circuit 530. The detection control circuit 6100 is electrically connected to a power loop of the LED tube lamp 1400 through a first detection connection terminal DE1 and a second detection connection terminal DE2, in order to sample and detect, under a detection mode, a signal on the power loop, and is configured to control the current-limiting circuit 6200 according to the detection result, so as to determine whether to prevent a current from passing through the LED tube lamp 1400. When the LED tube lamp 1400 is not yet correctly/properly installed onto a lamp socket, the detection control circuit 6100 detects a relatively small current signal and then assumes/presumes it to be facing or passing through relatively high impedance, so the current-limiting circuit 6200 in response disables the driving circuit 530 to prevent the LED tube lamp 1400 from operating in a normal lighting mode (i.e., suspending the LED tube lamp 1400 from lighting up). On the other hand, when a relatively large current signal is detected or a relatively small current signal is not detected, the detection control circuit 6100 determines that the LED tube lamp 1400 is correctly/properly installed onto a lamp socket, and then the current-limiting circuit 6200 allows the LED tube lamp 1400 to operate in a normal lighting mode (i.e., allowing the LED tube lamp 1400 being lighted up) by enabling the driving circuit 530. In some embodiments, when a current signal on the power loop sampled and detected by the detection control circuit 6100 is equal to or higher than a defined or set current value, the detection control circuit 6100 determines that the LED tube lamp 1400 is correctly/properly installed onto a lamp socket and then causes the current-limiting circuit 6200 to enable the driving circuit 530. But when the current signal sampled and detected by the detection control circuit 6100 is lower than a defined or set current value, the detection control circuit 6100 determines that the LED tube lamp 1400 is not correctly/properly installed onto a lamp socket and thus causes the current-limiting circuit 5200 to disable the driving circuit 530, thereby causing the LED tube lamp 1400 to enter into a non-conducting state or limiting an effective current value on a power loop in the LED tube lamp 1400 to being smaller than, for example, 5 mA (or 5 MIU according to certain certification standards). The installation detection module 6000 can be regarded as determining whether to cause current conduction or cutoff of the current-limiting circuit 6200 based on the detected impedance, thereby causing the LED tube lamp 1400 to operate in a conducting or normally driven state or enter into a current-limited state or non-driven state. Accordingly, an LED tube lamp 1400 using such an installation detection module 6000 has the benefit of avoiding or reducing the risk of electric shock hazard occurring on the body of a user when accidentally touching or holding a conducting part of the LED tube lamp 1400 which is not yet correctly/properly installed onto a lamp socket.

Specifically, when (part of) a human body touches or contacts an LED tube lamp, some impedance of the human body may cause a change in equivalent impedance on a power loop in the LED tube lamp, so the installation detection module 6000 can determine whether a human body has touched or contacted the LED tube lamp by e.g. detecting a change in current/voltage on the power loop, in order to implement the function to prevent electric shock. The installation detection module 6000 of the present embodiment can determine whether the LED tube lamp is correctly/properly installed onto a lamp socket or whether the body of a user has accidentally touched a conducting part of the LED tube lamp which is not yet correctly/properly installed onto a lamp socket, by detecting an electrical signal such as a voltage or current. Further, compared to the embodiments of FIGS. 14 and 25, since a signal used for determining the installation state is detected/sampled, by the detection control circuit 6100, from the input side of the rectifying circuit 510, the signal characteristics may not be easily influenced by other circuits in the power supply module, so that the possibility of misoperation of the detection control circuit 6100 can be reduced.

From circuit operation perspectives, a method performed by the detection control circuit 6100 and configured to determine under a detection mode whether the LED tube lamp 1400 is correctly/properly installed to a lamp socket or whether there is any unintended external impedance being connected to the LED tube lamp 1400 is shown in FIG. 38A. The method includes the following steps: temporarily conducting a detection path for a period and then cutting it off (step S101); sampling an electrical signal on the detection path during the conduction period (step S102); determining whether the sample of electrical signal conforms with predefined signal characteristics (step S103); if the determination result in step S103 is positive, controlling the current-limiting circuit 5200 to operate in a first state (step S104); and if the determination result in step S103 is negative, controlling the current-limiting circuit 6200 to operate in a second state (step S105) and then returning to the step S101.

In the method of FIG. 38A performed in the embodiment of FIG. 30, the detection path can be a current path connected between the input side of the rectifying circuit 510 and a ground terminal, and its detailed circuit configurations in the embodiment are presented and illustrated below with reference to FIGS. 31A-31C. In addition, the detailed description of how to set parameters such as the conduction period, intervals between multiple conduction periods, and the time point to trigger conduction, of the detection path in the detection control circuit 6100 can refer to the relevant embodiments described in the disclosure.

In the step S101, conducting the detection path for a period may be implemented by means using pulse signal to control switching of a switch.

In the step S102, the sample of an electrical signal is a signal that can represent or express impedance variation on the detection path, which signal may comprise a voltage signal, a current signal, a frequency signal, a phase signal, etc.

In the step S103, the operation of determining whether the sampled electrical signal conforms to predefined signal characteristics may comprise, for example, a relative relation of the sampled electrical signal to a predefined signal. In some embodiments, the sampled electrical signal that is determined by the detection control circuit 6100 to conform to the predefined signal characteristics may correspond to a determination or state that the LED tube lamp 1400 is correctly/properly connected to the lamp socket or there is no unintended external impedance being coupled to the LED tube lamp 1400, and the sampled electrical signal that is determined by the detection control circuit 4100 to not conform to the predefined signal characteristics may correspond to a determination or state where the LED tube lamp 1400 is not correctly/properly connected to the lamp socket or there is a foreign external impedance (e.g., a human body impedance, simulated/test human body impedance, or other impedance connected to the lamp and which the lamp is not designed to connect to for proper lighting operations) being coupled to the LED tube lamp 1400.

In the steps S104 and S105 performed in the embodiment of FIG. 25, the first state and the second state are two distinct circuit-configuration states, and may be set according to the configured position and type of the current-limiting circuit 6200. For example, in the case or embodiment where the current-limiting circuit 6200 refers to a bias adjustment circuit connected to a power supply terminal or enable terminal of a controller of the driving circuit 530, the first state is a cutoff state (or normal bias state, which allows the driving voltage to be normally supplied to the driving controller) while the second state is a conducting state (or bias adjustment state, which suspends the driving voltage from being supplied to the driving controller). And in the case or embodiment where the current-limiting circuit 6200 refers to a power switch in the driving circuit 530, the first state is a driving-control state, where switching of the current-limiting circuit 6200 is only controlled by the driving controller in the driving circuit 530 and not affected by the detection control circuit 6100; while the second state is a cutoff state.

Detailed operations and example circuit structures for performing the above method in FIG. 38A as under the structure of FIG. 25 are illustrated by descriptions herein of different embodiments of an installation detection module.

Figure 31A:
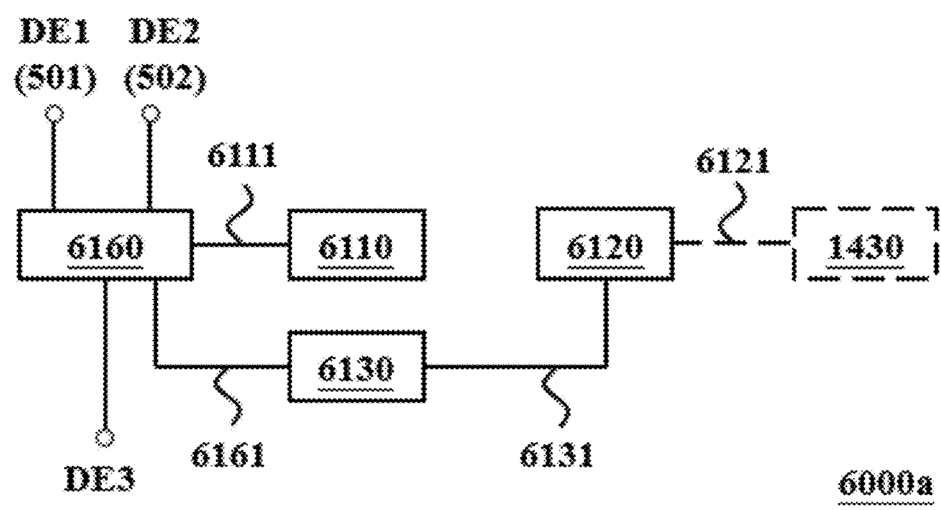
FIG. 31A is a block diagram of an installation detection module according to some exemplary embodiments.

FIG. 31A is a block diagram of an installation detection module according to some exemplary embodiments. Referring to FIG. 31A, the installation detection module 6000*a* includes a detection pulse generating module 6110, a control circuit 6120, a detection determining circuit 6130, and a detection path circuit 6160. The detection determining circuit 6130 is coupled to the detection path circuit 6160 via a path 6161, in order to detect a signal on the detection path circuit 6160. The detection determining circuit 6130 is coupled to the control circuit 6120 via a path 6131, in order to transmit a detection result signal to the control circuit 6120 via the path 6131. The detection pulse generating module 6110 is coupled to the detection path circuit 6160 via a path 6111, in order to generate a pulse signal to inform the detection path circuit 6160 of a time point to conduct a detection path or perform the installation detection. And the control circuit 6120 is coupled to a driving circuit 1430 through a path 6121, in order to control operations of the driving circuit 1430 according to the detection result signal.

In the present embodiment, the detection path circuit 6160 has a first detection connection terminal DE1, a second detection connection terminal DE2, and a third detection connection terminal DE3, wherein the first detection connection terminal DE1 and second detection connection terminal DE2 are electrically connected to two input terminals of a rectifying circuit 510 respectively, in order to receive or sample an external driving signal through a first pin 501 and a second pin 502. The detection path circuit 6160 is configured to rectify the received/sampled external driving signal and to determine under the control of the detection pulse generating module 6110 whether to conduct the rectified external driving signal through a detection path. For example, the detection path circuit 6160 is configured to determine whether to conduct the detection path, in response to the control of the detection pulse generating module 6110. Detailed circuit operations such as using pulse signal for conducting the detection path and detecting whether there is any extraneous impedance being connected to a conductive part of the LED tube lamp are similar to those described in the embodiments of FIGS. 19B-19D, and thus are not repeatedly described here again. Further, detailed configurations and operations of the detection pulse generating module 6110 and the detection determining circuit 6130 of FIG. 31A can be seen by referring to the descriptions herein of other analogous embodiments, and thus are not repeatedly described again.

From the perspective of the overall operation of the installation detection module 6000*a*, when the LED tube lamp is initially powered up, the detection pulse generating module 6110 is enabled/activated in response to the provided external power and generates a pulse signal to temporarily turn on or conduct the detection path formed by the detection path circuit 6160. During the period that the detection path is conducted, the detection determining circuit 6130 samples a signal on the detection path and determines whether the LED tube lamp is correctly installed on the lamp socket or whether a leakage current is generated by a user touching a conductive part of the LED tube lamp. The detection determining circuit 6130 generates a corresponding detection result signal, according to the determination result, and transmits it to the control circuit 6120.

In some embodiments, the control circuit 6120 may comprise a circuit configured to transmit a control signal to a controller in the driving circuit 1430. In the present embodiment, when the control circuit 6120 receives a detection result signal indicating that the LED tube lamp has been correctly installed on the lamp socket, the control circuit 6120 transmits a corresponding control signal to the driving circuit 1430, allowing the driving circuit 1430 to normally perform power conversion for supplying an LED module. On the other hand, when the control circuit 6120 receives a detection result signal indicating that the LED tube lamp is not correctly installed on the lamp socket, the control circuit 6120 transmits a corresponding control signal to the driving circuit 1430, causing the driving circuit 1430 to, in response to the control signal, stop its normal operation or to be disabled. In this case, when the driving circuit 1430 is disabled, the current flowing through the power loop can usually be limited to being lower than a safety value (e.g., 5 MIU).

In some embodiments, the control circuit 6120 comprises and may be referred to below as a bias adjustment circuit 6120, which can control the operation state of the driving circuit 1430 by affecting or adjusting a bias voltage of the driving circuit 1430. In the present embodiment, when the bias adjustment circuit 6120 receives a detection result signal indicating that the LED tube lamp has been correctly installed on the lamp socket, the bias adjustment circuit 6120 does not adjust the bias voltage of the driving circuit 1430, and therefore the driving circuit 1430 can be normally enabled by a received bias voltage and can perform power conversion to provide electricity to the LED module. On the contrary, when the bias adjustment circuit 6120 receives a detection result signal indicating that the LED tube lamp is not correctly installed on the lamp socket, the bias adjustment circuit 6120 adjusts the bias voltage provided to the driving circuit 1430, to a level that is not capable of enabling the driving circuit 1430 to normally perform power conversion. In this case, since the driving circuit 1430 is disabled, the current flowing through the power loop can be limited to lower than the safety value.

Under the configuration of the control circuit 6120, the switching circuit (such as each of the switching circuits 3200, 3200*a-d*, 4200, and 4200*a*) disposed on the power loop and thus required to withstand high current, can be omitted, and therefore the cost of the overall installation detection module can be significantly reduced. On the other hand, since the leakage current is limited by controlling the bias voltage of the driving circuit 1430 through the control circuit 6120, the circuit design of the driving circuit 1430 does not need to be changed, so as to make the commercialization easier.

Figure 31B:
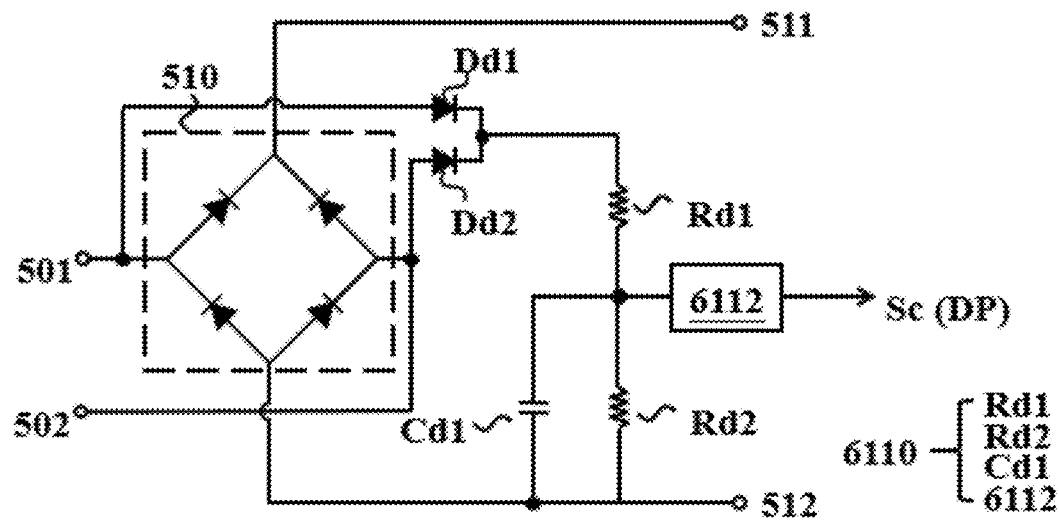
FIGS. 31B and 31C are schematic circuit diagrams of an installation detection module according to some exemplary embodiments.
Figure 31C:
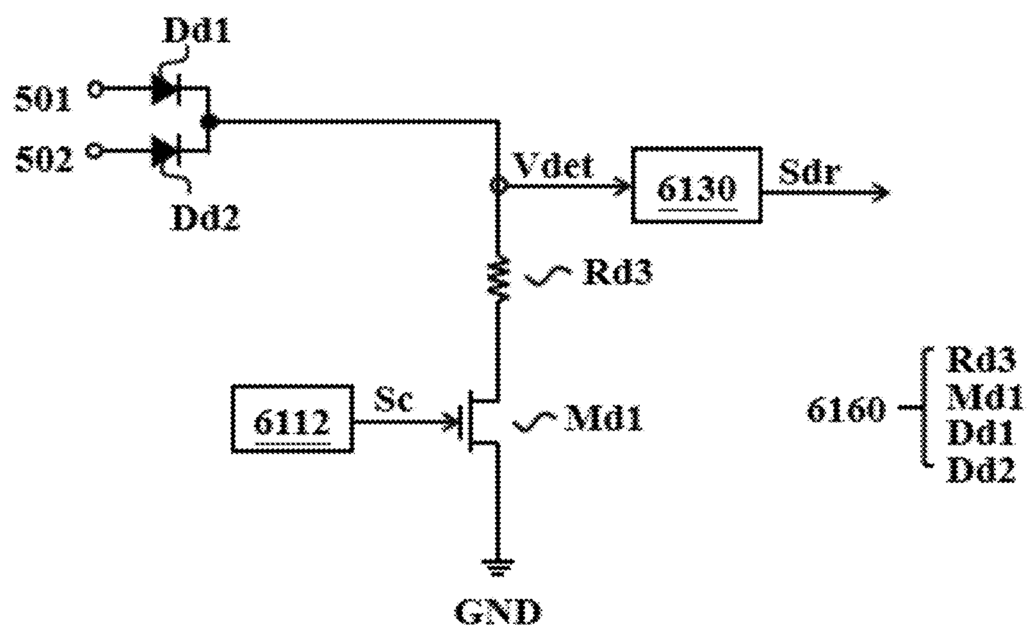

In an exemplary embodiment, the detection pulse generating module 6110 and the detection path circuit 6160 can be respectively implemented by, but not limited to, the circuit configurations illustrated in FIGS. 31B and 31C, and the circuit configurations of the other circuits of the installation detection module 6000*a* are similar to those of the counterpart circuits in other analogous embodiments described herein. Detailed descriptions of the module(s) and circuits illustrated by FIGS. 31B and 31C are presented below.

FIG. 31B is a schematic circuit diagram of the detection pulse generating module according to some embodiments. Referring to FIG. 31B, the detection pulse generating module 6110 includes resistors Rd1 and Rd2, a capacitor Cd1 and a pulse generating circuit 6112. The configuration of the embodiment illustrated in FIG. 31B is similar to that of the detection pulse generating module 5110, the difference between these two embodiments is that the first end of the resistor Rd1 is electrically connected to the first rectifying input terminal (represented as the pin 501) via the diode Dd1 and to the second rectifying input terminal (represented as the pin 502) via the diode Dd2.

FIG. 31C is a schematic circuit diagram of the detection path circuit according to some embodiments. Referring to FIG. 31C, the detection path circuit 6160 includes a resistor Rd3, a transistor Md1 and diodes Dd1 and Dd2. The configuration of the embodiment illustrated in FIG. 31C is similar to that of the detection path circuit 5160, and the difference between these two embodiments is the detection path circuit 6160 further includes the diodes Dd1 and Dd2, and the first end of the resistor Rd3 is electrically connected to the first rectifying input terminal (represented as the pin 501) via the diode Dd1 and to the second rectifying input terminal (represented as the pin 502) via the diode Dd2. In this manner, a detection path can be formed between the rectifying input terminal and the rectifying output terminal, which can be referred to a branch circuit extending from the power loop and is a current path substantially independent from the power loop. The configuration and operation of the diodes Dd1 and Dd2 can be seen referring to the embodiment illustrated in FIG. 24B, and it will not be repeated herein.

It should be noted that, although the transistor M51 is illustrated as a BJT for example, the invention is not limited thereto. In some embodiments, the transistor M51 can be implemented by a MOSFET. When utilizing the MOSFET as the transistor M51, the gate of the transistor M51 is connected to the detection pulse generating module 3510 via the path 3511. The resistor M51 is serially connected between the source of the transistor M51 and the ground. The resistor R51 is serially connected between the drain of the transistor M51 and the installation detection terminal TE1.

In addition, although the sample node X is selected from the first terminal of the transistor M51 for example, in which the first terminal is the collector terminal if the transistor M51 is BJT and the first terminal is the drain terminal if the transistor M51 is MOSFET, the present invention is not limited thereto. The sample node X can be selected from the second terminal of the transistor M51 as well, in which case the second terminal is the emitter terminal if the transistor M51 is BJT and the second terminal is the source terminal if the transistor M51 is MOSFET. As a result, the detection determining circuit 3530 can detects the signal feature on at least one of the first terminal and the second terminal of the transistor M51.

As noted above, the present embodiment may determine whether a user has a chance to get an electric shock by conducting a detection path and detecting a voltage signal on the detection path. Compared to the embodiment mentioned above, the detection path of the present embodiment is additionally built, but does not use the power loop as the detection path. In some embodiments, the additional detection path refers to at least one electronic element of the detection path circuit 3560 being different from electronic elements included in the power loop. In some embodiments, the additional detection path refers to all of the electronic elements of the detection path circuit 3560 being different from electronic elements included in the power loop.

Since the configuration of the components on the additional detection path is much simpler than the power loop, the voltage signal on the detection path may reflect a user's touching state more accurately.

Furthermore, similar to the above embodiment, part or all of the circuit/module can be integrated as a chip, as illustrated in the embodiments in FIG. 17A to FIG. 18F, and it will not be repeated herein.

Figure 32A:
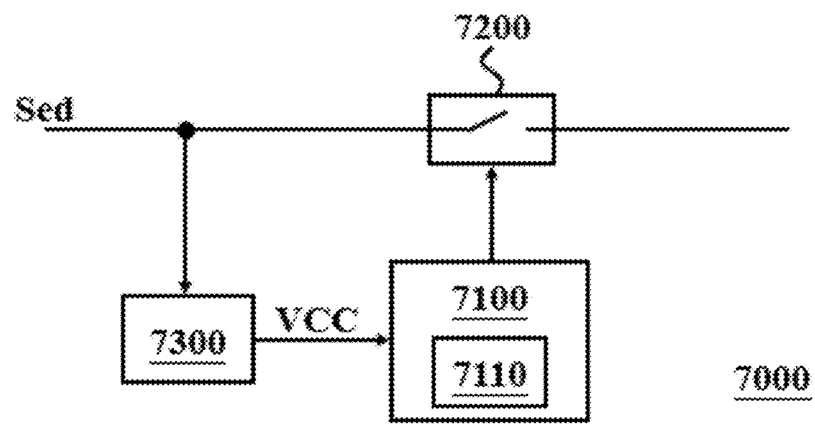
FIG. 32A is a block diagram of an installation detection module according to some exemplary embodiments.

For describing operations or working mechanisms of the installation detection module in concrete detail, in some disclosed embodiments, the circuit components of the installation detection module can be categorized into different functional modules, including, for example, a detection pulse generating module, a detection result latching circuit, a detection determining circuit, a detection control circuit, and a switch circuit/current limiting circuit/bias adjustment circuit. But elements of actual designed embodiments of the installation detection module are not limited to the described modules herein. For example, in one perspective as shown in FIG. 32A, circuits in an installation detection module 7000 and related to detecting an installation state and performing switching control can be integrated into or generally referred to as a detection controller 7100; and circuits in an installation detection module 7000 and related to responding to control by the detection controller 7100 and therefore affecting magnitude of current on a power loop can be integrated into or generally referred to as a current limiting module 7200. Furthermore, although not pointed out in the described example embodiments, a person of ordinary skill in the relevant art can naturally understand that any circuit including elements requiring power supply to operate needs at least one corresponding driving voltage (e.g., VCC) to operate, and thus that there will be some element(s) or circuit line(s) in the installation detection module that are for the purpose of generating the driving voltage VCC. In the embodiment of FIG. 32A, circuits in an installation detection module and for generating the driving voltage VCC are integrated into or generally referred to as bias circuit 7300.

Under the functional modules in the embodiment of FIG. 32A, the detection controller 7100 is configured to perform an installation detection (or an impedance detection), so as to determine whether the LED tube lamp is or has been correctly/properly connected to the lamp socket or whether there is any extraneous or unintended external impedance (such as human body impedance) intervening in or coupling to a circuit of the LED tube lamp, wherein the detection controller 7100 will control the current limiting module 7200 according to the determination result. If the detection controller 7100 determines that the LED tube lamp is not correctly/properly connected to the lamp socket or there is extraneous or unintended external impedance intervening in, the detection controller 7100 controls cut off of the current limiting module 7200, to prevent a current on a power loop of the LED tube lamp from being excessive to cause an electric shock. The current limiting module 7200 is configured to cause a current to normally flow on the power loop, when the detection controller 7100 determines that the LED tube lamp is correctly/properly connected to the lamp socket or there is no such unintended impedance; and is configured to cause a current on the power loop to be below a certain level to prevent the current from exceeding the safety value, when the detection controller 7100 determines that the LED tube lamp is not correctly/properly connected to the lamp socket or there is such unintended impedance. In circuit design or configuration, the current limiting module 7200 may be independent of the driving circuit (such as 530) and may comprise a switch circuit or a current limiting circuit connected to the power loop in series (such as each of current-limiting circuits 3200, 3200*a*, 3200*b*, and 3200*c*, in FIGS. 15A, 16A, 17A, 18A19A, 22A, and 22B), a bias adjustment circuit connected to a power supply terminal or enable terminal of a controller of the driving circuit (such as a bias adjustment circuit 5200A in FIG. 27B), or a power switch in the driving circuit (such as a switch circuit 1135 in FIG. 28B). The bias circuit 7300 is configured for providing a driving voltage VCC required for operation of the detection controller 7100, and embodiments of the bias circuit 7300 can be described hereinafter with reference to FIGS. 32B and 32C.

From functional perspectives, the detection controller 7100 may be regarded as detection control means used by the installation detection module of the present disclosure, and the current limiting module 7200 may be regarded as switching means or current limiting means used by the installation detection module of this disclosure, wherein the detection control means may correspond to partial or all circuits of the installation detection module and other than the switching means, and the switching means may correspond to any one of possible circuit embodiment types of the above described current limiting module 7200.

From circuit operation perspectives, a method performed by the detection controller 7100 and configured to determine whether the LED tube lamp is correctly/properly connected to the lamp socket or whether there is any unintended external impedance being connected to the LED tube lamp is shown in FIG. 38A. The method includes the following steps: temporarily conducting a detection path for a period and then cutting it off (step S101); sampling an electrical signal on the detection path (step S102); determining whether the sampled electrical signal conforms with predefined signal characteristics (step S103); if the determination result in step S103 is positive, controlling the current limiting module 7200 to be operated in a first state (step S104); and if the determination result in step S103 is negative, controlling the current limiting module 7200 to be operated in a second state (step S105) and then returning to the step S101.

Configuration of the detection path and setting of the conduction period of the detection path can be done with reference to the above described embodiments. In the step S101, conducting the detection path for a period may be implemented by means using pulse to control switching of a switch.

In the step S102, the sampled electrical signal is a signal that can represent or express impedance variation on the detection path, which may comprise a voltage signal, a current signal, a frequency signal, a phase signal, etc.

In the step S103, the operation of determining whether the sampled electrical signal conforms with predefined signal characteristics may comprise, for example, a relative relation of the sampled electrical signal and a predefined signal. In some embodiments, the sampled electrical signal that is determined to conform with the predefined signal characteristics may correspond to a determination or state that the LED tube lamp is correctly/properly connected to the lamp socket or there is no unintended external impedance being coupled to the LED tube lamp, and the sampled electrical signal that is determined to not conform with the predefined signal characteristics may correspond to a determination or state where the LED tube lamp is not correctly/properly connected to the lamp socket or there is a foreign external impedance (e.g., a human body impedance, simulated/test human body impedance, or other impedance connected to the lamp and which the lamp is not designed to connect to for proper lighting operations) being coupled to the LED tube lamp.

In the steps S104 and S105, the first state and the second state are two distinct circuit-configuration states, and may be set according to the configured position and type of the current limiting module 7200. For example, in the case or embodiment where the current limiting module 7200 is independent of the driving circuit and refers to a switch circuit or a current limiting circuit that is serially connected on the power loop, the first state is a conducting state (or non-current-limiting state) while the second state being a cutoff state (or current-limiting state). In the case or embodiment where the current limiting module 7200 refers to a control circuit connected to a power supply terminal or enable terminal of a controller of the driving circuit, the first state is a cutoff state (or normal bias state, which allows the driving voltage being normally supplied to the controller) while the second state is a conducting state (or bias adjustment state, which suspends the driving voltage from being supplied to the controller). And in the case or embodiment where the current limiting module 7200 refers to a power switch in the driving circuit, the first state is a driving-control state, which switches in response to the controller of the driving circuit and does not affect the detection controller 7100; while the second state is a cutoff state.

Detailed operations and circuit embodiments of the steps described in connection with FIGS. 37A-37C are exemplified by and described in the above description of embodiments and the steps serve to describe operation mechanism of the installation detection module in a different manner.

Figure 38C:
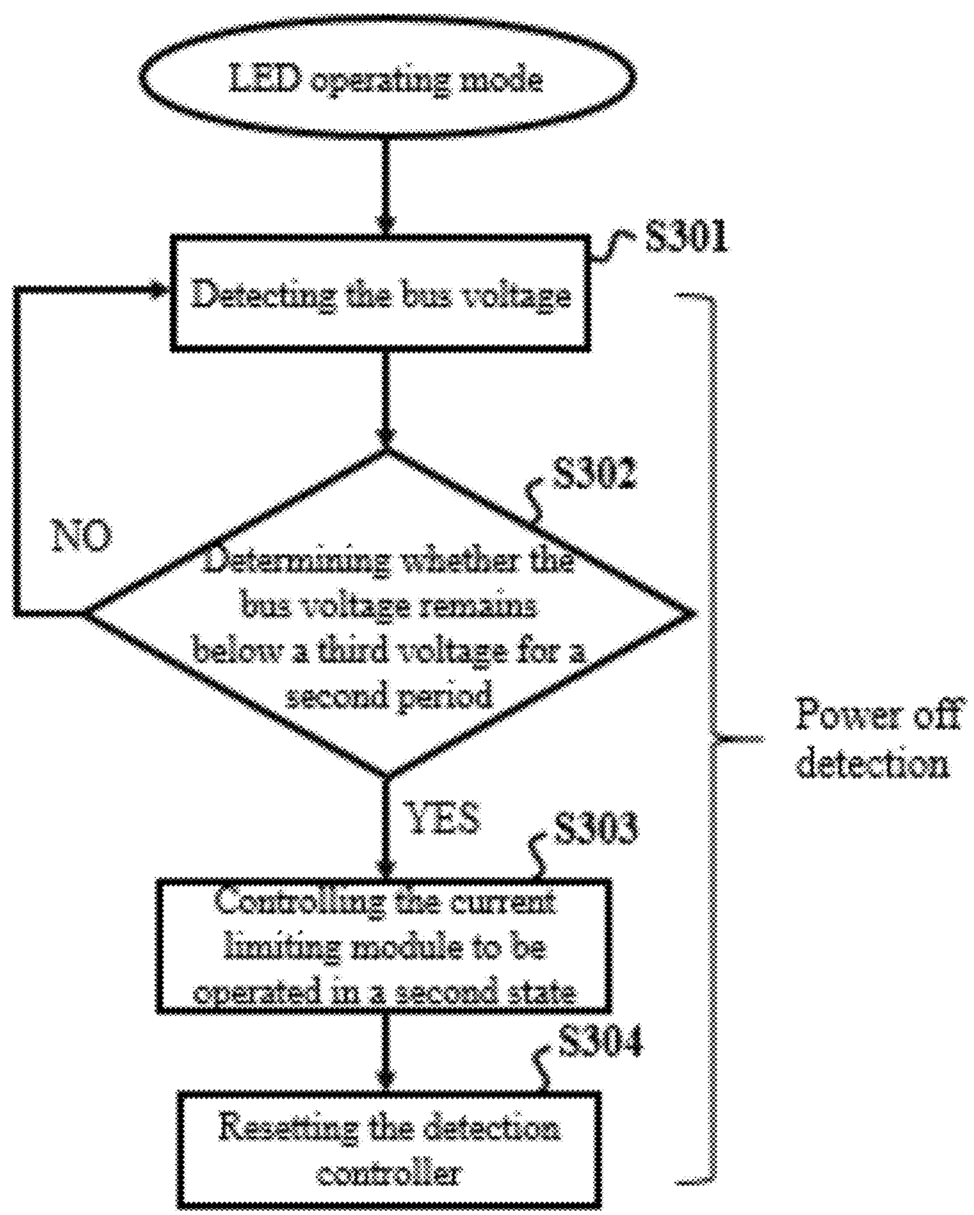
FIG. 38C is a flowchart of a power off detection method according to some exemplary embodiments.

Next, operations of the installation detection module after entering into the LED operating mode DRM are further described here with reference to the steps in FIG. 38C. Referring to FIGS. 32A and 38C, after entering into the LED operating mode DRM, the detection controller 7100 performs following steps: detecting a bus voltage on the power line (step S301); and determining whether the voltage on the power line remains below a third voltage level for a second period (step S302). The second period is for example in the range of 200 ms-700 ms, and is preferably 300 ms or 600 ms. The third voltage level is for example in the range of 80V-120V, and is preferably 90V or 115V. Thus in some embodiments of the step S302, the detection controller 7100 determines whether the voltage on the power line remains below 115V for 600 ms.

If the determination result in step S302 is positive, this indicates that the external driving signal is not, or ceases to be, provided to the LED tube lamp, or that the LED tube lamp is powered off, so the detection controller 7100 proceeds to perform the two steps of: controlling to switch the current limiting module 7200 into the second state (step S303) and then resetting the detection controller 7100 (step S304). On the other hand, if the determination result in step S302 is negative, this indicates or can be regarded as that the external driving signal is normally provided to the LED tube lamp, so the detection controller 7100 proceeds back to step S301 where it continually detects the voltage on the power line to determine whether the LED tube lamp is powered off.

Figure 32B:
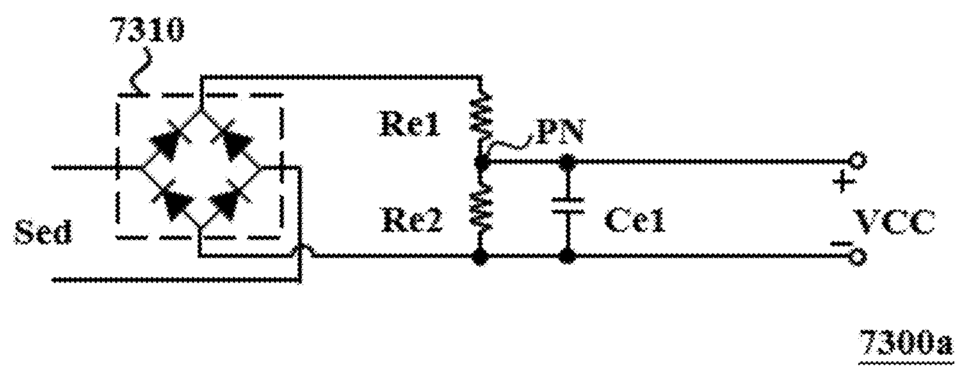
FIGS. 32B and 32C are a schematic circuit diagrams of bias circuits of an installation detection module according to some exemplary embodiments.

FIG. 32B is a circuit diagram illustrating a bias circuit with the installation detection module according to some embodiments. Referring to FIG. 32B, in an application where the LED tube lamp receives an AC power as an input, a bias circuit 7300*a* includes a rectifying circuit 7310, resistors Re1 and Re2, and a capacitor Ce1. In this embodiment, the rectifying circuit 7310 includes a full-wave bridge rectifier as an example, to which the present invention is not limited. The input terminals of the rectifying circuit 7310 are configured to receive an external driving signal Sed and rectify the external driving signal Sed to output a rectified (nearly) DC signal at the output terminals of the rectifying circuit 7310. Resistors Re1 and Re2 are connected in series between the output terminals of the rectifying circuit 7310, and the resistor Re2 is connected with the capacitor Ce1 in parallel. The rectified signal is divided by the resistor Re1 and Re2 and stabilized by the capacitor Ce1, so as to generate a driving voltage VCC output across two terminals of the capacitor Ce1 (i.e., the node PN and the ground terminal).

In an embodiment where the installation detection module is integrated into the LED tube lamp, since a power supply module in the LED tube lamp usually includes its own rectifying circuit (such as 510), the rectifying circuit 7310 can be replaced by the existing rectifying circuit. And the resistors Re1 and Re2 and the capacitor Ce1 may be directly connected on a power loop of the power supply module, such that the installation detection module can use the rectified bus voltage (i.e. the rectified signal) on the power loop as a power source. In an embodiment where the installation detection module is disposed outside of the LED tube lamp, since the installation detection module directly uses the external driving signal Sed as a power source, the rectifying circuit 7310 is separate from the power supply module, and is configured to convert the AC external driving signal Sed into the DC driving voltage VCC to be used by circuits in the installation detection module.

Figure 32C:
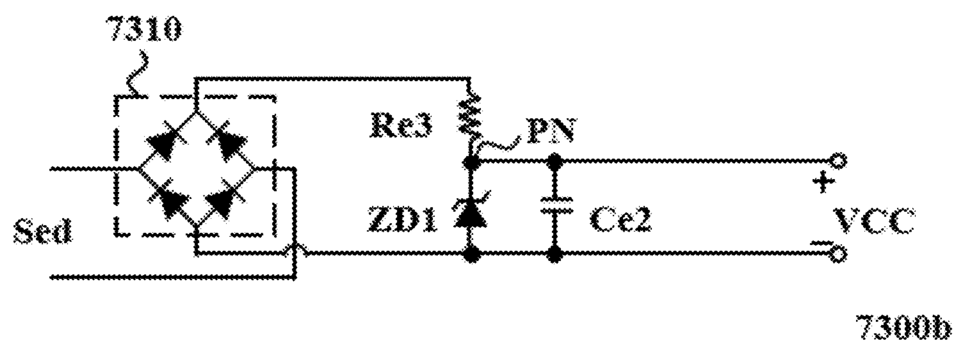

FIG. 32C is a circuit diagram illustrating a bias circuit with the installation detection module according to some embodiments. Referring to FIG. 32C, a bias circuit 7300*b* includes a rectifying circuit 7310, a resistor Re3, a Zener diode ZD1, and a capacitor Ce2. This embodiment is similar to that in FIG. 32B, with a main difference that the Zener diode ZD1 is used to replace the resistor Re2 in FIG. 32B, in order to make the driving voltage VCC more stable.

Figure 33:
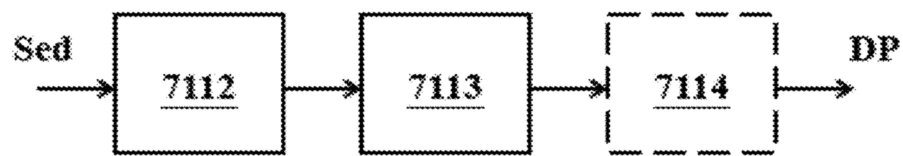
FIG. 33 is a block diagram of a detection pulse generating module according to some exemplary embodiments.

FIG. 33 is an application circuit block diagram of the detection pulse generating module according to some embodiments. Referring to FIG. 33, in this embodiment, a detection pulse generating module 7110 includes a pulse starting circuit 7112 and a pulse-width determining circuit 7113. The pulse starting circuit 7112 is configured to receive the external driving signal Sed, and to determine when (e.g., at what time, for example in relation to the time at which the external driving signal Sed was received) to generate or issue a pulse by the detection pulse generating module 7110, according to the external driving signal Sed. The pulse-width determining circuit 7113 is coupled to an output terminal of the pulse starting circuit 7112 to set or determine width of the pulse, and to issue at the determined time indicated by the pulse starting circuit 7112 a pulse signal DP having the set pulse width.

In some embodiments, the detection pulse generating module 7110 may further comprise an output buffer circuit 7114. An input terminal of the output buffer circuit 7114 is coupled to an output terminal of the pulse-width determining circuit 7113. And the output buffer circuit 7114 is configured or used to adjust the waveform of an output signal (such as a voltage or current signal) from the pulse-width determining circuit 7113, so as to output the pulse signal DP that can meet operation needs of rear end circuit(s).

Taking the detection pulse generating module 3110 illustrated in FIG. 15B as an example, its time at which to issue the pulse signal is determined based on when it receives the driving voltage, so a bias circuit that generates the driving voltage VCC can be regarded as a pulse starting circuit of the detection pulse generating module 3110. In another respect, the pulse width of the pulse signal generated or issued by the detection pulse generating module 3110 is mainly determined by the time constant of an RC charging-discharging circuit composed of the capacitors C11, C12, and C13, and the resistors R11, R12, and R13. So the capacitors C11, C12, and C13, and the resistors R11, R12, and R13 can together be regarded as a pulse-width determining circuit of the detection pulse generating module 3110. And the buffers BF1 and BF2 can be an output buffer circuit of the detection pulse generating module 3110.

Taking the detection pulse generating module 3210 illustrated in FIG. 16B as another example, its time at which to issue the pulse signal is determined based on the time at which it receives the driving voltage VCC in FIG. 16B and related to the time constant of an RC charging-discharging circuit composed of the resistor R21 and the capacitor C21. So a bias circuit that generates the driving voltage VCC, the resistor R21, and the capacitor C21 can together be regarded as a pulse starting circuit of the detection pulse generating module 3210. In another respect, the pulse width of the pulse signal generated or issued by the detection pulse generating module 3210 is mainly determined by the forward threshold voltage and reverse threshold voltage of the Schmitt trigger STRG and the switching latency of the transistor M21, so the Schmitt trigger STRG and the transistor M21 can together be regarded as a pulse-width determining circuit of the detection pulse generating module 3210.

Figure 34A:
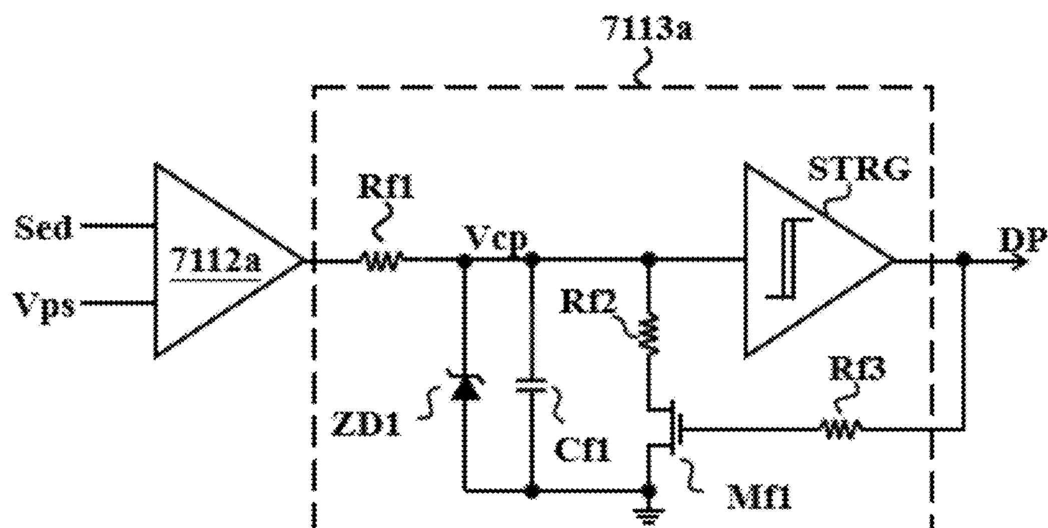
FIGS. 34A and 34B are schematic circuit diagrams of detection pulse generating modules according to some exemplary embodiments.

In some embodiments, a pulse starting circuit of the detection pulse generating module 3110 or 3210 can implement the control of the pulse starting time (or the time at which to issue the pulse signal) by including a comparator as shown in FIG. 34A. FIG. 34A is a circuit diagram illustrating a detection pulse generating module according to some embodiments. Referring to FIG. 34A, specifically, a detection pulse generating module 7110*a* includes a comparator 7112*a*, as a pulse starting circuit, and a pulse-width determining circuit 7113*a*. The comparator 7112*a* has a first input terminal to receive an external driving signal Sed, a second input terminal to receive a reference voltage level Vps, and an output terminal connected to an end of a resistor Rf1, which end corresponds to the input terminal of driving voltage VCC in FIG. 16B. Here, the comparator 7112*a*'s receiving of the external driving signal Sed is not limited to the way of inputting the external driving signal Sed directly to the first input terminal of the comparator 7112*a*. In some embodiments, the external driving signal Sed may first undergo some signal processing such as rectification and/or voltage division to be transformed to a state signal related to the external driving signal Sed, and the state signal then is inputted to the comparator 7112*a*. The comparator 7112*a* then learns about the state of the external driving signal Sed according to the state signal, which way is equivalent to the comparator 7112*a* directly receiving the external driving signal Sed or performing its following step of signal comparison based on the external driving signal Sed. The pulse-width determining circuit 7113*a* includes resistors Rf1, Rf2, and Rf3, a Schmitt trigger STRG, a transistor Mf1, a capacitor Cf1, and a Zener diode ZD1, wherein configuration of these devices is similar to that in FIG. 16B and therefore description of connections between these devices is referred to such descriptions of embodiments above. Under the configuration of FIG. 34A, an RC circuit composed of the capacitor Cf1 and the resistor Rf1 begins to charge the capacitor Cf1 only upon a voltage level of the external driving signal Sed exceeding the reference voltage level Vps, to in turn control the time to issue the pulse signal DP. Corresponding variations of three relevant signals along the time axis are shown in FIG. 35A.

Figure 35A:
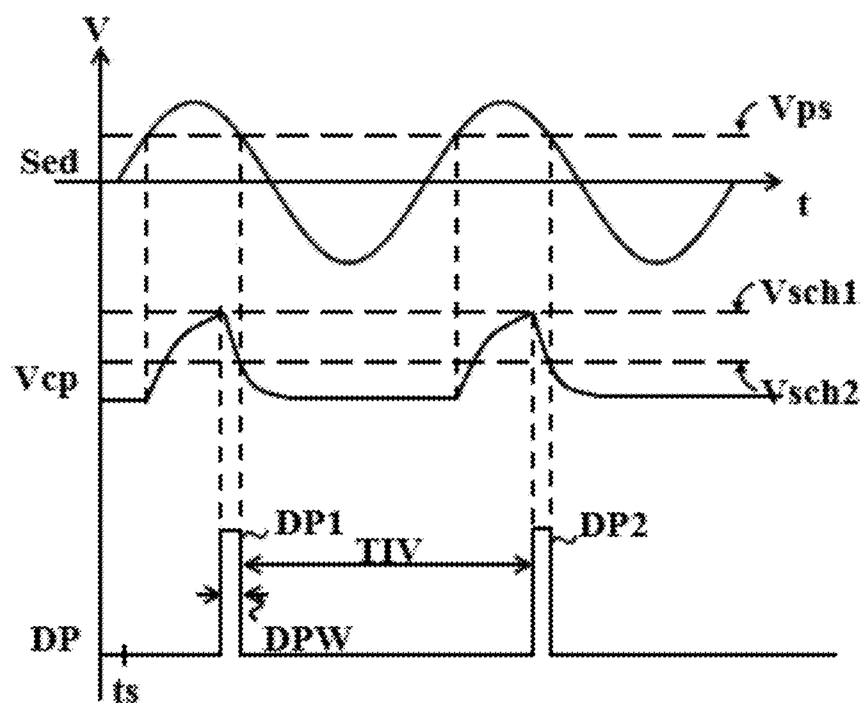
FIGS. 35A-35D are schematic signal waveform diagrams of detection pulse generating modules according to some exemplary embodiments.

Referring to FIGS. 34A and 35A, in this embodiment of FIG. 34A, the comparator 7112*a* as a pulse starting circuit outputs a high-level signal to an end of the resistor Rf1 to begin charging the capacitor Cf1, whose voltage Vcp gradually increases over time during the charging. When the voltage signal Vcp reaches the forward threshold voltage Vsch1 of the Schmitt trigger STRG, the Schmitt trigger STRG's output terminal outputs a high-level signal, which in turn conducts the transistor Mf1. Upon the conducting of the transistor Mf1, the capacitor Cf1 begins discharging to ground through the resistor Rf2 and the transistor Mf1, so as to gradually decrease the voltage signal Vcp. When the decreasing voltage signal Vcp reaches the reverse threshold voltage Vsch2 of the Schmitt trigger STRGz, the Schmitt trigger STRG's output terminal switches from outputting the high-level signal to outputting a low-level signal, thus forming/generating the pulse signal or waveform DP1, whose pulse width DPW is determined by the forward threshold voltage Vsch1, the reverse threshold voltage Vsch2, and the switching latency of the transistor Mf1. Upon forming the pulse signal DP1, another similar pulse signal or waveform DP2 is similarly generated by the Schmitt trigger STRG after an interval TIV, in which the interval TIV can be defined by a duration that the voltage signal Vcp falls from less than the reverse threshold voltage Vsch2 to higher than the forward threshold voltage Vsch1 again. Generation of such similar pulse signals (DP2, DP3, and etc) may similarly follow.

Figure 34B:
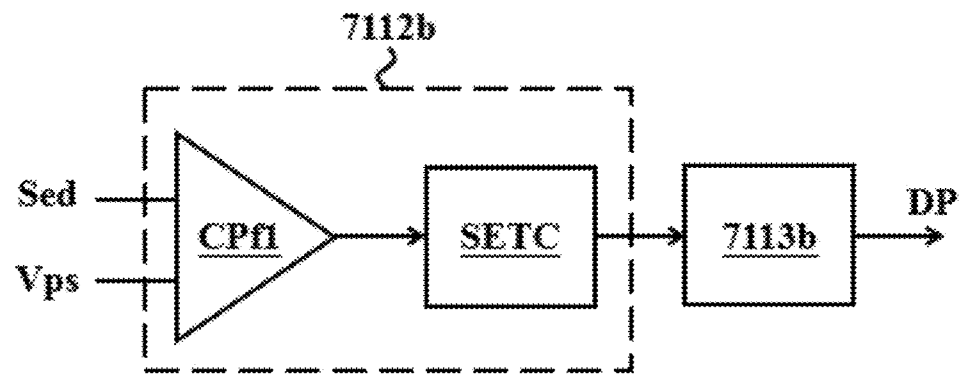

In some embodiments, the pulse starting circuit 7112 indicates the time to generate or issue a pulse signal, thereby determining the time to generate the pulse signal by the detection pulse generating module 7110, when the external driving signal Sed reaches or exceeds a specific voltage level, as implemented by an embodiment in FIG. 34B. FIG. 34B is a circuit diagram illustrating a detection pulse generating module according to some embodiments. Referring to FIG. 34B, specifically, a detection pulse generating module 7110*b* includes a pulse starting circuit 7112*b* and a pulse-width determining circuit 7113*b*. The pulse starting circuit 7112*b* includes a comparator CPf1 and a signal edge triggering circuit SETC. The comparator CPf1 has a first input terminal to receive an external driving signal Sed, a second input terminal to receive a reference voltage level Vps, and an output terminal connected to an input terminal of the signal edge triggering circuit SETC. The signal edge triggering circuit SETC may for example comprises a rising-edge triggering circuit or a falling-edge triggering circuit, configured to detect the time of the comparator CPf1 switching its output state, and then to transmit an instruction to generate a pulse signal for the later-stage pulse-width determining circuit 7113*b*. The pulse-width determining circuit 7113*b* may comprise any kind of pulse generating circuit that capable of generating, according to the pulse generation instruction, a pulse signal with a set width at a specific time, such as the circuits in each of FIG. 15B and FIG. 16B, or an integrated device like a 555 timer, and this invention is not limited to these example circuits. It's noted that although in FIG. 34B it's illustrated that the comparator CPf1's first input terminal directly receives an external driving signal Sed, this invention is not limited to this example. In some embodiments, the external driving signal Sed may first undergo some signal processing such as rectification, filtering, and/or voltage division to be a reference signal and then received by the first input terminal of the comparator CPf1. Thus, the pulse starting circuit 7112*b* can determine the time at which to generate a pulse signal based on a received reference signal related to or indicative of the voltage level or phase state of the external driving signal Sed.

Figure 35B:
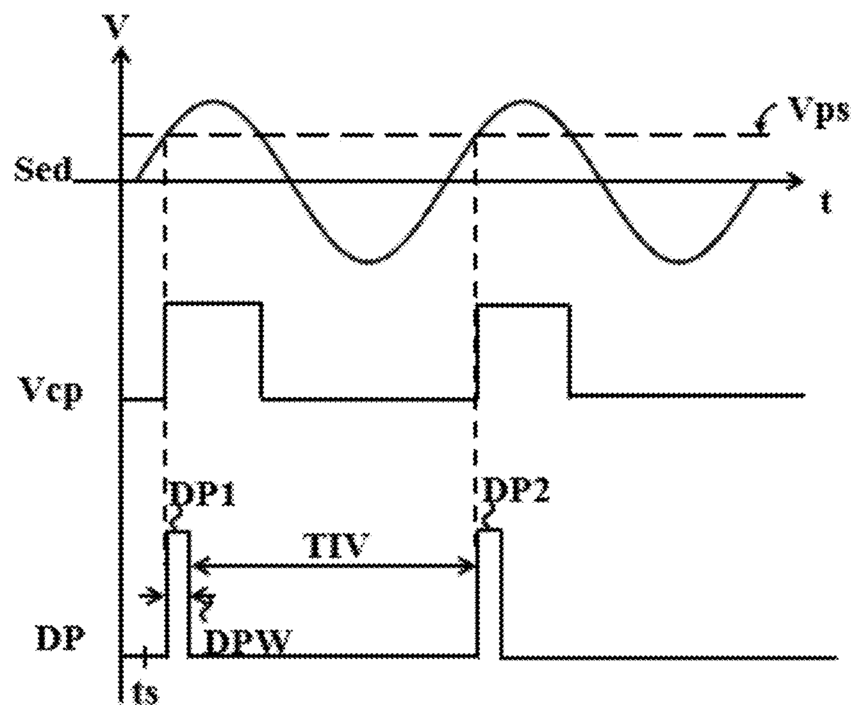
Figure 35C:
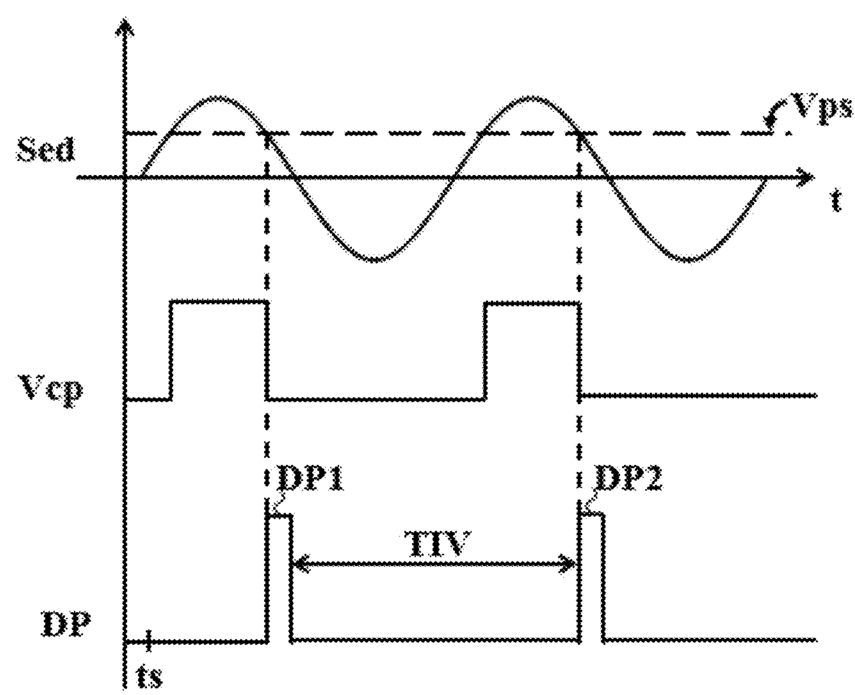

Corresponding variations of three relevant signals along the time axis generated in the embodiment of the detection pulse generating module 3610 in FIG. 34B are shown in each of FIG. 35B and FIG. 35C, wherein FIG. 35B shows waveforms of the three signals generated under the rising edge-triggered method and FIG. 35C shows waveforms of the three signals generated under the falling edge-triggered method. Referring to FIG. 34B and FIG. 35B, in this embodiment under the rising edge-triggered method, the comparator CPf1 begins outputting a high-level signal upon a voltage level of the external driving signal Sed exceeding a reference voltage level Vps, and the output is maintained at the high level for the duration that the external driving signal Sed is above the reference voltage level Vps. When the external driving signal Sed gradually decreases from its peak value and upon its falling below the reference voltage level Vps, the comparator CPf1 switches into outputting a low-level signal (again). Accordingly, the output terminal of the comparator CPf1 outputs an output voltage signal Vcp as shown in FIG. 35B. Around when a rising edge occurs on the voltage signal Vcp, the signal edge triggering circuit SETC triggers and outputs an enable signal to the pulse-width determining circuit 7113*b*, so that the pulse-width determining circuit 7113_b_ around the time of the rising edge generates a pulse signal DP having a pulse or waveform DP1, according to the enable signal and a set pulse width DPW of the pulse DP1. According to these described operations, the detection pulse generating module 7110_b_ can adjust the time to generate the pulse DP1 of the pulse signal DP by adjusting, or changing the setting of, the reference voltage level Vps, so that the detection pulse generating module 7110_b_ is triggered to generate the pulse DP1 of the pulse signal DP only upon the external driving signal Sed reaching a specific voltage level or phase. Therefore, the problem of generating the pulse DP1 of the pulse signal DP wrongly around when the external driving signal Sed crosses a zero voltage level associated with some embodiments mentioned earlier can be prevented by this rising edge-triggered method.

In some embodiments, the reference voltage level Vps may be adjusted according to the voltage level of the external driving signal Sed on the power line, so that the detection pulse generating module can generate a pulse DP1 of a pulse signal DP at a time point according to the distinct nominal supply voltage (such as 120V or 277V) of the AC power grid providing the power line. Thus, no matter what a distinct nominal supply voltage of an AC power grid providing the external driving signal is, the portion of a period of the external driving signal Sed on the power line or detection path of the LED tube lamp for which portion a detection is in a triggered state (for the duration of the pulse on the voltage signal Vcp) can be adjusted or limited according to the distinct nominal supply voltage, by adjusting the reference voltage level Vps, to improve accuracy of the installation detection or impedance detection. For example, the reference voltage level Vps may comprise a first reference voltage level corresponding to a first nominal supply voltage such as 120V of an AC power grid and a second reference voltage level corresponding to a second nominal supply voltage such as 277V of another AC power grid. When the external driving signal Sed received by the detection pulse generating module 7110_b_ has the first nominal supply voltage, the pulse starting circuit 7112_b_ determines the time at which to generate a pulse DP1 of the pulse signal DP based on the first reference voltage level of the reference voltage level Vps. When the external driving signal Sed received by the detection pulse generating module 7110_b_ has the second nominal supply voltage, the pulse starting circuit 7112_b_ determines the time at which to generate a pulse DP1 of the pulse signal DP based on the second reference voltage level of the reference voltage level Vps.

Referring to FIG. 34B and FIG. 35C, operations in this embodiment under the falling edge-triggered method are similar to those in the embodiment of FIG. 34B and FIG. 35B, with the main difference that under the falling edge-triggered method the signal edge triggering circuit SETC triggers and outputs an enable signal to the pulse-width determining circuit 7113_b_ around when a falling edge occurs on the voltage signal Vcp, so the pulse-width determining circuit 7113_b_ around the time of the falling edge generates a pulse signal DP having a pulse or waveform DP1. In some embodiments under the falling edge-triggered method, the reference voltage level Vps may comprise a first reference voltage level, such as 115V, corresponding to a first nominal supply voltage such as 120V of an AC power grid and a second reference voltage level, such as 200V, corresponding to a second nominal supply voltage such as 277V of another AC power grid. When the external driving signal Sed received by the detection pulse generating module 7110_b_ has the first nominal supply voltage, the pulse starting circuit 7112_b_ determines to generate a pulse DP1 of the pulse signal DP when the external driving signal Sed falls below the first reference voltage level of 115V. When the external driving signal Sed received by the detection pulse generating module 7110_b_ has the second nominal supply voltage, the pulse starting circuit 7112_b_ determines to generate a pulse DP1 of the pulse signal DP when the external driving signal Sed falls below the second reference voltage level of 200V.

Based on the above teachings and embodiments, a person of ordinary skill in the relevant art can understand that apart from the signal-edge triggering operations above, various possible mechanisms for determining the time to generate a pulse signal DP may be implemented by the pulse starting circuit 7112. For example, the pulse starting circuit 7112 may be designed to start recording time upon detecting a rising edge or a falling edge occurring on the voltage signal Vcp, and to trigger and output an enable signal to the pulse-width determining circuit 7113 when the recorded time reaches a predefined duration. Another example is that the pulse starting circuit 7112 may be designed to activate the pulse-width determining circuit 7113 in advance when the pulse starting circuit 7112 detects a rising edge occurring on the voltage signal Vcp, and to trigger and output an enable signal to the pulse-width determining circuit 7113 when later detecting a falling edge occurring on the voltage signal Vcp, for the early-activated pulse-width determining circuit 7113 to be able to quickly respond in order to generate the pulse signal DP at an accurate time point.

Figure 35D:
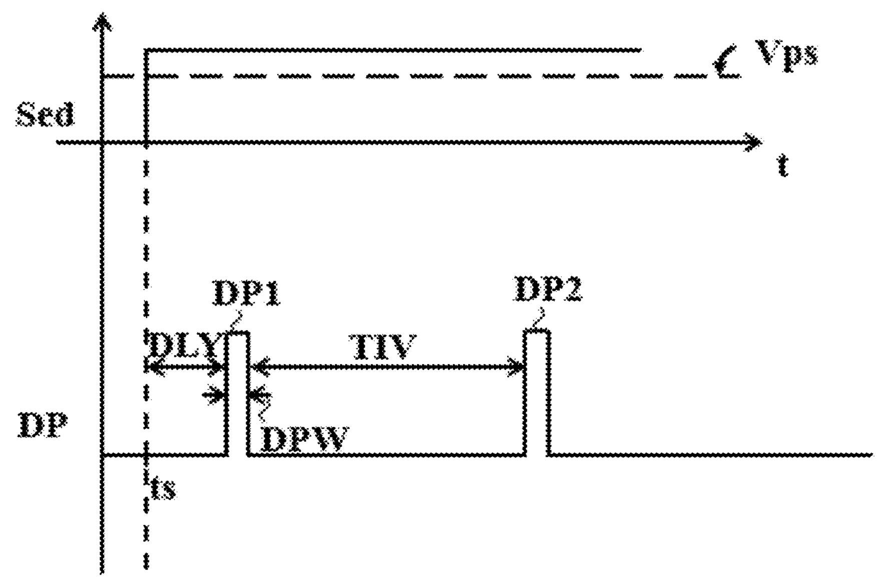

Corresponding variations of two relevant signals along the time axis generated in some embodiments of the detection pulse generating module are shown in FIG. 35D. Referring to FIG. 35D, operations in this embodiment are similar to those in the embodiments of FIG. 35B and FIG. 35C, with the main difference that in this embodiment the pulse starting circuit 7112 is designed to start recording time upon the external driving signal Sed exceeding a reference voltage level Vps, and to trigger so as to generate a pulse DP1 of a pulse signal DP when the recorded time reaches a delay duration DLY. Upon generating the pulse DP1, after an interval TIV shown in FIG. 35D, another similar pulse or waveform DP2 is generated by the detection pulse generating module, which can be followed by similar operations of pulse generation.

Figure 36:
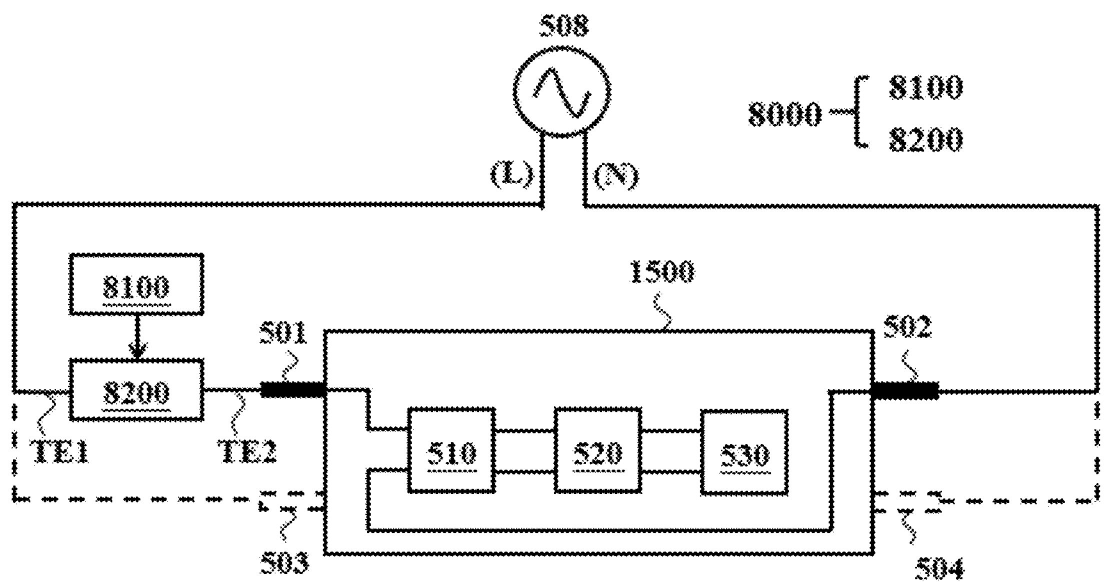
FIG. 36 is a block diagram of an exemplary power supply module in an LED tube lamp according to some exemplary embodiments.

FIG. 36 is a block diagram of an exemplary power supply module in an LED tube lamp according to some exemplary embodiments. Compared to the embodiment of FIG. 13A, an installation detection module 8000 is disposed outside of the LED tube lamp 1500 and includes a detection control circuit 8100 and a current-limiting circuit 8200 which is disposed on a power line from an external power source 508, and for example disposed in a lamp socket or fixture. Referring to FIG. 36, when pins on two ends of the LED tube lamp 1500 are electrically connected to the external power source 508, the current-limiting circuit 8200 is serially connected on a power loop of the LED tube lamp 1500 through a pin 501, causing or enabling the detection control circuit 8100 to judge, by performing any installation detection method as described in the embodiments of FIGS. 13A to 35D, whether the LED tube lamp 1500 is correctly/properly installed onto a lamp socket or whether the body of a user has accidentally touched a conducting part of the LED tube lamp 1500 which is not yet correctly/properly installed, and the detection control circuit 8100 then controls the current-limiting circuit 8200 to limit power supply from the external power source 508 to the LED tube lamp 1500 when determining that the LED tube lamp 1500 is not correctly/ properly installed onto a lamp socket or there is risk of electric shock upon the body of a user touching a conducting part of the LED tube lamp 1500.

It should be noted that, the current-limiting circuits mentioned above are embodiments of a means for limiting current, which is configured to limit the current on the power loop to less than a predetermined value (e.g., 5 MIU) when enabling. People having ordinary skill in the art may understand how to implement the current limiting module by circuits operated like a switch according to the embodiments described above. For example, the current limiting module can be implemented by electronic switch (e.g., MOSFET, BJT), electromagnetic switch, relay, triode AC semiconductor switch (TRIAC), Thyristor, impedance variable component (e.g., variable capacitor, variable resistor, variable inductor) and combination of the above.

Further, according to the embodiments illustrated in FIG. 16A to 20C, one skilled in the art should understand that the installation detection module illustrated in FIG. 16A can not only be designed as a distributed circuit applied in the LED tube lamp, but rather some components of the installation detection module can be integrated into an integrated circuit in an exemplary embodiment (e.g., the embodiment illustrated in FIG. 17A). Alternatively, all circuit components of the installation detection module can be integrated into an integrated circuit in another exemplary embodiment (e.g., the embodiment illustrated in FIG. 18A). Therefore, the circuit cost and the size of the installation detection module can be saved. In addition, by integrating/modularizing the installation detection module, the installation detection module can be more easily utilized in different types of the LED tube lamps so that the design compatibility of the LED tube lamp can be improved. Also, under the application of utilizing the integrated installation detection module in the LED tube lamp, the light emitting area of the LED tube lamp can be significantly improved since the circuit size within the tube lamp is reduced. For example, the integrated circuit design may reduce the working current (reduced by about 50%) and enhance the power efficiency of the integrated components. As a result, the saved power can be used for being supplied to the LED module for emitting light, so that the luminous efficiency of the LED tube lamp can be further improved.

To summarize, the embodiments illustrated in FIG. 14 to FIG. 38C teach a concept of electric shock protection by utilizing electrical control and detection method. Compared to mechanical electric shock protection (i.e., using the mechanical structure interaction/shifting for implementing the electric shock protection), the electrical electric shock protection has higher reliability and durability since the mechanical fatigue issue may not occur in the electrical installation detection module.

It should be noted that in embodiments of using detection pulse(s) for installation detection, the installation detection module in operation does not or will not substantially change characteristics and states of the LED tube lamp having the installation detection module that are related to LED driving and light emitting by the LEDs. The characteristics related to LED driving and light emitting by the LEDs include for example characteristics, such as phase of the power line signal and output current for the LED module, which can affect the brightness of light emission and output power of the lighted-up LED tube lamp. Operations of the installation detection module are only concerned with or related to leakage current protection when the LED tube lamp is not yet lighted up, which purpose makes the installation detection module distinctive from circuits used to adjust characteristics of LED lighting states, such as a DC power conversion circuit, a power factor correction circuit, and a dimmer circuit.

In some embodiments, the power supply module can be divided into two sub-modules, in which the two sub-modules are respectively disposed in the different end caps and the sum of power of the sub-modules equals to the predetermined output power of the power supply module.

According to some embodiments, the present invention further provides a detection method adopted by a light-emitting device (LED) tube lamp for preventing a user from electric shock when the LED tube lamp is being installed on a lamp socket. The detection method includes: generating a first pulse signal by a detection pulse generating module, wherein the detection pulse generating module is configured in the LED tube lamp; receiving the first pulse signal through a detection result latching circuit by a switch circuit, and making the switch circuit conducting during the first pulse signal to cause a power loop of the LED tube lamp to be conducting, wherein the switch circuit is on the power loop; and detecting a first sample signal on the power loop by a detection determining circuit as the power loop being conductive, and comparing the first sample signal with a predefined signal, wherein when the first sample signal is greater than or equal to the predefined signal, the detection method further includes: outputting a first high level signal by the detection determining circuit; receiving the first high level signal by the detection result latching circuit and outputting a second high level signal; and receiving the second high level signal by the switch circuit and conducting to cause the power loop to remain conductive.

In some embodiments, when the first sample signal is smaller than the predefined signal, the detection method further includes: outputting a first low level signal by the detection determining circuit; receiving the first low level signal by the detection result latching circuit and outputting a second low level signal; and receiving the second low level signal by the switch circuit and maintaining an off state of the switch circuit to cause the power loop to remain open.

In some embodiments, when the power loop remains open, the detection method further includes: generating a second pulse signal by the detection pulse generating module; receiving the second pulse signal through the detection result latching circuit by the switch circuit, and changing an off state of the switch circuit to a conducting state again during the second pulse signal to cause the power loop to be conducting once more; and detecting a second sample signal on the power loop by the detection determining circuit as the power loop being conductive once more, and comparing the second sample signal with the predefined signal, wherein when the second sample signal is greater than or equal to the predefined signal, the detection method further includes: outputting the first high level signal by the detection determining circuit; receiving the first high level signal by the detection result latching circuit and outputting the second high level signal; and receiving the second high level signal by the switch circuit and maintaining a conducting state of the switch circuit to cause the power loop to remain conducting.

In some embodiments, when the second sample signal is smaller than the predefined signal, the detection method further includes: outputting the first low level signal by the detection determining circuit; receiving the first low level signal by the detection result latching circuit and outputting the second low level signal; and receiving the second low level signal by the switch circuit and maintaining an off state of the switch circuit to cause the power loop to remain open.

In some embodiments, a period (or a width) of the first pulse signal is between 10 microseconds-1 millisecond, a period (or a width) of the second pulse signal is between 10 microseconds-1 millisecond.

In some embodiments, a time interval between the first and the second pulse signals (or a cycle of the pulse signal) includes (X+Y)(T/2), where T is the cycle of the external driving signal, X is an integer which is bigger than or equal to zero, $0<Y<1$.

In some embodiments, a period (or a width) of the first pulse signal is between 1 microsecond-100 microseconds, a period (or a width) of the second pulse signal is between 1 microsecond-100 microseconds.

In some embodiments, a time interval between the first and the second pulse signals (or a cycle of the pulse signal) is between 3 milliseconds-500 milliseconds.

In some embodiments, a protection device is electrically connected between the power supply module and the pins on the end caps. For example, a rated current fuse or a resistance type fuse (e.g., pico fuse) may be used.

In some embodiments, at least two protection elements, such as two fuses, are respectively connected between the internal circuits of the LED tube lamp and the conductive pins of the LED tube lamp, and which are on the power loop of the LED tube lamp. In some embodiments, four fuses are used for an LED tube lamp having power-supplied at its both end caps respectively having two conductive pins. In this case, for example, two fuses are respectively connected between two conductive pins of one end cap and between one of the two conductive pins of this end cap and the internal circuits of the LED tube lamp; and the other two fuses are respectively connected between two conductive pins of the other end cap and between one of the two conductive pins of the other end cap and the internal circuits of the LED tube lamp. In some embodiment, the capacitance between a power supply (or an external driving source) and the rectifying circuit of the LED tube lamp may be ranging from 0 to about 100 pF. In some embodiments, the above-mentioned installation detection module may be configured to use an external power supply.

According to the design of the power supply module, the external driving signal may be a low frequency AC signal (e.g., commercial power) or a DC signal (e.g., that provided by a battery or external configured driving source), input into the LED tube lamp through a drive architecture of dual-end power supply. For the drive architecture of dual-end power supply, the external driving signal may be input by using only one end thereof as single-end power supply.

The LED tube lamp may omit the rectifying circuit in the power supply module when the external driving signal is a DC signal.

According to the design of the rectifying circuit in the power supply module, there may be a dual rectifying circuit. First and second rectifying circuits of the dual rectifying circuit are respectively coupled to the two end caps disposed on two ends of the LED tube lamp. The dual rectifying circuit is applicable to the drive architecture of dual-end power supply. Furthermore, the LED tube lamp having at least one rectifying circuit is applicable to the drive architecture of a low frequency AC signal, high frequency AC signal or DC signal.

The dual rectifying circuit may comprise, for example, two half-wave rectifier circuits, two full-wave bridge rectifying circuits or one half-wave rectifier circuit and one full-wave bridge rectifying circuit.

According to the design of the pin in the LED tube lamp, there may be two pins in single end (the other end has no pin), two pins in corresponding ends of two ends, or four pins in corresponding ends of two ends. The designs of two pins in single end and two pins in corresponding ends of two ends are applicable to a single rectifying circuit design of the rectifying circuit. The design of four pins in corresponding ends of two ends is applicable to a dual rectifying circuit design of the rectifying circuit, and the external driving signal can be received by two pins in only one end or any pin in each of two ends.

According to the design of the filtering circuit of the power supply module, there may be a single capacitor, or π filter circuit. The filtering circuit filters the high frequency component of the rectified signal for providing a DC signal with a low ripple voltage as the filtered signal. The filtering circuit also further comprises the LC filtering circuit having a high impedance for a specific frequency for conforming to current limitations in specific frequencies of the UL standard. Moreover, the filtering circuit according to some embodiments further comprises a filtering unit coupled between a rectifying circuit and the pin(s) for reducing the EMI resulted from the circuit(s) of the LED tube lamp. The LED tube lamp may omit the filtering circuit in the power supply module when the external driving signal is a DC signal.

The LED module may be electrically connected with a voltage stabilization circuit in parallel for preventing the LED module from over voltage. The voltage stabilization circuit may be a voltage clamping circuit, such as Zener diode, DIAC and so on. When the rectifying circuit has a capacitive circuit, in some embodiments, two capacitors are respectively coupled between two corresponding pins in two end caps and so the two capacitors and the capacitive circuit as a voltage stabilization circuit perform a capacitive voltage divider.

If the external driving signal is a high frequency AC signal, a capacitive circuit (e.g., having at least one capacitor) is in at least one rectifying circuit and the capacitive circuit is electrically connected in series with a half-wave rectifier circuit or a full-wave bridge rectifying circuit of the rectifying circuit and serves as a current modulation circuit (or a current regulator) to modulate or to regulate the current of the LED module due to that the capacitor equates a resistor for a high frequency signal. In addition, an energy-releasing circuit is electrically connected in parallel with the LED module. When the external driving signal is no longer supplied, the energy-releasing circuit releases the energy stored in the filtering circuit to lower a resonance effect of the filtering circuit and other circuits for restraining the flicker of the LED module. In some embodiments, the driving circuit may be a buck converter, a boost converter, or a buck-boost converter. The driving circuit stabilizes the current of the LED module at a defined current value, and the defined current value may be modulated based on the external driving signal. For example, the defined current value may be increased with the increasing of the logic level of the external driving signal and reduced with the reducing of the logic level of the external driving signal. Moreover, a mode switching circuit may be added between the LED module and the driving circuit for switching the current from the filtering circuit directly or through the driving circuit inputting into the LED module.

A protection circuit may be additionally added to protect the LED module. The protection circuit detects the current and/or the voltage of the LED module to determine whether to enable corresponding over current and/or over voltage protection.

According to the design of the auxiliary power module of the power supply module, the energy storage unit may be a battery (e.g., lithium battery, graphene battery) or a super-capacitor, electrically connected in parallel with the LED module.

According to the design of the LED module of the power supply module, the LED module comprises plural strings of LEDs electrically connected in parallel with each other, wherein each LED may have a single LED chip or plural LED chips emitting different spectrums. Each LEDs in different LED strings may be electrically connected with each other to form a mesh connection.

The above-mentioned exemplary features of the present invention can be accomplished in any combination to improve the LED tube lamp, and the above embodiments are described by way of example only. The present invention is not herein limited, and many variations are possible without departing from the spirit of the present invention and the scope as defined in the appended claims.

What is claimed is:

1. A method for driving a ballast-bypass light-emitting diode (LED) tube lamp, comprising:

providing a rectifying circuit for receiving an AC driving signal from a first rectifying input terminal and a second rectifying input terminal;

providing a filtering circuit electrically connected to the rectifying circuit via a first rectifying output terminal and a second rectifying output terminal;

providing a driving circuit electrically connected to the filtering circuit for supplying a driving current to an LED module;

detecting whether a foreign external impedance is electrically connected to the LED tube lamp;

disabling the driving circuit so as to limit generation of the driving current to prevent the LED module from emitting light when part of the LED tube lamp is electrically connected to an external power source and the foreign external impedance is electrically connected to the LED tube lamp; and enabling the driving circuit so as to not limit the generation of the driving current in order to allow the LED module to emitting light when both ends of the LED tube lamp are electrically connected to the external power source and the foreign external impedance is not electrically connected to the LED tube lamp.

2. The method according to claim 1, wherein the step of providing the driving circuit electrically connected to the filtering circuit for supply the driving current to the LED module comprises:

providing a controller having a power input terminal and configured to control the generation of the driving current.

3. The method according to claim 2, wherein the step of detecting whether the foreign external impedance is electrically connected to the LED tube lamp comprises:

detecting a signal on a detection path, wherein the detection path is a branch circuit extending from a power loop of the LED tube lamp; and determining whether the foreign external impedance is electrically connected to the LED tube lamp based on the signal detected on the detection path.

4. The method according to claim 3, wherein the step of disabling the driving circuit so as to limit generation of the driving current to prevent the LED module from emitting light comprises:

generating an adjustment control signal with a first level when the signal detected on the detection path indicates the foreign external impedance is electrically connected to the LED tube lamp; and adjusting, in response to the adjustment control signal with the first level, a signal level on the power input terminal to a level that is not capable of enabling the driving circuit.

5. The method according to claim 4, wherein adjusting the signal level on the power input terminal to the level that is not capable of enabling the driving circuit comprises:

electrically connecting the power input terminal to a ground terminal by turning on a transistor connected to the power input terminal.

6. The method according to claim 4, wherein the step of enabling the driving circuit so as to not limit the generation of the driving current in order to allow the LED module to emitting light comprises:

generating an adjustment control signal with a second level when the signal detected on the detection path indicates the foreign external impedance is not electrically connected to the LED tube lamp; and allowing, in response to the adjustment control signal with the second level, a signal level on the power input terminal to be charged to a level that is capable of enabling the driving circuit.

7. The method according to claim 6, wherein allowing the signal level on the power input terminal to be charged to the level that is capable of enabling the driving circuit comprises:

electrically disconnecting the power input terminal from a ground terminal by turning off a transistor connected to the power input terminal.

8. The method according to claim 3, wherein the step of detecting the signal on the detection path comprises:

receiving a pulse signal by the detection path, so as to allow a current to flow through the detection path during a limited time frame.

9. The method according to claim 8, further comprising:

providing a resistor and a transistor electrically connected to the resistor in series to form the detection path, wherein the transistor is configured to turn on or cut off in response to the pulse signal.

10. The method according to claim 9, wherein the detection path is electrically connected to the first rectifying output terminal via a first detection connection terminal, and is electrically connected to the second rectifying output terminal via a second detection connection terminal.

11. The method according to claim 10, further comprising:

providing a current limiting element electrically connected between the first rectifying output terminal and the filtering circuit, and configured to limit direction of current on the power loop.

12. The method according to claim 11, wherein the step of providing the current limiting element electrically connected between the first rectifying output terminal and the filtering circuit comprises:

providing a diode having an anode electrically connected to the first rectifying output terminal and the resistor via the first detection connection terminal and a cathode electrically connected to the filtering circuit.

13. The method according to claim 11, wherein the step of providing the current limiting element electrically connected between the first rectifying output terminal and the filtering circuit comprises:

providing a diode having an anode electrically connected to the first rectifying output terminal and the transistor via the first detection connection terminal and a cathode electrically connected to the filtering circuit.

14. The method according to claim 8, further comprising:

providing a resistor, a transistor electrically connected to the resistor in series, a first diode, and a second diode to form the detection path, wherein the transistor is configured to turn on or cut off in response to the pulse signal, wherein the first diode has an anode electrically connected to the first rectifying input terminal and a cathode electrically connected to the resistor via a first detection connection terminal, and wherein the second diode has an anode electrically connected to the second rectifying input terminal and a cathode electrically connected to the resistor via a first detection connection terminal.

15. The method according to claim 3, wherein the step of detecting the signal on the detection path comprises:

sampling the signal on the detection path according to a set time point and generating a plurality of sample signals, respectively corresponding to the signal on the detection path, at different time points.

16. The method according to claim 15, wherein the step of determining whether the foreign external impedance is electrically connected to the LED tube lamp based on the signal detected on the detection path comprises:

comparing at least two sample signals with each other and generating a comparison result; and generating an adjustment control signal according to the comparison result.

17. The method according to claim 3, wherein the detection path is electrically connected to the first rectifying output terminal via a first detection connection terminal, and is electrically connected to the second rectifying output terminal via a second detection connection terminal.

18. The method according to claim 17, further comprising:

providing a current limiting element electrically connected between the first rectifying output terminal and the filtering circuit, and configured to limit direction of current on the power loop.

19. The method according to claim 18, wherein the step of providing the current limiting element electrically connected between the first rectifying output terminal and the filtering circuit comprises:

providing a diode having an anode electrically connected to the first rectifying output terminal and at least one of a resistor and a transistor included in the detection path via the first detection connection terminal and a cathode electrically connected to the filtering circuit.

20. The method according to claim 3, further comprising:

providing a first diode having an anode electrically connected to the first rectifying input terminal;

providing a second diode having an anode electrically connected to the second rectifying input terminal;

providing a resistor having a first end electrically connected to cathodes of the first and the second diodes; and providing a transistor electrically connected between a second end of the resistor and the second rectifying output terminal.

* * * * *